US012672566B2

(12) United States Patent
Acikalin et al.

(10) Patent No.: US 12,672,566 B2
(45) Date of Patent: Jun. 30, 2026

(54) WIRELESS CHIP-TO-CHIP HIGH-SPEED DATA TRANSPORT

(71) Applicant: Intel Corporation, Santa Clara, CA (US)

(72) Inventors: Tolga Acikalin, San Jose, CA (US); Tae Young Yang, Portland, OR (US); Debabani Choudhury, Thousand Oaks, CA (US); Shuhei Yamada, Vancouver, WA (US); Roya Doostnejad, Los Altos, CA (US); Hosein Nikopour, San Jose, CA (US); Issy Kipnis, Berkeley, CA (US); Oner Orhan, San Jose, CA (US); Mehnaz Rahman, San Jose, CA (US); Kenneth P. Foust, Beaverton, OR (US); Christopher D. Hull, Portland, OR (US); Telesphor Kamgaing, Chandler, AZ (US); Omkar Karhade, Chandler, AZ (US); Stefano Pellerano, Beaverton, OR (US); Peter Sagazio, Portland, OR (US); Sai Vadlamani, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 444 days.

(21) Appl. No.: 18/253,945

(22) PCT Filed: Dec. 23, 2020

(86) PCT No.: PCT/US2020/066747
§ 371 (c)(1),
(2) Date: May 23, 2023

(87) PCT Pub. No.: WO2022/139827
PCT Pub. Date: Jun. 30, 2022

(65) Prior Publication Data
US 2024/0021522 A1 Jan. 18, 2024

(51) Int. Cl.
*H10W 70/65* (2026.01)
*H01Q 1/22* (2006.01)
(Continued)

(52) U.S. Cl.
CPC .......... *H10W 70/65* (2026.01); *H01Q 1/2283* (2013.01); *H04B 5/72* (2024.01);
(Continued)

(58) Field of Classification Search
None
See application file for complete search history.

(56) References Cited

U.S. PATENT DOCUMENTS 5,986,382 A 11/1999 Nysen
8,351,982 B2 1/2013 Rofougaran
(Continued)

FOREIGN PATENT DOCUMENTS

CN 103168354 B 6/2013
CN 103947126 A 7/2014
(Continued)

OTHER PUBLICATIONS

Zia, Muneeb et al., "Chip-to-Chip interconnect integration technologies", published on Mar. 25, 2016, 16 pages, IEICE Electronics Express, vol. 13, No. 6.
(Continued)

*Primary Examiner* — Nicholas J Tobergte
(74) *Attorney, Agent, or Firm* — Viering, Jentschura & Partner mbB

(57) ABSTRACT
Various devices, systems, and/or methods perform wireless chip to chip high speed data transmission. Strategies for such transmission include use of improved microbump antennas, wireless chip to chip interconnects, precoding and decoding strategies, channel design to achieve spatial multiplexing gain in line of sight transmissions, open cavity chip design
(Continued)

for improved transmission, and/or mixed signal channel equalization.

19 Claims, 56 Drawing Sheets

(51) Int. Cl.

| | |
|---|---|
| *H04B 5/72* | (2024.01) |
| *H10W 44/20* | (2026.01) |
| *H10W 70/685* | (2026.01) |
| *H10W 72/00* | (2026.01) |
| *H10W 90/00* | (2026.01) |
| *H04B 5/22* | (2024.01) |
| *H04B 5/24* | (2024.01) |

(52) U.S. Cl.
CPC ......... *H10W 44/20* (2026.01); *H10W 70/685* (2026.01); *H10W 72/072* (2026.01); *H10W 90/00* (2026.01); *H04B 5/22* (2024.01); *H04B 5/24* (2024.01); *H10W 44/209* (2026.01); *H10W 44/234* (2026.01); *H10W 44/248* (2026.01); *H10W 90/722* (2026.01); *H10W 90/724* (2026.01)

(56) References Cited

U.S. PATENT DOCUMENTS

| | | | |
|---|---|---|---|
| 9,093,756 B2 | 7/2015 | Asai et al. | |
| 10,771,187 B1 | 9/2020 | Gamage et al. | |
| 2002/0066952 A1* | 6/2002 | Taniguchi | H01L 25/105 257/784 |
| 2002/0171591 A1 | 11/2002 | Beard | |
| 2006/0027666 A1* | 2/2006 | Glaser | G08B 13/2417 235/492 |
| 2012/0295539 A1 | 11/2012 | Mccormack et al. | |
| 2015/0035625 A1 | 2/2015 | Ohtomo et al. | |
| 2015/0042526 A1 | 2/2015 | Zeine | |
| 2015/0053772 A1* | 2/2015 | Holweg | G06K 19/07794 235/492 |
| 2015/0276856 A1 | 10/2015 | Castaneda | |
| 2018/0212306 A1* | 7/2018 | Elsherbini | H01Q 1/2283 |
| 2018/0212322 A1 | 7/2018 | Elsherbini | |
| 2018/0212645 A1 | 7/2018 | Kamgaing et al. | |
| 2018/0248254 A1 | 8/2018 | Islam et al. | |
| 2020/0105653 A1 | 4/2020 | Elsherbini | |
| 2020/0212538 A1 | 7/2020 | Pano et al. | |
| 2020/0242441 A1* | 7/2020 | Chen | G06K 19/07345 |

FOREIGN PATENT DOCUMENTS

| | | |
|---|---|---|
| CN | 109712947 A | 5/2019 |
| TW | 201724462 A | 7/2017 |
| WO | 2016/130090 A1 | 8/2016 |
| WO | 2018204610 A2 | 11/2018 |

OTHER PUBLICATIONS

Loke, Wing-Fai et al., "Wireless chip-to-chip communication in three-dimensional integrated circuits using microbump antennas", 2013 IEEE MTT-S International Microwave Symposium Digest (MTT), Jun. 2013, 4 pages, IEEE, Seattle, WA, USA.

Intel; https://www.intel.com/content/www/us/en/foundry/emib. html.; retrieved on May 11, 2023, 6 pages.

Pano, Vasil et al., "TSV-based antenna for on-chip wireless communication", IET Microwaves, Antennas & Propagation, retrieved on May 11, 2023, 20 pages, The Institution of Engineering and Technology.

Bohagen, Frode et al., "Design of Optimal High-Rank Line-of-Sight MIMO Channels", IEEE Transactions on Wireless Communications, Apr. 2007, pp. 1420-1425, IEEE, vol. 6, Issue 4.

Keehr, Edward A. et al., "Equalization of Third-Order Intermodulation Products in Wideband Direct Conversion Receivers", IEEE Journal of Solid-State Circuits, Dec. 2008, pp. 2853-2867, IEEE, vol. 43, Issue 12.

Thakkar, Chintan et al.; "Design of Multi-GB/s Multi-Coefficient Mixed-Signal Equalizers"; https://www2.eecs.berkeley.edu/Pubs/TechRpts/2014/EECS-2014-189.html; retrieved on May 11, 2023, 6 pages.

Yang, Tae-Young, "Fundamental Limits on Antenna Size for Frequency and Time Domain Applications", Sep. 3, 2012, 269 pages, Dissertation.

Hwangbo, Seahee et al., "Directional Through Glass via (TGV) Antennas for Wireless Point-to-point Interconnects in 3D Integration and Packaging", 2017 IEEE 67th Electronic Components and Technology Conference, May 30-Jun. 2, 2017, pp. 260-265, IEEE, Orlando, FL, USA.

Hwangbo, Seahee et al., "Millimeter-wave Wireless Intra-/Inter Chip Communications in 3D Integrated Circuits using Through Glass via (TGV) Disc-loaded Patch Antennas", 2016 IEEE 66th Electronic Components and Technology Conference (ECTC), May 31-Jun. 3, 2016, pp. 2507-2512, IEEE, Las Vegas, NV, USA.

Guirado, Robert et al., "Dataflow-Architecture Co-Design for 2.5D DNN Accelerators using Wireless Network-on-Package", Nov. 30, 2020, 7 pages, arXiv, V1.

Search Report issued for the corresponding Dutch patent application No. 2029884, dated Feb. 7, 2023, 17 pages (for informational purposes only).

International Search Report issued for the corresponding International patent application No. PCT/US2020/066747, dated Sep. 17, 2021, 8 pages (for informational purposes only).

Taiwanese Search Report issued for the corresponding TW patent application No. TW 110133732 dated Jan. 21, 2025, 2 pages (for informational purposes only).

Supplementary European Search Report for corresponding European Patent Application No. EP 20967194, dated Jul. 23, 2024, 14 pages (for informational purposes only).

Hu, Samming, "High-Efficiency Horn Antenna Using Solder Balls for Seamless Package with Millimeter-Wave 3D Chips", 8th European Conference on Antennas and Propagation (EuCAP 2014), IEEE, 2014, pp. 211-215.

* cited by examiner

| | Extra Short Range (XSR) | Short Range (MSR) | Long Range (LR) |
|---|---|---|---|
| Link type | point-to-point | multipoint-to-multipoint | multipoint-to-multipoint |
| Power Efficiency | 1pJ/b | 3pJ/b | 5pJ/b |
| Channel Length | 1-4mm | 5-10mm | 100mm |
| Latency | 2ns | 3-4ns | 5ns |
| BER | 1e-12 | 1e-12 | 1e-6 (raw) |
| Data rate | >500Gbps aggregate | >200Gbps per link | >200Gbps per link |
| Si Area efficiency | > 500 Gbps/mm^2 | 200 Gbps/mm^2 | 200 Gbps/mm^2 |

800

Rack Unit-to-Rack Unit

810

1602

1603

1608  1606  1604

1702

1604

1606

1608  1704

2402                                    2404

Group Mirror     Side-by-Side Mirror     Side-by-Side Rotate     Single Center Feed Single
Center Feed

FIG. 38
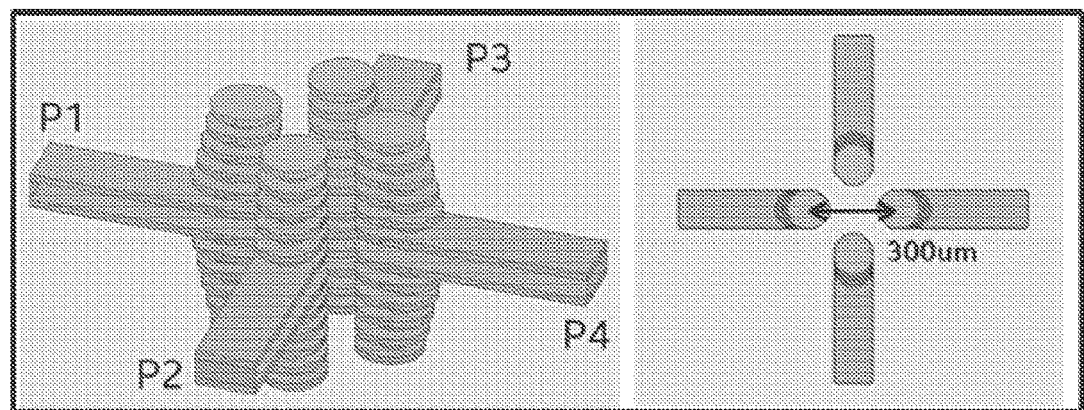
FIG. 39
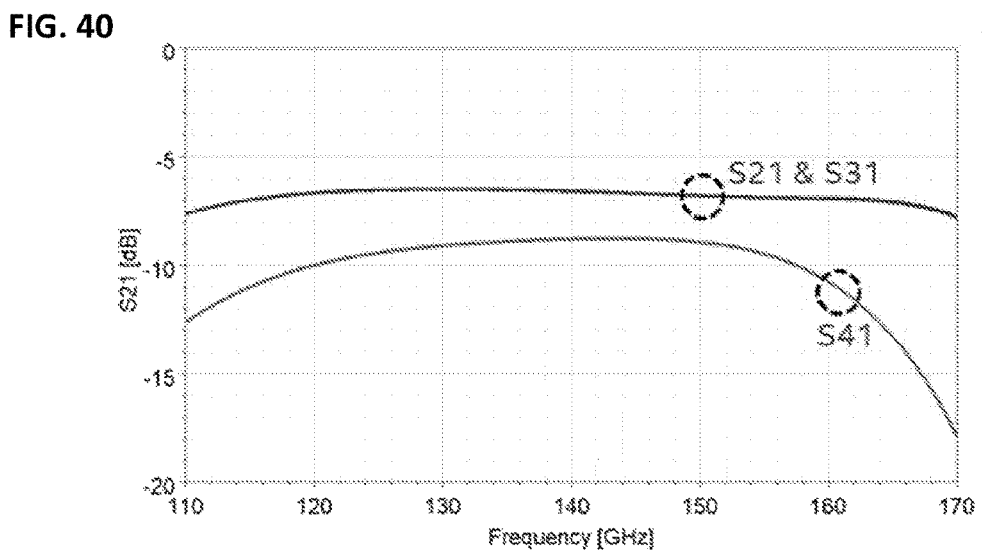
FIG. 40

Top GND (15um) ⟋ 4202

Substrate (50um) ⟋ 4204

Stripline (15um) ⟋ 4206

Substrate (50um) ⟋ 4208

Bottom GND (15um) ⟋ 4210

Monopole antenna
formed with via
4802

5502
5504
5506
5508

5510

5602

5604

/O 2022/139827

*Figure 4: High-Level diagram for fixed MIMO Precoder/Decoder*

$$d_1 = \sqrt{\frac{D \cdot \lambda}{2}}$$

$$d_2 < \lambda/2$$

6506

6502

6504

6508

6510

6512        6512

6606

6604

6602

6702

6704

6802

6804

7108

7102

7104

7106

7202

7204

7900

8302

8304

Polarization Direction of
Dipole µ-Bump Antenna

Power Flow Direction (Poynting Vector) of
both Dipole and Slot µ-Bump Antennas

Polarization Direction of
Slot µ-Bump Antenna

8402

8404 8406

Source₀

Source₁

8408

Die 0   Die 1   Die 2   Die 3
Die 4   Die 5   Die 6   Die 7

8606

9002

9004

9102

9104

9106

1

WIRELESS CHIP-TO-CHIP HIGH-SPEED DATA TRANSPORT

CROSS-REFERENCE TO RELATED APPLICATIONS

This is a national phase of PCT Application PCT/US2020/066747 filed on Dec. 23, 2020, the entire contents of which are incorporated by reference.

TECHNICAL FIELD

Various aspects of this disclosure relate to wireless chip-to-chip communication, e.g., such as within a multichip package, between chiplets, between multichip packages, and/or within a three-dimensional chip package context.

BACKGROUND

Today's emerging technologies and applications continue to demand increasingly greater computational power. Traditionally, increased computational requirements or performance requirements could be met by virtue of the inherent advancement described by Moore's law, which explains that the number of transistors included in an integrated circuit will double approximately every eighteen months.

However, as the number of transistors in integrated circuits appears to be approaching limited dictated by the laws of physics, the frequency of transistor doubling has slowed down. At the same time, the technologies involving artificial intelligence, machine learning, neuromorphic computing, data servers, cloud computing continue to demand greater computational performance. One approach to meet today's ever-increasing computational demands has been the integration of disaggregated resources in a single package or module. In some cases, the disaggregated resources may be a hardware component in the form of a chip or chiplet. A chiplet can be a functional block in the form an integrated circuit that can be specifically designed to work with other chiplets to form larger more complex chips. That is, chiplets can refer to the independent constituents which make up a large chip built out of multiple smaller chiplets or dies. A chiplet may be an integrated circuit block of a multichip module (MCM) or of MCM devices. Otherwise stated, a chiplet may be understood as a sub-processing unit or a disaggregated functional resource. A chiplet may optionally have a specialized function and be designed to integrate with other chiplets of a same multichip device or module. A chiplet may optionally be fabricated on its own individual semiconductor die with physical dimensions that are often smaller than other chips or processors.

In aspects of the disclosure, where appropriate, the term "die" may refer block of semiconductor material on which a component, e.g., a chip or chiplet is fabricated. In appropriate cases the term "die" may be used to refer to the integrated circuit fabricated from the semiconductor material (e.g., a chip, chiplet, etc.).

Devices described herein may be in the form of a multichip module. Multichip modules described herein be an electronic assembly, in which multiple chiplets and/or other discrete components are integrated. In so integrating, the multiple chiplets can be treated as if they were a larger integrated circuit.

The integration of disaggregated resources by way of integrating chiplets in a module may effectively bypass the limits of Moore's law and provide the computational power needed for today's applications. Nevertheless, the integration of disaggregated resource poses many challenges in terms of realizing performance improvements, cost efficiency, and design flexibility. For example, the connections between the chiplets or other functional blocks in a module can provide difficulties and challenges.

BRIEF DESCRIPTION OF FIGURES

In the drawings, like reference characters generally refer to the same parts throughout the different views. The drawings are not necessarily to scale, emphasis instead generally being placed upon illustrating the principles of the disclosure. In the following description, various aspects of the disclosure are described with reference to the following drawings, in which:

FIG. 38 depicts the proposed wireless broadcasting channel using an interconnect antenna element;

FIG. 39 depicts simulation results;

FIG. 40 depicts simulation results;

DESCRIPTION

Figure 1:
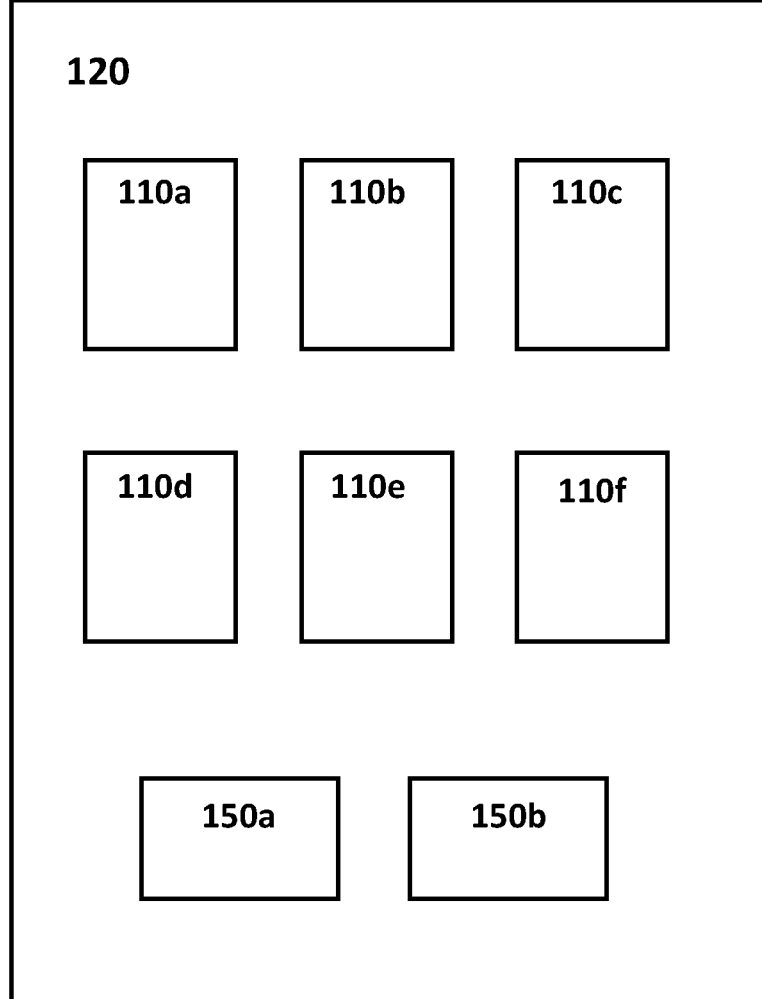
FIG. 1 shows a simplified representation of a multichip electronic device.

To meet the computational demands for today's application, chips or modules or chipsets that include and integrate multiple disaggregated resources are used. One way to increase the performance or power of a processor is to increase the computational elements or transistors on the processor. However, as the size of transistors has shrunk, the transistor doubling frequency noted in Moore's Law industry has decelerated, thereby limiting the usefulness of this strategy. One alternative to boost performance has been the use of aggregated heterogeneous chiplets.

As used herein, the term "chiplet" includes an integrated circuit block of a multichip module (MCM) or of MCM devices. A chiplet can be considered as a sub-processing unit or a disaggregated functional resource with a specialized function that is designed to integrate with other chiplets of a same multichip device or module. A chiplet may be fabricated on its own individual semiconductor die with physical dimensions that are often smaller than other chips or processors. The MCM unit provides interconnections of the chiplets so as to form complete electronic function(s).

In aspects of the disclosure, where appropriate, the term "die" may refer block of semiconductor material on which a component, e.g., a chip or chiplet is fabricated. In appropriate cases the term "die" may be used to refer to the integrated circuit fabricated from the semiconductor material (e.g., a chip, chiplet, etc.).

An MCM or MCM can be an electronic assembly that may be a single package including multiple components or modules or circuitries. In examples herein, an MCM can be a plurality of chiplets arranged in a single package including die-to-die interconnect schemes for connecting the chiplets. In such cases, the chiplets of an MCM can be integrated and mounted onto a unifying substrate, so that in use it can be treated as if it were a larger IC. The unifying substrate may be the package carrier or package carrier substrate. The chiplets (and possibly other components) of the MCM may also share a common encapsulation and a common integrated heat spreader (IHS).

An MCM may in some cases include components other than chiplets. That is, an MCM may include integrated devices with their own packaging, such as, for example, central processing units (CPUs), graphics processing units (GPUs), field programmable gate arrays (FPGA), etc. These such components with their own packaging can be arranged on a common substrate or base layer within relatively close proximity to each other in the MCM.

As used herein, "racks" or "rack enclosures" may be any type of equipment for housing electronic equipment. Racks house multiple types or sets of electronic equipment with an individual set of electronic equipment being housed within a single rack unit of the rack. Rack units of a rack may be stacked closely together, e.g., vertically in some cases. In aspects of the present disclosure, a rack unit may contain or hold one or more circuit boards or simply "boards". Each board can include a plurality of electronic devices, e.g., one or more multichip devices mounted the board. A rack may include multiple rack units that may be enclosed or contained in a common frame structure or chassis.

FIG. 1 shows a simplified representation of a multichip electronic device 100. The device 100 includes a plurality of chiplets 110a-f. Each of the chiplets 110a-f may include one or a plurality of processor-cores or cores. In addition to the chiplets 110a-f, the electronic device 100 may include other hardware and/or software resources as represented by the blocks 150a and 150b. For example, the electronic device 100 may include elements or components such as, for example, processors (e.g., CPU, GPU, AI engine, etc.), random access memory (RAM), read-only memory (ROM), erasable programmable ROM (EPROM), electrically erasable programmable ROM (EEPROM), application specific integrated circuit (ASIC), etc.), software, hardware, and/or firmware.

The device 100 may include a base layer or a substrate 120 for mounting, on which the chiplets and other components can be mounted. In some cases, the substrate 120 may be a printed circuit board (PCB), including wired connections between the components, e.g., wired connections between the chiplets and wired connections for the resources 150a-b.

The device 100 of FIG. 1 can be considered as a 2D (two-dimensional) device because the components the mounted on a single plane. However, the above approach may be of less value because area of the mounting plane (e.g., real estate) may be not sufficient to allow enough components for a particular application. Further, the connections of a base layer like a PCB (e.g., conductive traces) may be unsuitable for applications requiring fast interconnections.

Figure 2:
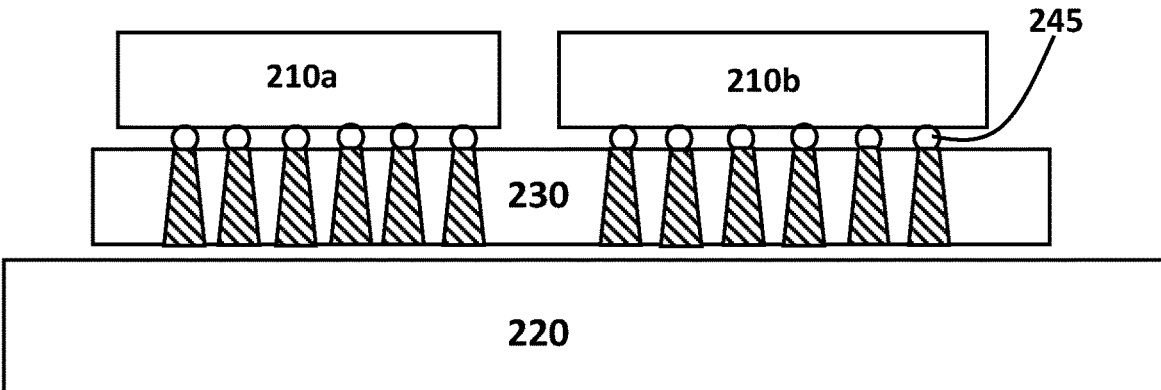
FIG. 2 shows a module device as an example of a 2.5D heterogeneous integration of integrated circuits or components.

Another architectural approach for increasing computational power is the use of 2.5 dimensional (2.5 D) packages. One example of a 2.5D package is shown in the device 200 of FIG. 2. 2.5D packages, as known in the art, can include multiple components, e.g., chips or chiplets mounted on an interposer. Conventionally, 2.5D semiconductor packages place several or chips side-by-side on a silicon interposer. This can be seen in FIG. 2, where in the device 200, the chips or chiplets 210a and 210b are mounted using bumps 245 on the interposer 230. The interposer itself can be mounted on the base layer, the package carrier, or the substrate 220.

An interposer is an electrical interface between connectors. For example, an interposer can provide interconnections between the components (e.g., chips, chiplets, etc.), as well as the external input/outputs (I/Os) through the use of through-substrate vias or through-silicon vias (TSV). Interposers can be silicon interposers that have lateral dimensions larger than the chips or components they are interconnecting.

Further, 2.5D package devices may also include bridges. For example, silicon bridges are a small piece of silicon that can be embedded under the edges of two components and provide interconnections therebetween. This can allow for most chips or components to be attached in multiple dimensions and thus eliminate additional physical constraints on heterogeneous chip attachment within the theoretical limits. In other words, EMIB or bridges are essentially embedded into a standard packaging substrate and are used to provide high interconnect density exactly where needed, while the rest of a standard packaging substrate can be used for the rest of the interconnects.

Another architectural approach for improving devices is the use of three-dimensional (3D) stacking of semiconductor devices or components. The components (e.g., chips or chiplets) can be arranged in 3 dimensions instead of 2 dimensions. This allows the components of a device or module to be placed in closer proximity to one another.

Figure 3A:
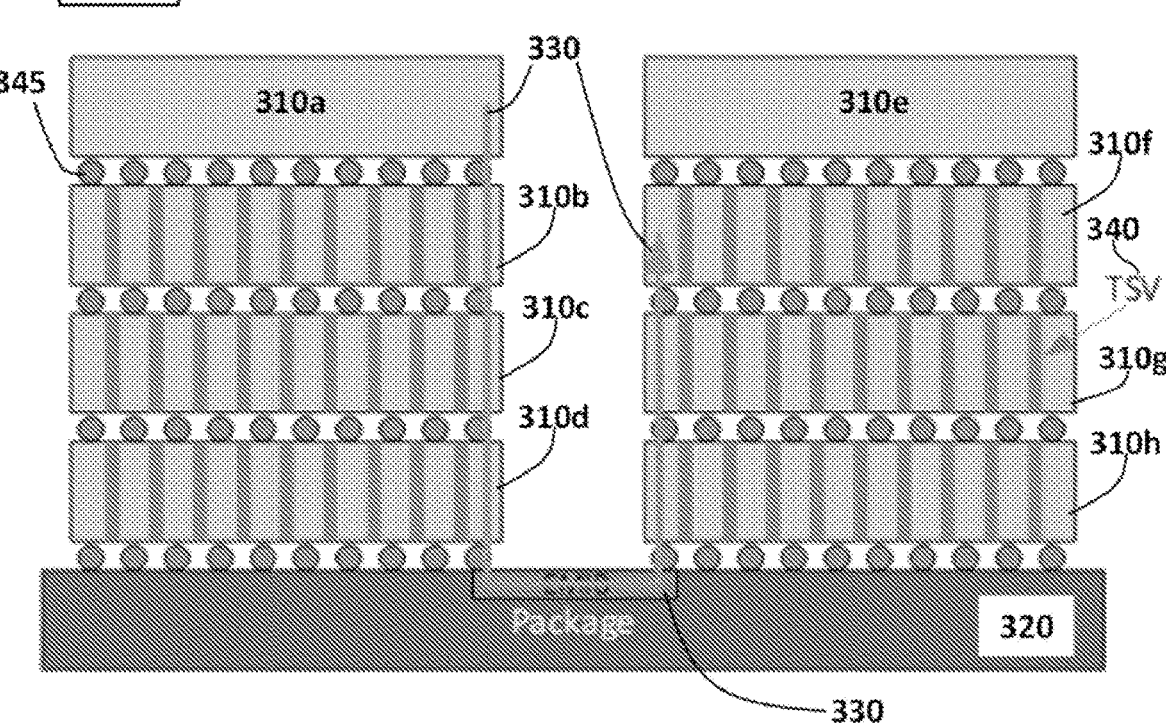
FIG. 3A depicts a module device as an example of a 3D heterogeneous integration of integrated circuits or components.

The module device 300 of FIG. 3A is one example of a 3D heterogeneous integration of integrated circuits or components (e.g., chiplets). The device 300 integrates disaggregated components in vertical stacks. The device includes at least a first vertical stack of chiplets 310a-d and a second vertical stack of chiplets 310e-f. In some examples, the chiplets may be any type of hardware component, e.g., include any type of processor (e.g., CPU, GPU, etc.), AI engine, accelerator, memory, or other suitable or desired component. As shown, the vertically adjacent chiplets are connected to one another using TSVs 340 and bumps 345.

Further, the packaging substrate 320 providing a mount for each stack can further include a bridge 330 for connecting the vertical stacks of chiplets. Specifically, the bridge 330 can directly connect the lower chiplet/component 310*d* of one stack with the lower chiplet/component 310*h* of the second stack. One example of a bridge is an embedded multi-die interconnect bridge (EMIB).

Figure 3B:
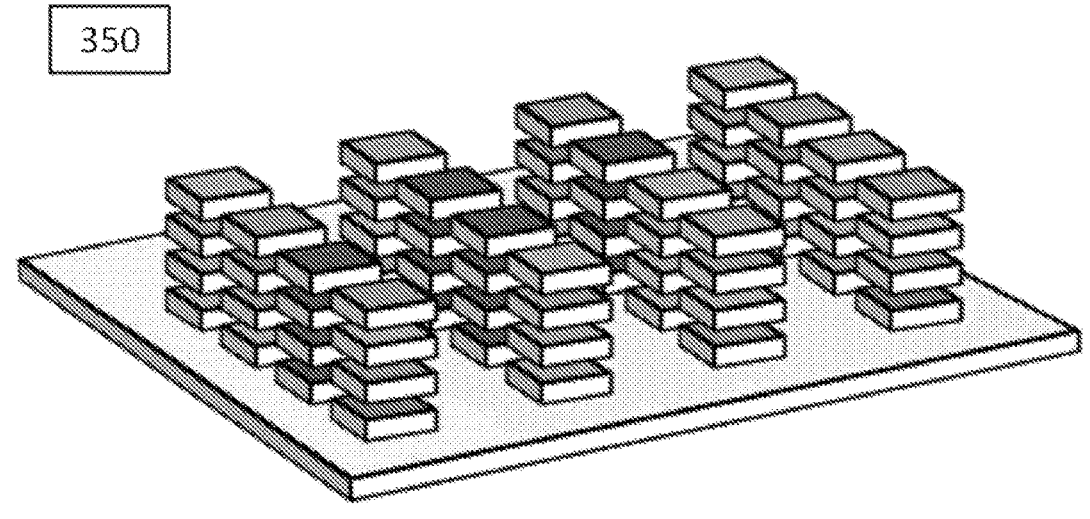
FIG. 3B depicts an exemplary multi-chip-module (MCM) implemented with a Manhattan architecture.

3D integration may provide improved speed between components (e.g., chips) as average wire length becomes shorter, and thus leading to shorter propagation delay and improved overall performance. 3D heterogonous integrated devices may be built with a Manhattan-like architecture which includes large X-Y arrays of heterogeneous chiplets (e.g., CPU, GPU, AI, memory, etc.), and each chiplet can be positioned as on a chess board, having several stacked dies. FIG. 3B depicts a device 350 which is an MCM implemented with a Manhattan architecture. The vertical dimension allows for greater connectivity and more design possibilities. Further, the 3D heterogeneous integration of resources may provide devices that provide improved performance while consuming lower power due to shorter wires which lead lower power consumption and less parasitic capacitance. Reducing the power budget leads to less heat generation, extended battery life, and lower cost of operation.

Nevertheless, the above-mentioned technologies do not scale well for massive 3D integration because the data rate per line may only be 2 to 10 Gbps. For example, referring to the wired interconnection approach for the device 300, no chiplets or components other than the lower two chiplets 310*d* and 310*h* have a direct connection. Therefore, if the chiplet 310*a* needs to connect and communicate with the chiplet 310*f*, the data path 330 would have to be one that extends through the TSVs 340 of the chiplets 310*b*-310 on the first stack, through the EMIB 330, and then through the TSVs 340 of the chiplets 310*g* and 310*h* before arriving at the chiplet 310*f*. Therefore, communication between chiplets would often require the use of many connections. The more and more components are added, thereby requiring communication with each other, the more the traffic in the TSVs, EMIBs, interposers, etc. increases. This increase in traffic presents problems in cases where high-transport data connections are needed.

For example, to create an aggregate data transport of 1 Tbps, 100 to 500 interconnect lines would be needed. While such data transports are possible for communication between neighboring chips, it would be physically and economically unfeasible to provide such data transports for larger integrations that involve hundreds of interconnect lines between horizontal and vertical stacked chips.

Further, the cost of a silicon interposer is proportional to the area of that interposer. So, in cases needing several or many localized high-density interconnects, the costs can quickly accumulate.

In short, TSV silicon interposers are relatively expensive and do not scale well for applications that require a massive number of components e.g., chiplets. Further, wires (interconnects) that connect together chips or chiplets degrade in performance with scaling. That is, wires can dominate the performance, functionality and power consumption of ICs.

The use of wireless Chip-to-Chip interconnects is an approach for realizing high-speed transport that would meet the requirements for high-performance computing products and applications. The wireless chip-to-chip (WC2C) technology can complement wired communications. WC2C can provide additional flexibility for high-performance computing products by enabling broadcast and multipoint-to-multipoint links with significant advantages for dynamically reconfigurable data-center networks.

Figure 4:
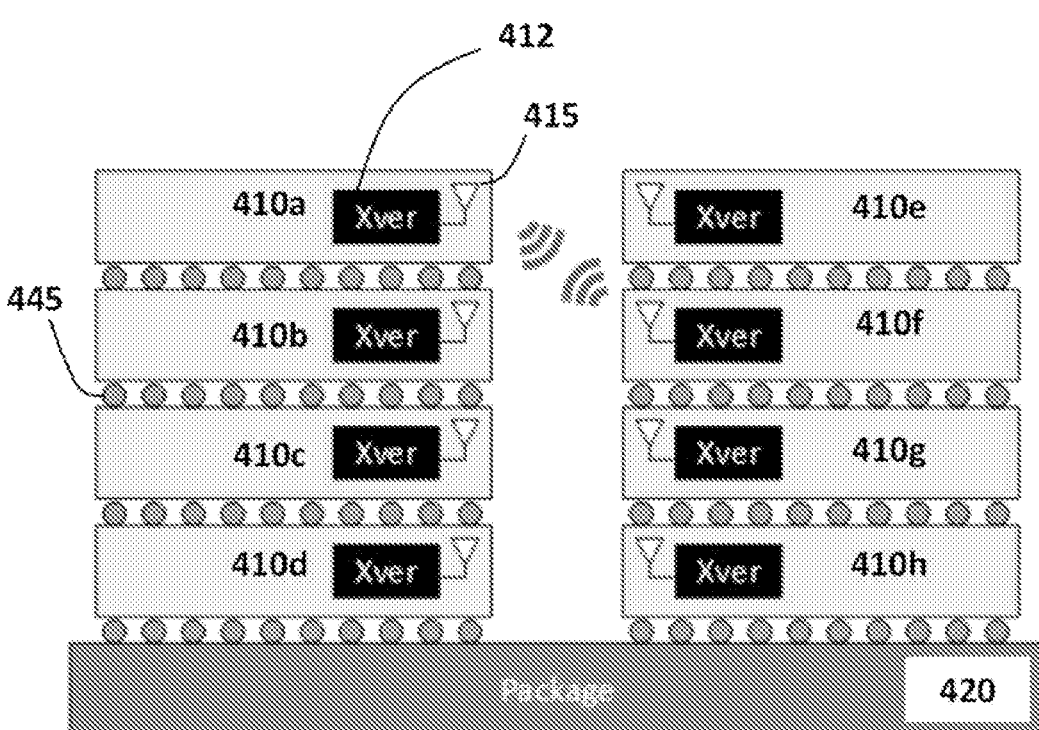
FIG. 4 depicts an example of an MCM incorporating wireless interconnections.

FIG. 4 shows an example of an MCM (MCM) 400 incorporating wireless interconnections. The MCM 400 includes a 3D integration of disaggregated resources (e.g., chiplets 410*a*-*f*).

The chiplets 410 can be stacked and mounted on a package substrate 420. To enable wireless connection, each chiplet or component can include an antenna or antenna structure 415 and radio circuitry, e.g., transceiver circuitry 412. In addition, module 400 can include or provide wired communication between components. Similar to the module 300 of FIG. 3, the chiplets 410 may include TSVs (not shown) and bumps 445 that can allow for vertical interconnection. Further, the packaging substrate 420 can include bridges (e.g., EMIBs) and other types of interconnects or routing lines for providing connections between components.

WC2C communication may permit dense chiplet based products and supplement existing chip to chip communications, e.g., wired interconnections. As shown in the example of FIG. 4, the chiplet 410*a* can directly communicate wirelessly with the chiplet 410*f*. Therefore, in aspects of the present disclosure, the use of WC2C communication can be used to greatly relieve or reduce the data traffic through TSVs, interposers, or bridges and improve device performance, efficiency and allow for greater and more massive 3D heterogeneous integration.

According to aspects of the present disclosure, to implement WC2C communication, an MCM such as the module 400 may implement protocols that can be divided into a control plane and a data plane.

The data plane carries the network data (e.g., in-module data) in accordance with the directives of the control plane. That is, the data plane performs the actual forwarding of the data according to the configuration or routing paths managed and set forth by the control plane.

In at least some cases, the data plane of WC2C communications may operate with frequencies in the 110-170 GHz D-band using CMOS circuits with economical power efficiency. For example, in some aspects, the antennas may have approximately 1 mm of spacing. As CMOS technology continues to evolve and improve, higher frequencies, the reduce the size and spacing of antenna elements, and higher bandwidths can be realized.

Different implementations or cases can be used for providing in-package communication such as WC2C communication. For example, three types of communications are possible for in-package or in-module communications including, wireless extra-short reach (WXSR), wireless short reach (WSR) and wireless long reach (WLR).

Figure 5A:
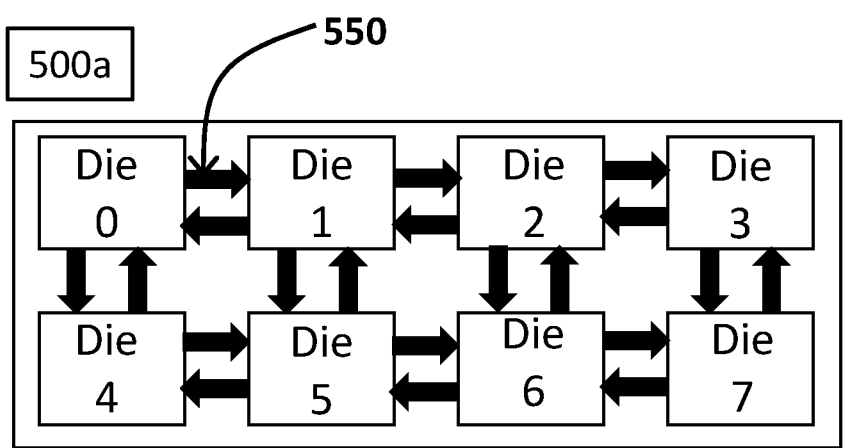
FIGS. 5A through 5C show examples of these 3 types of wireless links that can be used for intra-device configurations.
Figure 5B:
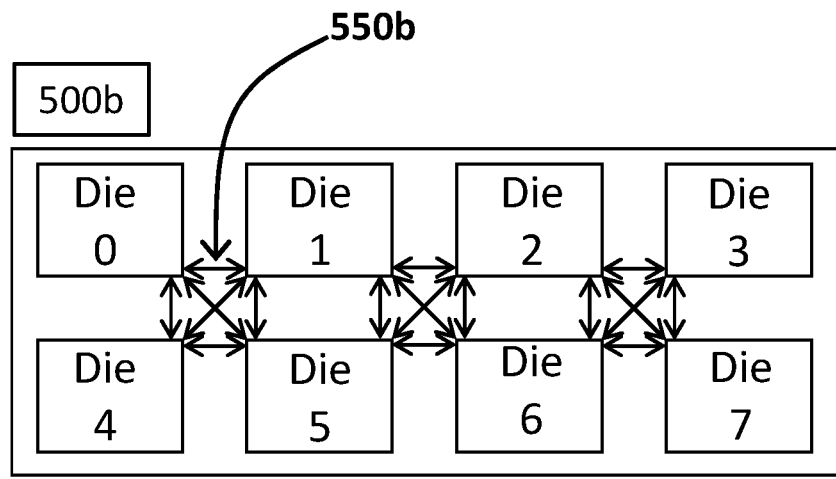
Figures 5C, 5D:
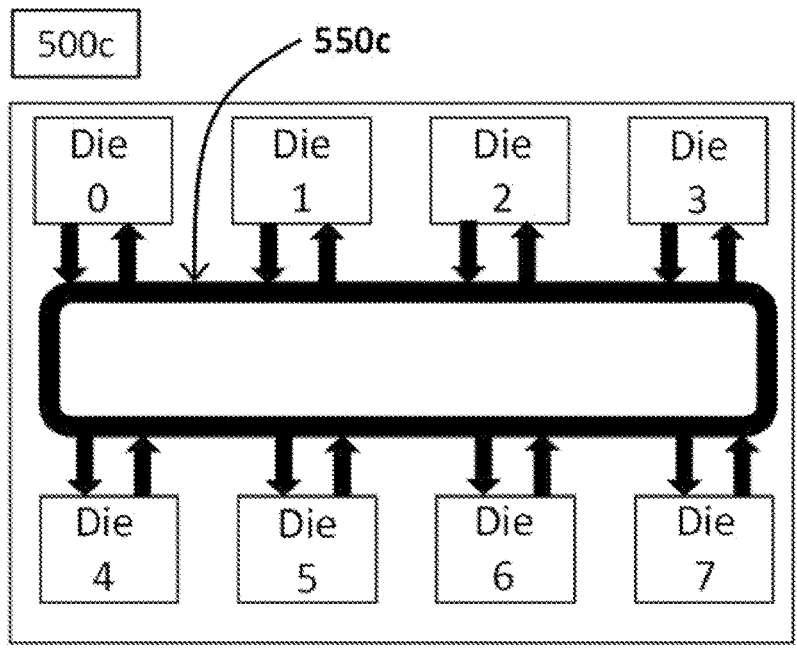
FIG. 5D shows exemplary communications configurations for wireless chip to chip communication.

FIGS. 5A-5C show examples of these 3 types of wireless links that can be used for intra-device configurations. In each case, the dies may be formed on a common base layer, e.g., a packaging layer or carrier.

The MCM 500*a* or simply module 500*a*, illustrated in FIG. 5A, includes WXSR communication which allows for point-to-point links 550*a* between adjacent or immediately neighboring chips. In one example, adjacent or neighboring dies may be separated by 1-4 mm spacing. This type of wireless communication is akin to a bridge connection, e.g., an EMIB.

The MCM 500*b*, illustrated in FIG. 5B, includes WSR communication. As shown, the WSR communication links 550*b* includes point-to-point links like WXSR communication, but also includes diagonal links amongst the kitty-corner dies, and thus provides or enables multipoint-tomultipoint links. For example, die 0 can now directly have wireless links with die in addition to links die 1 and 4. By contrast, in the module 500*a* implementing WXSR communication, die 0 only has direct wireless links with die 1 and die 4. The configurable diagonal link adds a degree of design flexibility over current wired interconnects because it enables a direct link amongst kitty-corner dies without having to hop-switch-hop across dies.

The MCM 500*c*, illustrated in FIG. 5C, portrays WC2C communication using WLR. As shown, the WLR communication 550*c* can enable mesh-type wireless communication amongst several dies. As in WSR, the communication amongst dies is a direct link. That is, data communication can be accomplished without having to hop-switch-hop over many dies. WLR can also enable broadcasting to many or all the dies (e.g., dies 0-7 in 500*c*) on a mesh. In each of the cases, e.g., modules 500*a*, 500*b*, and 500*c* the WC2C may be capable of full duplex communication.

FIG. 5D shows non-limiting exemplary communications configurations for wireless chip to chip communication, including eXtra Short Range configured for point-to-point communication; short range, configured for multipoint-to-multipoint communication; and long range, configured for multipoint-to-multipoint communication.

Using, WC2C communication can be done for in-package links and may similarly be used for or applied to package-to-package wireless communications.

While the examples of WXSR, WSR, and the WLR communication in FIG. 5 are shown implemented in a planar or 2D environment, such types or similar types of communication may also be extended vertically. The wireless links, e.g., point-to-point, broadcast, etc. may also be implemented to allow one component (e.g. chiplet) to communicate with another chiplet disposed on another different elevation. Said differently, wireless communication links may allow for communication along the z-direction (vertical).

The modules implementing WC2C communication can include control plane capabilities. That is, to augment the above-mentioned high-speed wireless data links or the data plane, control plane capabilities or functionalities can be included in the modules. Control plane functions implemented using wireless control signaling can establish the wireless data connections described herein. The control plane protocols can be used to establish wireless connections within a module or package and further to define routing paths for the data. For example, industry protocols, including Wi-Fi, I²C, USB, and/or other known protocol are possible.

Figure 6:
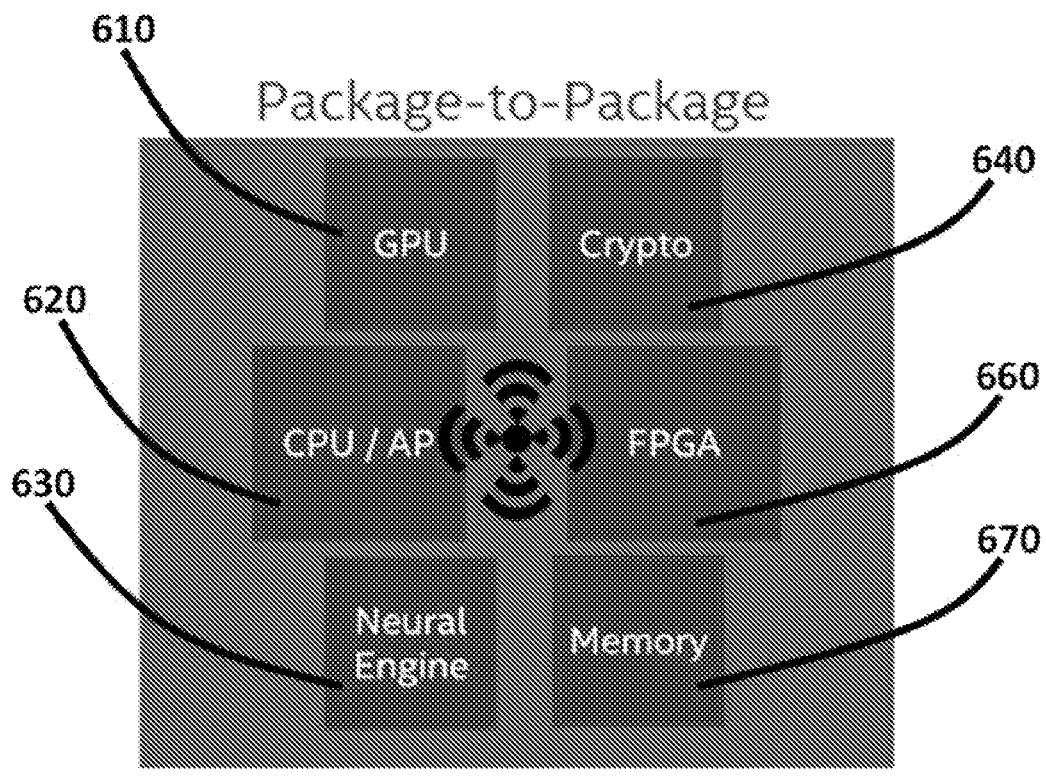
FIG. 6 depicts a multichip device with wireless package-to-package communications.

Control plane messages or control signaling may be in the form of packets to inform other components where to forward data or data messages. In some aspects, the control plane messages of an MCM may be implemented by using frequencies that differ from the data or data plane messages to manage and configure network data or data being transmitted to and from the components of a multichip device. In some cases, the messages may be implemented in a package-to-package type of communication scheme. For example, as described herein, a multichip device may include components that have their own individual packaging. (This is in contrast to an MCM of chiplets which may be packaged together (e.g., the dies of the chiplets share a common package)). In such cases, the multichip device may include wireless package-to-package communications. This is the scenario of FIG. 6, where in the device 600, the several components (GPU 610, CPU 620, Neural Engine 630, Cryptoprocessor 640, Field-programmable gate array (FPGA) 660, Memory device 670) have their own packaging which includes wireless circuitry to implement wireless package-to-package communications.

Figure 7:
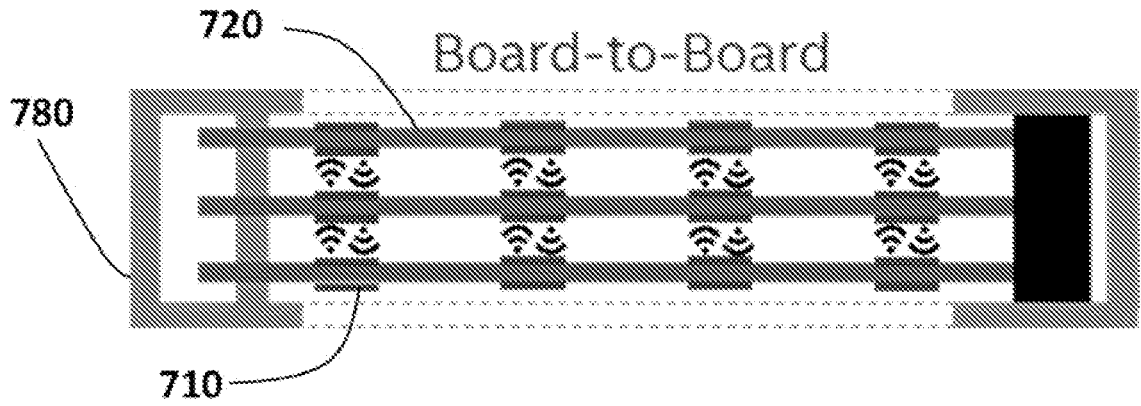
FIG. 7 depicts a control plane being used for facilitating board-to-board communications.
Figure 8:
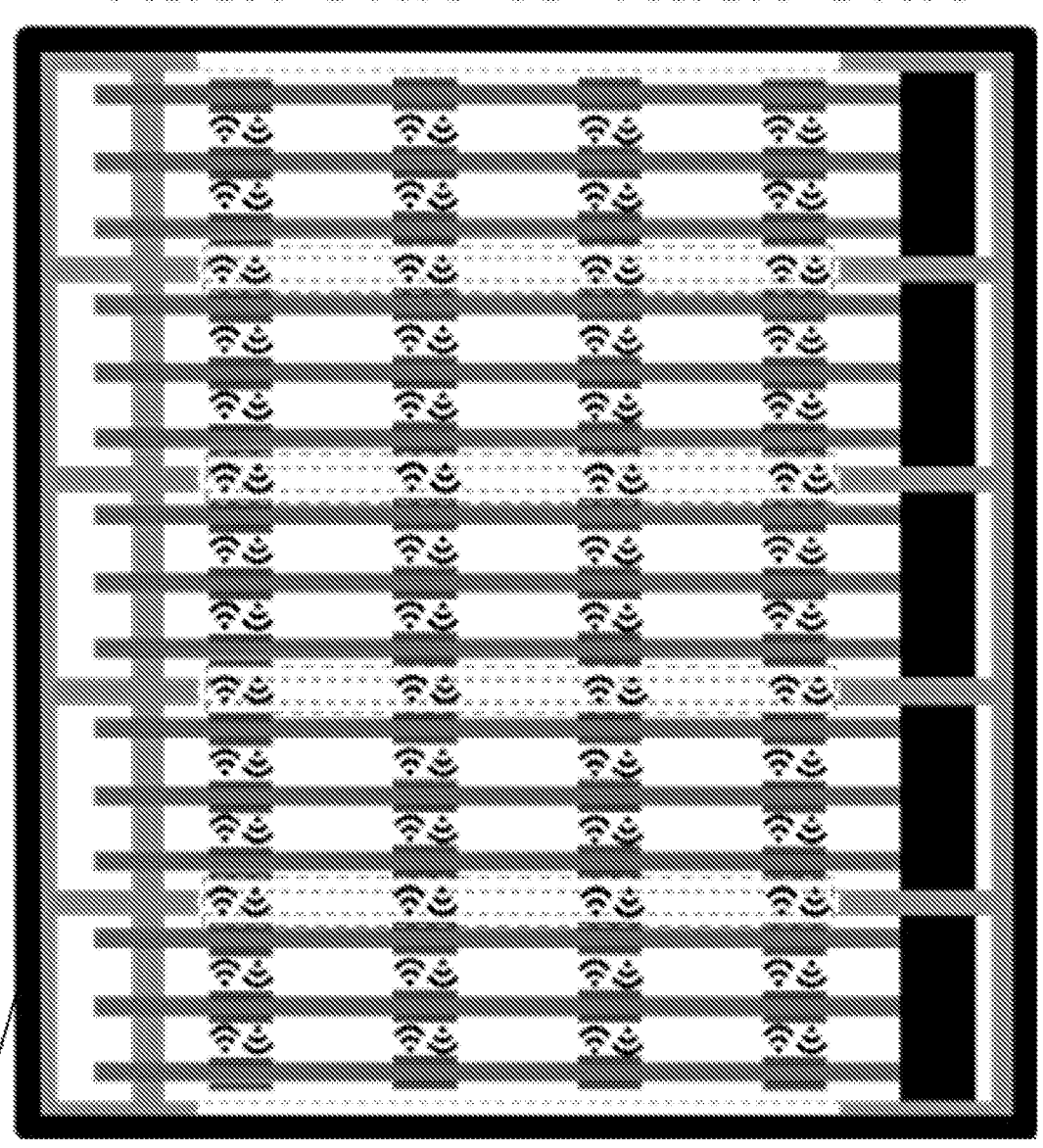
FIG. 8 shows an extension of wireless communication to rack-unit-to-rack-unit communication.

The control plane may manage communication not only for traffic within a multichip package (also denoted as in-package communication), but also may manage the communication between modules or packages e.g., MCMs or packages. This type of communication may be considered as wireless package-to-package communications. Furthermore, the control plane may be used for facilitating board-to-board communications in FIG. 7. That is, the devices or MCMs described herein can be mounted on boards, such as the boards 720, which in turn may be housed in a rack unit, such as the rack unit 780. In board-to-board communication, wireless communication may occur between the mounted devices 710 (e.g., MCMs) of different boards 720. In addition, FIG. 8 shows that wireless communication may be extended to rack-unit-to-rack-unit communication, e.g., within a chassis 810 of the rack 800.

In aspects of the present disclosure, control plane circuitry can be provided in dies of an MCM and configured to provide control plane functions for a wireless communication network involving devices (e.g., MCMs), dies, and packages described herein. The control plane circuitry may operate or use, as an example sub-10 GHz RF carrier technology to enable point-multipoint, broadcastable, full-duplex wireless control/manageability links for various scenarios, e.g., board-board, package-package, and chiplet-to-chiplet within a package, type communications. Control signaling may be in the form of packets reflecting any suitable type of control plane protocol. The control plane circuitry may be integrated in an application-specific manner in a module. Components of the control plane circuitry such as the transceiver circuitry or the antenna structure may be integrated or incorporated with any part of an MCM described herein. Further, aspects or components of the control plane circuitry such as the antenna, connections, or waveguides, may also be included or incorporated into other components holding or involving MCMs, such as boards, chassis, racks, etc.

According to aspects of the present disclosure, sub-10 GHz technology may be used for control signaling. Operation at sub-10 GHz can allow for process portability and easy adoption of the radio frequency (RF) transceiver and may use near-field couplers/antennas. The flexibility of an RF link can allow convenient placement and use within a product chassis, from rack-unit-to-rack-unit, and for 3D heterogeneously integrated semiconductor products. For example, in at least some aspect of the present disclosure, control signaling bit rates may be in the range of 0.5-2 Gbps over distances up to 20 cm, supporting both symmetric and asymmetric topologies. The distance may decrease with increasing frequency, e.g. for a frequency of up to about 100 GHz the distance may be in the range of about 1 cm.

Figure 9:
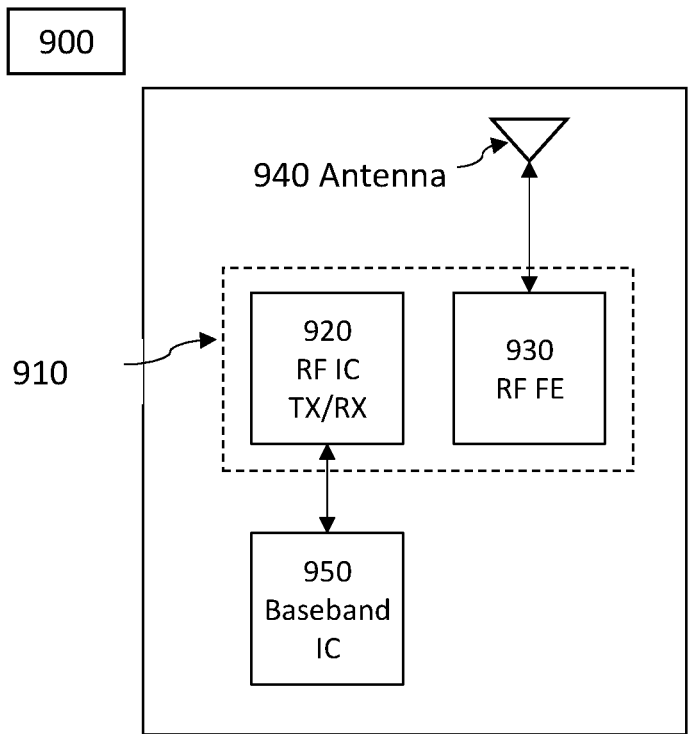
FIG. 9 shows a block diagram showing a wireless circuitry.

For the WC2C communications, both the data plane and control plane require the use of a RF circuitry. FIG. 9 shows a block diagram showing a wireless circuitry 900. The wireless circuitry 900 includes a hardware component, e.g., a baseband integrated circuit 950 for baseband signal processing, a radio circuitry 910 for radio frequency signal processing, and an antenna or antenna structure 940.

The radio circuitry 910 may include an RF integrated circuit (IC) 920 including one or more RF transceivers (TRX) and a common RF front end (FE) 930. The RF IC 920 may receive one or more data and control signals (also denoted as signal of the control plane of the OSI model) and operate to receive a communication signal from the baseband IC and generate an RF electrical signal from the communication signal for radio transmission from the circuitry 900 or receive an RF electrical signal and generate a communication signal from the RF electrical signal for providing to the baseband IC. The RF FE 930 may convert an RF electrical signal into a format for transmission via the antenna 940 and/or convert a signal received from the antenna 940 into an RF electrical signal for the RF IC 920.

Figure 10:
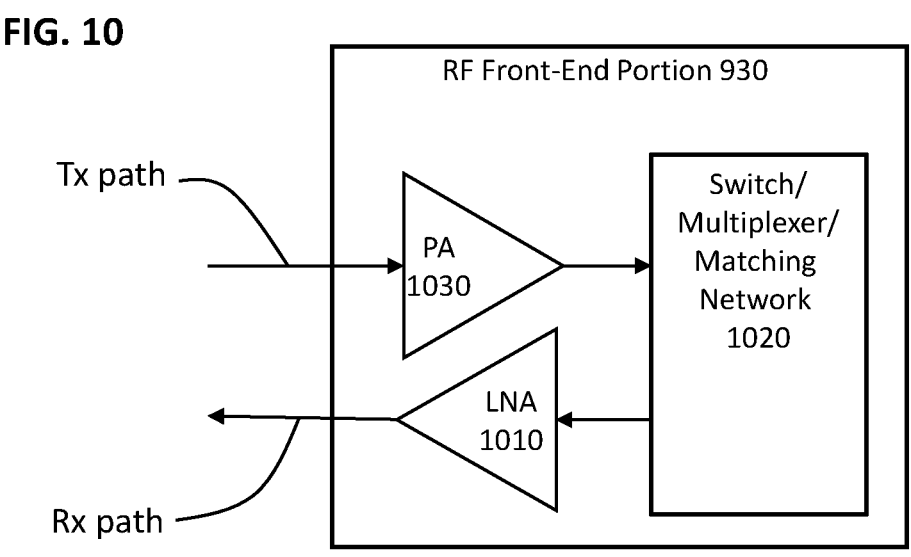
FIG. 10 shows an example of a radiofrequency front end portion that may be implemented in the circuitry.

FIG. 10 shows an example of a RF front end portion 930 that may be implemented in the circuitry 900. A receive signal path (Rx path) of the RF front end 930 of FIG. 10 includes an LNA (low noise amplifier) 1010 for amplifying received RF signals and provides the amplified received RF signals as an output. A transmit signal path (Tx path) of the RF front end 930 of FIG. 10 includes a PA (power amplifier) 1030 for amplifying input RF signals. One or more filters may be included for generating suitable RF signals for transmission and reception. In addition, the RF front-end 930 of FIG. 10 may include other components 1020 or circuitry, such as, for example, a tuner or matching network, switches, multiplexers, and/or other circuitry for coupling the RF front end 930 to an antenna 940 as illustrated in FIG. 9. In addition, other components may be included to support both transmit and receive modes.

The RF FE 930 of at least FIG. 9 can provide signals obtained from the antenna 940 to the RFIC 920. The transceiver chain or RFIC 920 can interface between the RF FE 930 and one or more other components.

Figure 11:
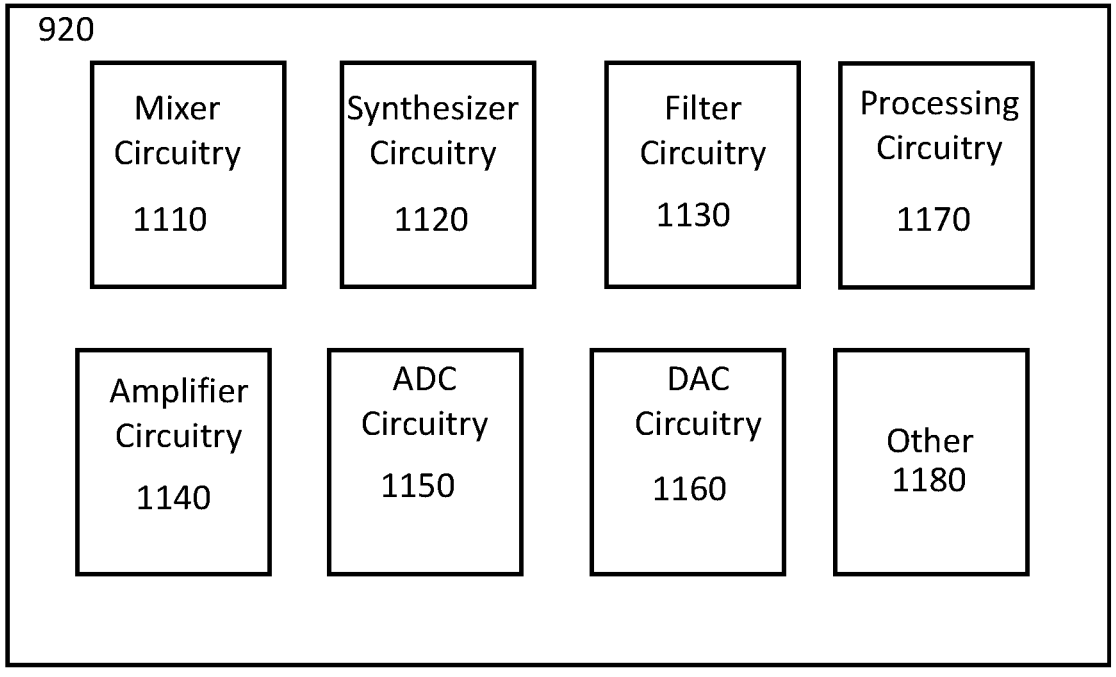
FIG. 11 shows an example of a radiofrequency integrated circuit or transceiver circuitry.

FIG. 11 shows one example of the RFIC or transceiver circuitry 920. As shown, the transceiver chain/RFIC 920 can include components such as a mixer circuitry 1110, synthesizer circuitry 1120 (e.g., local oscillator), filter circuitry 1130 (e.g., baseband filter), amplifier circuitry 1140, analog-to-digital converter (ADC) circuitry 1150, digital-to-analog (DAC) circuitry 1160, processing circuitry 1170, and other suitable digital front end (DFE) components 1180, to name a few. The processing circuitry 1170 may include a processor, such as one or more time-domain and/or frequency domain processor/components in at least one example.

The other components 1180 may include logic components, modulation/demodulation elements, and an interface circuitry for interfacing with another component.

DFE (digital front end) components 1180 may include any suitable number and/or type of components configured to perform functions known to be associated with digital front ends. This may include digital processing circuitry, portions of processing circuitry, one or more portions of an on-board chiplet having dedicated digital front end functionality (e.g., a digital signal processor), etc. The DFE components 1180 may selectively perform specific functions based upon the operating mode of the radio circuitry 910 and, for example, may facilitate beamforming. Digital front end components may also include other components associated with data transmission such as, for instance, transmitter impairment correction such as LO correction, DC offset correction, IQ imbalance correction, and ADC skew, digital pre-distortion (DPD) calculation, correction factor (CF) calculation, and pre-emphasis (pre. emp.) calculation. To provide additional examples, the digital front end components 1180 may facilitate or perform receiver or transmitter digital gain control (DGC), up-sampling, down-sampling, zero crossing detection algorithms, phase modulation, perform beam management, digital blocker cancellation, received signal strength indicator (RSSI) measurements, DPD and calibration accelerators, test signal generation, etc.

In at least one example, the transceiver chain (of the RF IC 920) can include a receive signal path which may include mixer circuitry 1110, amplifier circuitry 1140 and filter circuitry 1130. In some aspects, the transmit signal path of the transceiver chain 920 may include filter circuitry 1130 and mixer circuitry 1110. The transceiver chain 920 may also include synthesizer circuitry 1120 for synthesizing a frequency signal for use by the mixer circuitry 1110 of the receive signal path and the transmit signal path. In some aspects, the mixer circuitry 1110 of the receive signal path may be configured to down-convert RF signals received from the RF FE 930 based on the synthesized frequency provided by synthesizer circuitry 1120.

In some aspects, the output baseband signals and the input baseband signals may be digital baseband signals. In such aspects, the radio circuitry 910 may include analog-to-digital converter (ADC) 1150 and digital-to-analog converter (DAC) circuitry 1160.

In at least one example, the transceiver chain 920 may also include a transmit signal path (Tx path) which may include circuitry to up-convert baseband signals provided by e.g., a modem and provide RF output signals to the RF FE 930 for transmission. In some aspects, the receive signal path may include mixer circuitry 1110, amplifier circuitry 1140 and filter circuitry 1130. In some aspects, the transmit signal path of the RFIC 920 may include filter circuitry 1130 and mixer circuitry 1110. The RFIC 920 may include synthesizer circuitry 1120 for synthesizing a frequency signal for use by the mixer circuitry 1110 of the receive signal path and the transmit signal path. The mixer circuitry 1110 of the receive signal path may be configured to down-convert RF signals received from the RF FE 930 based on the synthesized frequency provided by synthesizer circuitry 1120.

In various aspects, amplifier circuitry 1140 may be configured to amplify the down-converted signals and filter circuitry may be a low-pass filter (LPF) or band-pass filter (BPF) configured to remove unwanted signals from the down-converted signals to generate output baseband signals. Output baseband signals may be provided to another component for further processing. In some aspects, the output baseband signals may be zero-frequency baseband signals, although this is not a requirement.

The mixer circuitry 1110 for a receive signal path may include passive mixers, although the scope of this disclosure is not limited in this respect. In some aspects, the mixer circuitry 1110 for a transmit signal path may be configured to up-convert input baseband signals based on the synthesized frequency provided by the synthesizer circuitry 1120 to generate RF output signals for the RF FE 930.

In some aspects, the mixer circuitry 1110 of the receive signal path and the mixer circuitry 1110 of the transmit signal path may include two or more mixers and may be arranged for quadrature downconversion and upconversion, respectively. In some aspects, the mixer circuitry 1110 of the receive signal path and the mixer circuitry 1110 of the transmit signal path may include two or more mixers and may be arranged for image rejection (e.g., Hartley image rejection). In some aspects, the mixer circuitry 1110 of the receive signal path and the mixer circuitry 1110 may be arranged for direct downconversion and direct upconversion, respectively. In some aspects, the mixer circuitry 1110 of the receive signal path and the mixer circuitry 1110 of the transmit signal path may be configured for super-heterodyne operation.

In some aspects, the synthesizer circuitry 1120 may be a fractional-N synthesizer or a fractional N/N+1 synthesizer, although the scope of the aspects is not limited in this respect as other types of frequency synthesizers may be suitable. For example, synthesizer circuitry 1120 may be a delta-sigma synthesizer, a frequency multiplier, or a synthesizer including a phase-locked loop with a frequency divider.

The synthesizer circuitry 1120 may be configured to synthesize an output frequency for use by the mixer circuitry 1110 of the radio circuitry 1120 based on a frequency input and a divider control input. In some aspects, the synthesizer circuitry 1120 may be a fractional N/N+1 synthesizer.

In some aspects, frequency input may be provided by a voltage controlled oscillator (VCO), although that is not a requirement. In various cases, divider control input may be provided by a processing component of the RFIC 920, or may be provided by any suitable component. In some aspects, a divider control input (e.g., N) may be determined from a look-up table based on a channel indicated by external component.

In some aspects, synthesizer circuitry 1120 of the RFIC 920 may include a divider, a delay-locked loop (DLL), a multiplexer and a phase accumulator. In some aspects, the divider may be a dual modulus divider (DMD), and the phase accumulator may be a digital phase accumulator (DPA). In some aspects, the DMD may be configured to divide the input signal by either N or N+1 (e.g., based on a carry out) to provide a fractional division ratio. In some aspects, the DLL may include a set of cascaded, tunable, delay elements, a phase detector, a charge pump and a D-type flip-flop. The delay elements may be configured to break a VCO period up into No equal packets of phase, where Nd is the number of delay elements in the delay line. In this way, the DLL provides negative feedback to help ensure that the total delay through the delay line is one VCO cycle.

In some aspects, synthesizer circuitry 1120 may be configured to generate a carrier frequency as the output frequency, while in other aspects, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some aspects, the output frequency may be a LO frequency (fLO). In some aspects, the RFIC 920 may include an IQ/polar converter.

Figure 12:
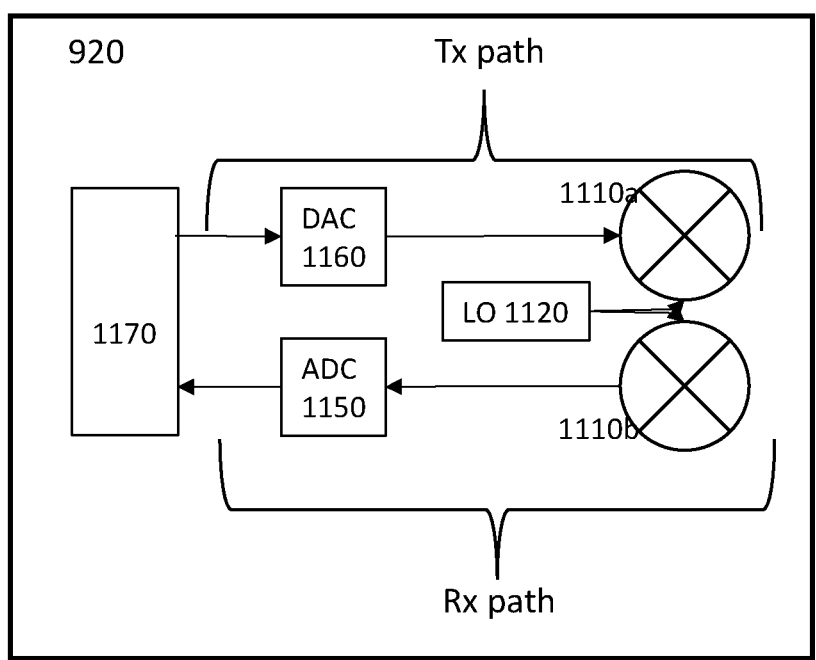
FIG. 12 shows an example of a transceiver chain.

FIG. 12 shows one example of a transceiver chain/RFIC 920 that may be implemented. The receive signal path (Rx path) circuitry down-converts RF signals received from the RF FE 930 and provides baseband signals. Specifically, the receive signal path may include a mixer 1110b and an ADC 1150. The transmit signal path (Tx path) circuitry up-converts provided baseband signals and provides RF output signals to the RF front end 930 for transmission. Specifically, the transmit signal path may include a DAC 1160 and a mixer 1110a. The transceiver chain shown in FIG. 12 includes a synthesizer circuit, specifically, at least one local oscillator (LO) 1120 to generate reference signals for the mixers 1110a and 1110b.

The antenna 940, illustrated in FIG. 9, may include a single antenna for transmission and reception. In other cases, the antenna or antenna structure 940 may include multiple transmit antennas in the form of a transmit antenna array and multiple receive antennas in the form of a receive antenna array.

In other cases, the antenna 940 may be one or more antennas to be used as transmit and receive antennas. In such cases, the RF FE 930 may include, for example, a duplexer, to separate transmitted signals from received signals.

While the transceivers described herein include traditional super-heterodyning schemes or architectures, other type of transceiver or transmitter architectures and schemes may be used. In some aspects, the transceiver chain of the RFIC 920 may include components so as to implement a near zero IF scheme, a Direct Conversion scheme, or a digital transmission schemes, such as, for example, a Digital IQ transmission, a Digital Polar transmission, and the like.

In one example, the transceiver chain of the RFIC 920 may include a transmit path that includes or implements a direct digital transmitter (DDT). That is, in one simple example, a DDT may include a digital signal processor, a RF digital-to-analog converter (RFDAC), a PA, and a RF filter/antenna coupler. Referring back to FIG. 12, in cases where the DAC 1160 is a direct RF DAC that produces RF output directly from digital input, the mixer 1110a can be omitted from the transmit path.

For example, a DDT may be implemented with or without an IQ-mixer. In general, a RF-DAC may be included on a RFIC to convert digital input into a RF signal. A DDT may include other digital components such as numerically controlled oscillator (NCO) and digital mixers for shifting an input signal to desired frequency. The use of a DDT can reduce the number of analog components needed in the transmitter or transmit path. For example, analog LOs, analog filters, analog mixers, and etc., may be eliminated from the RFIC when a direct digital transmitter (DDT) is employed. Further, the use of a digital transmitter or digital transmission schemes such may bring energy savings and efficiencies.

For example, FIG. 12B shows another example of a transceiver chain that may be implemented. The receive signal path (Rx path) circuitry down-converts RF signals received from the RF FE 930 and provides baseband signals. Specifically, the receive signal path may include a mixer 1110b and an ADC 1150. The transmit signal path (Tx path) circuitry up-converts provided baseband signals and provides RF output signals to the RF front end 930 for transmission. Specifically, the transmit signal path may include a DAC 1160 and a mixer 1110a. The transceiver chain shown in FIG. 12 includes a synthesizer circuit, specifically, at least one local oscillator (LO) 1120 to generate reference signals for the mixers 1110a and 1110b.

DP #13

Many efforts at heterogeneous chip integration have relied upon silicon interposers and/or embedded multi-die interconnect bridges (EMIB) for communication between chiplets. Such interposers and EMIB s may carry significant drawbacks, however, at least in terms of manufacturing difficulty and cost. Such challenges grow more significant in the presence of an increased number of chips in a multichip package and/or a three-dimensional chip arrangement. To overcome these difficulties, it is desired to implement a wireless communication process between chiplets, thereby permitting wireless communication (e.g. communication from one chiplet to another, communication from one chiplet to multiple chiplets, and/or broadcast communication) in the context of an MCM.

Previous attempts at wireless communication in an MCM have encountered significant difficulties. Chiefly among them is the problem that the angular coverage, distance range, and efficient wide-frequency operation tend to be quite limited, at least due to a hostile in-package/silicon channel environment and a low-profile form factor requirement for their antennas. For example, wireless interconnects, (e.g. microbump antennas) often utilize horizontally-polarized antennas due to the short-and-wide form factor of the chiplets. However, the horizontally-polarized antennas may experience a limited communication range when a top layer of a package is dominated by a metallic pattern due to the radiating current cancellation from image currents. When dummy-fill patterns between silicon oxide layers are considered, the impedance bandwidth and radiation performance of the horizontally-polarized antennas can be further limited.

Figure 13:
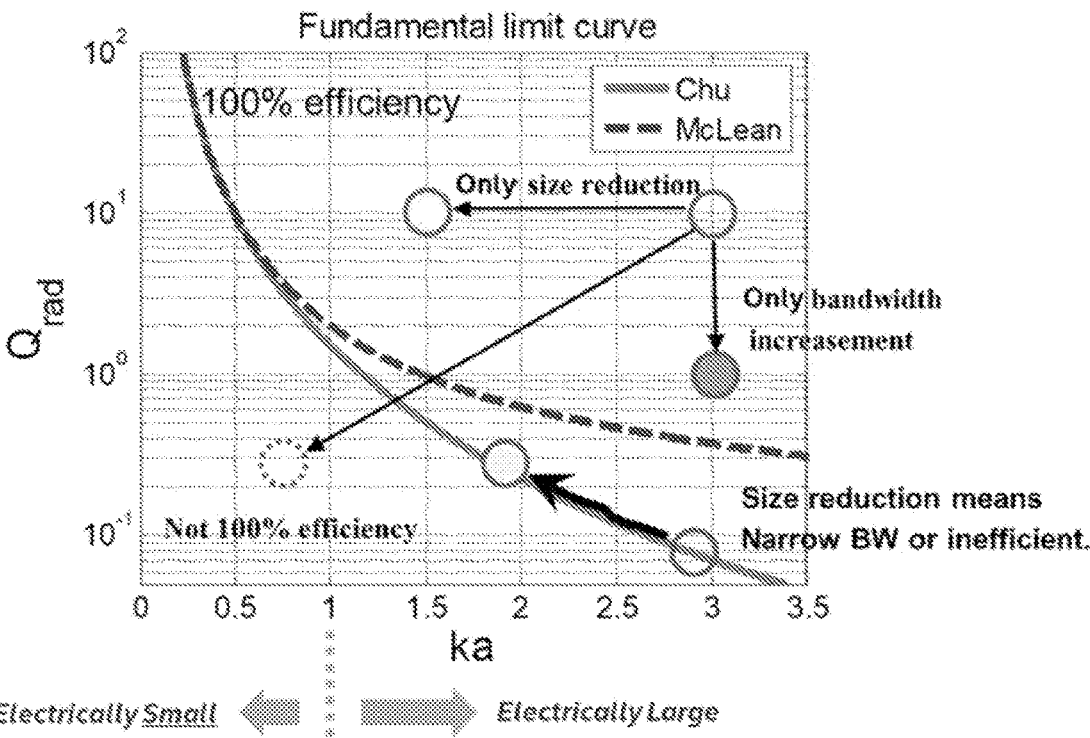
FIG. 13 shows an illustration of a fundamental limit theory of antenna size and performance based on radiation quality factor ($Q_{rad}$) compared to scaled electrical size (ka), assuming 100% (or 0 dB) radiation efficiency.
Figure 13:

In light of this, it may be advantageous to utilize vertically-polarized microbump antennas; however, it can be extremely challenging to obtain broadband and efficient antenna performance due to the microbump height limitation (e.g. microbump height is generally less than 100 μm). FIG. 13 shows an illustration of a fundamental limit theory of antenna size and performance based on radiation quality factor (radiation Q or $Q_{rad}$) compared to a scaled electrical size (ka), where k is the wave number ($2\pi$/wavelength) and a is a radius of the sphere just enclosing the antenna structure. Otherwise stated, FIG. 13 depicts an estimated radiation Q of a specific antenna for given size of the antenna. Thus, the estimated radiation Q is plotted as a single point. The radiation Q may be, for example, related to 3-dB bandwidth. Thus, ka may be understood as $2*\pi*$ (electrical size of the antenna), or $2*\pi*$(a/wavelength), which may be understood as a scaled electrical size of the antenna. Element ka thus becomes a common input variable for the spherical-wave functions describing the antenna radiation performance, which is one of the foundational formulas for defining the limit theory. In addition, as depicted at the bottom of FIG. 13 with respect to the '1' along the x-axis, "ka=1" is a useful criterion for determining whether an antenna is electrically small or large.

Figure 14:
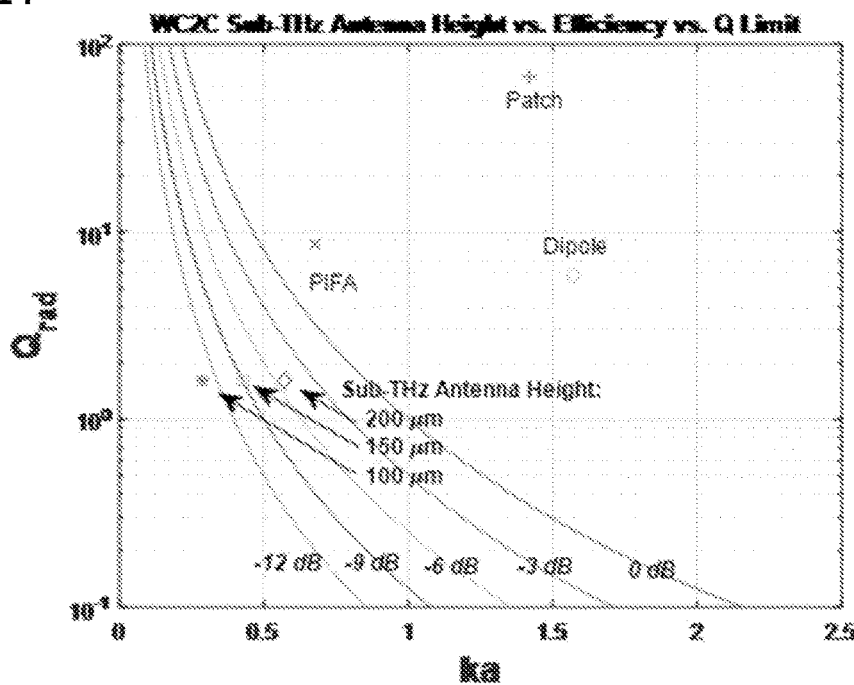
FIG. 14 shows radiation quality factor and electrical size of a first antenna at 200 μm, a second antenna at 150 μm, and a third antenna at 100 μm for various radiation efficiency assumptions.

FIG. 14 shows radiation Q and scaled electrical size of a first antenna at 200 μm, a second antenna at 150 μm, and a third antenna at 100 μm for various radiation efficiency criteria (0,–3,–6,–9, –12 dB), e.g. limit curves. These limit curves are depicted as solid lines or dotted curves. Normally, the radiation Q of specific antenna should be higher than the radiation Q limit curve. If not, the antenna radiation efficiency should be lower than the originally assumed radiation efficiency. According to these figures, decreased size should be directly associated with at least either decreased bandwidth or decreased efficiency. Nevertheless, decreased size of a microbump antenna in a multichip context may be a foregone conclusion, and therefore it is necessary to develop strategies and implementations to create an antenna small enough to be formed in and/or between layers of a chiplet while achieving improved bandwidth and/or efficiency with respect to the theoretical limits of FIG. 13. As illustrated in FIG. 14, a radiation efficiency of 100-μm vertically-polarized microbump antennas with an operational bandwidth of 110-170 GHz would be lower than –12 dB. Given that the height of the microbumps is typically smaller than 100 μm, the wireless link performance between vertically-polarized microbump antennas would be extremely poor, and practical wireless communication range would be significantly limited (<<1 mm).

According to an aspect of the disclosure, the theoretical challenges depicted in 1302 can be largely or fully overcome using wideband, low-profile "slot" antennas. Such antennas may be vertically-polarized, broadband microbump antennas (3 SKUs), which may enable point-to-point and point-to-multipoint wireless communications. They may leverage use of solderbumps/microbumps (e.g. C4 bumps) and/or guided-wave phenomena, such as between the integrated heat spreader (IHS) and the package ground plane, to yield extremely low-profile antennas with acceptable efficiency and/or broadband capabilities for transmission and/or reception in a multichip package context.

According to an aspect of the disclosure, the microbump antennas as described herein may at least overcome narrow bandwidth and poor link performance issues of conventional wireless interconnect antennas; improve upon the excessive complexity and the topological limitations of wired interconnect solutions; allow for flexible floor planning of 3D integrated products to alleviate thermal/mechanical constraints; reduce time-to-market; and reduce cost and latency.

Figure 15:
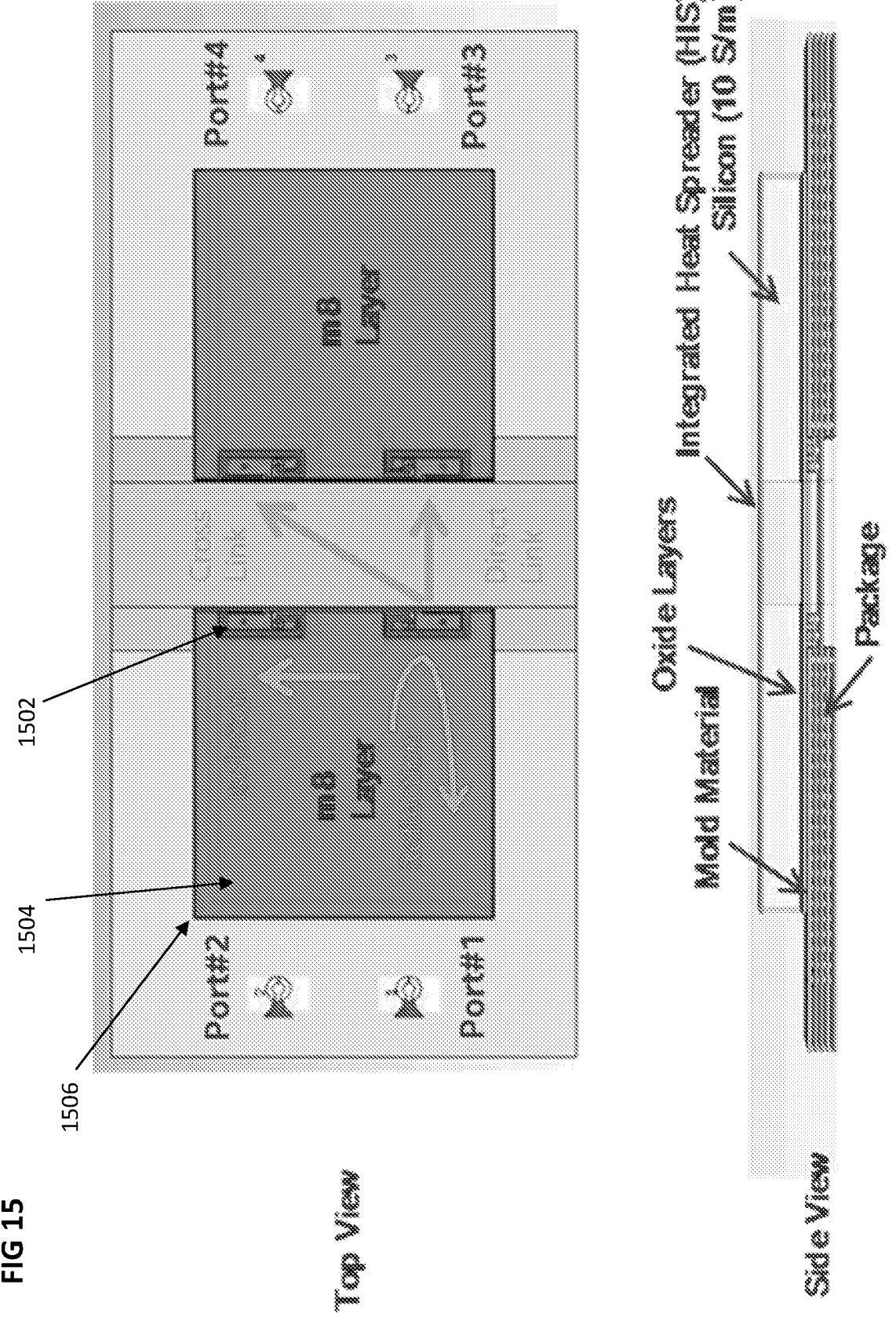
FIG. 15 depicts an exemplary 2×2 multiple-input-multiple-output (MIMO) antenna configuration, according to an aspect of the disclosure.

FIG. 15 depicts an exemplary 2×2 MIMO antenna configuration, according to an aspect of the disclosure. One or more wideband, microbump antennas as described herein (one such antenna is labelled as 1502) may be located at the edge of a silicon substrate 1504. According to an aspect of the disclosure, the substrate may have a conductivity of approximately 10 S/m. The substrate may include multiple layers, such as, for example, 9 oxide and 8 metal layers. It is assumed that each metal layer has a high metal density with microscopic patterns, and lends itself to modeling as a solid metal ground plane. A square metal seal ring 1506 may be present on an outer perimeter of the silicon substrate. An integrated heat spreader (pictured only in side view) may be placed on the silicon dies. These chips may be connected to one or more other chips, such as via a flip chip ball grid array (fcBGA) package through microbumps. As disclosed herein, one or more of these microbumps may function as a wideband antenna in conjunction with a coupling structure as will be described in greater detail herein. According to an aspect of the disclosure, these one or more microbump antennas may be located on a bottommost metal layer, such as on the $8^{th}$ metal layer (m8 layer, the bottom metal layer in a chip with 8 metal layers). The package antenna feed may include or consist of package probes. For the purpose of this description, the separation distance between the 2×1 antenna arrays is assumed to be 1 mm; however, the separation distance may be greater or less than 1 mm in a given implementation. For example, the microbump antennas disclosed herein may perform sufficiently well for chip-to-chip transmissions at distances of <1 mm, <10 mm, <20 mm, or more. Although a 2-D geometry is depicted herein for simplicity, the microbump antennas disclosed herein may operate in a 3-D MCM context (e.g. when chips are stacked on one another). For example, for 3-D chip-to-chip transmissions, each silicon substrate may include MIMO antennas to enable 3-D heterogeneous chiplet integration.

Figure 16:
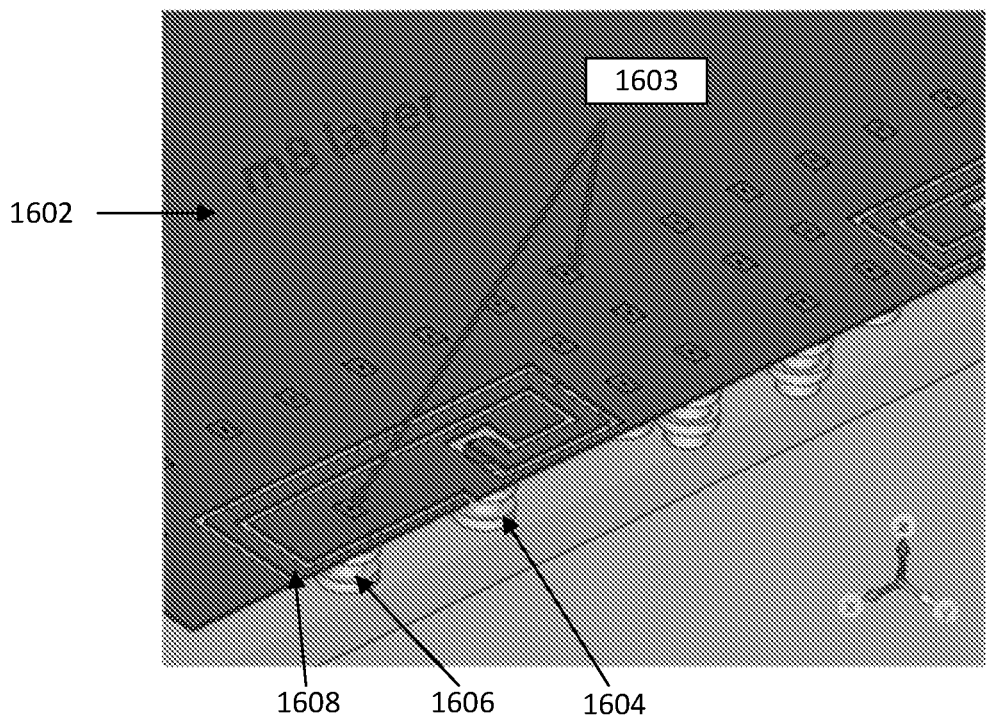
FIG. 16 depicts a detailed geometry of a wideband microbump antenna SKU #1 according to an aspect of the disclosure.

FIG. 16 depicts a detailed geometry of a wideband microbump antenna according to an aspect of the disclosure. In this figure, a plurality of first vias with their corresponding pads 1603 are depicted between the m7 and m8 1602 layers. The m8 layer 1602 is depicted as being connected to an adjacent layer at least by a plurality of terminals or vias (two of the plurality of such terminals or vias are labeled as 1604 and 1606). The metal layer (in this example, the m8 layer) may include a cutout, which forms a coupling element 1608. The relevant functions of the parts will be discussed with respect to FIG. 17. A plurality of package vias 1604 and 1606 are as layer m7-layer m8 vias along with corresponding microbump. The package vias 1604 and 1606 along with corresponding microbumps and package connections create vertically-polarized microbump antennas as described herein.

Figure 17:
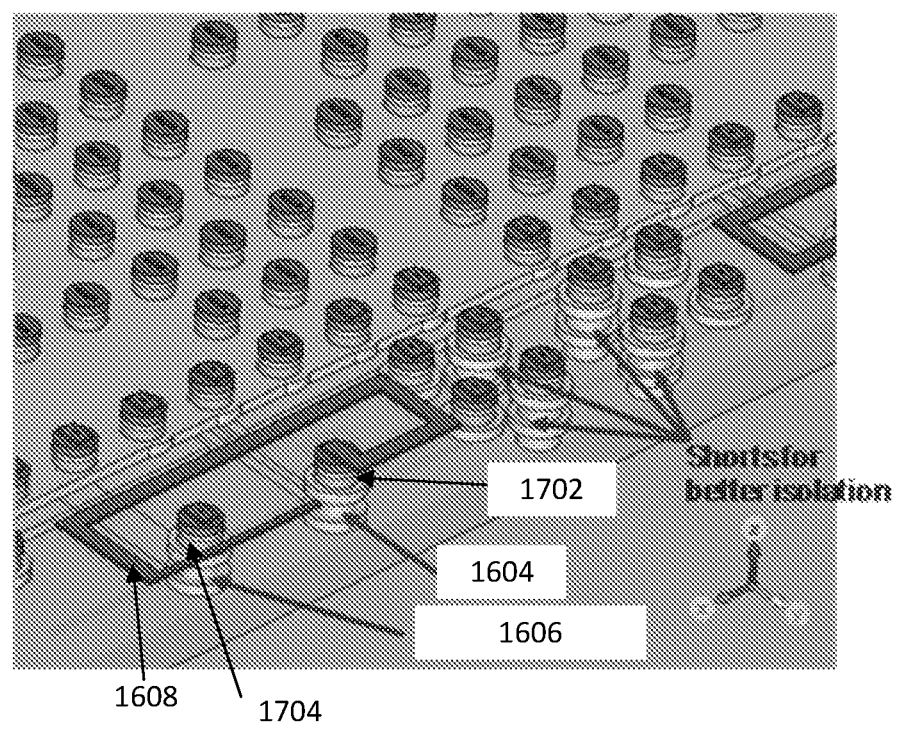
FIG. 17 depicts a first terminal, configured as a feed for a microbump antenna.

In FIG. 17, a first terminal 1604 may be configured as a feed for a microbump antenna. The microbump 1702 may be mounted on and electrically conductively connected to the feed terminal 1604. The coupling element 1608 may be mounted on and electrically conductively connected to the feed microbump 1702. In this example, the coupling element 1608 is depicted as having a rectangular shape, although the coupling element may have a curved, rounded, squared, rectangular, or other shape that may result in the proper inductance and/or capacitance as will be described herein. The coupling element 1608 may be configured to capacitively couple with the driven antenna 1704 (e.g. a radiating microbump), which may be mounted on a terminal or via 1704. The driven antenna 1704 (antenna microbump) and surrounding microbumps may be connected to the package ground layer and also to an m7 ground layer though the vias between m7 and m8 (e.g., 1608 or 1704). In particular, the driven antenna may be connected to the package ground layer with a transmission line, which may be different from SKU #2, as will be described below.

The feed microbump 1702 may be connected to a curved transmission-line structure on m8 and not connected to the m7 ground layer, the m8 ground layer, or the package ground layer. In this example, the pitch of the microbumps (including the feed microbump and the driven antenna microbump was 110.3 μm; however, other pitches may be utilized depending on the implementation). Wideband impedance matching for the microbump antenna 1704 may be performed as a result of (1) a width ratio between the transmission line of the feed and the extra transmission line of the driven antenna, (2) a separation distance between feed and driven antenna microbumps, and (3) a coupling from the curved transmission line of feed microbump to the driven antenna microbump. According to one aspect of the disclosure, the necessary parameters for impedance matching may be determined through various global-search optimization techniques, including, but not limited to, genetic algorithm, particle swarm, CMA Evolution Strategy. Relatedly, cost functions may be written for joint optimization of impedance bandwidth, radiation efficiency, and/or link response. Given the information presented herein, the skilled person will understand how to alter these above factors to achieve the desired impedance matching.

The microbumps surrounding feed and driven antenna microbumps (e.g. the microbumps below the coupling element 1608 as pictured in FIG. 17, the microbumps to the left and to the right of the coupling element 1608 as pictured in FIG. 17) may be electrically shorted. These shorted microbumps may define a radiating aperture for the driven antenna 1704, which may be, as depicted herein, a U-shaped aperture.

Figure 18:
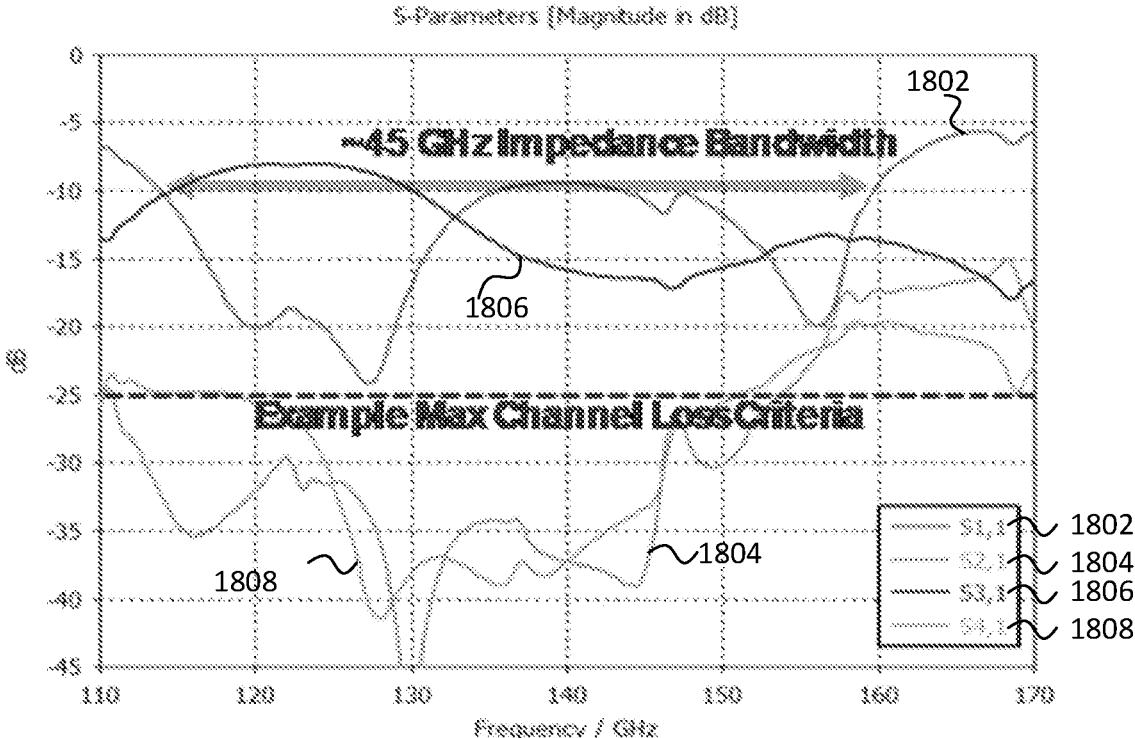
FIG. 18 shows simulated S-parameter results.

FIG. 18 shows simulated S-parameter results ($S_{11}$: Reflection 1802, $S_{21}$: Isolation 1804, $S_{31}$: Direct link 1806, and $S_{41}$:Cross link 1808) for the 2×2 MIMO wideband antenna array configuration with a 1-mm antenna separation distance and Port #1 excitation, as depicted herein. As can be seen in this figure, the impedance bandwidth may be ~45 GHz with a 10-dB return loss criterion. Considering an example maximum channel loss criterion of 25 dB, the transmission bandwidth for the direct link may exceed 60 GHz (110-170 GHz) with a significant dB margin. Isolation between adjacent element antennas on the same silicon substrate may exceed 15 dB. The cross link level may be less than ~20 dB.

Figure 19:
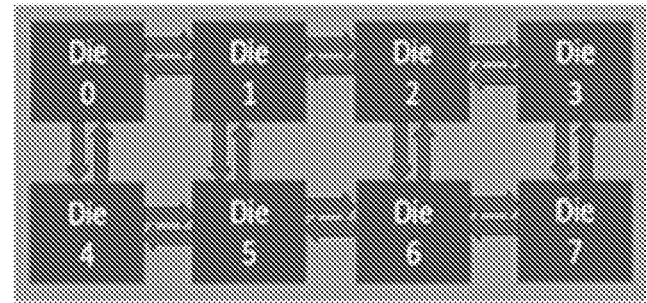
FIG. 19 depicts a wireless interconnect topology.

In light of this, a wideband microbump antenna (SKU #1) may allow for point-to-point extra-short-range wireless interconnect network topologies, such as configurations with multiple dies, to maximize aggregated throughputs. Such a wireless interconnect topology is depicted in FIG. 19. In this figure, eight dies or chiplets, numbered 0-7, are depicted in a configuration according to an aspect of the disclosure. Each die is connected to two or more other dies via a set of bidirectional arrows. These bidirectional arrows indicate transmission capabilities between dies. That is, corner die 0 may be configured to transmit to, and/or receive from, adjacent dies 1 and 4. Some dies (e.g. interior dies 1, 2, 5, and 6 as depicted herein) may be configured to transmit to and/or receive from at least three other dies. For example, Die 1 may be configured to transmit to and/or receive from adjacent dies 0, 2, and 5. The one or more dies/chiplets may be configured to transmit to and/or receive from non-adjacent dies/chiplets by transmitting to and/or receiving from one or more adjacent dies, thereby forming a transmission chain and/or reception chain among multiple dies/chiplets. Although the dies/chiplets within FIG. 19 are depicted herein two dimensionally, the dies/chiplets may also be configured three dimensionally, wherein a plurality of dies are stacked on one another. In this way, the dies may be configured not only to transmit to/receive from dies located adjacently with the same x-y-plane, but also to/from dies located adjacently along a z-dimension, wherein the x-y plane is represented by the plane depicted in FIG. 19, and wherein the z-axis is an axis perpendicular to the plane depicted in FIG. 19.

According to an aspect of the disclosure, the one or more antennas may include a package feed. The antenna may receive a feed (e.g. electrical signals for wireless transmission) from one or more transceiver circuits on the silicon. In this manner, the overall antenna structure may be flipped, (e.g. upside down), and the curved transmission line may be located on the top layer of the package.

Figure 20:
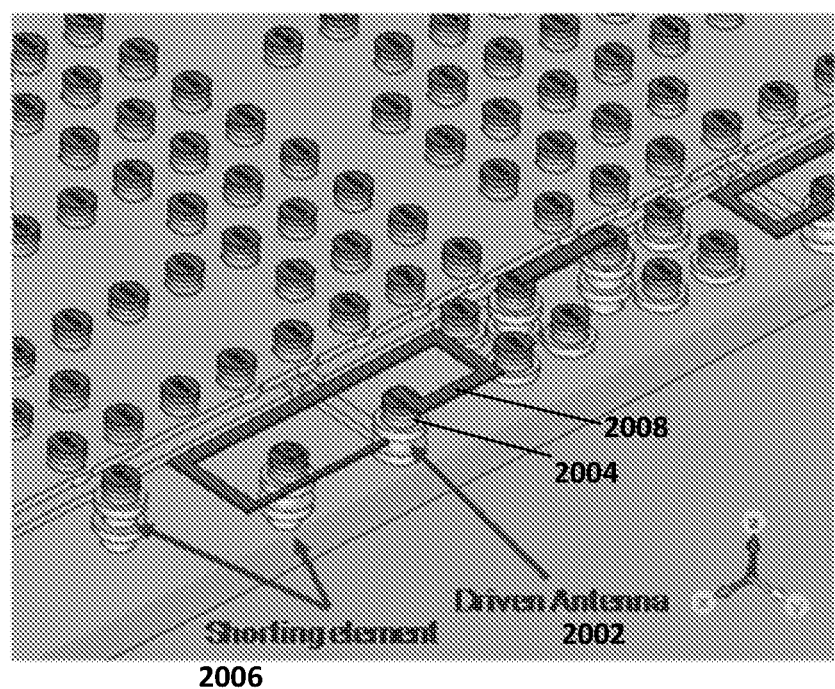
FIG. 20 depicts an antenna configuration (SKU #2) according to an aspect of the disclosure.

According to another aspect of the disclosure, (e.g., SKU #2), it is possible to utilize an alternative configuration to result in changed radiation behavior with a different package design. FIG. 20 depicts an antenna configuration according to an aspect of the disclosure. In this figure, a driven antenna 2002 includes a solder microbump 2004, which may be a primary radiating element of the driven antenna 2002. This may also include one or more shorting elements 2006, such as for impedance matching purposes, as will be described in greater detail herein. The driven antenna 2002 is electrically connected to a top-loading element 2008 and it may be surrounded by the one or more electrically-shorted elements 2006. The top-loading element 2008 may be a curved, rounded, squared, rectangular, or otherwise shaped structure, which may result from one or more cuts within a metal layer, such as the m8 layer.

Figure 21:
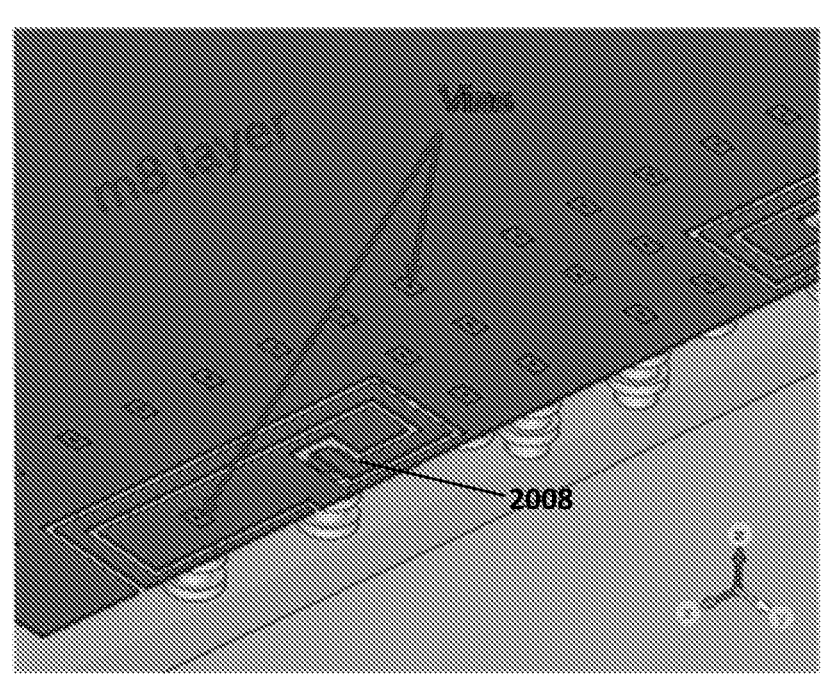
FIG. 21 depicts the m8 layer relative to the antenna configuration.

FIG. 21 depicts the m8 layer relative to the antenna configuration. As shown here, the coupling element 2008 is cut from the m8 layer. The top of the driven antenna microbump may be connected to the coupling element 2008 (e.g., the curved transmission line pattern on m8). According to an aspect of the disclosure, the m8 metal pattern may function as a top-loading structure. Other surrounding microbumps may be electrically shorted, such as to both the silicon substrate ground plane and to the package ground plane. This electrical shorting may form a radiation aperture, which may further direct a primary emission of a radiofrequency transmission. The top-loaded, driven microbump (e.g. 2004 in FIG. 21) may excite the radiation aperture.

Figure 22:
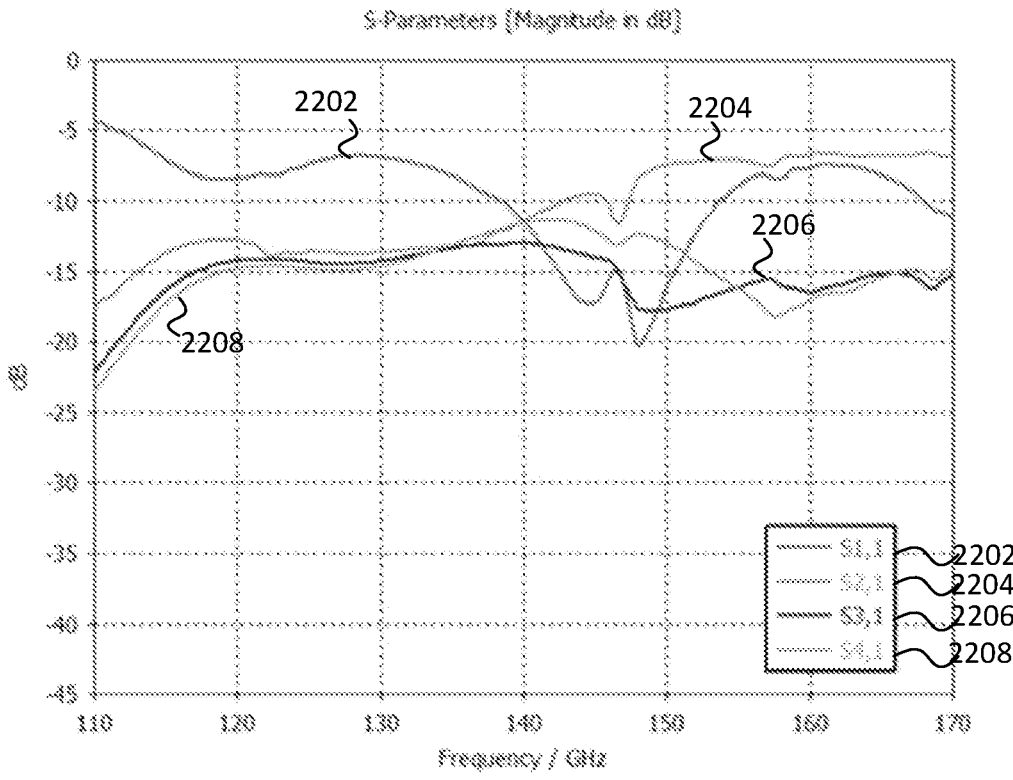
FIG. 22 depicts simulated S-parameter results.
Figure 23:
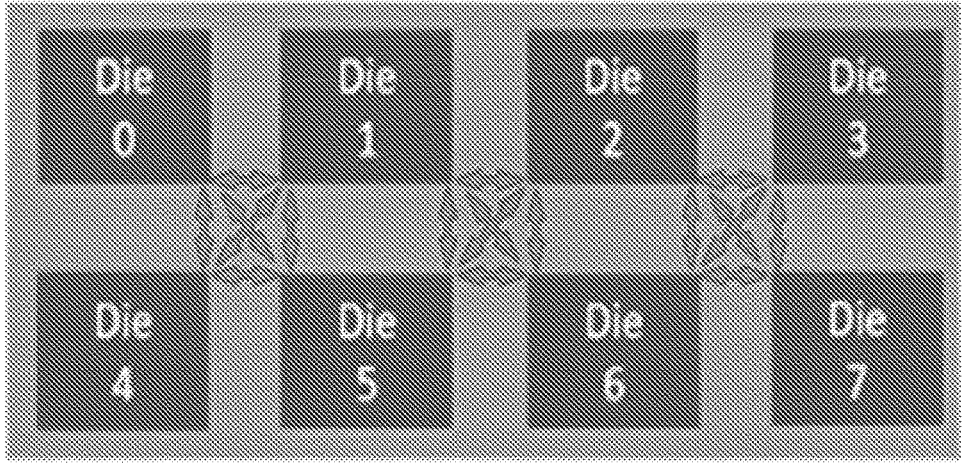
FIG. 23 depicts a chip topology.

FIG. 22 depicts simulated S-parameter results for the antenna configuration depicted in FIGS. 20 and 21, according to an aspect of the disclosure. In this figure, $S_{11}$: Reflection is shown as 2202, $S_{21}$: Isolation is shown as 2204, $S_{31}$: Direct link is shown as 2206, and $S_{41}$: Cross link is shown as 2208 for a 2×2 MIMO wideband antenna array configuration with a 1-mm antenna separation distance and Port #1 excitation. Considering an example maximum channel loss criterion of 25 dB, the transmission bandwidth for both direct and cross links may exceed 60 GHz (110-170 GHz) with a significant dB margin. In light of the foregoing, the wideband microbump antenna as disclosed according to an aspect of the disclosure (e.g. SKU #2) may be suitable for point-to-multipoint extra-short-range wireless interconnect network topologies. Such topologies may include multiple dies, such as topologies in which broadcasting messages or maximized aggregated throughputs are performed. FIG. 23 depicts a chip topology which may permit broadcasting of messages and/or maximized aggregated throughput for an antenna topology is disclosed in FIGS. 20 and 21. This figure depicts eight dies/chiplets (e.g. dies 0 to 7), arranged for demonstrative purposes and a rectangular formation. The dies may be configured to perform wireless transmission to a plurality of adjacent dies, such as in a first direction, in a second direction perpendicular to the first direction, and/or in a third direction oblique to the first direction and the second direction (e.g. at a 45° angle relative to the first direction and/or the second direction). In this manner, the dies may be configured for transmission to and/or reception from multiple other dies, to permit chip to chip communication and/or broadcast communication in a multichip context. Although the chips of FIG. 23 are depicted in a two dimensional format for convenience, the chips may alternatively or additionally be configured in a three-dimensional format such that a plurality of chiplets/dies are stacked upon one another, and communication may function (e.g. be routed) in the first, second, and/or third directions as stated above, and/or also in one or more additional directions along a z-axis, which may be perpendicular to the two-dimensional plane shown in FIG. 23.

A given implementation may include either or both antenna configurations disclosed herein (e.g. SKU #1 and SKU #2). That is, although a multichip implementation may use only antenna configurations according to SKU #1 or SKU #2 in certain configurations, multichip implementations may be configured to use both one or more antenna configurations according to SKU #1 and one or more antenna configurations according to SKU #2. It is noted that SKU #1 and SKU #2 may share an identical antenna-related design on the silicon substrate and only use the different package designs to configure the antenna, thereby offering flexibility in their implementations.

Figure 24:
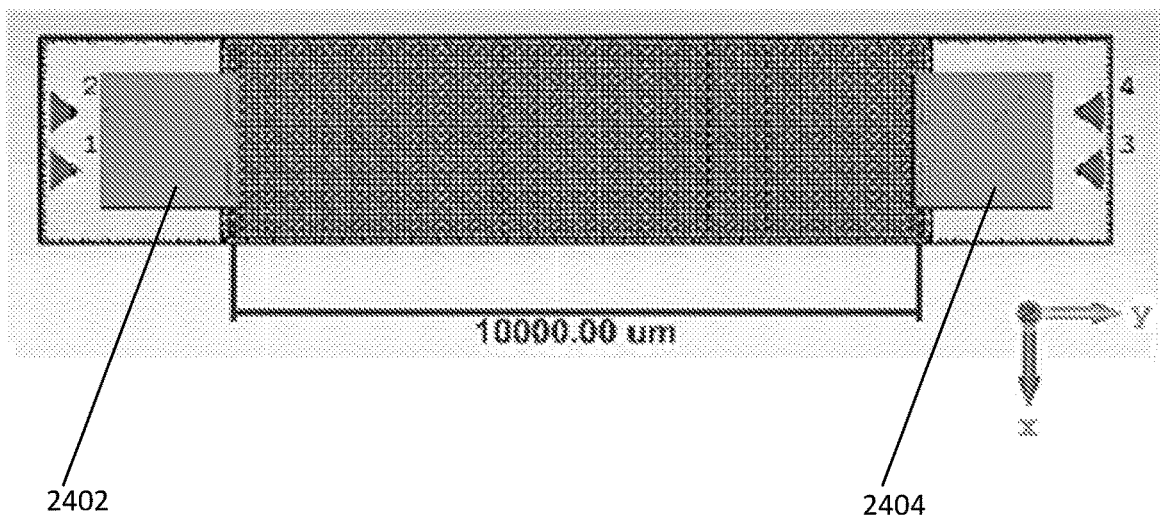
FIG. 24 depicts a configuration with a 10-mm antenna separation distance.
Figure 25:
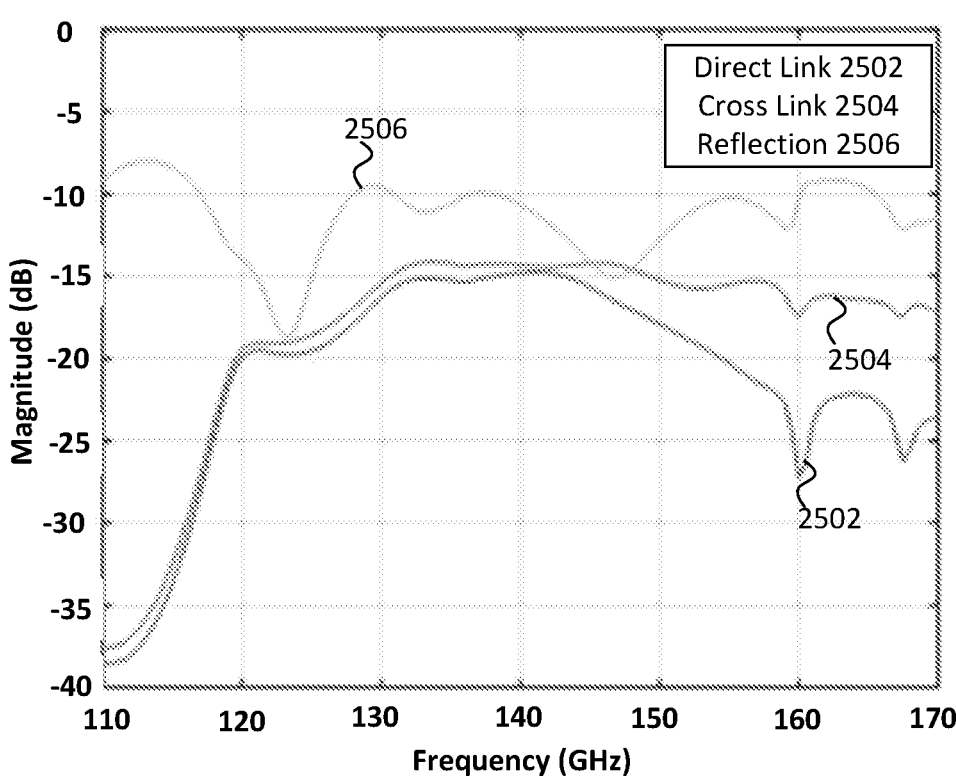
FIG. 25 depicts simulation results.

According to another aspect of the disclosure, the antenna designs disclosed herein may leverage a guide-wave phenomenon between integrated heat spreaders (or heat sinks) and a ground package top ground plane. As such, their radiation performance may not follow the well-known Friis' free-space path loss equation. Consider, for example, a 10-mm antenna separation distance as illustrated in FIG. 24, which depicts a first chip including one or more antennas 2402 and a second ship including one or more antennas 2404, separated by 10-mm (depicted as 10,000.00 μm). In terms of Friis' equation, the expected path loss would be ~25 dB at 140 GHz, assuming a 5-dB gain for both of the Tx and Rx antennas. However, the simulation results in FIG. 25 show that the path loss is rather ~15 dB with wideband operation. In particular, the cross link of SKU #2 outperforms the direct link, which renders SKU #2, for example, a good candidate for diagonal wireless communications between silicon dies.

Figure 26:
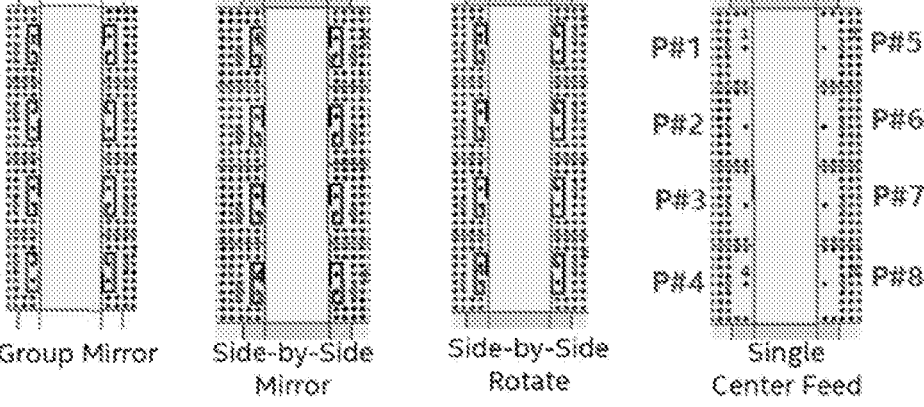
FIG. 26 depicts antenna configurations in a MIMO setting.

The following describes antenna configurations in a MIMO setting according to a third aspect of the disclosure, which are depicted in FIG. 26. Various 4×4 MIMO array configurations may be implemented, for example, with a 4×4 mm² silicon substrate and 1-mm antenna separation distance. In a first configuration, FIG. 26 depicts a group minor configuration, in which a first group of antenna structures are structured to minor one another both vertically and horizontally (the top four antennas mirror one another vertically and horizontally, and the bottom for antennas mirror one another vertically and horizontally). Although the group mirror formation is depicted for demonstrative purposes as including eight antennas, the devices and principles disclosed herein may use any number of antennas, based, for example, on the number of dies, on the number of chiplets, or on the number of chips used in a given configuration. That is, the antennas may be implemented in various ways, and the number of antennas selected may be dependent on any of a plurality of factors including, but not limited to, a number of dies; a number of chiplets; a number of chips; data transfer requirements between the dies, between the chiplets, or between the chips; or any combination thereof.

FIG. 26 alternatively depicts a side-by-side mirror configuration in which a first column of antennas on the left side are identically oriented, and a second column of antennas on the right side are identically oriented, such that the antennas on the left side are mirror images of the antennas on the right side.

FIG. 26 alternatively depicts a side-by-side rotational arrangement, in which a first column of antennas on the left side are oriented in a first orientation, and a second column of antennas on the right side are oriented in a second orientation, essentially rotated 180° from the first orientation.

FIG. 26 alternatively depicts a single center feed orientation, in which each chip/die includes a single center feed antenna (e.g. without a coupling element as described herein) and one or more shorted antennas to create a radiation aperture. In this case, the radiation aperture forms along the left side of the left column of antennas, such that a primary radiating direction will be toward a center vertical axis of the chip formation, and a radiation aperture forms along the right side of the right column of antennas, such that a primary radiating direction will be toward the center vertical axis of the chip formation.

Configurations for oxide layers, metal layers, integrated heat spreaders, mold material, and packages may be identical or similar to those in SKU #1. Group-mirrored, side-by-side mirrored, and side-by-side rotated arrays may include element antennas of SKU #1. However, as described above, the single center-feed configuration may be configured without the coupling element (e.g. the curved transmission line on the m8 layer). Instead, this configuration may only use the single center-located microbump for transmission, wherein this microbump may be electrically shorted to the m8 layer, which is referred as SKU #3. The feed microbump may be located at a center of the U-shaped radiation aperture formed from electrically-shorted surrounding microbumps.

Figure 27:
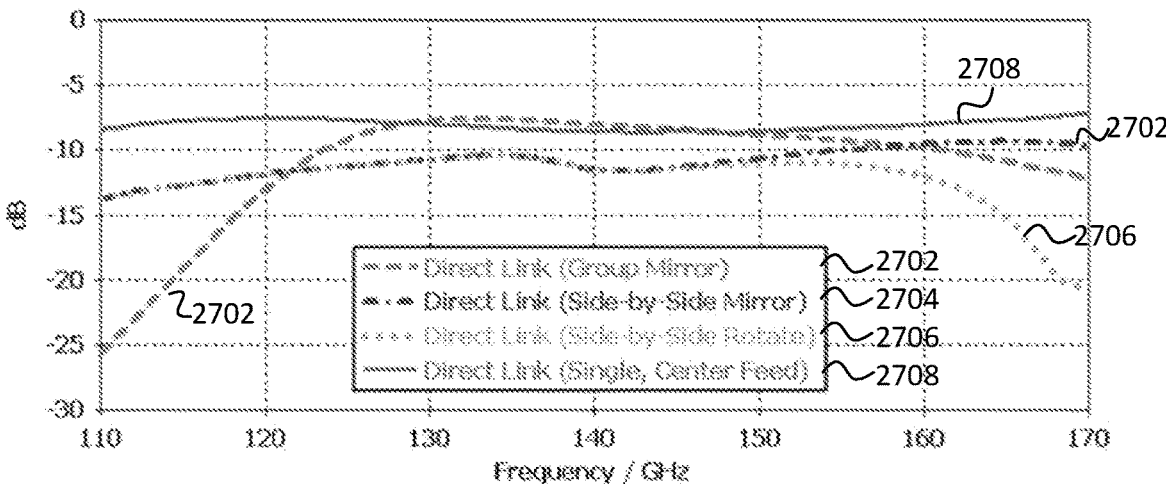
FIG. 27 depicts a simulated direct link comparison between various 4×4 MIMO array configurations.

FIG. 27 depicts a simulated direct link comparison between various 4×4 MIMO array configurations as described in FIG. 26. In this figure, the group mirror configuration is depicted as 2702; the side-by-side mirror configuration is depicted as 2704; the side-by-side rotation configuration is depicted as 2706; and the single, center feed configuration is depicted as 2708. The antenna configuration SKU #3 may provide a relatively flat response over a wide-frequency range (110-170 GHz), which may help to achieve a power specification of 1 pJ/bit by reducing equalizer power consumption.

Figure 28:
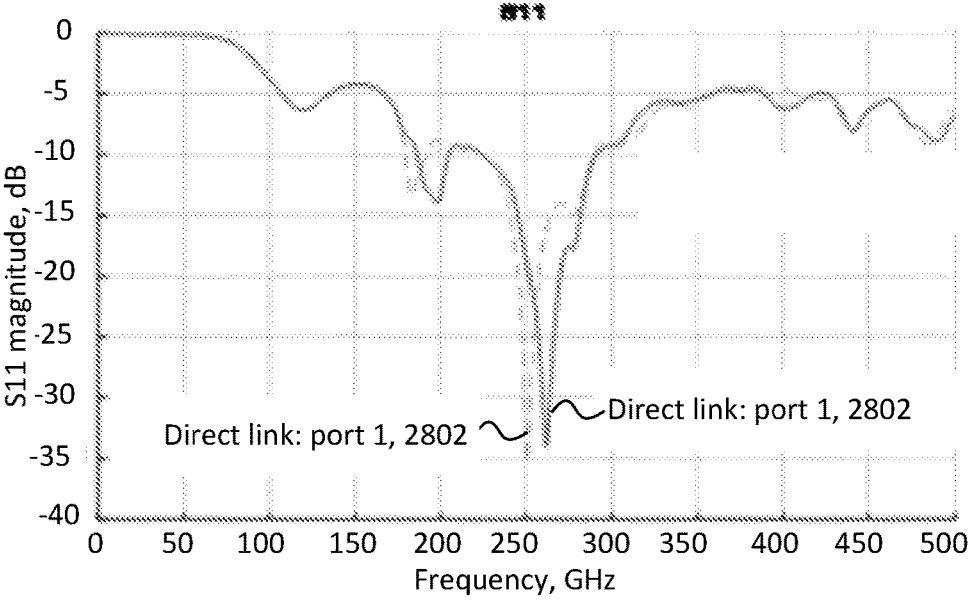
FIG. 28 shows simulated reflection performance for extremely wide band.

FIG. 28 shows simulated reflection performance for extremely wide band (DC—500 GHz), according to an aspect of the disclosure. This simulation indicates that the impedance bandwidth of antenna configuration SKU #3 is ~125 GHz (175-300 GHz) for a 10-dB return-loss criterion, but that it may also function from 100-350 GHz with an additional impedance match circuit.

Figure 29:
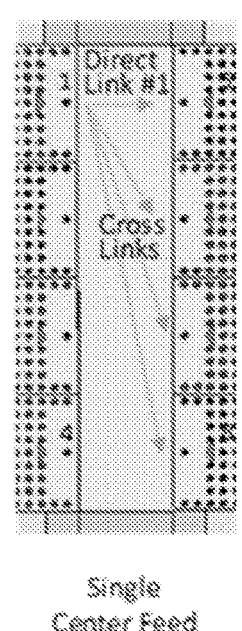
FIG. 29 depicts a multi-antenna configuration.

FIG. 29 depicts a multi-antenna configuration as disclosed herein, in which the antennas are configured to perform direct links (e.g., wireless links to a chip directly across from a chip, i.e. from left to right) and cross-links (e.g. oblique transmissions). Comparison of magnitude and phase responses for direct and cross links from DC to 500 GHz is shown in FIG. 30.

Figure 30:
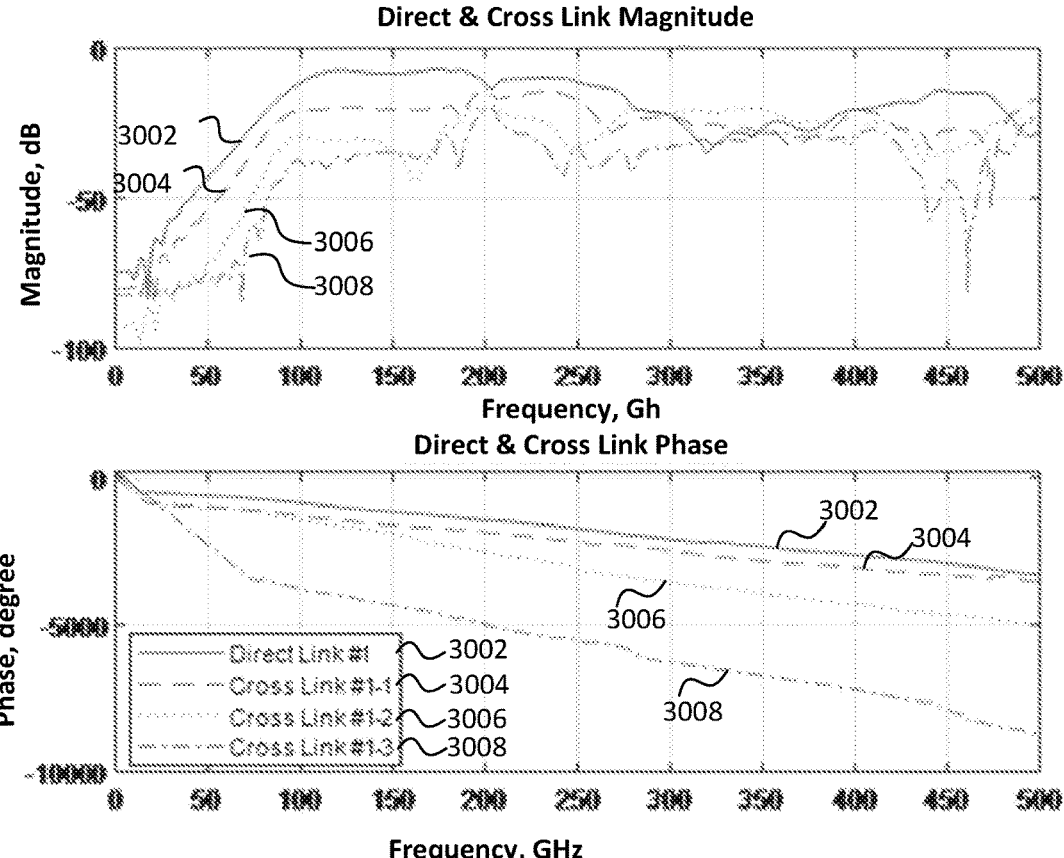
FIG. 30 depicts a comparison of the direct links and cross-links.

FIG. 30 depicts a comparison of the direct links and cross-links depicted in FIG. 29. Direct link #1 is depicted as 3002; cross link #1-1 is depicted as 3004; cross link #1-2 is depicted as 3006; and cross link #1-3 is depicted as 3008. These indicate that SKU #3 is an excellent candidate for wireless interconnect applications demanding high through-puts.

Figure 31:
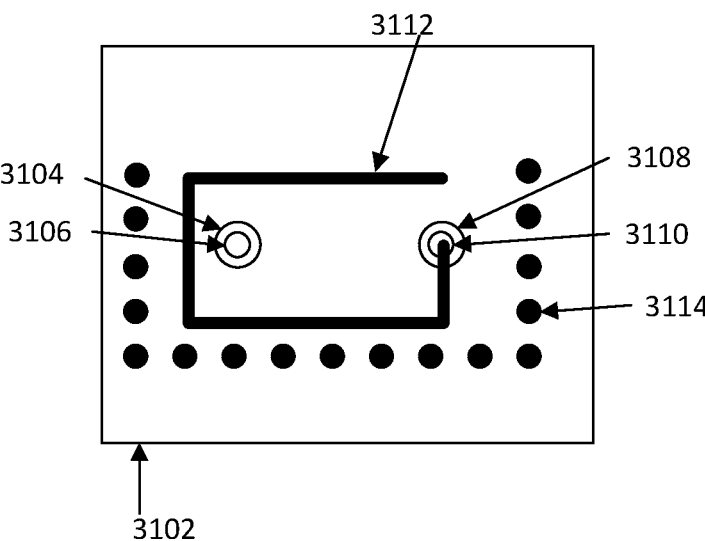
FIG. 31 depicts common elements of antenna, according to an aspect of the disclosure.

As described above, and according to an aspect of the disclosure, the broadband microbump antennas described herein may generally be divided into two basic configurations, as will be described in greater detail. Common elements are depicted in at least FIG. 31 (for simplicity of visualization, the elements of this figure are intentionally not drawn to scale), which shows that both configurations may include a first chiplet 3102, which has a first side and a second side, opposite to the first side; the chiplet may include a first terminal 3104, extending between the first side and the second side; a first solder element 3106, mounted on the first terminal; a second terminal 3108, extending between the first side and the second side, a second solder element 3110, mounted on the second terminal; and a metallic element 2212, electrically conductively connected to the second solder element; wherein the metallic element has a shape whose perimeter at least partially surrounds the first terminal. The broadband microchip antenna may include one or more electrically shorted microbumps (labelled as 3114 and represented by each of the plurality of solid circular shapes in FIG. 31). These surrounding, electrically-shorted microbumps 3114 form a radiating aperture (e.g., a reflector or a slot aperture), which may direct the radiofrequency signal from the broadband microbump antenna. Although the radiating aperture formed by the plurality of shorted microbumps 3114 is formed in a 'U'-shape for demonstrative purposes, the aperture may be alternatively formed in a variety of other shapes. For example, the aperture may be formed in an 'L'-shape, a "_"-shape, or a 'V'-shape, which may further refine the radiation pattern. For example, an 'L'-shaped radiating aperture will result in a more directive pattern which radiates in a rightward direction. A "_"-shaped aperture would result in a wider field of view. A 'V'-shaped aperture would provide a more directive beam at boresight, which would result in higher directivity, but a narrower field of view.

In a first configuration of the microbump antennas, the circuit package may further include a first transmission line, which may be electrically conductively connected to the first terminal; wherein the first terminal may be configured to receive an electrical signal from the first transmission line and to emit a radiofrequency signal from at least the solder element, wherein the radiofrequency signal represents the received electrical signal. In this manner, the first solder bump of the first terminal may function as a driven antenna.

In this first configuration, the metallic element may be configured to at least one of inductively or capacitively couple the second solder element with the first solder element. The capacitive and/or inductive coupling may result, for example, from a physical design of the metallic element. That is, by virtue of the metallic element's perimeter extending around or nearly around the first terminal, the metallic element forms a kind of loop and thus functions as an inductor. Furthermore, the close proximity of the metallic element to the first terminal results in a capacitive coupling. Given both the capacitive and inductive functions associated with the metallic element, the metallic element may constructively form an LC circuit, which may alter an impedance of the first solder element. That is, at least one of the inductive or capacitive coupling of the metallic element with the first solder element may perform an impedance matching function relative to the first terminal and/or the first solder element. The first terminal may be electrically conductively connected to a package ground layer and/or an m7 ground layer of the first chiplet.

In this second configuration, the metallic element may be configured as part of the primary radiating antenna and may function as a top loading element. The circuit package according to this configuration may further include a first transmission line (not depicted in this figure), which may be electrically conductively connected to the second terminal. The second terminal may be configured to receive an electrical signal from the first transmission line and to emit a radiofrequency signal from at least the solder element, wherein the radiofrequency signal represents the received electrical signal. In this manner, the metallic element and/or the solder element that is electrically conductively connected to the metallic element becomes the primary radiating element, and the first terminal is shorted to direct the resulting radiofrequency emission. In this manner, the metallic element may be a top-loaded antenna and/or perform a top-loading function.

Regardless of whether the first configuration or second configuration as described above is implemented, any of the following may be true. The first solder element may be a solder bump and/or a microbump; and the first terminal may be a via. The second solder element may be a solder bump and/or a microbump; and the second terminal may be a via.

Regardless of whether the first configuration of the second configuration is implemented, the circuit package may further include one or more third terminals, placed along at least one side of the metallic element, wherein the one or more third terminals are electrically shorted. In this manner, the one or more third terminals may form an aperture to direct the radiofrequency signal. The one or more third terminals are vias. The metallic element may be cut from at least one layer of the circuit package, such as from an m8 layer of the circuit package.

DP #3

Market pressures and manufacturing costs create additional challenges for the design and manufacture of large processing dies. Rather than create a single, large processing die, it is often preferable to de-integrate the die into multiple integrated circuits. This simplifies manufacturability and may also contribute to simplified spatial design considerations of an end product. As described above, these subdivided chips may be known as chiplets.

As chip architecture becomes more subdivided, the interconnection between chiplets becomes increasingly crucial. Such interconnections are necessary to support chip-to-chip connectivity with high-throughput, high-efficiency, and low-latency characteristics. Conventional interconnect techniques may not be able to provide highly-efficient, high-throughput connections with low-latency.

According to an aspect of the disclosure, a wireless chip-to-chip broadcasting interconnect technique may generate highly-efficient, high-throughput connections between chiplets with low-latency. By utilizing an extremely short distance wireless broadcasting channel in conjunction with a low loss transmission medium on the package/base-die, such as a stripline, the proposed solution enables multichip-to-multichip interconnection with high throughput, high efficiency, low latency, and variable distances while avoiding a large number of bumps and routing congestions. These techniques enable improved interconnection between multiple dies, which may significantly improve the performance of the chiplet system.

Some conventional efforts at developing multichip interconnections have relied on package- or PCB-based wired interconnects. Such package- or PCB-based wired interconnects are generally unable to meet the bandwidth and throughput demands required of today's integrated chiplets. Moreover, such package- or PCB-based wired interconnects are associated with routing difficulties, and it is often difficult to implement wired interconnects in a multichip-to-multichip communication topology. Other conventional efforts at developing multichip interconnections have relied on a silicon Interposer/bridge wired interconnect. For these, however, increased throughput requires an increased quantity of traces and bumps, which introduces routing congestion. These traces and bumps also negatively affect the yield and thus the cost of the chip manufacture. Moreover, the signal integrity and mechanical requirements limit the communication link distance. Other conventional efforts at developing multichip interconnections have relied on optical interconnects. Silicon interposers/bridges do not generally permit multichip-to-multichip communication. Optical interconnects require electrical-to-optical conversion, which often increases the power consumption and the form factor and cost. Moreover, stringent thermal requirements for lasers may also pose additional technical risks. As with silicon interposers/bridges, optical interconnects do not permit multichip-to-multichip communication. Finally, wireless interconnects have been attempted in multichip communication by utilizing a wireless interconnect; however, high over-the-air path losses, or path losses over a material medium significantly degrade the SNR. As such, systems relying on wireless interconnects cannot generally support long distance communication and may result in high power consumption. In addition, it is difficult to increase the number of wireless streams due to the limited isolation between streams, which generally results in limited throughput. Finally, given that the wireless channel can be multipath-rich environment due to the surrounding components, the performance can be further degraded.

Herein are disclosed devices and methods for multichip-to-multichip (i.e. all dies may communicate with each other) interconnection. These devices and methods may operate in extremely short-distance wireless broadcasting channels in conjunction with low loss transmission lines or waveguides. By keeping the wireless channel as short as possible while utilizing the low loss transmission medium to extend the channel length, the devices and methods described herein reduce the wireless link loss for longer distance channels while preserving multichip-to-multichip link options. Benefits may include die-to-die distance extension, high throughput, low latency, and multichip-to-multichip interconnect capabilities. This devices and methods disclosed herein may enable seamless communication between multiple dies and may improve the performance of the chiplet system. The proposed approach can also be implemented for various data center interconnect applications.

Figure 32:
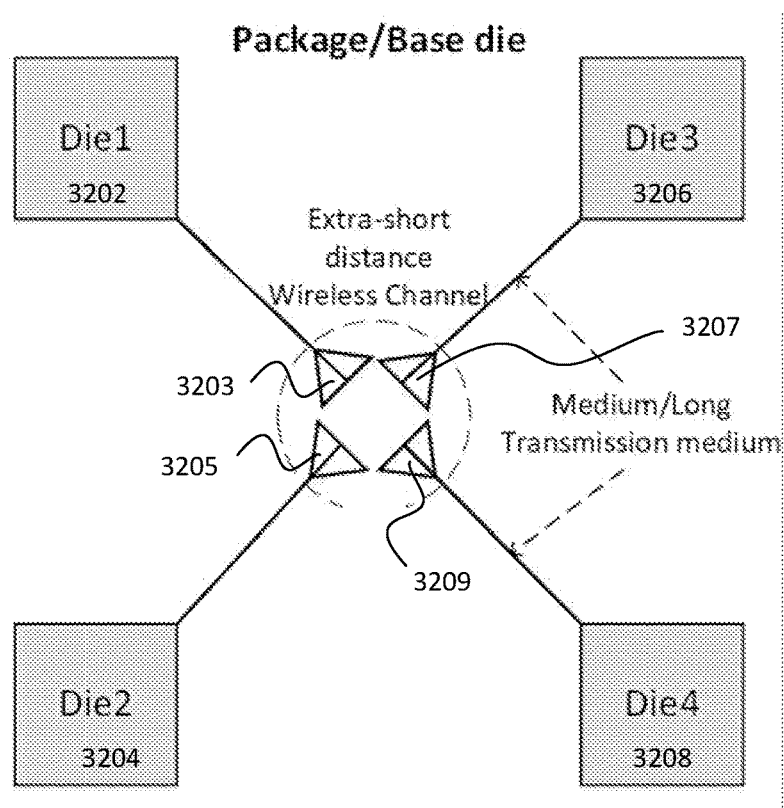
FIG. 32 depicts a core wireless broadcasting multichip-to-multichip interconnect architecture.

FIG. 32 depicts a core wireless broadcasting multichip-to-multichip interconnect architecture according to an aspect of the disclosure. In this figure, a first die 3202 is connected via a first transmission line (not labeled) to a first interconnect 3203; a second die 3204 is connected via a second transmission line (not labeled) to a second interconnect 3205; a third die 3206 is connected via a third transmission line (not labeled) to a third interconnect 3207; and a fourth die 3208 is connected via a fourth transmission line (not labeled) to a fourth interconnect 3209. In this case, the interconnects may be configured as wireless antennas. The interconnects/wireless antennas may have a shape so as to permit very close proximity of the interconnects, as will be discussed in greater detail.

The interconnects placed in close proximity to one another may define the wireless channel and may minimize or greatly reduce wireless path loss (e.g. whether over-the-air or over-material-medium) while enabling wireless broadcasting to support multichip-to-multichip communications (e.g. multiple dies communicate with each other). By connecting this wireless channel and each die with a low loss transmission medium, such as with a stripline, a microstrip line, a coplanar waveguide, a substrate integrated waveguide, etc., the proposed technique may further extend the die-to-die communication distance.

The topology shown in FIG. 32 is depicted for demonstrative purposes as interconnecting four dies in which any combination of two dies can establish a bi-directional communication link at a time through this channel (i.e. link between die 1-2, 1-3, 1-4, 2-3, 2-4, or 3-4). Although a four-die architecture is depicted in the figure, the concept is not limited to only four dies and can be applied for any number of die configurations. This wireless broadcasting channel and transmission medium can be formed on a package or a silicon, such as base die or bridge die.

The die-to-die distance may be adjustable as long as the total path loss (e.g. wireless path loss and transmission line path loss) satisfies the minimum SNR requirement of the system. The concept can also be formed in any other medium on architectures needing multipoint-to-multipoint connectivity.

Figure 33:
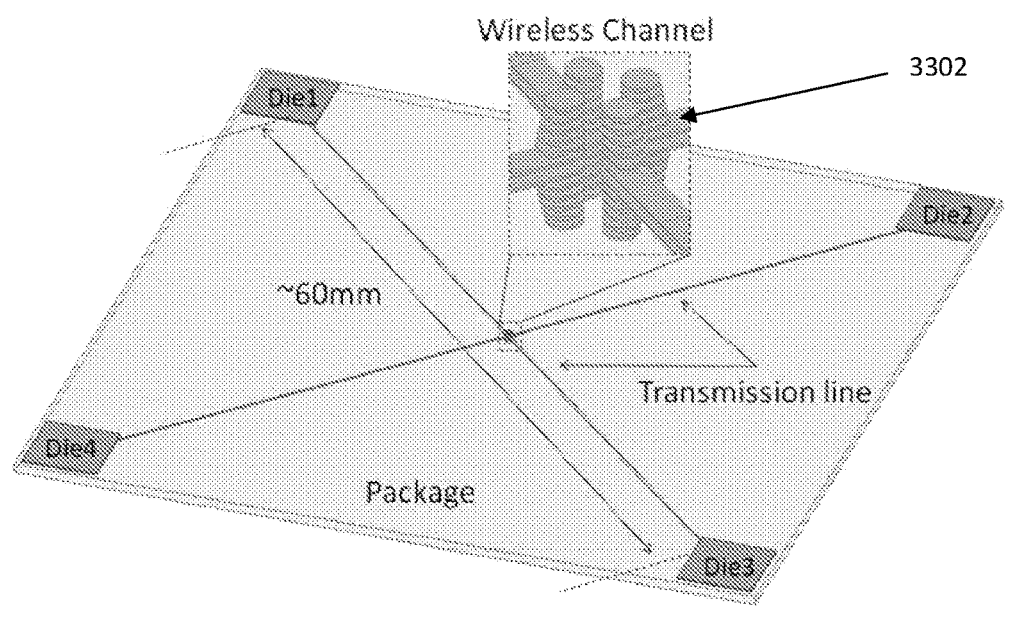
FIG. 33 depicts an example interconnect (e.g. antenna element) for a multichip architecture.

FIG. 33 depicts an example interconnect (e.g. antenna element) for a multichip architecture 3302, according to an aspect of the disclosure. In this configuration, the antenna is configured as a multiple-layer (e.g. in this instance, a 14-layer) stack-up package using stacked vias to realize a vertically polarized dipole antenna. Note that this design utilizes a 14-layer package substrate stackup for demonstrative purposes, and the devices and method described herein may function with fewer or more substrate layers.

Figure 34:
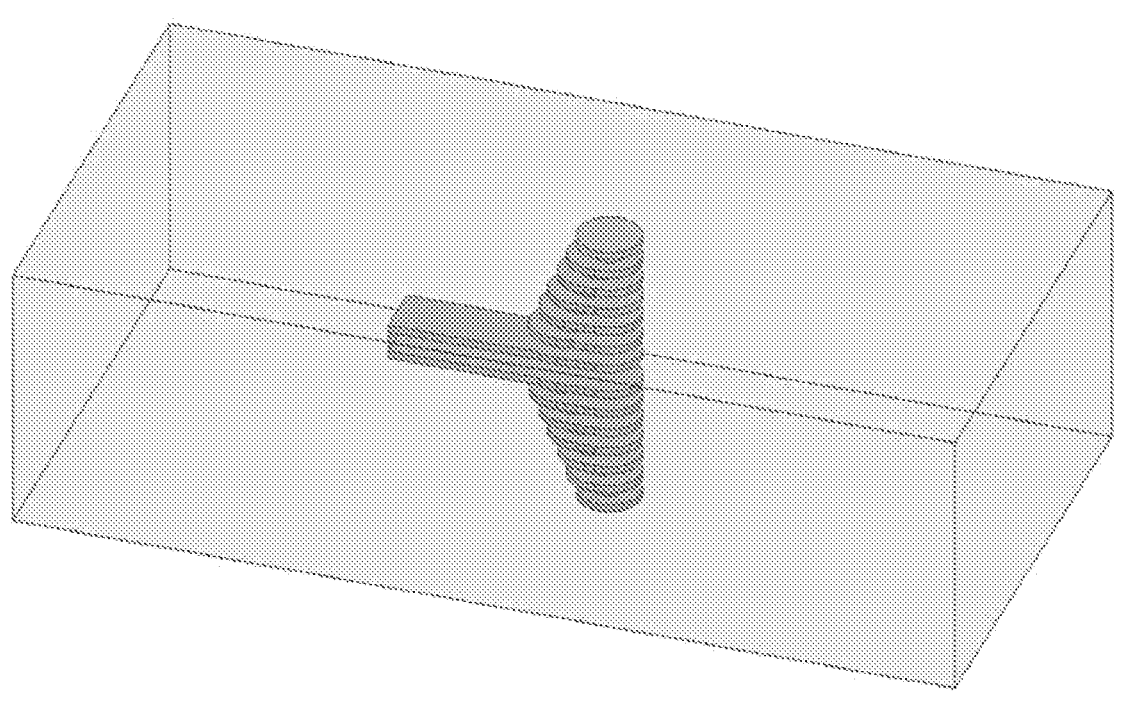
FIG. 34 depicts an interconnect as a 14-layer package of stacked vias.
Figure 35:
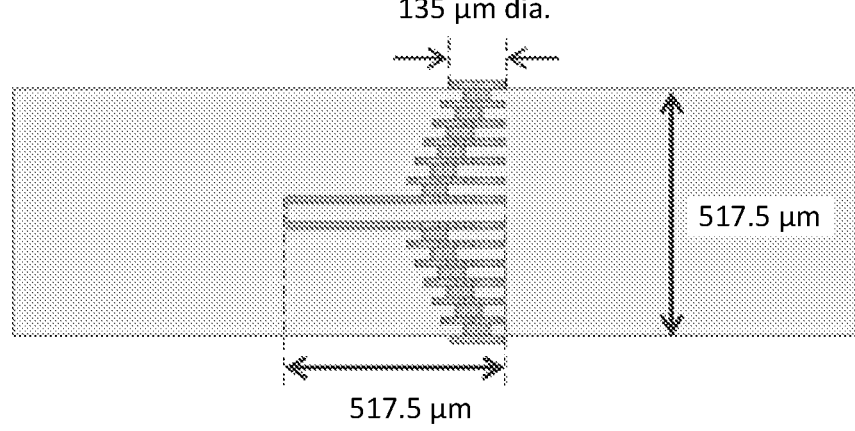
FIG. 35 depicts an interconnect with top and bottom vias.

FIGS. 34 and 35 further depict the interconnect of FIG. 33. In FIG. 34, the interconnect is again depicted as a 14-layer package of stacked vias. According to an aspect of the disclosure, the stacked vias may be of differing lengths such that a middle portion (e.g. a middle portion along the interconnect's vertical axis) may include vias that are longer than a top portion or a bottom portion. In this manner, this may result in the generation of a connection terminal. As depicted in FIG. 35, the top and/or bottom vias may exemplarily be approximately 135 μm long, and the length of the vias may increase toward the middle of the interconnect (e.g. along the vertical axis) such that the longest vias are approximately 517.5 μm.

Figure 36:
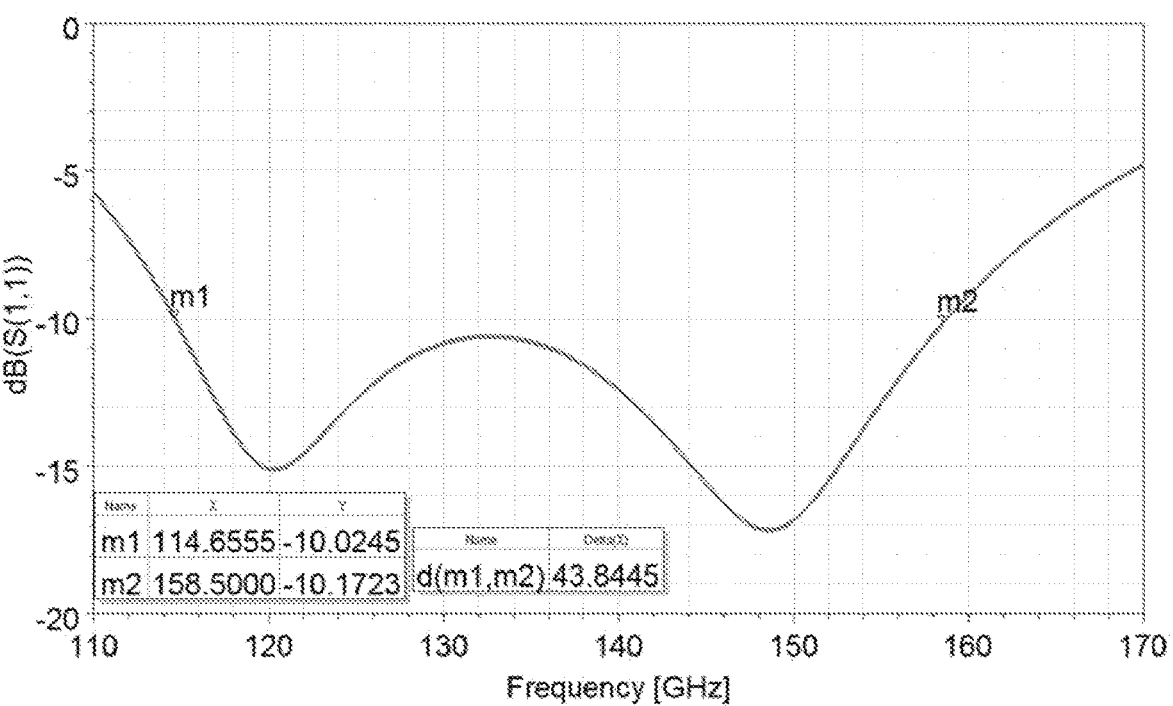
FIG. 36 depicts simulation results of the interconnects.

FIG. 36 depicts simulation results of the interconnects in the configurations of FIGS. 32 to 35. As shown, the interconnects exhibit ~44 GHz of bandwidth and ~3.6 dB of antenna gain at a 140 GHz center frequency.

Figure 37:
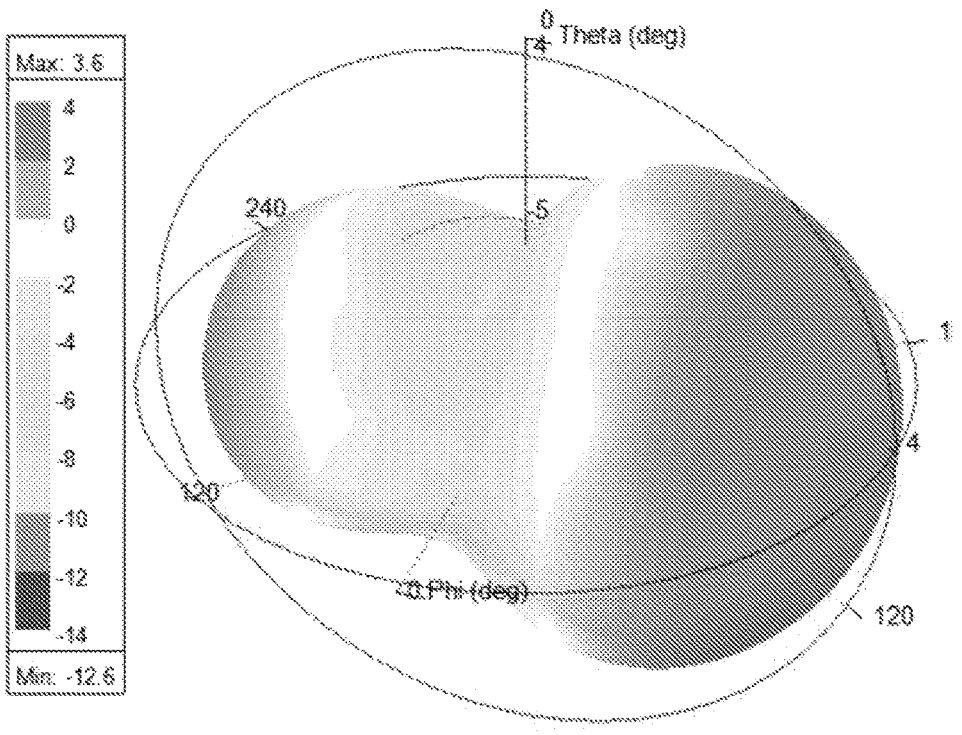
FIG. 37 depicts a simulation result of the interconnect as depicted in FIGS. 32 through 35.

FIG. 37 depicts a simulation result of the interconnect (e.g. antenna) as depicted in FIGS. 32 through 35.

FIG. 38 depicts the proposed wireless broadcasting channel using the interconnect antenna element described with respect to FIGS. 32 through 35, according to an aspect of the disclosure. This topology, depicted herein, may minimize the wireless link path loss by permitting the antennas to be placed extremely close to one another while enabling broadcasting capability to support multichip-to-multichip interconnections. The antenna-to-antenna distance is not fixed, but can rather be adjusted as desired for a given implementation. For example, the distance may be greater, as long as the result satisfies a relevant SNR requirement for transmission/reception. In this particular example, which is provided for demonstrative purposes, the interconnect antennas are placed with a 300 μm gap between antennas across from one another.

FIGS. 39 and 40 depict simulation results of the wireless channel created by the interconnect antennas of FIG. 38. As depicted by FIG. 39, the simulated return loss was ~50 GHz of bandwidth. (In FIG. 39, each link is shown in a separate line/curve; however, due to substantial overlap, little meaningful difference between the links can be visually depicted). As depicted in FIG. 40, the transmission exhibited <10 dB of path loss in each link (S21 (P1 to P2), S31 (P1 to P3), and S41 (P1 to P4)).

Furthermore, to improve performance, one may optimize the wireless broadcasting channel shown in FIG. 38 (referring to the space between the interconnect antennas) with a suitable material selection. The material may optionally differ from the rest of the substrate material for a given layer. For example, it may be desired, for a given implementation, to use a material (and/or to use substrate voids) locally, wherein the material and/or the voids provide a better coupling medium with optimized material properties.

Figure 41:
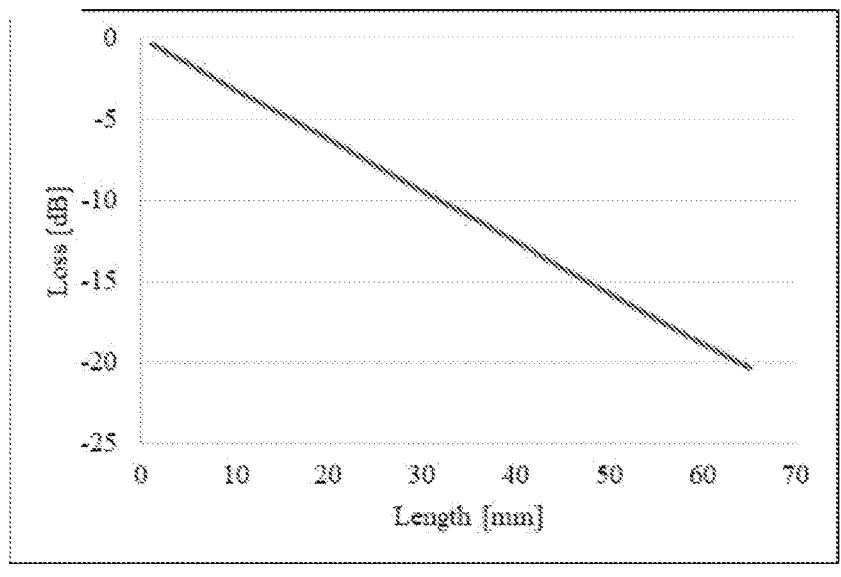
FIG. 41 depicts the simulated transmission performance of a stripline.
Figure 42:
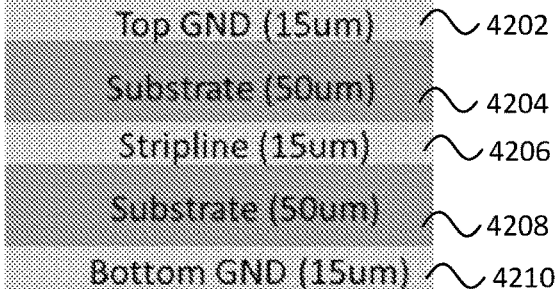
FIG. 42 depicts a "stack-up" for a prior simulation.
Figure 42:
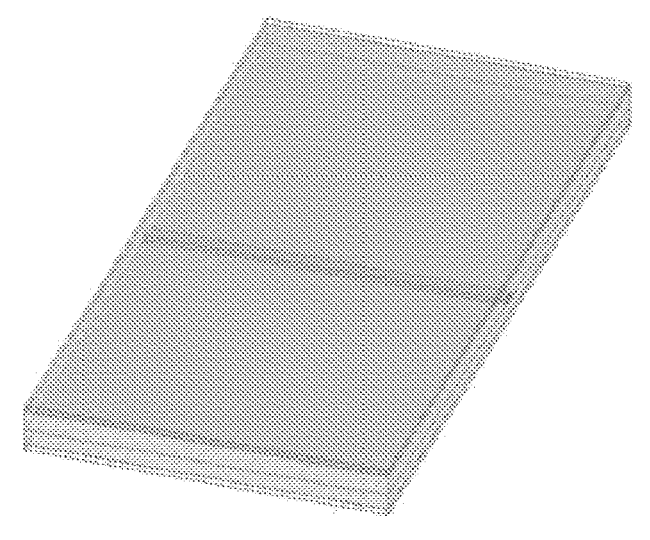

One may implement the devices and methods disclosed herein for wireless interconnect antennas to connect each die and this wireless channel through a low loss transmission medium, such as through microstrip/strip lines, and substrate integrated waveguide (SIW) which may extend the die-to-die communication distance. FIG. 41 depicts the simulated transmission performance of a stripline at 170 GHz over various distances. FIG. 42 depicts a "stack-up" for the simulation of FIG. 41. The stack up includes a top ground layer 4202, a substrate 4204, a stripline 4206, a substrate 4208, and a bottom ground 4210. In this stack-up of FIG. 42, and in light of the simulation results of FIG. 41, and assuming the system accepts up to 30 dB of total path loss, because of the <10 dB of wireless path loss from FIG. 40, the stripline path loss can be up to 20 dB, with which the line length can be up to ~60 mm, as depicted in FIG. 42. Thus, the proposed system can be configured, for example, as shown in FIG. 33. This system configuration may enable wireless broadcasting of chip-to-chip communication between multiple dies which are placed up to ~60 mm away from one another. Implementation of this technique may enable seamless chip-to-chip interconnection, thereby significantly improving the performance of the chiplet system.

Because, as described above, a variety of types and numbers of interconnect antennas/couplers can be used to configure the proposed wireless channel as described herein, attention will now be turned to various possible implementations in accordance with various aspects of the disclosure.

Figure 43:
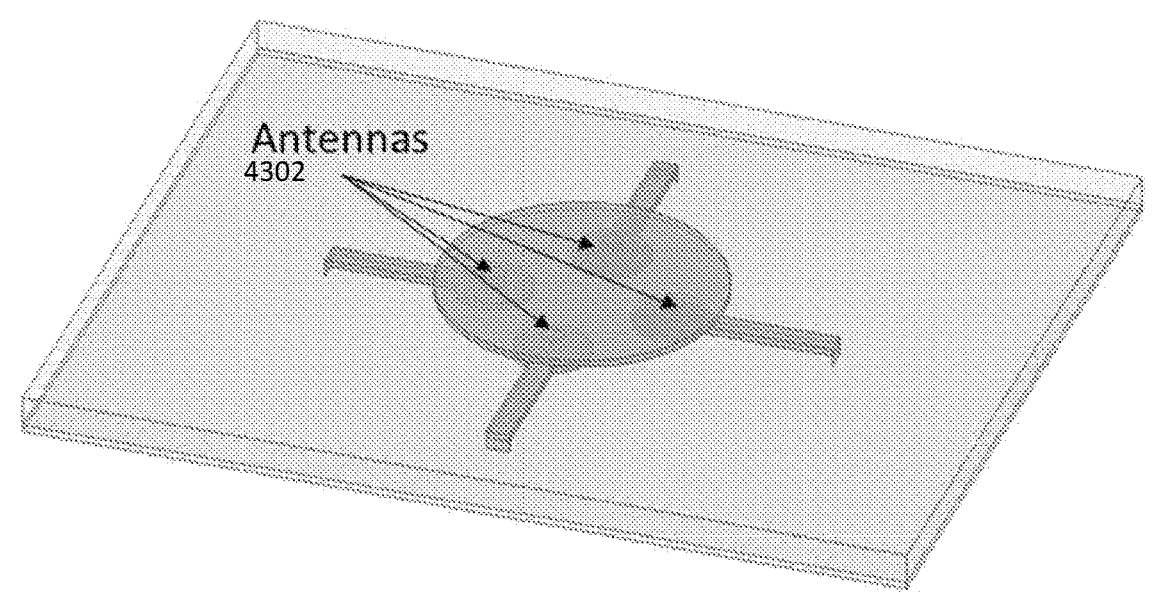
FIG. 43 depicts a wireless channel configuration according to an aspect of the disclosure.
Figure 44:
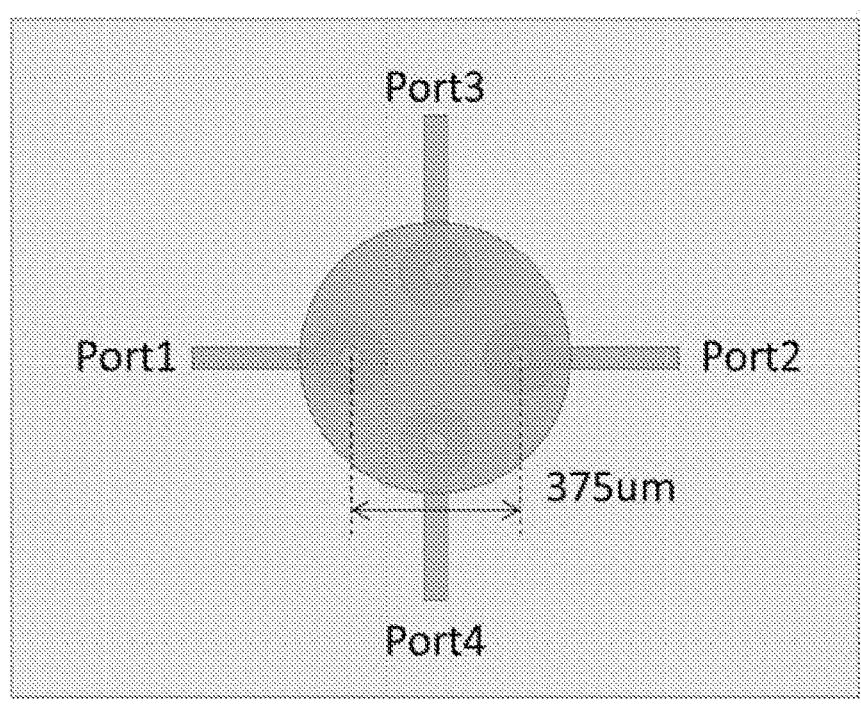
FIG. 44 depicts a wireless channel configuration according to an aspect of the disclosure.
Figure 45:
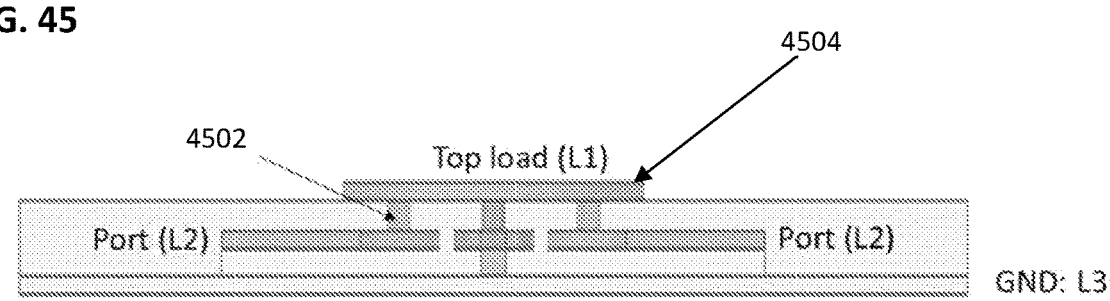
FIG. 45 depicts a wireless channel configuration according to an aspect of the disclosure.

FIGS. 43, 44, and 45 show the wireless channel configurations according to various aspects of the disclosure. In these figures, the wireless channel includes top-loaded monopole antennas formed on a package stack-up. The antennas in FIG. 43 are labeled as 4302. In this example, the circular top-loaded shape of the antenna may be on the 1$^{st}$ layer of the package with micro-vias. The signal feed of each antenna may be on the 2$^{nd}$ layer, and the entire 3$^{rd}$ layer may be the ground plane. FIG. 44 depicts the antenna configuration of FIG. 43 from a different view. In this figure, the antennas are spaced such that a gap of 375 μm exists between antennas lying across from one another. As stated above, the gap between antennas is not fixed at 375 μm, but may rather be greater or smaller, subject to the needs of a given implementation and subject to the desired SNR. As shown in FIG. 44, each of the antennas may have a connection to an antenna port via a transmit line. In this manner, each chiplet may control its own antenna(s). As described above, one or more different substrate materials and/or voids may improve the loading characteristics of the antennas. FIG. 45 depicts the antenna configuration of FIGS. 43 and 44 from a side view. In this view, it can be seen that the antennas may be monopole antennas that are formed by/include one or more vias 4502. An optional top loading structure 4504 may cover the antennas to permit for top-loading antenna function.

Figure 46:
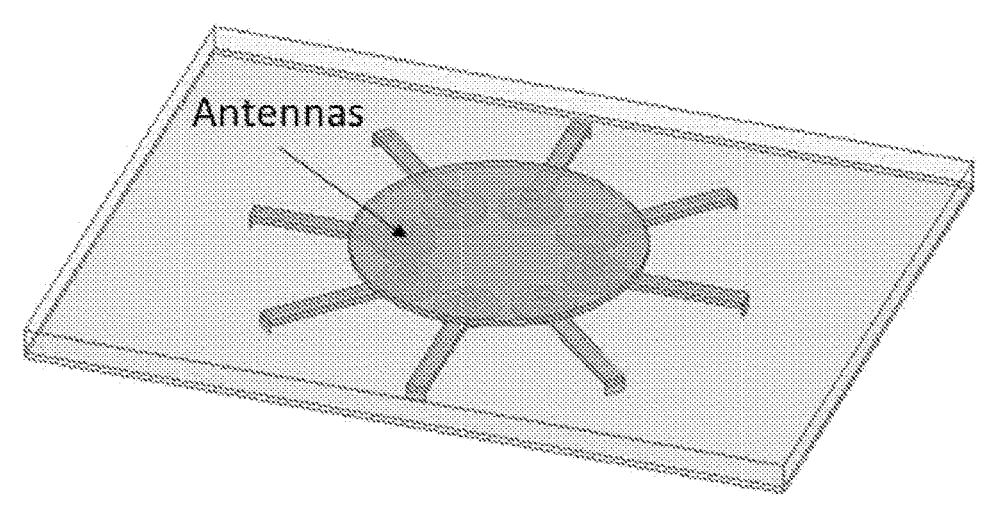
FIG. 46 depicts an antenna configuration.
Figure 47:
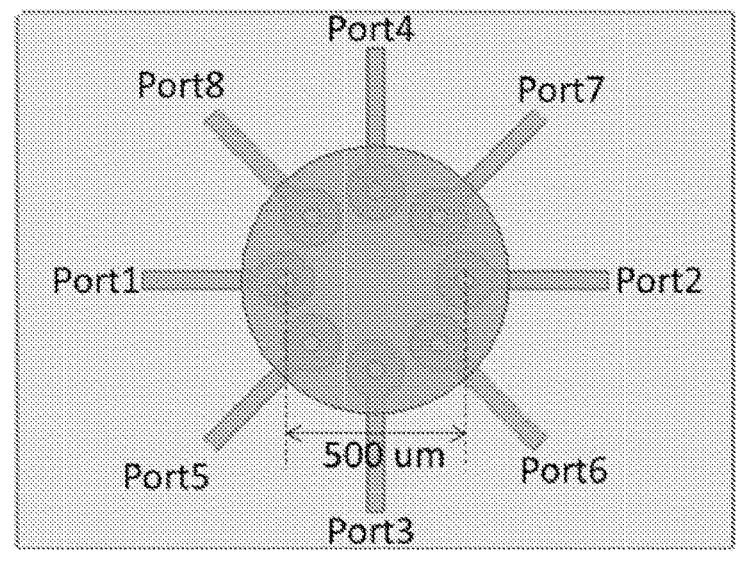
FIG. 47 depicts an antenna configuration.
Figure 48:
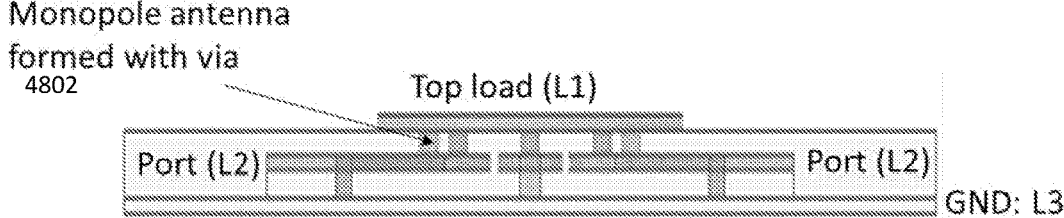
FIG. 48 depicts an antenna configuration.

The antenna topologies described herein are depicted for demonstrative purposes with a given quantity of antennas (e.g., the antenna structures of FIGS. 43, 44, and 45 are shown with four antennas); however, the antenna configurations disclosed herein are not limited to four antennas, but can alternatively be formed with more or fewer antennas. For example, FIGS. 46, 47, and 48 depict an antenna configuration as otherwise disclosed herein, but with eight antennas. FIG. 47 depicts the resulting channel of the 8-antenna configuration, wherein a gap between opposite antennas (e.g. antennas extending essentially along a common line or axis) is 500 μm. As stated above, this gap may be larger or smaller, as desired for the needs of a given implementation and the requirements for a given SNR. FIG. 48 depicts a side-view of the antenna configuration of FIGS. 46 and 47, in which antennas ports (L2) are connected to monopole antennas 4802 (e.g. antennas formed with one or more vias) by transmission lines. The antennas in FIG. 48 are depicted as being covered by an optional top-loading structure to enable an antenna top-loading function. Due to the increased number of antennas in FIGS. 46, 47, and 48, the total number of the dies connected to this channel are also increased.

Figure 49:
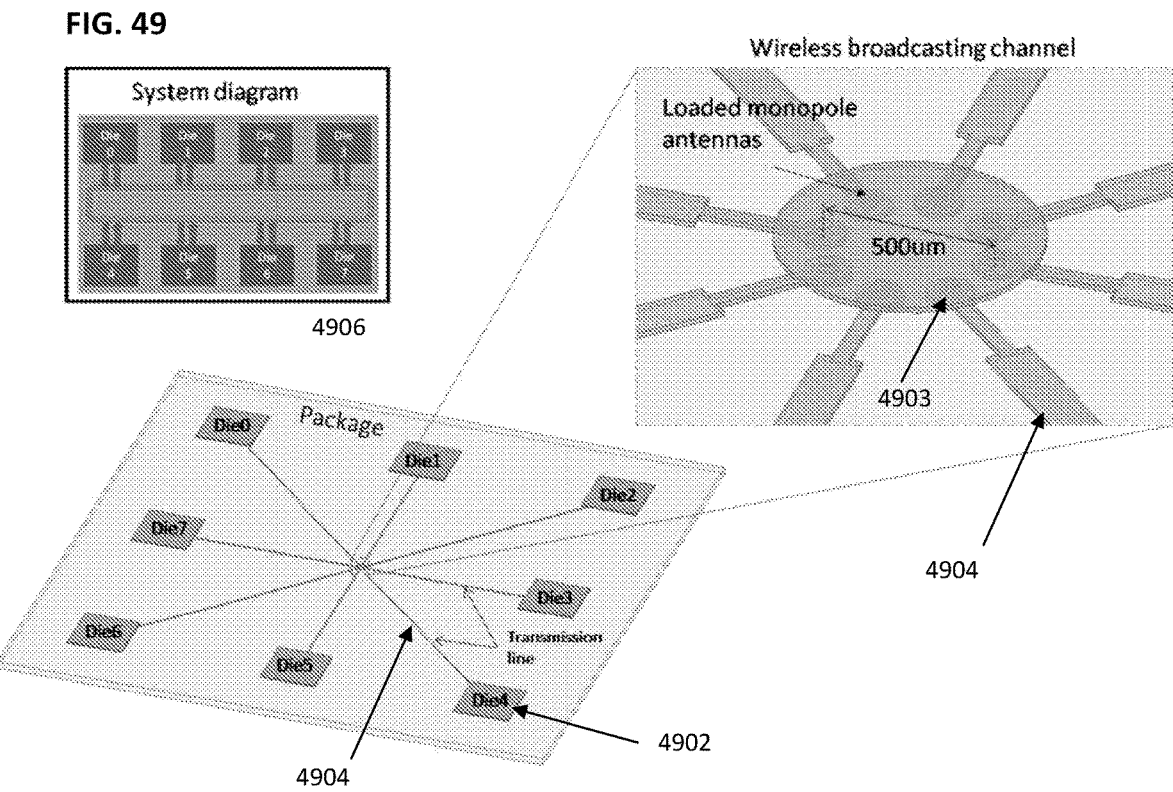
FIG. 49 depicts a multichip-to-multichip interconnect system.

FIG. 49 depicts a multichip-to-multichip interconnect system with an 8-antenna broadcasting channel, such as, for example, the broadcasting channel depicted in FIGS. 46, 47, and 48. In this figure, each die 4902 is connected to its respective antenna 4903 via a transmission line 4902. The antennas 4903 (only one antenna is labeled) may be spaced as desired for the given implementation and the desired SNR. According to an aspect of the disclosure, the antennas may be spaced such that a gap of approximately 500 μm is present between opposite antennas (e.g. antenna that extend essentially along a joint line or axis).

Figure 50:
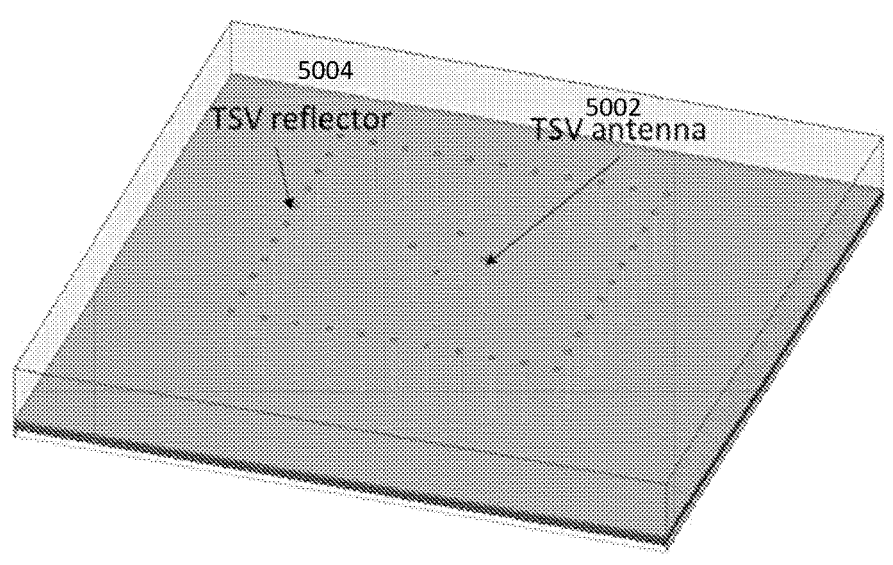
FIG. 50 depicts a side view of the TSV antenna configuration.
Figure 51:
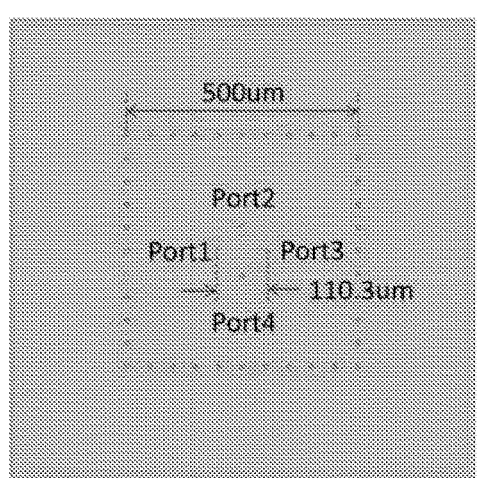
FIG. 51 depicts an example configuration of an antenna structure.
Figure 52:
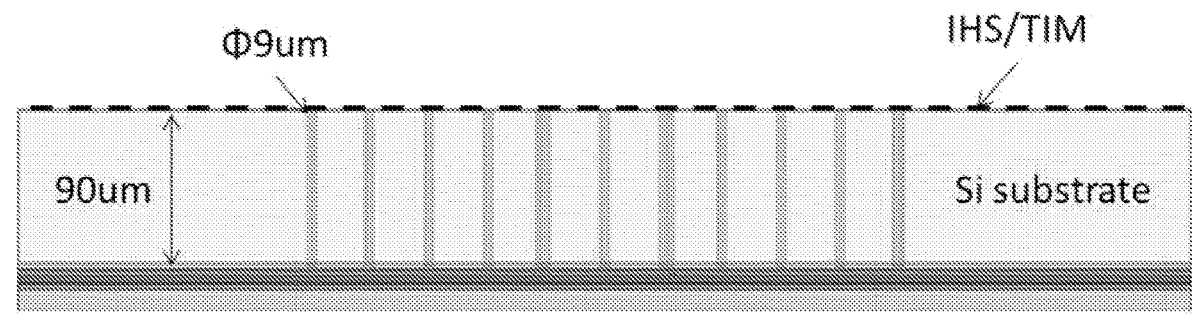
FIG. 52 depicts an example configuration of an antenna structure.

FIGS. 50, 51 and 52 depict an aspect of the wireless channel according to an aspect of the disclosure, in which the one or more antennas include through-silicon-via (TSV) antennas. The channel may include one or more TSV antennas 5002, and one or more TSV reflectors 5004. The backside of the silicon may be connected due to the integrated heat spreader/conductive thermal interface material, which may act as a top-loaded structure for the TSV monopole antennas. As with other configurations disclosed herein, the TSV antennas may each be connected to an antenna port via a transmission line. The TSV reflectors may be configured to reflect electromagnetic radiation, which may thereby increase the signal strength that reaches an intended receive antenna and/or improve SNR.

FIG. 51 depicts an example configuration of the antenna structure of FIG. 50, according to an aspect of the disclosure. In this sample, the TSV reflectors may be very close together, such as at a distance of approximately 110.3 μm from opposite antennas. The one or more TSV reflectors may be located around the one or more antennas to reflect a signal. As depicted, the one or more TSV reflectors may, for example, be placed in a square formation, with sides of 500 μm in length. Again, the dimensions for placement of the antennas and the reflectors are provided herein as examples; however, the antennas and the reflectors may each be placed closer to, or father apart from, one another than the distances depicted in the figures. Any of space requirements, cost, and/or desired SNR may bear on the distances selected.

FIG. 52 depicts a side view of the TSV antenna configuration of FIG. 50, according to an aspect of the disclosure. In this figure, the antennas are depicted as being embedded within a silicon substrate. The TSV antennas are shown as being 9 μm in diameter and 90 μm high (e.g. long). The one or more integrated heat sinks may cover the one or more antennas.

Figures 53, 54:
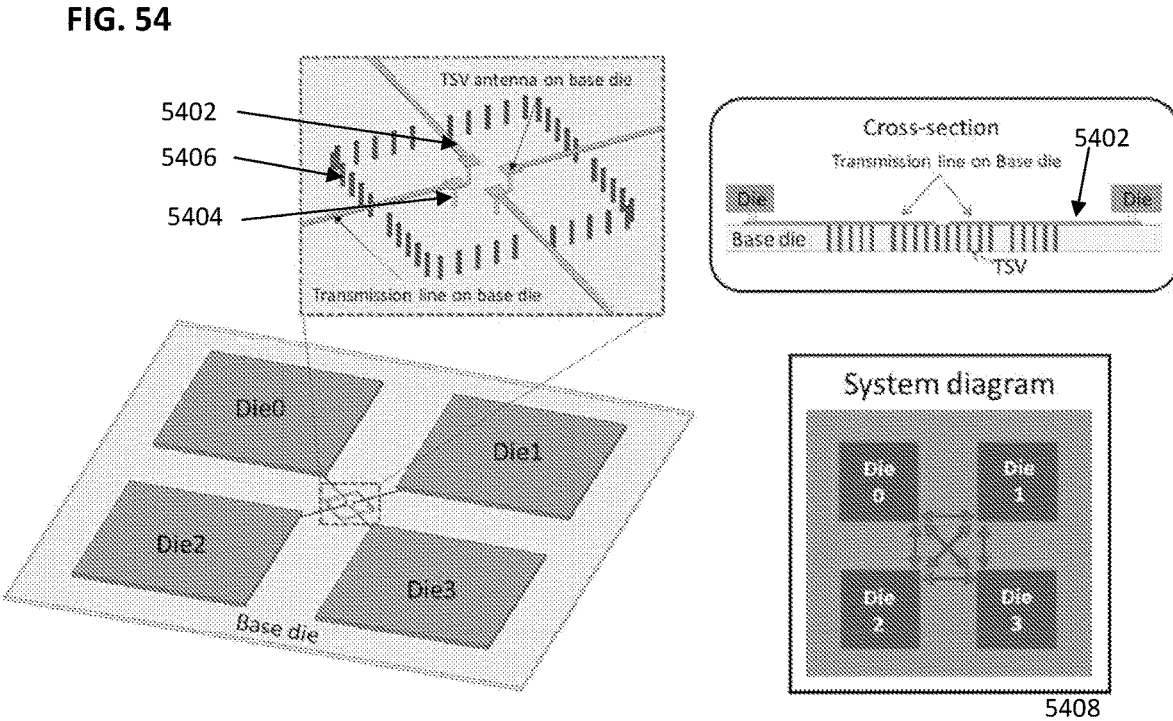
FIG. 53 depicts the implementation of the TSV antenna channel.
FIG. 54 shows an implementation of the TSV antenna channel in the base die.

FIG. 53 depicts the implementation of the TSV antenna channel according to another aspect of the disclosure. In this configuration, a fifth die (labeled here as "die 0") 5302 may create the broadcasting channel for dies 1-4. The fifth die which may be located between dies 1-4, such as at the center of the package. The fifth die 5302 may include a plurality of TSV antennas 5304 as described herein. The fifth die 5302 may include a plurality of TSV reflectors 5306. The TSV reflectors 5306 may be in a pattern around some or all of the TSV antennas 5304 (e.g. surrounding or partially surrounding the TSV antennas). The TSV reflectors 5306 may be configured to reflect electromagnetic radiation toward the one or more antennas 5304, such as to increase signal strength and/or improve SNR. According to an aspect of the disclosure, the configuration described in FIG. 53 may permit an antenna of any one chip to send a wireless signal to an antenna of any other chip. In a four chip scenario (e.g. four transmitting chips and one antenna chip) as depicted in 5308 and 5302, the chips may be able to communicate with adjacent chips and/or obliquely-positioned chips.

FIG. 54 shows an implementation of the TSV antenna channel in the base die, according to an aspect of the disclosure. In this figure, the wireless channel and each of the dies are connected through the transmission lines 5132, which are also created on the base die. One may create the transmission lines on the base die using any known manner (e.g. etching, depositing, etc.). Each of the TSV antennas 5404 may be electrically conductively connected to one of the transmission lines, respectively. One or more TSV reflectors 5406 may surround or partially surround the TSV antennas 5404. These one or more TSV reflectors 5406 may be configured to reflect radiofrequency emissions toward the one or more antennas 5404, such as to increase signal strength or improve SNR. As shown in system diagram 5408, this arrangement permits each die to send a radiofrequency transmission to any or each of the other dies, whether adjacent or obliquely positioned relative to the sending die.

Figure 55:
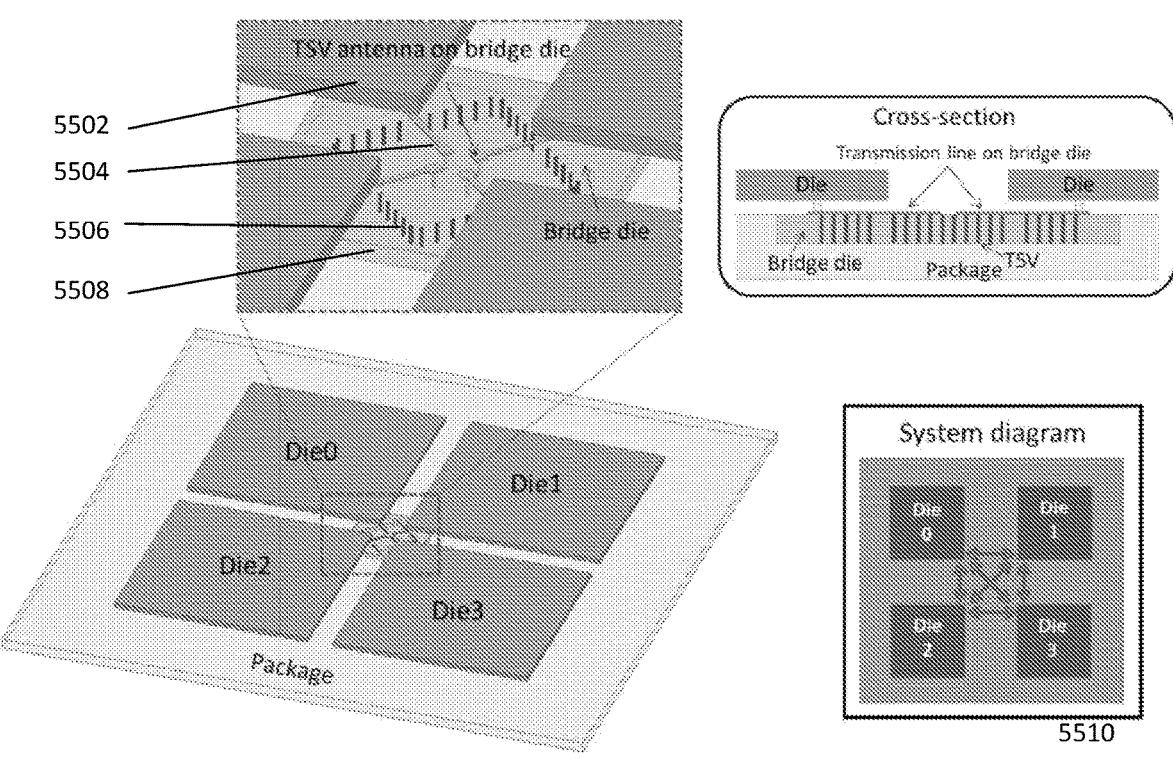
FIG. 55 shows the implementation of the TSV antenna channel in the bridge die.

FIG. 55 shows the implementation of the TSV antenna channel in the bridge die, according to another aspect of the disclosure. In this configuration, the transmitting dies (e.g. the chiplets) 5502 are each connected to a wireless channel via a transmission line 5504. One or more TSV reflectors 5506 may surround or partially surround the antennas of the wireless channel. The one or more TSV reflectors 5506 may be configured to reflect radiofrequency emissions toward the one or more antennas, such as to increase signal strength or improve SNR. The transmission line 5504 may be mounted on the bridge die 5508. According to an aspect of the disclosure, and should it be desired for a given implementation, the bridge die may be multiple bridge dies, fully embedded in the substrate and/or placed in an open substrate cavity with their top surfaces higher than that of substrate. As shown in system diagram 5510, this arrangement permits each die to send a radiofrequency transmission to any or each of the other dies, whether adjacent or obliquely positioned relative to the sending die.

Figure 56:
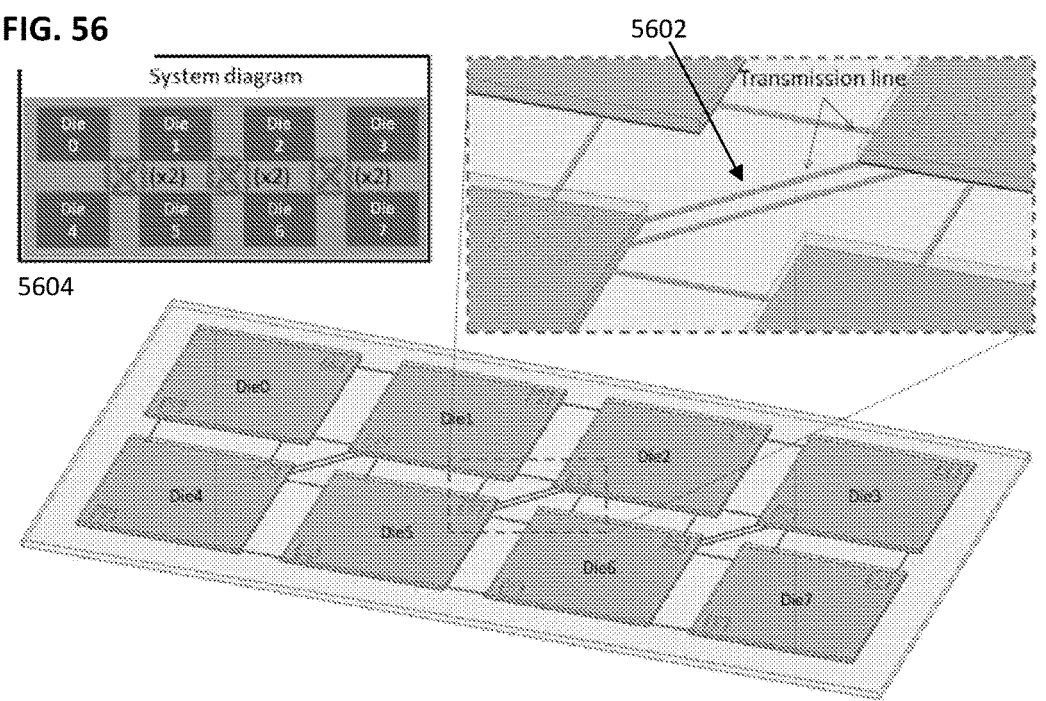
FIG. 56 shows the implementation of multi-stream TSV antenna channels.

FIG. 56 shows the implementation of multi-stream TSV antenna channels, according to another aspect of the disclosure. As shown in this figure, the number of TSV broadcasting channels may be greater or less than the number of channels depicted. These TSV broadcasting channels may be isolated from each other. This topology may be beneficial at least by increasing a number of lines, which may result in enhancing the throughput. In this figure, the additional transmission lines are depicted as 5602. The system diagram 5604 depicts communication being possible from each die to any adjacent die, whether to the left or right, top or bottom, or diagonally/obliquely. The reference to "×2" in the figure indicates a doubling of the transmission line to increate throughput, as disclosed herein.

Figure 57:
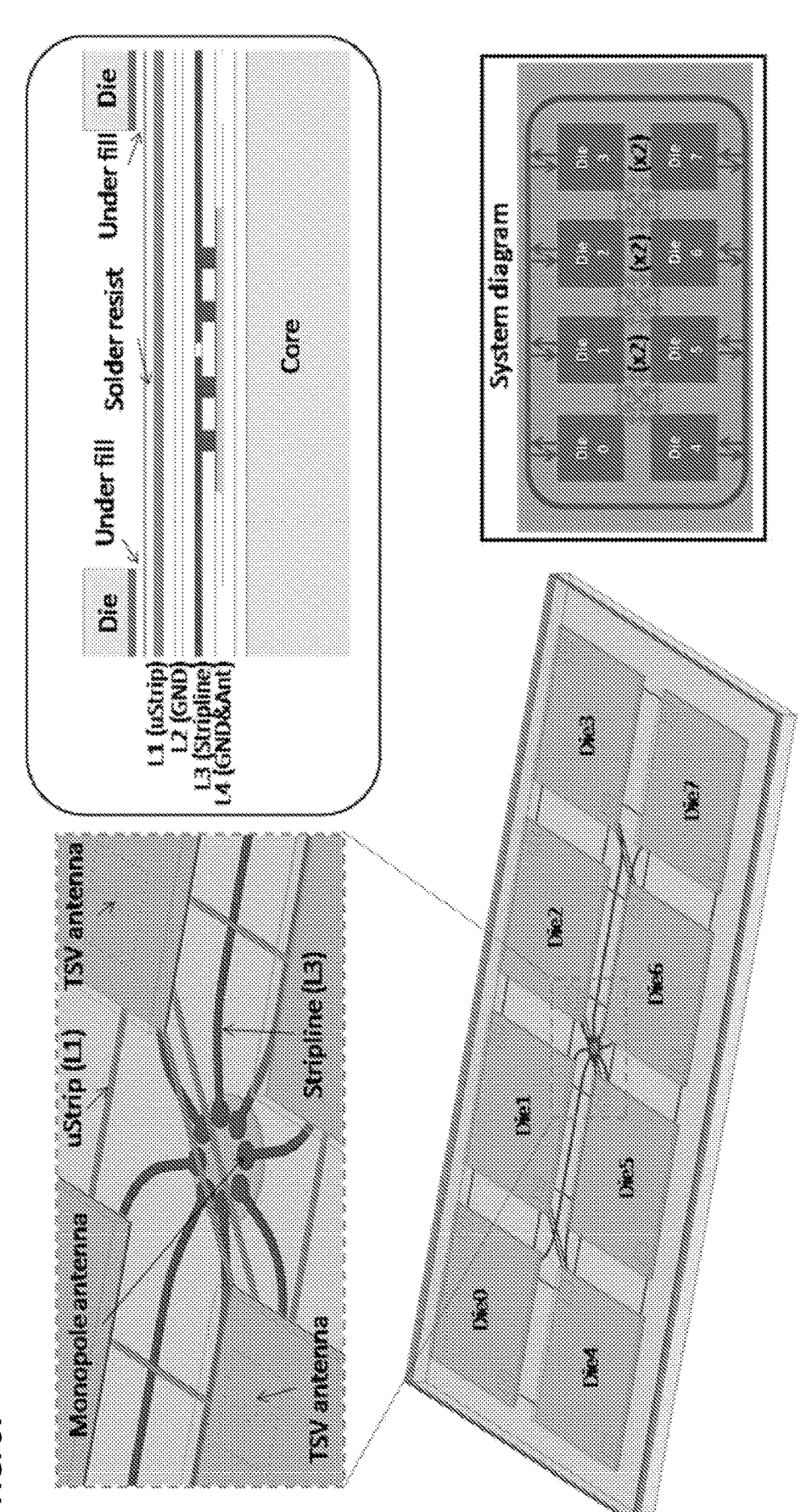
FIG. 57 depicts a multi-lane multi-stream multichip-to-multichip interconnect system architecture.

FIG. 57 depicts a multi-lane multi-stream multichip-to-multichip interconnect system architecture, according to an aspect of the disclosure. By combining the multiple broadcasting channels while maintaining the isolation between each other, this system including channels configured both on the package (e.g., FIGS. 50, 51, and 52) and on the silicon (e.g., FIG. 56) to increase the total number of streams. Given the increased number of lines, this optional configuration may further enhance the throughput and energy efficiency.

This devices and methods disclosed herein may also be applied to data center interconnect applications requiring PCB-to-PCB and rack-to-rack long distance interconnects within certain material medium or over-the-air. For this, waveguides and/or other transmission media can be integrated with antenna elements to enable multipoint-to-multipoint communication scenarios. Current technologies utilizing only embedded transmission media like waveguides, fibers or other Cu-based interconnects cannot generally implement a multipoint-to-multipoint communication architectures efficiently. Nevertheless, optical transmission line links with nano-antennas can use such structures/implementations generate multiport-to-multiport connectivity for data-center type applications.

According to an aspect of the disclosure, the multichip radiofrequency transmission device may include a first chiplet; a first antenna; and a first transmission line, connecting the first antenna to the first chiplet. It may further include a second chiplet; a second antenna; and a second transmission line, connecting the second antenna to the second chiplet. In this manner, the elements of the device may be configured and/or arranged such that a minimum distance between the first chiplet and the second chiplet is greater than a minimum distance between the first antenna and the second antenna.

Although the multichip radiofrequency transmission device is described immediately above in terms of a first chiplets having a first antenna and a second chiplet having a second antenna, the multichip radiofrequency transmission device as described herein may include any number of chiplets and corresponding antennas. For example, as depicted in FIG. 33, the multichip radiofrequency transmission device may include four chiplets and corresponding antennas. The number of chiplets may be greater than or fewer than four. The number of chiplets may be limited only by package space and/or the ability to place multiple corresponding antennas within sufficiently close proximity to one another.

As described herein, the antennas may include or consist of a plurality of vertically stacked vias, according to an aspect of the disclosure. In this manner, the vias may be built-in to one or more aspects of the package to form the antenna structure. Alternatively or additionally, the one or more antennas may include one or more through silicon via (TSV) antennas and/or one or more top-loaded monopole antennas.

As described herein, each of the plurality of chiplets may be connected to one of the plurality of antennas via a transmission line. The transmission lines may be one or more strip lines, one or more microstrips; and/or one or more waveguides. Where one or more waveguides are used, the one or more waveguides may include one or more substrate integrated waveguides.

According to another aspect of the disclosure, a length of one or more of the transmission lines may be variable. In this manner, a die-to-die distance may be adjustable. The distance may any length, limited at least by the available space (e.g., space on the package) and/or the total path loss (e.g., wireless path loss and transmission line path loss).

DP #6

As multichip implementations become more complex, and as demands on multichip processors increase, it will become ever more necessary to design an array architecture with low-complexity, low-power multi-antenna processing to achieve full spatial multiplexing (SM) in Line-of-sight (LOS) wireless chip-to-chip (WC2C) communication to improve aggregated data throughput. Herein are disclosed various transmit/receive schemes for 2×2 MIMO, considering non-linear impairments and phase offsets across antennas. The architecture disclosed herein disjoints the MIMO decoding and per stream equalization to reduce the complexity of receiver.

Chip-to-chip data communication traditionally relies on either metal wires or guided (fiber) optics. In these conventional configurations, multiple wires may connect two chips to increase aggregated data throughput. As described herein, MIMO antenna architecture may enable spatial multiplexing with a fixed low-complexity MIMO precoder/decoder in the context of wireless chip-to-chip connectivity.

Both wires and optics suffer from physical space requirements, poor network configurability, excessive power consumption, and high cost. Wired typologies negatively affect the scalability and flexibility of the connectivity in chiplets. For example, the number of pins that a small chip can have is limited, and this limits the addition of wires to increase data throughput.

In wireless chip-to-chip connectivity, however, the use of a fixed MIMO precoder/decoder may provide more optimal performance with the assumption of a symmetric MIMO channel. However, using this strategy, any phase offset between antennas at transmitter/receiver, or any misalignment in the MIMO channel, could negatively affect the performance of the MIMO receiver.

A low-complexity precoder/decoder is disclosed herein for use with 2×2 MIMO to improve data throughput, such as in Terahertz (THz) wireless chip-to-chip connectivity. Various aspects of this disclosure may compensate impairment and attain more optimal separation of MIMO streams. The proposed MIMO decoder may be before the equalizer.

Wireless connectivity may provide flexibility, which can augment or replace the use of wires for transmissions between chiplets. Aspects of this disclosure enable spatial multiplexing with a low-power receiver, even in the presence of misalignments and impairments.

A key challenge for wireless communication is that the required data rates in existing systems (e.g. wired systems) are already in the hundreds of gigabits per second. Terahertz (THz) wireless communication can produce data rates of several hundreds of Gbits/s, but still single wireless link cannot attain the required data throughput (>500 Gbps) for chip-to-chip.

Impairments and transmitter/receiver misalignment are known to negatively impair MIMO performance.

In chip-to-chip communications, the channel may have a line-of-sight (LOS) characteristic, meaning that at least some of the emitted radiofrequency signal may travel directly between a transmit antenna and one or more receive antennas without first being redirected by an object. In short distances, the spherical-wave model (SWM) is an appropriate channel model, whereas, in a multichip context, the direction of departure (DOD) and the direction of arrival (DOA) are different for each pair of transmit antennas and receive antennas. This property may create a full-rank MIMO channel, in which SM gain equal to a number of antennas can be achieved. To provide a high-rank MIMO channel, where D is the distance between transmitter and receiver, N is number of antenna elements and A is the wavelength, the spacing between antenna elements (d) is:

$$d \geq \sqrt{\frac{D.\lambda}{N}} \, .$$

It is noted that the receiver architecture is not a function of d.

In such short-range LOS set ups, if the transmitter and receiver are aligned, the 2×2 MIMO channel can be modeled as a circulant matrix (symmetric channel):

$$H_{sym} = \begin{bmatrix} h_D & h_x \\ h_x & h_D \end{bmatrix} \tag{1}$$

As a result, eigen beamforming to optimally separate spatial streams at the receiver can be implemented by fixed DFT precoding/decoding at transmitter/receiver. One advantage for an eigen beamforming implementation is that the proposed design disjoints the MIMO stream separation and per stream equalization, thereby helping to reduce the complexity of receiver.

In practice, the following impairments may result in an asymmetric MIMO channel in which DFT precoding/decoding will be suboptimal. Regarding phase offset across antennas, each antenna has a separate Phase-locked loop (PLL). The same clock can be shared across antennas but still there will be a phase offset between antennas at transmitter ($\theta_t$) and/or receiver ($\theta_r$) especially if antennas are not sharing the same PLL. There may be misalignment between transmitter and receiver arrays (e.g., as will be discussed infra with respect to at least FIG. 58). There may be relative displacement of antenna elements. There may be an asymmetric environment, which may include Heterogeneous integration with different sizes of chiplets.

Figure 58:
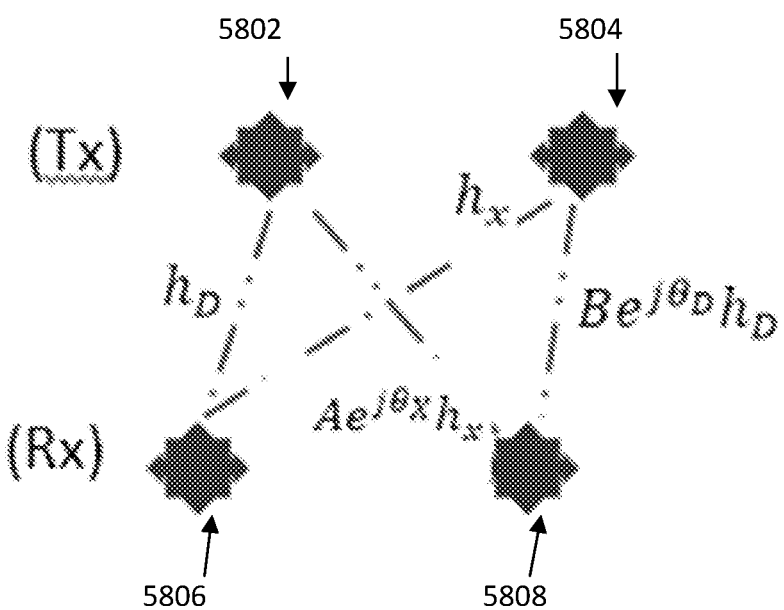
FIG. 58 depicts a MIMO antenna configuration.

FIG. 58 depicts a MIMO antenna configuration, according to an aspect of the disclosure. In this figure, a transmitting device (e.g. a transmitting chiplet) includes two Tx antennas 5802 and 5804. A receiving device (e.g. a receiving chiplet) includes two Rx antennas 5806 and 5808. Ideally a precise, predetermined geometric configuration would be maintained between the Tx and Rx antennas. That is, each of the Tx antennas would be precisely one or more known distances from the Rx antennas. In practice, however, this may not occur. Variations in the geometric configuration may occur due to any of a plurality of reasons including, but not limited to, manufacturing jitter, warping, bending, thermal-mechanical changes, etc.

As a result of these variations in the antenna configuration, the MIMO channel may be asymmetric as follows:

$$H_{equ} = \begin{bmatrix} 1 & 0 \\ 0 & e^{j\theta_r} \end{bmatrix} \left( H_{Asym} = \begin{bmatrix} h_{D1}.e^{-j\theta_{D1}} & h_{x1}.e^{-j\theta_{x1}} \\ h_{x2}.e^{-j\theta_{x2}} & h_{D2}.e^{-j\theta_{D2}} \end{bmatrix} \right) \cdot \begin{bmatrix} 1 & 0 \\ 0 & e^{j\theta_t} \end{bmatrix} \quad (2)$$

The assumption of circulant matrix will not be valid, and fixed DFT precoding/decoding will not be optimal unless it is compensated for.

Equation (2) can be simplified as:

$$H_{equ} = \begin{bmatrix} 1 & 0 \\ 0 & e^{j\theta_{r0}} \end{bmatrix} \begin{bmatrix} h_D & h_x \\ Ae^{j\theta_X} h_X & Be^{j\theta_D} h_D \end{bmatrix} \cdot \begin{bmatrix} 1 & 0 \\ 0 & e^{j\theta_t} \end{bmatrix} \quad (3)$$

$$H_{equ} = \begin{bmatrix} 1 & 0 \\ 0 & B.e^{j\theta_r} \end{bmatrix} \begin{bmatrix} h_D & h_x \\ \frac{A}{B}.e^{j\theta'_X} h_X & h_D \end{bmatrix} \begin{bmatrix} 1 & 0 \\ 0 & e^{j\theta_t} \end{bmatrix} \quad (4)$$

Wherein $\frac{h_{x2}}{h_{x1}} = A, \frac{h_{D2}}{h_{D1}} = B, \theta_{x1} - \theta_{x2} = \theta_X,$ $\theta_{D1} - \theta_{D2} = \theta_D, \theta'_X \triangleq \theta_X - \theta_D, \theta_{r0} \triangleq \theta_r + \theta_D$ By defining the receiver MIMO decoder as:

$$W_R = 1/\sqrt{2} \begin{bmatrix} 1 & 1 \\ 1 & -1 \end{bmatrix} \begin{bmatrix} 1 & 0 \\ 0 & \sqrt{B/A} e^{j\left(-\theta_r - \frac{\theta'_X}{2}\right)} \end{bmatrix} 1/\sqrt{2} = \begin{bmatrix} 1 & w_r \\ 1 & -w_r \end{bmatrix} \quad (5)$$

(The scaler (1/√2) can be ignored, as it will be absorbed in the equalizer after the MIMO decoder.)

The transmitter MIMO precoder may be calculated as:

$$W_T = 1/\sqrt{2} \begin{bmatrix} 1 & 0 \\ 0 & \sqrt{A/B} e^{j\left(-\theta_t + \frac{\theta'_X}{2}\right)} \end{bmatrix} \begin{bmatrix} 1 & 1 \\ 1 & -1 \end{bmatrix} = 1/\sqrt{2} \begin{bmatrix} 1 & 1 \\ w_t & -w_t \end{bmatrix} \quad (6)$$

Where: $w_r = \sqrt{B/A} e^{j\left(-\theta_r - \frac{\theta'_X}{2}\right)}, w_t = \sqrt{A/B} e^{j\left(-\theta_t + \frac{\theta'_X}{2}\right)} \quad (7)$ It can be shown that:

$$\quad (8)$$

$W_R \cdot H_{equ} \cdot W_T =$ $$\underbrace{\begin{bmatrix} 1 & 1 \\ 1 & -1 \end{bmatrix} \begin{bmatrix} 1 & 0 \\ 1 & \sqrt{B/A} e^{j\left(-\theta_r - \frac{\theta'_X}{2}\right)} \end{bmatrix}}_{Receiver\ detector} \underbrace{\begin{bmatrix} 1 & 0 \\ 0 & e^{j\theta_r} \end{bmatrix}}_{Receiver\ RF\ impairment} \underbrace{\begin{bmatrix} h_D & h_X \\ A/B e^{j\theta'_X} h_X & h_D \end{bmatrix}}_{channel} \underbrace{\begin{bmatrix} 1 & 0 \\ 0 & e^{j\theta_t} \end{bmatrix}}_{Transmitter\ RF\ impairment}$$

-continued $$\underbrace{\begin{bmatrix} 1 & 0 \\ 1 & \sqrt{B/A} e^{j\left(-\theta_r - \frac{\theta'_X}{2}\right)} \end{bmatrix} \begin{bmatrix} 1 & 1 \\ 1 & -1 \end{bmatrix}}_{Transmitter\ precoder} =$$

$$\begin{bmatrix} h_D + h_X \sqrt{A/B} e^{j\left(\frac{\theta'_X}{2}\right)} & 0 \\ 0 & h_D - h_X \sqrt{A/B} e^{j\left(\frac{\theta'_X}{2}\right)} \end{bmatrix}$$

Thus, in the presence of phase offsets and an asymmetric channel (e.g., manufacturing jitters), applying DFT MIMO precoding/decoding, one complex weight is also required at both the transmitter ($w_t$) and the receiver ($w_r$) to calibrate and compensate the amplitude and phase jitters so that spatial streams may be optimally separated in the receiver (see diagonal matrix in equation-8).

Figure 59:
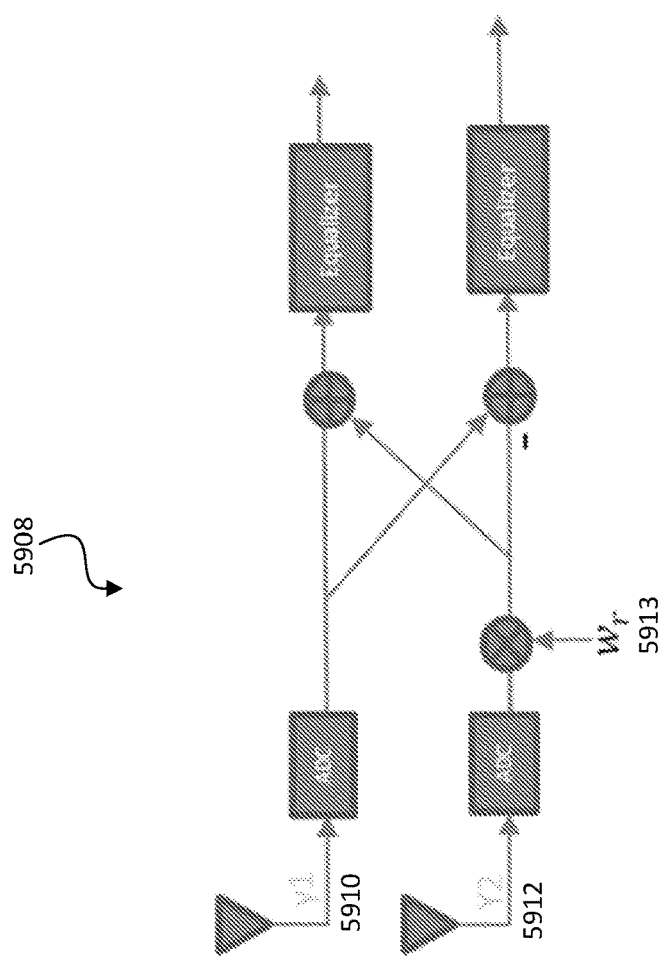
FIG. 59 depicts a MIMO precoder/decoder.
Figure 59:
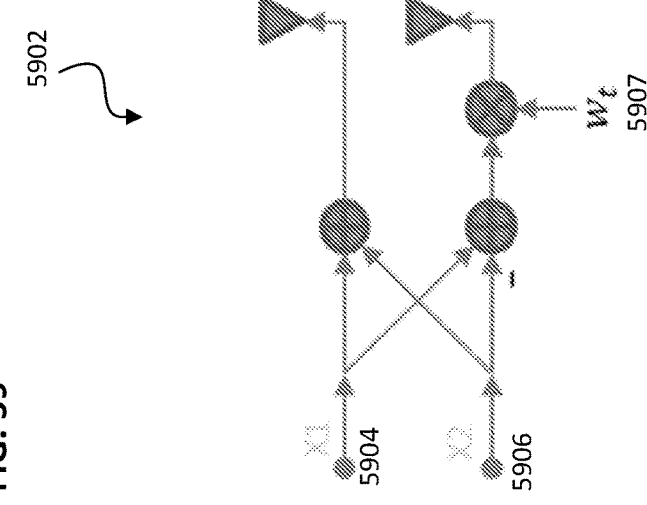

FIG. 59 depicts a MIMO precoder/decoder, according to an aspect of the disclosure. In this figure, a MIMO channel including a transmit portion 5902 and a receive portion 5908 is depicted. The transmit portion 5902 includes a first transmit feed 5904 with a first transmit signal (x1) and a second transmit feed 5906 with a second transmit signal (x2). The transmit portion may sum transmit signals x1 and x2 and weight the summing output on the second feed 5906 (as seen in 5907). The first feed 59040 may output x1 as added with x2, and the second feed 5906 may output the weighted sum of x1 and x2. The receive portion 5908 includes a first receive feed 5910 with a first receive signal (y1) and a second receive feed 5912 with a second receive signal (y2). The decoder may sum receive signals y1 and y2 and weight and the summing output on the second feed 5912 (as shown by 5913). The first feed 5910 may output y1 as added with y2 to an equalizer, and the second feed 5912 may output the weighted sum of y1 and y2 to an equalizer. In this method, the precoder/decoder may compensate for inter-symbol interference (ISI) and RF impairments per stream.

A first procedure for MIMO Precoder and Decoder to calibrate impairments is now described:

In light of the foregoing, the following procedure may calculate $w_t$ and $w_r$ (equation 7), in FIG. 59:

First, one or more processors may cause the Tx antennas to transmit the same training symbols without precoding. This is the same as considering the case ($x_2$=0) and performing precoding. The receiver may measure the power of the received signals in both antennas before MIMO decoding. The complex weight w t may be defined (e.g., through an exhaustive search over possible options) such that the received power at both antennas is equal. One or more processors may control the antennas to send the index for an optimum w t back from the receiver to the transmitter, such as through a backchannel. The following demonstrates the procedure:

$$\begin{bmatrix} y1 \\ y2 \end{bmatrix} = \begin{bmatrix} h_D & h_x \\ e^{j\theta_X} h_X & e^{j\theta_D} h_D \end{bmatrix} \begin{bmatrix} S1 \\ S1 \cdot e^{j\theta_t} \cdot w_t \end{bmatrix} \quad (9)$$

$$\begin{bmatrix} y1 \\ y2 \end{bmatrix} = \begin{bmatrix} h_D & h_x \\ e^{j\theta_X} h_X & e^{j\theta_D} h_D \end{bmatrix} \begin{bmatrix} S1 \\ S1 \cdot e^{j\theta_t} \cdot w_t \end{bmatrix} \quad (10)$$

$$y1 = s1\left(h_D + h_X \cdot e^{j\theta_t} \cdot w_t\right) \quad (11)$$

$$y2 = s1 e^{j\theta_D} e^{j(\theta_X - \theta_D)/2} \cdot \left(e^{j(\theta_D - \theta_X)/2} h_D e^{j\theta_t} w_t + e^{j(\theta_X - \theta_D)/2} h_X\right) \quad (12)$$

$$w_t = e^{j\left(-\theta_t + \frac{\theta'_X}{2}\right)}, \theta'_X \triangleq \theta_X - \theta_D \quad (13)$$

Second, two spatial streams are sent using the MIMO precoder. The one or more processors may control the transmit antennas to transmit different symbols. In this manner, the one or more processors may adjust $w_r$. The complex weight $w_r$ may be defined through the joint training with the equalizer. For example, if a linear-mean-squared (LMS) training is used to adjust equalizer taps, then $w_r$ may also be jointly optimized to minimize the error at the receiver chains.

The transmit powers for two symbols can be defined through water filling. After defining $w_r$, $w_r$, the average power (root-mean-square value) of the signals, after MIMO decoder, are measured as $r_1$, $r_2$. The power coefficients at the transmitter may be calculated as follows:

$$k1 = 1/r_1, \quad k2 = 1/r_2 \tag{14}$$

$$c1 = k1/\sqrt{k1^2 + k2^2}, \quad c2 = k2/\sqrt{k1^2 + k2^2} \tag{15}$$

wherein c1 and c2 are feedback to the transmitter. The data symbols are weighted by c1 and c2 before applying the precoder. Before obtaining c1, c2, c1=c2=1/√2 is set as in equation (6).

According to an aspect of the disclosure, one reason for misalignment of the transmitting antennas and receive antennas may be due to factory miscalibration/misalignment. Such misalignment of the transmitter and/or receiver may result in an asymmetric channel, which may result in a static impairment and can be calibrated in the factory as follows: (1) Loop on transmit antennas: One transmitter is ON and others are OFF; (2) Send low-rate stream; (3) Determine magnitude and phase on each receive channel; and (4) Record amplitude and phase jitters "A, B, $\theta_X$, $\theta_D$".

In such short ranges of WC2C, it is possible that A~1, B~1. If a factory calibration is performed, the above steps may function to compensate phase offsets at the transmitter and the receiver ($\theta_r$, $\theta_r$). The details of optimization for this scenario are shown infra.

According to an aspect of the disclosure, the principles and devices disclosed above for spatial multiplexing with asymmetric MIMO channel for WC2C connectivity may be implemented as an MCM including a chiplet, wherein the chiplet includes a first receive antenna; and a second receive antenna; one or more receivers, configured to receive a combined wireless transmission on the first receive antenna and the second receive antenna, wherein the combined wireless transmission represents a first wireless transmission transmitted by a first transmit antenna and a second wireless transmission, different from the first wireless transmission, transmitted by a second transmit antenna; decode the combined wireless transmission according to one or more predefined decoding parameters to determine the first wireless transmission and the second wireless transmission from the combined wireless transmission; and send the decoded first wireless transmission to an equalizer and the decoded second wireless transmission to an equalizer.

Decoding the combined wireless transmission may include applying a predetermined weight to at least one of the combined wireless transmission as received on the first receive antenna or the combined wireless transmission as received on the second receive antenna. The predetermined weight may be an adaptive complex weight. The predetermined weight may be based on a spatial relationship between the first transmit antenna and the second transmit antenna relative to the first receive antenna and the second receive antenna. According to an aspect of the disclosure, the predetermined weight may represent a phase shift between one of the first transmit antenna or the second transmit antenna and one of the first receive antenna or the second receive antenna.

The MCM may include one or more equalizing circuits, wherein the one or more equalizing circuits may be configured to receive the decoded first wireless transmission and the decoded second wireless transmission and to modify the decoded first wireless transmission and the decoded second wireless transmission according to one or more equalization parameters. This modifying the decoded first wireless transmission and the decoded second wireless transmission according to the one or more equalization parameters may include reducing inter-symbol interference and/or performing at least one of a precursor equalization operation or a postcursor equalization operation.

As described above, the MCM may be configured to perform a training operation. The training operation may include receiving a first training transmission as transmitted by a first transmit antenna on at least the first radiofrequency antenna or the second radiofrequency antenna; and determining a first receive training parameter based on the first training transmission. According to an aspect of the disclosure, the first receive training parameter is a first receiver weight. In some configurations, the MCM may be further configured to receive a second training transmission as transmitted by the first transmit antenna on at least the first radiofrequency antenna or the second radiofrequency antenna; determine a first signal parameter of the received first training transmission and a second signal parameter of the received second training transmission; and transmit data representing an index for either the first training transmission or the second training transmission based on at least one of the first signal parameter or the second signal parameter. According to an aspect of the disclosure, the first signal parameter and the second signal parameter include signal strength.

As described herein, the MCM may utilize an adaptive complex weight at the receiver, which may permit the MCM to compensate phase offset and/or asymmetric properties of channel. The complex weight may be utilized at the transmitter, such that the receiver may then compensate for amplitude/phase offsets across the MIMO channels based on the adaptive complex weight. The receiver may be configured to determine the adaptive complex weight during the one or more training operations. Upon determining the adaptive complex weight, the receiver may be configured to send (e.g., non-wirelessly or through one or more back channels) to the transmitter the adaptive complex weight.
DP #5

According to another aspect of the disclosure, an array architecture with low-complexity multi-antenna-processing may be used to achieve full spatial multiplexing (SM) in Line-of-sight (LOS) channels for wireless chip-to-chip (WC2C) connectivity. The array architecture as disclosed herein may increase aggregated data throughput to meet the required high data rates for WC2C while maintaining low power receiver processing.

In-package data communication (e.g., communication between chips, chiplets, etc.) for in-package or package-to-package communication have conventionally relied on metal wires or guided (fiber) optics. In such configurations, multiple wires (e.g. metal or guided optic wires) are used to connect two chips to increase aggregated data throughput. Although some level of multichip communication is possible with these conventional methods, both wires and optics are associated with multiple disadvantages, such as the limited physical space of a multichip configuration, challenges regarding network configurability, excessive or undesirable power consumption, assembly cost, airflow, service time, and overall cost. Furthermore, the number of pins that a small chip package can have is limited. Such wired typologies may negatively affect the scalability and flexibility of the connectivity in chiplets, since the number of pins that can be placed on a small chip is limited, and this in turn limits the addition of wires to increase data throughput.

Integration of wireless transceivers and antennas into the chip package may provide communication bandwidth without the need for (as many) pins or optical connectors to the chip package. Such use of wireless transceivers may also leverage multicast/broadcast capability to reduce latency by providing direct communication from one chip to another. A key challenge for wireless communication is that the required data rates in existing systems are already in the hundreds of gigabits per second. To meet these needs, and to plan for the more demanding needs that will inevitably arise in the future, it is proposed to use Terahertz (THz) wireless communication for wireless chip-to-chip communication. Such Terahertz wireless communication has at least two key advantages that can be combined to achieve the required data rates. First, the usable frequency band around each frequency is much larger, so each channel can have a much higher data rate. This alone can increase data rates to several hundreds of Gbits/s; nevertheless, single wireless links cannot attain the current required data throughput (>500 Gbps), let alone the anticipated throughput needs in future implementations. Achieving such high data rates will inevitably require MIMO antennas. The devices and methods disclosed herein include a fixed MIMO precoder and decoder that can be implemented with a low-power transceiver to achieve the necessary data rates with the space and power restrictions of a multichip environment. These devices and methods enable spatial multiplexing even in a LOS channel. Such spatial multiplexing may operate with a fixed MIMO decoder without the need for complex MIMO processing, which may significantly increase data throughput. Furthermore, THz frequencies allow for smaller antennas and antenna spacing, which may provides for more MIMO channels within the same array aperture.

In chip-to-chip communication, the channel may be created with a line-of-sight (LOS) characteristic. In conventional MIMO channels, the degrees of freedom for LOS channels are known to be one, and therefore there is conventionally no spatial multiplexing (SM) gain. This is likely to have been understood as a rationale against LOS MIMO configurations in a multichip context. In short distances, however, such as where the transceiver distance is comparable with the size of the array aperture, this assumption no longer holds true. In such short distances, the spherical-wave model (SWM) is a more appropriate channel model, in which the direction of departure (DOD) and direction of arrival (DOA) are different for each pair of transmit and receive antenna. This property may be used to create a full-rank MIMO channel where SM gain equaling the number of antennas can be achieved.

In this short-range scenario, the placement of the Tx/Rx antennas and the transmission scheme should be jointly optimized subject to the given wavelength and the link distance. The Rayleigh distance, $D_R$, is defined as the approximate "border" between the near-field and the far-field zone. If the communication range, D (distance between transmitter and receiver) is much larger than the Rayleigh distance $D \ll D_R$, there can be no multiplexing gain. Rayleigh distance may be defined as $$D_R = \frac{d_T \cdot d_R \cdot N}{\lambda} \tag{16}$$

Where $d_T$ ($d_R$)=distance between Transmit (Receive) elements; N=number of antenna elements; and $\lambda$=Wavelength.

For a given link distance of D, the distance between antennas at transmitter/receiver is designed such that:

$$d_T \cdot d_R >= \frac{D \cdot \lambda}{N} \tag{17}$$

Figure 60:
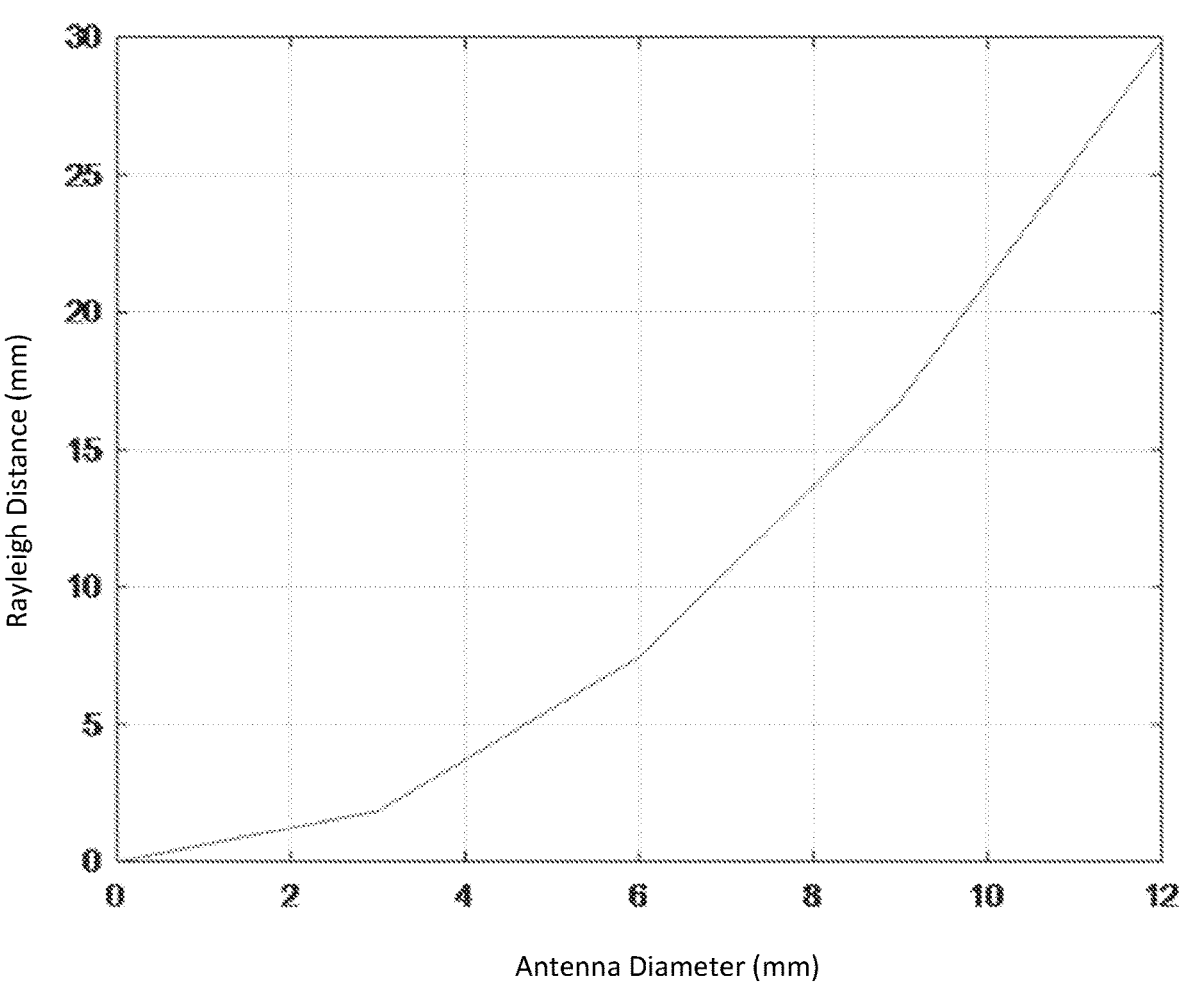
FIG. 60 depicts a plot of the Rayleigh distance versus antenna distance.

FIG. 60 depicts a plot of the Rayleigh distance versus antenna distance for a frequency $f_c$=140 GHz ($\lambda$=2.14 mm), assuming $d_T$=$d_R$. From the figure, it is apparent that, for this frequency, the antenna diameter in mm is roughly equivalent to the Rayleigh distance in mm for small diameters; however, as the antenna diameter increases, it corresponds with a non-linear and comparatively larger increase in the Rayleigh distance.

In light of the foregoing, it is desired to design an antenna architecture for wireless chip-to-chip communication that may meet the throughput requirements described herein. It is proposed to determine a distance between antennas within an array (e.g. distance between transmitting antennas or the distance between receiving antennas) as a calculation of the number of the antennas, between the Tx antenna array and the Rx antenna array, and the wavelength as follows:

$$d \geq \sqrt{\frac{\lambda D}{N}} \tag{18}$$

wherein N is the number of antennas; A is the wavelength; and D is the distance between antenna arrays.

By way of example, assuming that a number of antennas, N=2, a distance of 1 mm between the Tx antenna array and the Rx antenna array, and a frequency of $f_c$=140 GHz ($\lambda$=2.14 mm), the minimum distance between antennas of a given array (e.g., Rx or Tx) can be calculated as:

$$d \geq \sqrt{\frac{\lambda D}{N}} = 1.04 \text{ mm} \tag{19}$$

For two-antennas, the elements at each side may be placed, for example, 1.2 mm apart from one another to guarantee full SM gain. For the full-rank channel, Singular-Value-Decomposition (SVD) results in optimal performance in the separation of different spatial streams at the receiver with no inter-symbol interference. This requires that channel estimation take place at the receiver and performing SVD and feedback of the optimal precoder data to the transmitter. In a conventional OFDM system, this is conventionally performed per-carrier; however, according to an aspect of the disclosure, and to maintain low power consumption, OFDM modulation may not be used. Instead, a wideband precoder may be utilized.

When antennas at the transmitter/receiver are aligned, the channel matrix is circulant and SVD results in a fixed precoder/decoder that is not dependent on the channel. FIG.

Figure 61:
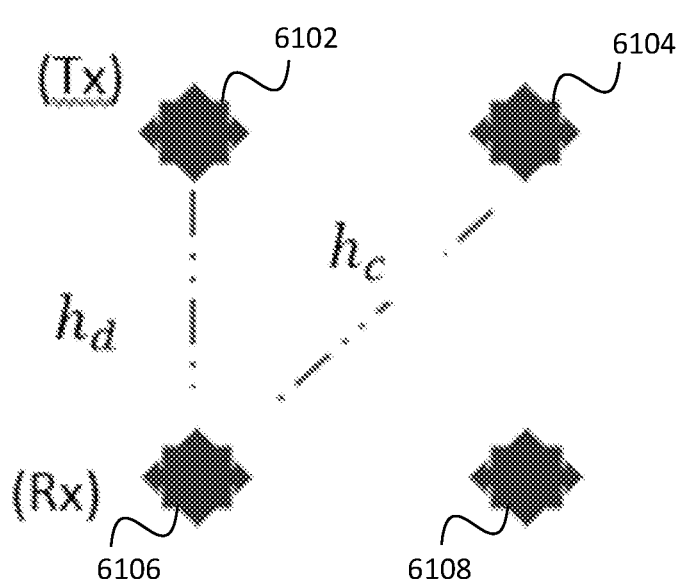
FIG. 61 depicts a 2×2 MIMO configuration including two transmit antennas.

61 depicts a 2×2 MIMO configuration including two transmit antennas 6102 and 6104, and two receive antennas 6106 and 6108. In FIG. 61, the channel matrix between these antennas can be modeled as:

$$H = \begin{bmatrix} h_d & h_c \\ h_c & h_d \end{bmatrix} \quad (20)$$

The MIMO precoder and decoder may be defined as a 2×2 DFT matrix, such that:

$$W = 1/\sqrt{2} \cdot \begin{pmatrix} 1 & 1 \\ 1 & -1 \end{pmatrix} \quad (21)$$

wherein W'.H.W is a diagonal matrix.

Figures 62, 63:
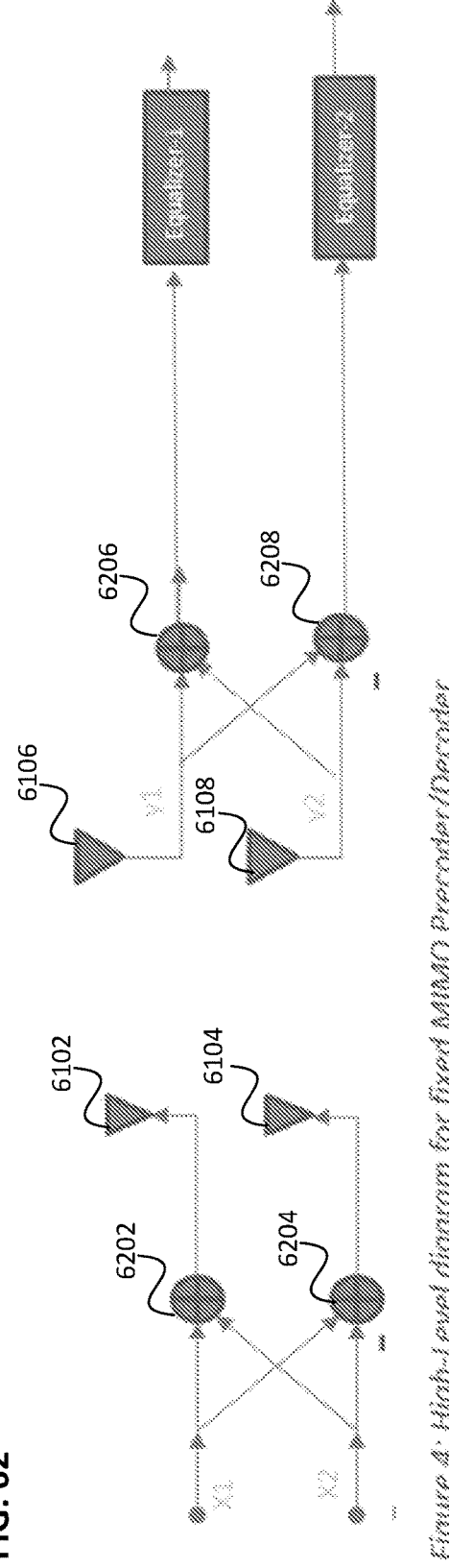
FIG. 62 depicts a MIMO architecture, including a MIMO precoder and decoder.
FIG. 63 depicts an array of two 2-element sub-arrays.

FIG. 62 depicts a MIMO architecture, including a MIMO precoder and decoder, according to an aspect of the disclosure. As shown in FIG. 62, the MIMO decoding is performed prior to the signal reaching the equalizer. In this figure, transmit antennas 6102 and 6104 are configured to transmit wireless signals to receive antennas 6106 and 6108. On the transmit side, signals x1 and x2 are direct summed at element 6202, and an inverse direct sum is taken at 6204. Each of receive antennas 6106 and 6108 receive the signals from transmit antennas 6102 and 6104, the signal received on 6106 being depicted here as y1 and the signal received on 6108 being depicted here as y2, for demonstrative purposes. As depicted, y1 and y2 are direct summed at element 6206, and an inverse direct sum is taken at 6208. The output of element 6206 is sent to a first equalizer, and the output of element 6208 is sent to a second equalizer. That is, the spatial streams are separated before applying channel equalizer over each chain.

In the following, two options will be discussed for a configuration having four transmit antennas and four receive antennas. For the purposes of formula (18), the number of antennas (N) is 4; the distance between transmitting antenna array and receiving antenna array is 1 mm; and the frequency is $f_c$=140 GHz (λ=2.14 mm).

According to an aspect of the disclosure, a first implementation under the above conditions is as follows:

$$d \geq \sqrt{\frac{\lambda D}{N}} = 0.73 \text{ mm} \quad (22)$$

For four-antennas, the elements at each side may be placed 0.8 mm apart (placement>d) to guarantee full SM gain. The chip may be, for example, 4×4 (mm) and can accommodate 4 elements with a 0.8 mm distance. In light of the foregoing, the MIMO precoder may be defined as a 4×4 DFT matrix, such that $$W = 1/2 \cdot \begin{bmatrix} 1 & 1 & 1 & 1 \\ 1 & -1 & 1 & -1 \\ 1 & 1 & -1 & -1 \\ 1 & -1 & -1 & 1 \end{bmatrix} \quad (23)$$

for a 4-antenna channel, and with a DFT MIMO precoder, there is expected to be minor inter-symbol interference that can be cancelled at the receiver.

According to another aspect of the disclosure, a second implementation under the above conditions is as follows. An array of two 2-element sub-arrays is proposed as shown in FIG. 63. The distance between elements in each sub-array may be <λ/2, and the distance between the two sub-arrays follows the design for two-antennas, as in formula (18). The two spatial streams may be transmitted with a MIMO precoder as:

$$W = \frac{1}{\sqrt{2}} * \begin{bmatrix} 1 & 1 \\ 1 & 1 \\ 1 & -1 \\ 1 & -1 \end{bmatrix}$$

According to this aspect of the disclosure, this antenna implementation is expected to realize an SM gain of two, plus an array gain of 3 dB, which may further improve the link budget. In this configuration, there is expected to be zero inter-symbol interference at the receiver. Accordingly, it is not necessary to implement strategies for interference cancellation, whether before the equalizer or after the equalizer.

The principles and methods disclosed herein may be implemented as a multichip package, which may include a first chiplet, including a radio circuitry; a plurality of receive antennas, connected to the radio circuitry, and configured to receive a line of sight wireless signal transmitted from a plurality of transmit antennas of a second chiplet at a predetermined wavelength; wherein a distance between each of the plurality of receive antennas and a neighboring antenna of the plurality of receive antennas is greater than a predetermined minimum distance; and wherein the predetermined minimum distance is determined from a function that includes at least the predetermined wavelength.

As described above, the predetermined minimum distance may be calculated from a function including at least the predetermined wavelength and either a total number of receive antennas in the plurality of receive antennas or a total number of transmit antennas in the total number of transmit antennas. In this manner, a distance between each antenna of the plurality of transmit antennas and a neighboring antenna of the plurality of transmit antennas may be equal to a distance between each antenna of the plurality of receive antennas and a neighboring antenna of the plurality of receive antennas.

According to another aspect of the disclosure, the predetermined minimum distance may be calculated as $$\sqrt{\frac{D\lambda}{N}},$$

wherein D is a distance between any of the plurality of transmit antennas and any of the plurality of receive antennas; λ is the predetermined wavelength; and N is a total number of transmit antennas in the plurality of transmit antennas or a total number of receive antennas in the plurality of receive antennas.

The above multichip package may be configured as a multichip system, wherein the multichip system may include a first chiplet, the first chiplet including a first radio circuitry; and a plurality of transmit antennas, connected to the first radio circuitry, and configured to transmit a line of sight wireless signal at a predetermined wavelength; and may also include a second chiplet including a second radio circuitry;

and a plurality of receive antennas, connected to the second radio circuitry, and configured to receive a line of sight wireless signal at the predetermined wavelength; wherein a distance between each of the plurality of transmit antennas relative to a neighboring antenna of the plurality of transmit antennas and a distance between each of the plurality of receive antennas relative to a neighboring antenna of the plurality of receive antennas is greater than a predetermined minimum distance; and wherein the predetermined minimum distance is calculated from a function including at least the predetermined wavelength.

The principles and methods disclosed herein may be implemented as one or more wireless transmission precoders and/or one or more wireless transmission decoders. With respect to the precoder, the precoder may be configured within the context of a chiplet. In this manner, the chiplet may include an antenna array, including a first transmit antenna and a second transmit antenna and a wireless transmission precoder. The precoder may include a precoding circuit, configured to receive a first signal, representing first data for wireless transmission; receive a second signal, representing second data for wireless transmission; generate a first precoded signal as a direct sum of the first signal and the second signal; generate a second precoded signal as an inverse of the direct sum of the first signal and the second signal; and send the first precoded signal on the first transmit antenna and the second precoded signal on the second transmit antenna. The precoder may perform any of the above using one or more processors, which may be part of the precoder.

According to an aspect of the disclosure, the precluding circuit may receive the above-described first signal and second signal from one or more equalizers. The precoding circuit may be configured to perform a line of sight transmission to a decoding circuit. In this manner, the pre-coding circuit and the decoding circuit may be able to utilize the above-described principles and methods for spatial multiplexing gain in the context of a line of sight transmission.

As stated above, the principles and methods described herein may be implemented as chiplets that may include a receiver and a decoding circuit. The receiver may include an antenna array, including a first receive antenna and a second receive antenna; the decoding circuit may be configured to receive a first wireless signal on the first receive antenna, wherein the first wireless signal includes a first precoded signal and a second precoded signal; receive a second wireless signal on the second receive antenna, wherein the second wireless signal includes the first precoded signal and the second precoded signal; generate a first decoded signal as a direct sum of the first wireless signal and the second wireless signal; and generate a second decoded signal as an inverse of the direct sum of the first wireless signal and the second wireless signal.

According to an aspect of the disclosure, the decoding circuit may be further configured to send the first decoded signal and the second decoded signal to one or more equalizers.

DP #16

Throughout this disclosure, various techniques and implementations for inter alia wireless transmission for chip-to-chip transmissions in a multichip context. Many or all of these techniques and implementations rely on one or more transmission line structures to transfer a signal from e.g., one or more transceivers to one or more antennas. A primary impediment in developing THz circuits for communication between chiplets is the issue of how to integrate or build these transmission line structures (e.g. transmission lines, antenna lines, waveguides, etc.). Given the high frequency operation, it is paramount that the antenna structures are placed very close to circuitry, which may require that the antennas are on the same package as the relevant circuitry. However simple placement of these elements on the circuitry tends to increase the package size (e.g., package height, package width, and/or package length). For example, D-band air waveguides may be 1.8 mm by 0.6 mm, and it is not generally possible to directly place a D-band air waveguide on the package substrate without an increase in the overall package height.

Prior efforts to place transmission lines for multichip communication have included the use of package traces, interposers, and/or embedded silicon bridges to form communication links between chiplets; using package level interconnects and PCB traces to form communication links between chiplets; or directly placing waveguide elements on the packages. Such efforts have yielded suboptimal results. Such strategies tend to be inflexible, due at least to physical wiring limitations. Moreover, problems related to power consumption and signal integrity may render PCB tracing for package to package communications for high data rates rather challenging to implement. Regarding photonic package to package communications, such strategies require specialized circuits, optical fibers, and complex fiber alignment techniques that in turn increase package cost and complexity. Finally, as stated above, directly placing the antenna or waveguide elements on the package increases package size. Rather, by building these structures partially or wholly into the package, closer placement with respect to the circuit excitation source point can be obtained. Moreover, direct integration of these structures enables smaller form factor in the resulting packages. Using cavities formed in the organic package also increases flexibility, such as by using techniques that not available with organic package processes.

Herein are described devices and method for including transmission lines for chip-to-chip communication with reduced or no increase in package size. These may include creating a physical or virtual cavity in one or more organic packages and leveraging the package process technologies to form these antenna/waveguide elements as part of the package, and/or allowing externally built elements to be integrated into an organic package. Such integration techniques may be to enable high frequency communication links between Sub-THz circuits, whether located on the same package or on different packages, wherein the antenna/waveguide elements are fully or partially built-in to the organic package.

As a general principle, cavities in the package can be formed using two main procedures: (1) virtual or additive, or (2) physical or subtractive. With respect to the virtual or additive procedure, layers with gaps or holes may be added up (e.g. layered, accumulated, placed on one another) to form a cavity. For example, organic substrate layers may be built on top of a high density interposer board to form a cavity. For the physical or subtractive procedure, a cavity may be hollowed out by machine or chemical means. For example machining, etching, and/or releasing sacrificial layers can be used to remove material from an organic substrate to form a cavity Antennas may be formed by placing microbumps between the silicon die and the package substrate; however, for vertically polarized antennas, these microbumps may not be tall enough to form an optimal antenna element. Where additional antenna height is desired or required, an open cavity approach (e.g., creating an open cavity to accommodate an antenna of greater height) can permit an extended antenna length to fit the optimal height for the operating antenna frequency.

Figure 64:
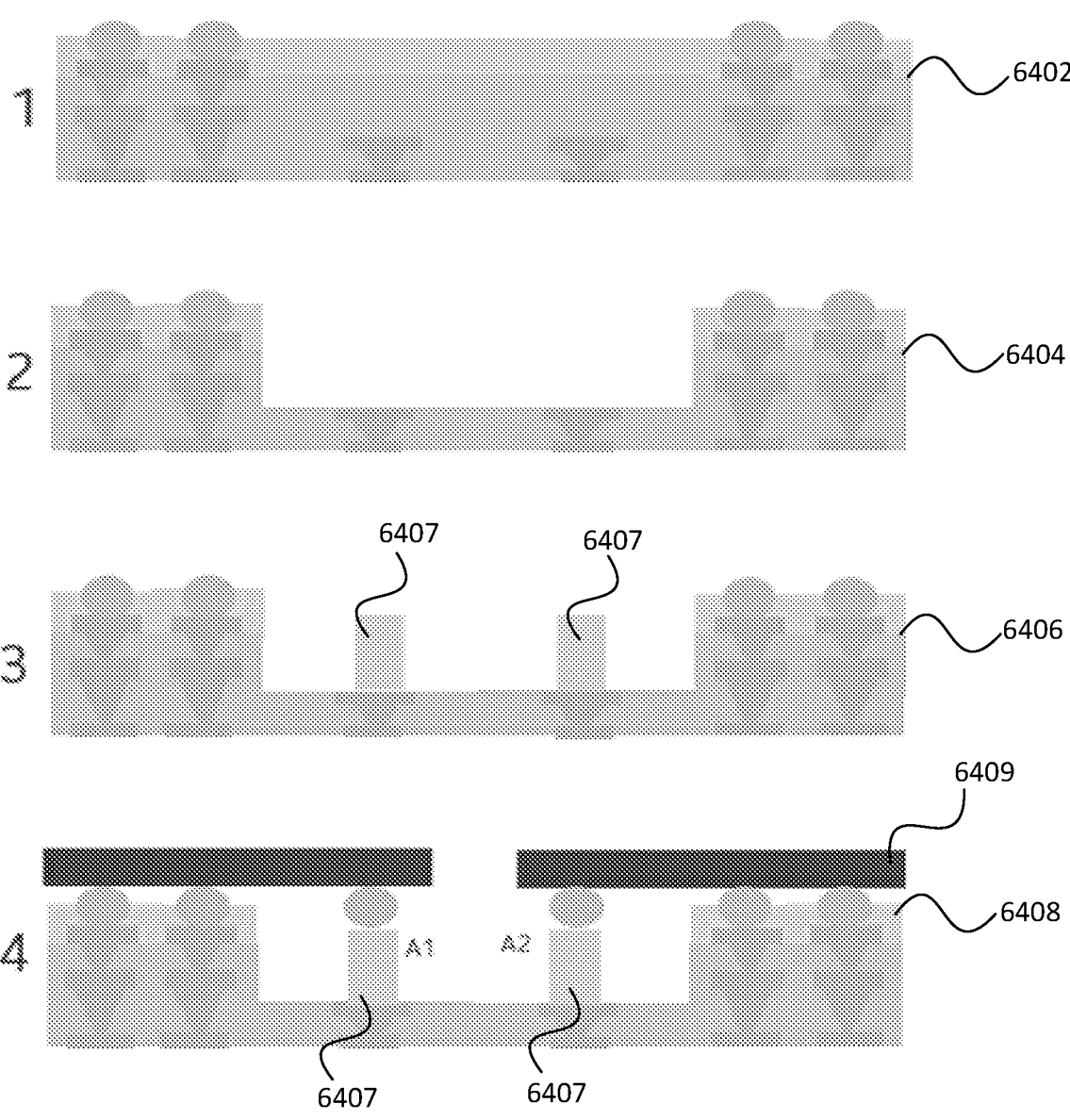
FIG. 64 depicts the formation and integration of an antenna in an organic package.

FIG. 64 depicts the formation and integration of an antenna in an organic package, according to an aspect of the disclosure. Using an organic package (e.g. an organic printed circuit board) e.g., as depicted in 6402, a cavity may be formed as depicted in 6404, and one or more antenna elements may be placed or grown in-situ 6408. As shown in 6408, a die 6409 may be placed over these antenna elements 6407. Using this strategy, it can be ensured that a space between the antennas 6407 (e.g. the channel) is free of metallic structures. In contrast, if these antenna extensions were to be formed using standard organic package processes, the space between the antennas would need to contain at least some amount of metal for organic package manufacturability. Obviously it may desirable to reduce any unnecessary metal between the package antennas. It is noted that the antenna feed structures and source may be either internal to the die external to the die (e.g. using a redistribution layer, RDL).

Antenna elements inside the cavity can be fabricated by any of multiple methods. One such method is to grow the antenna(s) as metallic structure(s), such as copper pillars from the pads located at the bottom surface of the cavity. Such growing of the metallic structures may use any procedure, whether deposition, printing, or otherwise. Another such method may be simply to place the antenna(s) after the cavity is formed, and to attach the antenna(s) to the cavity using solder or chemical, thermo-mechanical bonding methods.

Figure 65:
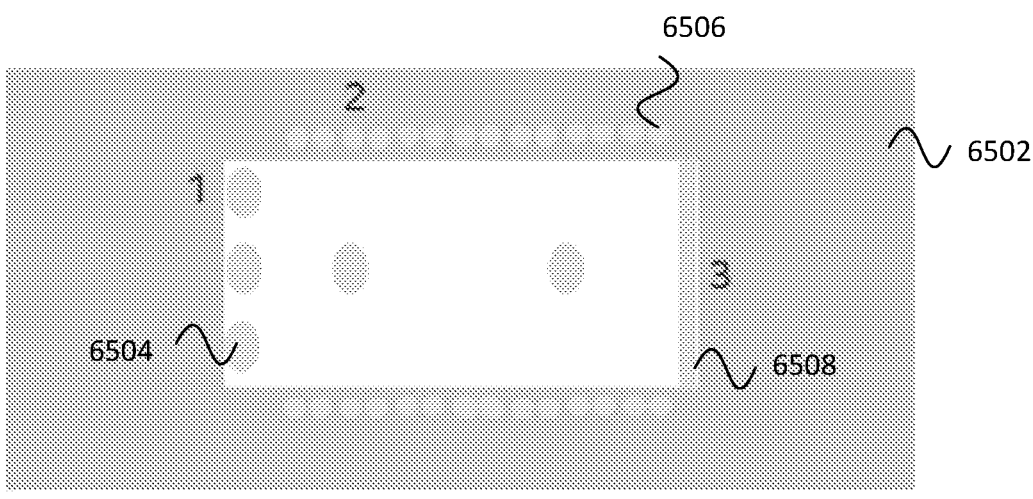
FIG. 65 depicts one or more reflector elements inside a cavity.
Figure 65:
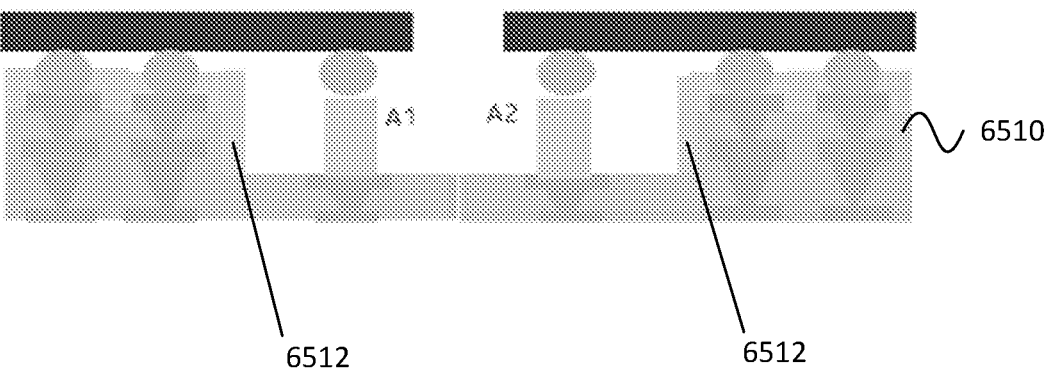

Beyond the creation of the antennas themselves, one or more reflector elements may also be built inside the cavity, as depicted in FIG. 65. This figure depicts a top view of an antenna cavity 6502 and a side view of an antenna cavity 6510, according to an aspect of the disclosure. In 6502, a first type of reflector element is depicted as a plurality of reflectors along one or more side walls of the cavity, as shown by 6504. Such reflectors may optionally be approximately the same diameter as the one or more antennas grown in the cavity. According to another aspect of the disclosure, the one or more antennas may be placed outside of the cavity, as depicted by 6506. In this case, a plurality of reflector elements may be placed adjacently in a row on and/or within the package. According to another aspect of the disclosure, the reflector may be configured as a single reflector element as depicted by 6508. In this configuration, the reflector element may be a single metal element, placed along one or more sides of the cavity. The one or more reflector elements may be optionally grown using the same procedure as that used to grow the one or more antennas. The one or more reflector elements may optionally be placed into the cavity (e.g., formed outside of the cavity and then placed/mounted in the cavity). The one or more reflector elements may be or include metallic walls/pillars/rods/structures attached to the sides of the cavity and/or stacked vias outside of the cavity. As depicted in 6510, the one or more reflector elements 6512 may abut one or more sides of the cavity. By placing the one or more reflector elements along or adjacent to one or more sides of the cavity, an emission aperture may be created, wherein the emission aperture may direct the radiofrequency emission of the one or more antennas in one or more primary directions.

According to another aspect of the disclosure, the cavity including the one or more antennas may be filled with a material, such as a material having a higher dielectric constant. Use of such a higher dielectric material and/or magneto-dielectric material may provide the advantage that the optimal antenna heights for a given frequency of operation will be shorter than the optimal antenna heights without the higher dielectric material. With this size reduction, both the required cavity size and the required cavity width may be smaller than without the higher dielectric material. Reduction in cavity height may be associated with simplification of the fabrication process, which may yield a cost-reduction. Reduction in cavity width may result in more wireless antenna to antenna channels being placed in the same area, therefore increasing the overall data throughput between dies, using MIMO technology. Further, one or more layer redistribution layers (RDL) may be fabricated on top of the open cavity to provide electrical connections, feed lines, impedance matching, and/or to provide additional coupling.

Figure 66:
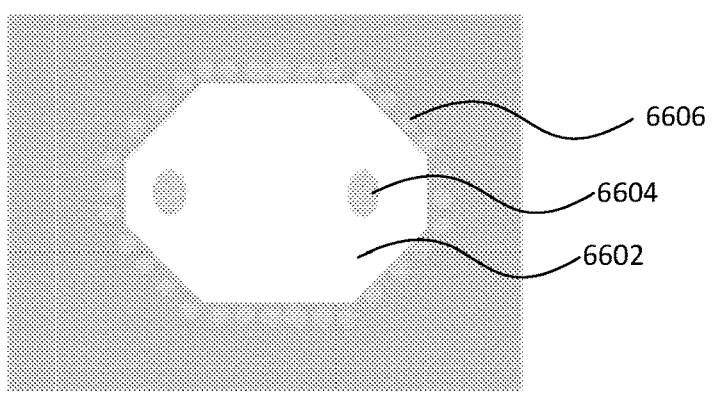
FIG. 66 depicts a top view of a non-rectangular cavity formed in an organic package.

According to an aspect of the disclosure, the cavities may be of any shape, and not necessarily rectangular. Many conventional open cavity forming processes can be utilized to create a non-rectangular shapes. Such shapes may include, but are not limited to, circles, hexagons, octagons, or ovals. For instance, it is known to machine the cavity and/or to etch sacrificial layers, and these techniques can be used to create nearly any shape. Given that nearly any shape is possible for the cavity, and according to another aspect of the disclosure, the antenna and cavity shape may be co-optimized to increase antenna gain and bandwidth. FIG. 66 depicts a top view of a non-rectangular cavity formed in the organic package. In this figure, the cavity is depicted as an octagon of unequal side lengths 6602, wherein the cavity includes two antennas 6604, and wherein the cavity is surrounded by a plurality of reflecting elements 6606. As stated above, this implementation is not limited to an octagon, but may rather be any shape, whether rectangular, or non-rectangular. Further, and although not depicted because of the nature of the view in FIG. 66, the cavity walls may be perpendicular to the die surface. Alternatively, the walls may be tapered, such as by having a linear taper or an exponential taper.

Figure 67:
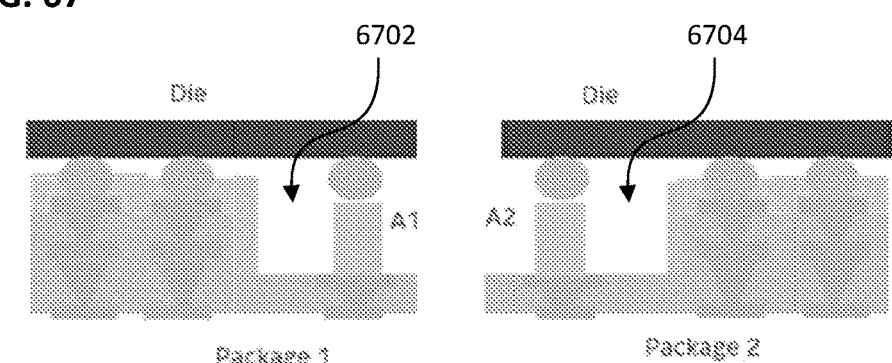
FIG. 67 depicts two packages utilizing cavities at package edges to perform package to package communication.
Figure 68:
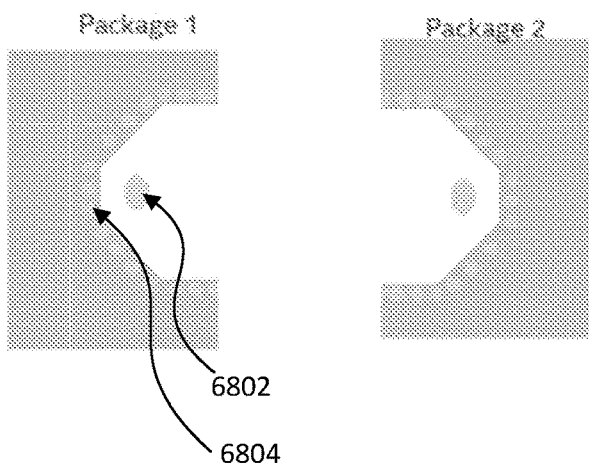
FIG. 68 depicts a top view of a package configuration.

According to another aspect of the disclosure, cavities may be used for package to package communication. In this manner, the cavities may be placed at edges of the package. As such, the cavities can be split between two different packages to provide package to package communication links. FIG. 67 depicts two packages utilizing cavities at package edges to perform package to package communication. In this figure, a first cavity 6702 is located at a right edge (as depicted in the figure) of package 1, and a second cavity 6704 is depicted at a left edge (as depicted in the figure) of package 2. By placing the packages in close proximity to one another with the cavities facing, a favorable channel for package to package communication may be created. Wireless transmissions between the packages may occur through a medium such as air. Alternatively, the wireless transmissions may occur via one or more waveguide structures. FIG. 68 depicts a top view of the package configuration of FIG. 67. In this figure, the antennas 6802 (only the antenna of package one is labeled) of each package may be in close proximity to one another, with a generally unobstructed channel between them. According to an aspect of the disclosure, one or more reflective elements 6804 may be placed behind each of the antennas so as to reflect a wireless signal from a first antenna toward a second antenna.

Figure 69:
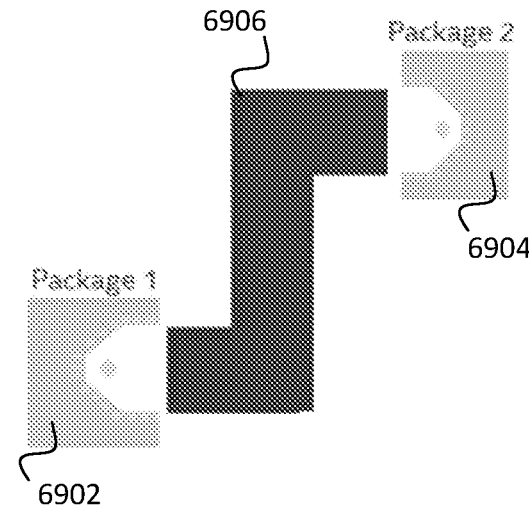
FIG. 69 depicts the use of one or more waveguides for package to package communication.

FIG. 69 depicts the use of one or more waveguides for package to package communication according to another aspect of the disclosure. In greater detail, FIG. 69 depicts a first package including one or more antennas mounted in a package cavity 6902 and a second package including one or more antennas mounted in a package cavity 6904, connected by one or more waveguides 6906. In this example, and according to an aspect of the disclosure, the cavities of the packages may be placed on the edges of the packages as described above, so as to permit simplified connection via the one or more waveguides 6906. The one or more waveguides 6906 may include any of one or more substrate integrated waveguides (SIW) and/or one or more dielectric waveguide structures. The one or more waveguides may be built as part of the package after the cavity has been formed, or they may be built outside and placed into/onto the package. Using an SIW or dielectric waveguide may further reduce a size of the waveguide to allow for an easier integration into the package.

Figure 70:
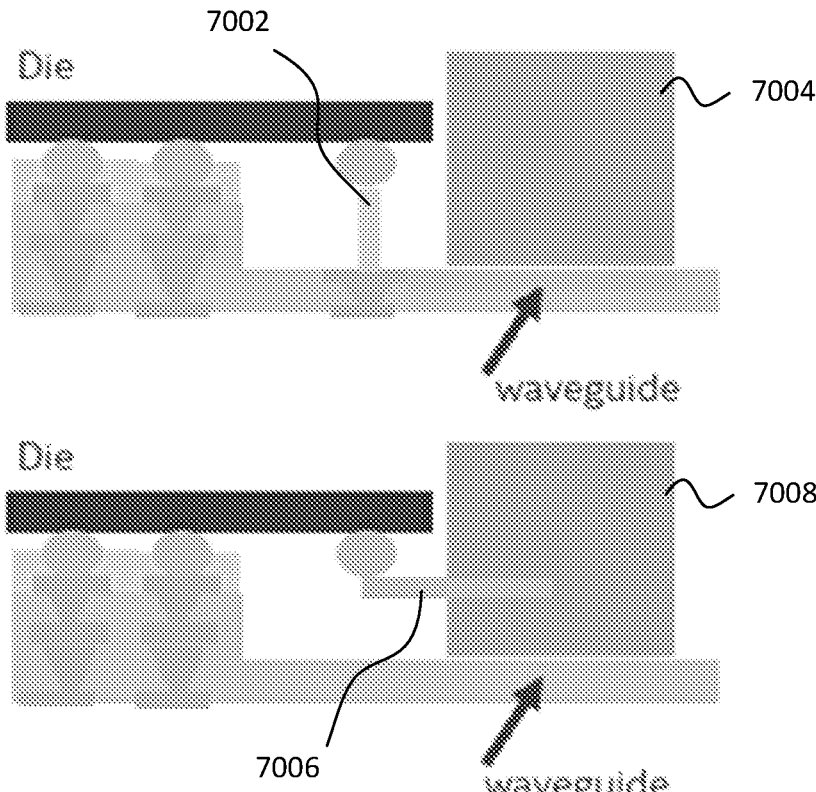
FIG. 70 depicts package to package transmission using one or more waveguides.

FIG. 70 depicts package to package transmission using one or more waveguides according to another aspect of the disclosure. At the top of FIG. 70, the package is depicted as including a vertically oriented antenna 16702 (e.g. perpendicular to the body of the package) with waveguide structure 7004. In this manner, the antenna 7002 may radiate electromagnetic energy, which may be received and further directed by the waveguide 7004. The bottom of FIG. 70 depicts a package with a horizontally oriented antenna 7006, which extends into, and thereby transmits directly into, the waveguide 7008. In some configurations, the waveguide structure may protrude from the package, whereas in other configurations, the waveguide structure may not protrude from the package, as desired for the implementation.

Figure 71:
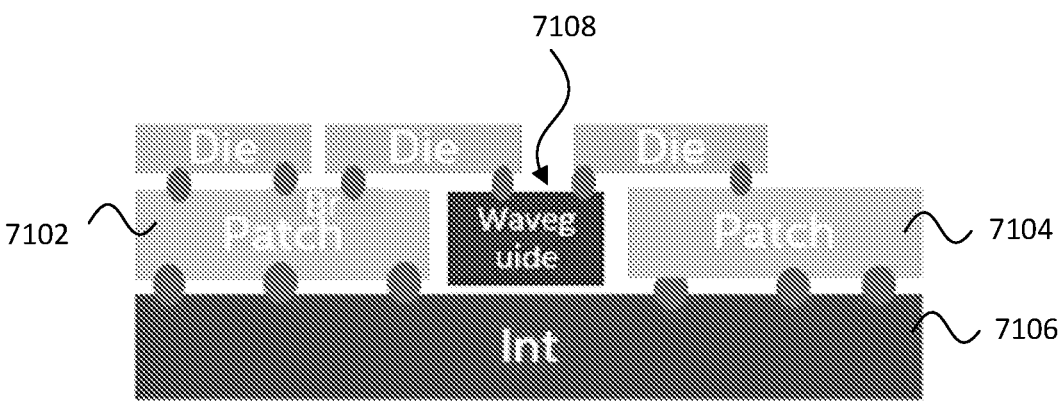
FIG. 71 depicts patch substrate boards and built on an interposer.
Figure 72:
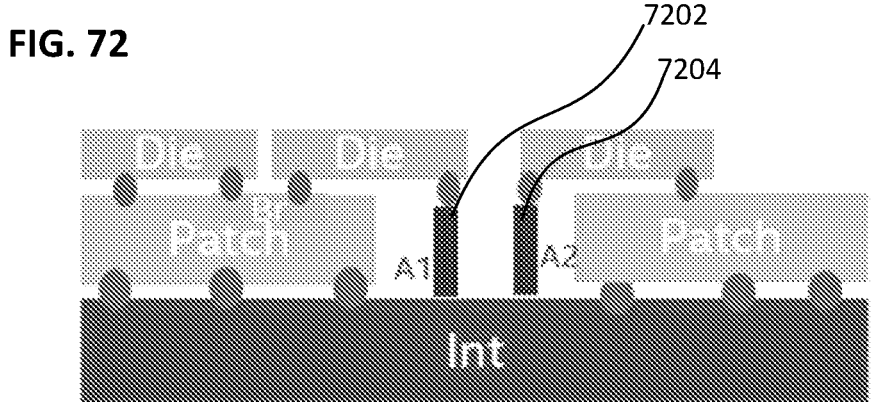
FIG. 72 depicts a gap between patch substrate boards with two antennas.

According to another aspect of the disclosure, cavities may also be created virtually (e.g., created by building around the desired cavity area to create a void). That is, patch substrate boards may be assembled on top of high density interposer boards with a gap in between to create a cavity for one or more antennas and/or one or more waveguides. FIGS. 71 and 72 depict creation of virtual cavities according to aspects of the disclosure. In FIG. 71, patch substrate boards 7102 and 7104 are built on interposer 7106 with a gap between them, in which a waveguide 7108 is placed. This gap is understood as the virtual cavity. In FIG. 72 the gap between patch substrate boards includes two antennas 7202 and 7204. This method of the cavity fabrication may be used to achieve much deeper cavities than may be available by other methods. Using a subtractive cavity manufacturing processes, the deepest cavity size is generally determined by the layer count of the organic package. With the virtual cavity approach, cavity depths of 1 mm or more may be achieved. Such depths may permit pins or similar metallic structures to be placed inside the cavity, such as by using traditional pin attach or solder processes.

Figure 73:
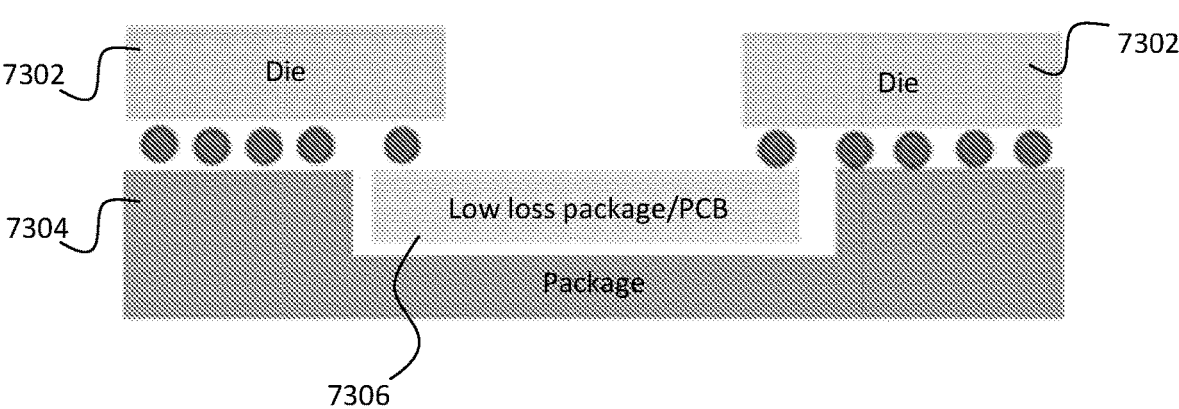
FIG. 73 depicts signal lines incorporated as a die-to-die bridge using an open cavity.

Focus will now be turned to options for a high-frequency compatible (e.g. appropriate) design and/or material package integration using an open cavity. Materials available for typical organic package fabrication processes can be limited, and not necessarily suitable for high frequency signal lines/waveguides. Moreover, the design rules for fabricating organic package substrates may not allow for design optimization to achieve the best performance. Using an open cavity, designs can be fabricated with other methods that are more advantageous at higher frequencies. For example, signal lines can be incorporated as a die-to-die bridge using an open cavity, as depicted in FIG. 73. In this figure, two dies 7302 are mounted on a package 7304 that includes a cavity, such as the package cavities described above. Rather than including a grown-antenna or an antenna that is placed or mounted into the cavity, this cavity includes a low loss package/PCB 7306, which is connected to each of the dies

7302. This low loss PCB package material may include active and/or passive devices made of materials other silicon (i.e. GaN, SiC, glass . . . etc.). It may be created using, for example, any known lithography fabrication method. Once developed, such low loss packages may be integrated into the package via the open cavity.

The open cavity substrate device and methods therefor disclosed herein may be configured as part of a multichip package. This multichip package may include a plurality of chiplets, in which at least a first chiplet includes a first surface and a second surface opposite to the first surface, wherein the first surface includes a cavity, and wherein the cavity is defined by a plurality of surfaces; and one or more antennas, on a surface of the plurality of surfaces. The cavity may include any of one or more bottom surfaces, one or more top surfaces, one or more side surfaces, or any combination thereof. The cavity may be any shape including, but not limited to, rectangular, circular, or ovular, cylindrical, or otherwise. The multichip package may include a second chiplet in this manner, the second ship may include a first surface and a second surface opposite to the first surface, wherein the first surface includes a cavity, and wherein the cavity is defined by a plurality of surfaces; and one or more antennas, on a surface of the plurality of surfaces; wherein the one or more antennas of the first chiplet are configured to transmit a wireless signal to the one or more antennas of the second chiplet.

According to an aspect of the disclosure, each of the first chiplet and the second chiplet may include a transceiver. The transceivers may be electrically conductively connected to the one or more antennas of each chiplet. The transceiver of the first chiplet may be configured to control the one or more antennas of the first chiplet to transmit a radiofrequency signal. The transceiver of the second chiplet may be configured to control the one or more antennas of the second chiplet to transmit a radiofrequency signal.

According to an aspect of the disclosure, the one or more antennas may be configured with a solder element. This solder element may be, for example, a solder bump and/or a microbump.

The multichip package may include one or more dielectric layers, in its cavity. The one or more dielectric layers may surround one or more sides of the one or more antennas or antenna extensions. The one or more dielectric layers may have a higher dielectric constant than the one or more antennas.

The multichip package may be configured such that the cavity includes a plurality of terminals, which may be located around one or more sides of the cavity. This plurality of terminals are may be configured to receive a radiofrequency signal transmitted by the one or more antennas in a first direction and to reflect the radiofrequency signal in a second direction, different from the first direction.

According to an aspect of the disclosure, the multichip package may correspond with an edge of the chiplet. In this configuration, the one or more antennas may be configured to send a wireless signal to one or more second antennas on a second chiplet. Such a wireless signal may be transmitted, for example, in a medium such as air. Alternatively or additionally, such a wireless signal may be transmitted using one or more waveguides between the first chiplet and the second chiplet.

According to an aspect of the disclosure, the chiplet and antenna structure, may include an interposer; a first patch substrate, mounted on the interposer; a second patch substrate, mounted on the interposer; a gap between the first patch substrate and the second patch substrate; and one or radiofrequency transmission elements in the gap. In this configuration, the one or more radiofrequency transmission elements may be implemented as one or more waveguides and/or one or more antennas.

DP #7

Wireless chip to chip systems experience frequency selective IQ imbalance, inter symbol interference, DC offset, and phase noise. These factors may be associated with a reduction in throughput, which may be undesirable or unacceptable in a chip to chip communication setting. Furthermore, conventional methods and devices for correction of these factors may be associated with significant increases in form factor, complexity, and/or cost, which may also prove unworkable in a chip to chip setting. To limit the number of circuit components and reduce power consumption and improve performance, joint inter-symbol interference and frequency selective IQ imbalance mitigation strategies using a feed forward (FFE) and decision feedback (DFE) equalizer are disclosed. The devices and methods disclosed herein may also include one or more FFE/DFE equalization taps, may perform DC offset estimation with low-bit training, and may compensate for phase noise using blind phase noise tracking.

Known efforts to resolve the above problems have conventionally relied on joint channel equalization and IQ imbalance estimation in the digital domain, while performing DC compensation in the analog domain with high pass filtering. Some such efforts have used high resolution sampling for training, but without mixed signal and blind phase noise tracking. Conventional efforts to resolve the above issues have often relied on separate circuit design for each impairment (e.g., IQ imbalance, inter symbol interference, DC offset, and phase noise), which increases the number of coefficients (multipliers) and samplers in the circuit, thereby increasing complexity and, often, cost. Since each block must be trained separately, the performance is generally suboptimal, and in any event beneath that which can be achieved with joint optimization of the parameters. As such, previous solutions have implemented stringent requirements on RF impairments, which can be difficult to achieve and are often associated with increased power use, the levels of which may be unacceptable or undesirable for some implementations. Nevertheless, systems must implement some form of phase noise tracking and correction, since, without adequate phase noise correction, the chip to chip system's performance will be unacceptable.

To address the above problems, a receiver design with joint channel equalization, IQ imbalance and DC offset compensation with 1-bit ADCs for training is disclosed herein. In this receiver design, the receiver may utilize FFE/DFE equalization strategies with 2×2 real coefficients per FFE and DFE taps for channel equalization. These same coefficients may essentially be reused to mitigate frequency selective IQ imbalance and to estimate DC offset at the receiver. The offset may require only one real summation block per in-phase and quadrature components. The training procedure may require only low-bit (1-bit) ADCs. Furthermore, this receive may include a blind phase noise tracking procedure, which may be implemented, for example, during its data transmission mode. Such blind phase noise tracking may be performed with little to no overhead. According to an aspect of the disclosure, the receiver disclosed herein may optimize channel equalization with IQ imbalance, and the device may perform DC offset using a single LMS training or any other type of adaptive learning.

This receiver and the strategies described herein may represent a simplification over conventional correction strategies for IQ imbalance, inter symbol interference, DC offset, and phase noise in a chip to chip context. As will be described in greater detail herein, such coefficients of channel equalization may be used to sufficiently compensate for IQ imbalance, thereby eliminating the need for an additional circuit for IQ imbalance compensation. The may be further used for DC offset estimation training, which may eliminate the need for extra circuit design for DC offset estimation. Using the procedures and devices disclosed herein, the device may perform DC offset compensation with only one real summation block per I and Q components of a received signal, and only a single-bit ADC may be sufficient for training. The blind phase noise tracking can be performed without training symbols. These strategies permit the receiver to operate using significantly less power than conventional receivers.

Figure 74:
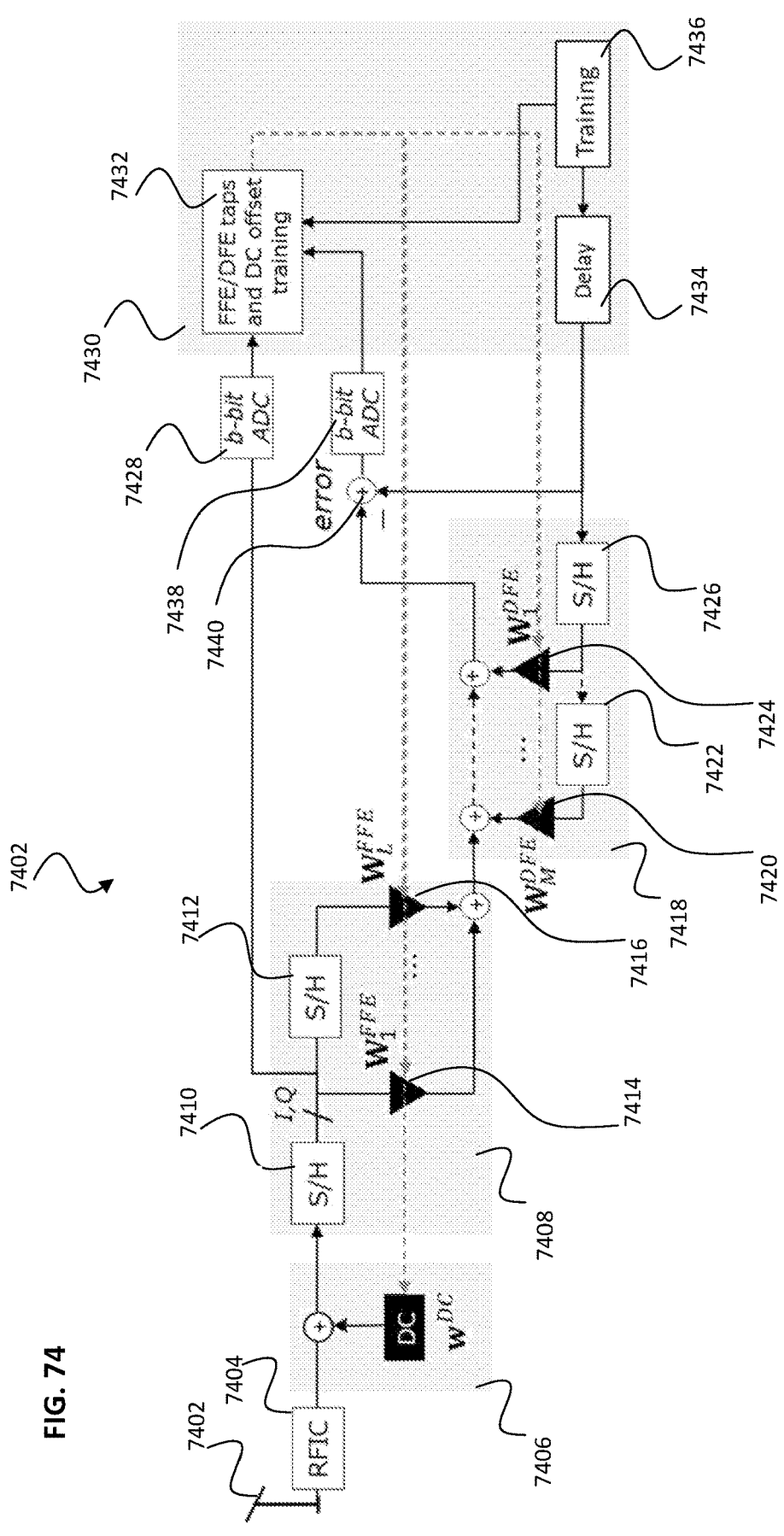
FIG. 74 depicts a wireless chip to chip mixed signal receiver design and corresponding training method.

FIG. 74 depicts a wireless chip to chip mixed signal receiver design 7402 and corresponding training method. This receiver can be understood in terms of four main components: DC offset cancellation 7406, feed forward equalization (FFE) for pre-cursor taps of channel impulse response 7414, decision feedback equalization (DFE) for post-cursor taps of channel impulse response 7418, and digital signal processing (DSP) for training of analog multiplier coefficients 7430.

In this figure, one or more antennas 7402 may be configured to receive a wireless signal and to deliver an electrical signal representing this wireless signal to a radio frequency integrated circuit (RFIC) 7404. The RFIC 7404 may be configured to output a signal to the DC offset cancellation unit 7406. The DC offset cancellation 7406 unit may operate in an analog domain, such as with a single summation block per in-phase and quadrature components. The DC offset cancellation unit 7406 may be configured to adjust the signal received from the RFIC 7404 to moderate or correct for DC offset and to output a DC offset corrected signal to the FFE unit 7408. The FFE unit may include one or more sample/hold (S/H) circuits (e.g., as depicted by 7410 and 7412), which may accumulate energy for analog processing of the received signal. According to an aspect of the disclosure, at least one S/H block may be necessary for each of the FFE and DFE taps, for analog signal processing. An ADC 7428 may be configured to receive an output of the first S/H circuit 7410. This ADC 7428 may be configured to sample the received signal for training of the DC offset and FFE/DFE coefficients, as will be further described, infra. The FFE unit 7408 may include one or more analog multipliers (depicted as 7414 and 7416). The multipliers 7414 and 7416 may be analog multipliers, $W_k$, with a 2×2 real matrix over I and Q components of the received signal. These will be referred to herein as the tap or taps of the equalizer. The output of each tap may be is summed together at/before DFE equalizer (see adder at bottom right corner of FFE unit 7408, which is configured to receive and sum the tap outputs).

Like the FFE unit 7408, the DFE unit 7418 may include one or more S/H blocks (depicted as 7422 and 7426) one or more analog multipliers (depicted as 7420 and 7424). The DFE equalizer may receive input from digital training symbols during training as will be described in greater detail. The DFE unit may be configured to receive an output of the FFE unit 7408 (e.g., the multiplied and summed signal as described above) and an output signal of the decision feedback equalizer (DSP) 7430. The DFE's S/H blocks 7422 and 7426 may store the DSP output (e.g., the output of the training module 7436 and processed by a delay module 7434), which is then multiplied by multipliers 7420 and 7424. The output of multiplier 7420 may be summed with the output of the FFE 7408, and the output of the multiplier 7424 may be summed with the output of the prior adder (e.g., with the output of the FFE unit 7408 as added with the output of the multiplier 7420). The DFE 7418 may output the multiplied and summed signal to an error detection circuit 7440 (which may be e.g., configured as bitwire addition modulo-2 circuit), which may be configured to output an error detection signal to an ADC 7438, which may be configured to output a digital signal to the DSP 7430, wherein the digital signal represent an analog signal received by the ADC 7438.

The DSP 7430 may include FFE/DFE taps and a DC offset training circuit 7432, which may be configured to receive an output of the first ADC 7428, and output of the second ADC 7438, and an output of a training circuit 7436, and based on those inputs, to calculate one or more coefficients for FFE/DFE taps (7414, 7416, 7420, and 7424) and DC offset training (see generally, 7406). These coefficients may be sent to the DC offset unit 7406, the FFE unit 7408, and the DFE unit 7418, as depicted by the dotted lines. In this manner, the DC offset unit 7406, the FFE unit 7402, and the DFE unit 7418 are configured to perform the respective DC offset, FFE equalization and DFE equalization based on the coefficients that it received from the DSP 7430, which are determined from the at least the tap outputs as shown in FIG. 1 (see all sources of input to the DSP 7430, which are indicated by the arrows leading to the DSP). The training module 7436 may be configured to store one or more sequences of transmitted symbols. The training module 7436 may determine/calculate error (e.g., a difference between transmitted symbol 7436 and received signal 7440) to update weights of the equalizer and the DC offset. In addition, training module 7436 may also directly update one or more equalization weights. In addition, training module 7434 may compensate a time delay of a received signal, such as by compensating the time delay as compared to a stored transmit sequence.

Figure 75:
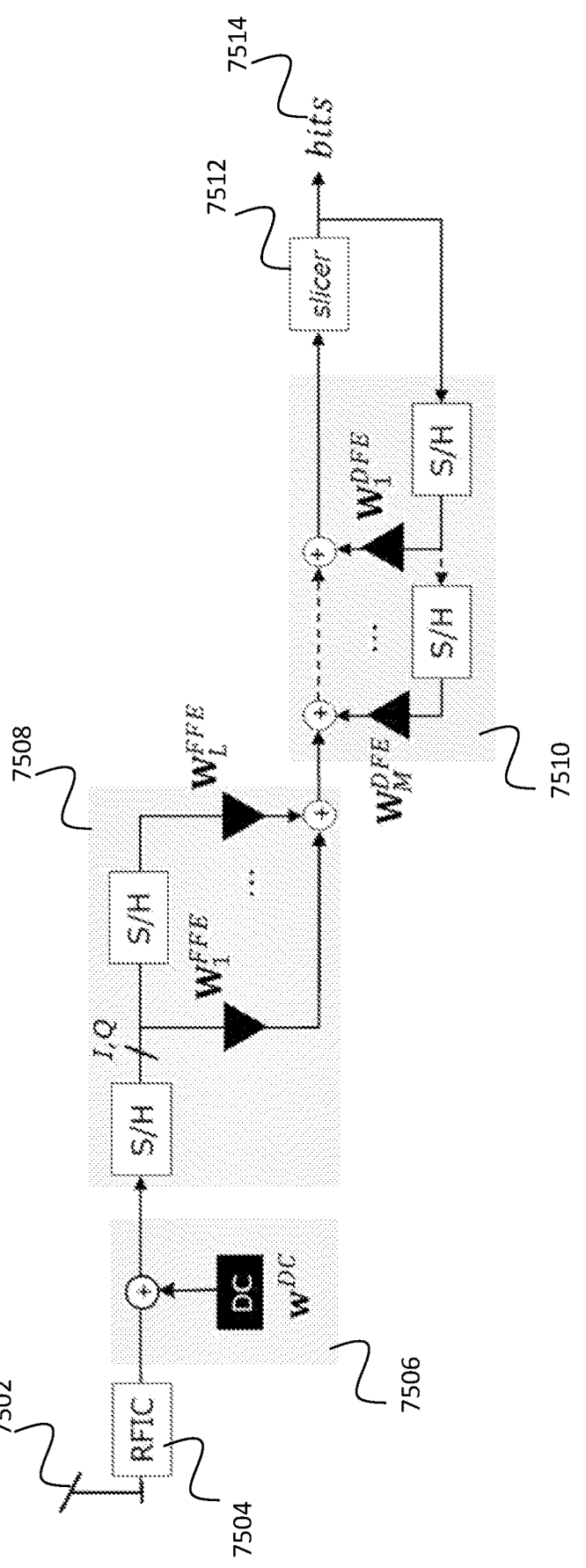
FIG. 75 depicts a receiver architecture for a data mode.

FIG. 75 depicts a receiver architecture for a data mode (see distinction between training mode and data mode in FIG. 76) according to another aspect of the disclosure. In this figure, the structure of the receiver architecture is similar to that in FIG. 74, except that the training blocks are removed, and a slicer is added to the end of the equalizer for data demodulation. As described relative to FIG. 75 in greater detail, the one or more antennas 7502 may be configured to receive a wireless radiofrequency signal and to output a signal representing the received wireless radiofrequency signal to the RFIC 7504. The processing of the signal within an RFIC 7504 may be performed, for the purposes of the equalizer described herein, according to any method. The RFIC 7504 may be configured to output a signal to the DC offset unit 7506, which may be configured to offset a DC offset of the received signal and to output the DC offset signal to the FFE 7508. The FFE may be configured to perform an FFE equalization and to deliver an FFE equalized signal to the DFE 7510. The DFE 7510 may be configured to receive the FFE equalized signal from the FFE 7508 and to perform one or more DFE operations on the received signal, at least by adding a multiplied output signal of the slicer 7512 to the received signal from the FFE unit 7508. The DFE may output to a slicer 7512, which may be configured to perform one or more demodulation functions, which may be performed according to any conventional methods. The slicer 7512 output may be output from the receiver in the form of one or more bits representing the received radiofrequency signal.

Figures 76, 77:
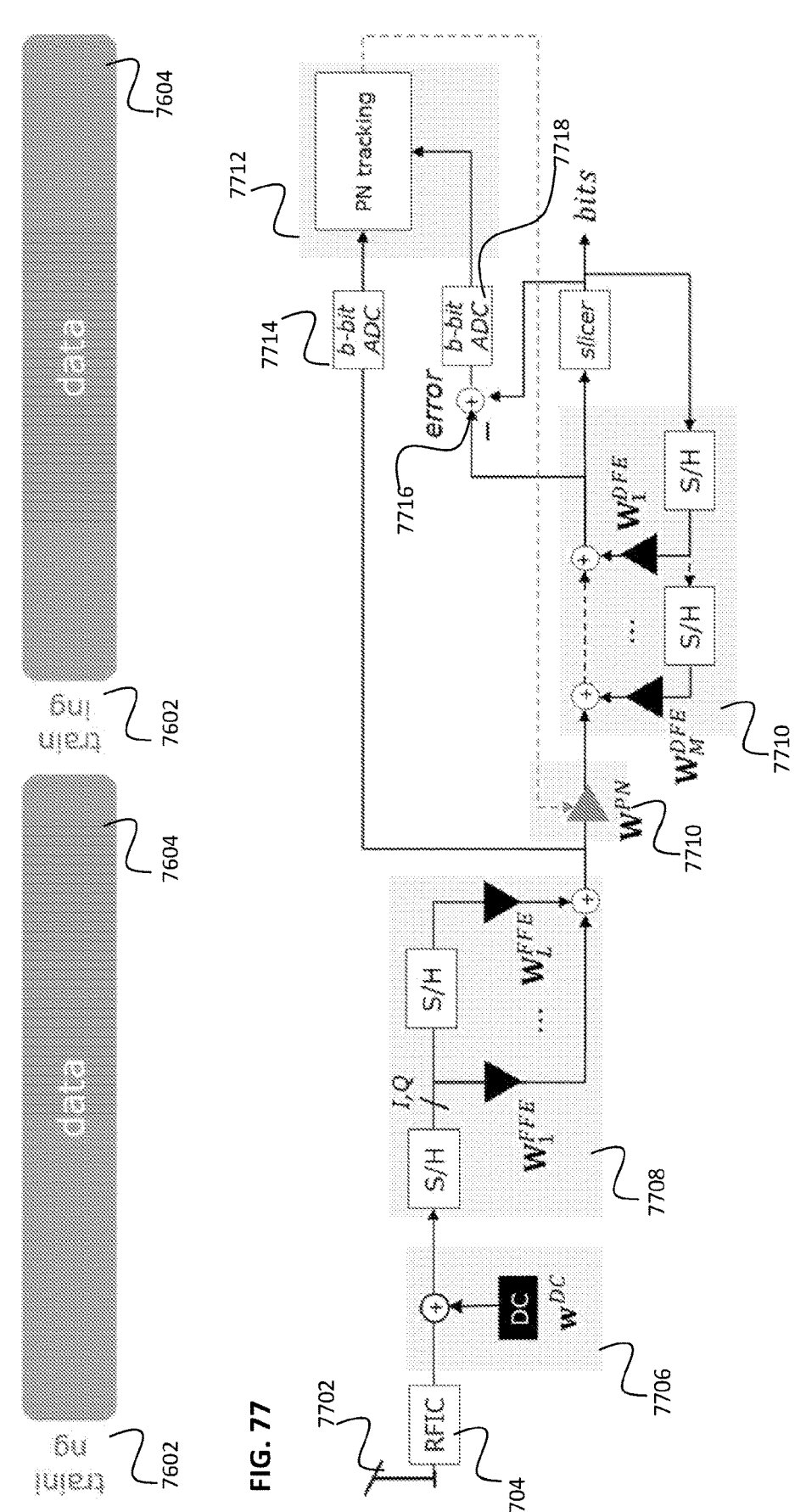
FIG. 76 depicts a training sequence without phase noise tracking.
FIG. 77 depicts a receiver with phase tracking operating in data mode.

FIG. 76 represents a training sequence without phase noise tracking according to an aspect of the disclosure. As shown in this figure, training sequences 7602 may be performed periodically or intermittently, such that they are following by periods of data decoding 7604. That is, an initial training sequence may yield the necessary coefficients for DC offset, FFE, and DFE, and periods of training may be followed by periods of data decoding, such that the coefficients gained in the training may be used to decode received data. Since various changes, for examine changes in the wireless channel, may require new coefficients to be determined from time to time. The frequency of training may be static/fixed, or may be dynamic. A dynamic training frequency may be configured such that the training is performed whenever the one or more signal qualities (e.g., throughput, error rate, etc.) fall outside of a predetermined range. The training 7602 may be performed by receiving any known training sequence. That is, a transmitter may transmit any sequence that is also known to the receiver. The equalizer (for example the DSP 7432) determines the one or more coefficients for DC offset, FFE, and DFE based on one or more differences between the known sequence as received by the one or more antennas 7402 and the known, transmitted data.

According to another aspect of the disclosure, the receiver may be configured to be operated in data mode (see distinction between training mode and data mode in FIG. 76) but operated with phase tracking. FIG. 77 depicts a receiver with phase tracking operating in data mode. If the received signal is heavily impacted by phase noise, the phase noise tracking may be necessary. To correct for phase noise in this context, the receiver may include an additional "tap" between the FFE 7708 and the DFE 7710. The phase noise compensation tap may be configured to process a 2×2 real matrix. In order to track phase noise, the equalizer may use one or more adaptive training procedures in the DSP 7712. For adaptive training, the receiver may include an additional pair of ADC samplers 7714 before the phase noise tap. The receiver may be configured to calculate the extra error as a difference between the input of the slicer (e.g. the output of the DFE 7710) and the output of the slicer (e.g. see comparator 7716), such as by utilizing a bitwise addition modulo-2 circuit 7716. In order to process the error in the digital domain, an additional 1-pair of ADCs may receive the output of the error detection 7716 and to output a digital signal representing the error detection output. For conservation of resources, it is possible to operate the equalizer with phase correction by reusing some or all of the ADCs from the training mode of FIG. 74. That is, it may not be necessary to include ADCs that solely function during operation of the data-phase with phase correction as depicted in FIG. 77.

Figure 78:
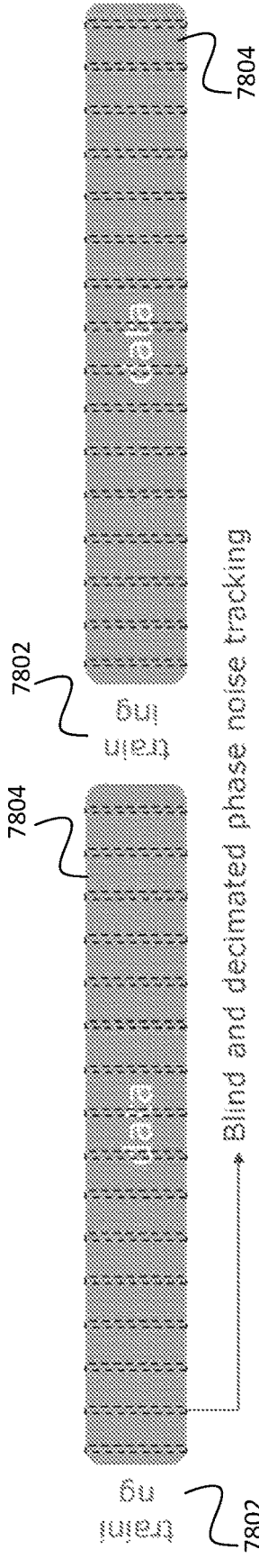
FIG. 78 depicts a training sequence.

The blind phase noise tracking does not require any known training sequence as shown in FIG. 78. Rather, the equalizer may perform the phase noise tracking without a known sequence, such as during the data phase, in which it would be expected that data otherwise unknown to the receiver would be transmitted. During the phase noise training 7802, the equalizer determines phase noise parameters as described above. The training periods 7802 are followed by data periods 7804, during which phase noise correction is performed on received radiofrequency signals. The equalizer may determine parameters for sampling and updating of phase noise compensation, for example, based on phase noise power spectral density. The period of phase noise tracking is shown with dashed lines in FIG. 78

Now that a high-level overview of the equalizer and its functions has been established, the following will describe the DC offset compensation, FFE procedures, and DFE procedures in greater detail, with a focus on the underlying calculations.

The DC offset can be modelled as $$r(t) = y(t) + d_{dc} \qquad (24)$$

wherein y(t) is a complex baseband received signal, and $d_{dc}$ is the DC offset at the receiver. The overall received signal with DC offset is given by r(t). Note that y(t) is corrupted with inter-symbol interference and Tx and Rx IQ imbalances, as follows:

$$IQ_{tx} = \begin{bmatrix} (1 - \epsilon_t)\cos\dfrac{\Delta\varphi_t}{2} & (1 + \epsilon_r)\sin\dfrac{\Delta\varphi_t}{2} \\ -(1 - \epsilon_t)\sin\dfrac{\Delta\varphi_t}{2} & (1 + \epsilon_r)\cos\dfrac{\Delta\varphi_t}{2} \end{bmatrix} \qquad (25)$$

Where $\epsilon_t$ is the transmitter amplitude imbalance, and $\Delta\varphi_r$ is the transmitter phase imbalance.

$$IQ_{rx} = \begin{bmatrix} (1 + \epsilon_r)\cos\dfrac{\Delta\varphi_r}{2} & (1 + \epsilon_r)\sin\dfrac{\Delta\varphi_r}{2} \\ (1 - \epsilon_r)\sin\dfrac{\Delta\varphi_r}{2} & (1 - \epsilon_r)\cos\dfrac{\Delta\varphi_r}{2} \end{bmatrix} \qquad (26)$$

Where $\epsilon_r$ is the receiver amplitude imbalance, and $\Delta\varphi_r$ is the receiver phase imbalance.

$$y(t) = e^{j\theta(t)}\int_0^{\tau_d} IQ_{rx}H(t - \tau)IQ_{tx}z(\tau)d\tau + n(t) \qquad (27)$$

Here, $$z(t) = \begin{bmatrix} z_I(t) \\ z_Q(t) \end{bmatrix}$$

is a transmitted symbol vector of the in phase and quadrature elements; H(t−τ) is a channel impulse response matrix in the real domain; $IQ_{tx}$ is the transmitter IQ imbalance; and $IQ_{rx}$ is the receiver IQ imbalance. The phase noise is modelled as θ(t). It is expected that the phase noise will change with every time instance. n(t) is the additive white Gaussian noise.

Focus is now turn to the mixed signal processing, which includes sample and hold circuits, and in which the receive chain applies filtering of received signal in the analog domain, but in discrete time intervals. The sampled signal at the first sample and the hold circuit are denoted as r[n] at sample time n. Note that the sample and the hold circuit may include various filtering for noise and aliasing reduction.

Given an L-tap feed forward equalizer (FFE), and an M-tap decision feedback equalizer (DFE) at the receiver, and a single tap DC offset cancellation before FFE as shown in FIG. 74 the FFE taps may be written as:

$$W^{FFE} = \begin{bmatrix} w_{1,II}^{FFE} & w_{1,QI}^{FFE} & \cdots & w_{L,II}^{FFE} & w_{L,QI}^{FFE} \\ w_{1,IQ}^{FFE} & w_{1,QQ}^{FFE} & \cdots & w_{L,IQ}^{FFE} & w_{L,QQ}^{FFE} \end{bmatrix} \qquad (28)$$

In this case, different coefficients may be used between the in-phase and quadrature components of the signal, i.e., II is an in-phase to in-phase portion, IQ is an in-phase to quadrature portion, QI is a quadrature to in-phase portion, and QQ is a quadrature to quadrature portion. The IQ imbalance compensation requires the use of different coefficients for these functions. The DFE coefficients may be given by:

$$W^{DFE} = \begin{bmatrix} w_{1,II}^{DFE} & w_{1,QI}^{DFE} & \cdots & w_{M,II}^{DFE} & w_{M,QI}^{DFE} \\ w_{1,IQ}^{DFE} & w_{1,QQ}^{DFE} & \cdots & w_{M,IQ}^{DFE} & w_{M,QQ}^{DFE} \end{bmatrix} \qquad (29)$$

and the DC offset cancellation coefficient may be notated by:

$$w^{DC} = \begin{bmatrix} w_I^{dc} \\ w_Q^{dc} \end{bmatrix} \qquad (30)$$

The phase noise compensation coefficients may be given by $$W^{PN} = \begin{bmatrix} w_{II}^{PN} & w_{QI}^{PN} \\ w_{IQ}^{PN} & w_{QQ}^{PN} \end{bmatrix} \qquad (31)$$

In light of the foregoing, the received signal after DC offset cancellation and channel equalization may be written as:

$$\begin{bmatrix} s_I[n] \\ s_Q[n] \end{bmatrix} = W^{PN}W^{FFE} \begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix} + W^{DFE} \begin{bmatrix} w_I[n] \\ w_Q[n] \\ w_I[n-1] \\ w_Q[n-1] \\ \vdots \\ w_I[n-M+1] \\ w_Q[n-M+1] \end{bmatrix} \qquad (32)$$

Here, $x_I[n]$ is the demodulated signal corresponding to the equalized sample $s_I[n]$, i.e., $x_I[n] = \mathrm{demod}(s_I[n])$. This may also apply to the quadrature component. Note that demodulation may be achieve with a slicer as shown in FIG. 75. Note that slicer is implemented according to transmitted constellation. For example, 16QAM requires 2-bit slicer.

Focus will now be turned to the training procedures, as described herein. During training, some of the demodulated symbols $x_I[n]$ and $x_Q[n]$ are not reliable. Therefore, training symbols (e.g. any symbols that are known at both the transmitter and the receiver) may be used with appropriate channel delay d as shown in FIG. 74. The training symbols may be denoted as $$x_I'[n]$$

and $$x_Q'[n].$$

It should be noted that data during the training mode (with phase noise tracking) is not active, that is $W^{PN}$ is set as an identity matrix.

The receiver determines its parameters for equalization as follows. Consider for example least mean square (LMS) training such that error is minimized as follows:

$$\text{Loss} = \sum_n \begin{bmatrix} e_I[n] \\ e_Q[n] \end{bmatrix}^T \begin{bmatrix} e_I[n] \\ e_Q[n] \end{bmatrix} \tag{33}$$

The error may be calculated as:

$$\begin{bmatrix} e_I[n] \\ e_Q[n] \end{bmatrix} = \begin{bmatrix} s_I[n] \\ s_Q[n] \end{bmatrix} - \begin{bmatrix} x_I^t[n-d] \\ x_Q^t[n-d] \end{bmatrix} \tag{34}$$

wherein the loss is:

$$\text{Loss} = \left| W^{FFE} \begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix} + W^{DFE} \begin{bmatrix} x_I^t[n-d] \\ x_Q^t[n-d] \\ x_I^t[n-1-d] \\ x_Q^t[n-1-d] \\ \vdots \\ x_I^t[n-M+1-d] \\ x_Q^t[n-M+1-d] \end{bmatrix} - \begin{bmatrix} x_I^t[n-d] \\ x_Q^t[n-d] \end{bmatrix} \right|^2 \tag{35}$$

In light of this, the update rule for each coefficient becomes:

$$W^{FFE} \leftarrow W^{FFE} - \mu \nabla_{W^{FFE}} \text{Loss} \tag{36}$$

where $\mu$ is the learning rate.

Based on this, the coefficients may be calculated as:

$$W^{FFE} \leftarrow W^{FFE} - 2\mu \begin{bmatrix} e_I[n] \\ e_Q[n] \end{bmatrix} \begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix}^T \tag{37}$$

$$W^{DFE} \leftarrow W^{DFE} - \mu \nabla_{W^{DFE}} \text{Loss} \tag{38}$$

$$W^{DFE} \leftarrow W^{DFE} - 2\mu \begin{bmatrix} e_I[n] \\ e_Q[n] \end{bmatrix} \begin{bmatrix} x_I^t[n-d] \\ x_Q^t[n-d] \\ x_I^t[n-1-d] \\ x_Q^t[n-1-d] \\ \vdots \\ x_I^t[n-M+1-d] \\ x_Q^t[n-M+1-d] \end{bmatrix}^T \tag{39}$$

$$w_I^{dc} \leftarrow w_I^{dc} - \mu \nabla_{w_I^{dc}} \text{Loss} \tag{40}$$

-continued $$w_I^{dc} \leftarrow w_I^{dc} - \mu \begin{bmatrix} e_I[n] \\ e_Q[n] \end{bmatrix}^T \tag{41}$$

$$\nabla_{w_I^{dc}} \left( \begin{bmatrix} w_{1,II}^{FFE} & w_{1,QI}^{FFE} & \cdots & w_{L,II}^{FFE} & w_{L,QI}^{FFE} \\ w_{1,IQ}^{FFE} & w_{1,QQ}^{FFE} & \cdots & w_{L,IQ}^{FFE} & w_{L,QQ}^{FFE} \end{bmatrix} \begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix} \right)$$

-continued $$w_I^{dc} \leftarrow w_I^{dc} - \mu \begin{bmatrix} e_I[n] \\ e_Q[n] \end{bmatrix}^T \begin{bmatrix} w_{1,II}^{FFE} & w_{1,QI}^{FFE} & \cdots & w_{L,II}^{FFE} & w_{L,QI}^{FFE} \\ w_{1,IQ}^{FFE} & w_{1,QQ}^{FFE} & \cdots & w_{L,IQ}^{FFE} & w_{L,QQ}^{FFE} \end{bmatrix} \begin{bmatrix} -1 \\ 0 \\ -1 \\ 0 \\ \vdots \\ -1 \\ 0 \end{bmatrix} \tag{42}$$

$$w_I^{dc} \leftarrow w_I^{dc} + 2\mu \begin{bmatrix} e_I[n] \\ e_Q[n] \end{bmatrix}^T \sum_{i=1}^{L} \begin{bmatrix} w_{i,II}^{FFE} \\ w_{i,IQ}^{FFE} \end{bmatrix} \tag{43}$$

$$w_Q^{dc} \leftarrow w_Q^{dc} + 2\mu \begin{bmatrix} e_I[n] \\ e_Q[n] \end{bmatrix}^T \sum_{i=1}^{L} \begin{bmatrix} w_{i,QI}^{FFE} \\ w_{i,QQ}^{FFE} \end{bmatrix} \tag{44}$$

Focus will now be directed to the details of the phase noise tracking implementation, as depicted in FIG. 77. As described above, phase noise tracking does not require training symbols and it is activated when receiver is in data mode. The parameters for the training may be calculated as follows:

$$\begin{bmatrix} e_I[n] \\ e_Q[n] \end{bmatrix} = \begin{bmatrix} s_I[n] \\ s_Q[n] \end{bmatrix} - \begin{bmatrix} x_I[n] \\ x_Q[n] \end{bmatrix} \tag{45}$$

$$\text{Loss} = \left| W^{PN} \left( W^{FFE} \begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix} + W^{DFE} \begin{bmatrix} x_I^t[n-d] \\ x_Q^t[n-d] \\ x_I^t[n-1-d] \\ x_Q^t[n-1-d] \\ \vdots \\ x_I^t[n-M+1-d] \\ x_Q^t[n-M+1-d] \end{bmatrix} \right) - \begin{bmatrix} x_I[n] \\ x_Q[n] \end{bmatrix} \right|^2 \tag{46}$$

$$W^{PN} \leftarrow W^{PN} - \mu \nabla_{W^{PN}} \text{Loss} \tag{47}$$

$$W^{PN} \leftarrow W^{PN} - 2\mu \begin{bmatrix} e_I[n] \\ e_Q[n] \end{bmatrix} W^{FFE} \begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix} \tag{48}$$

It is noted that phase noise tracking need not be performed at every sample. That is, and with respect to the formulas above, n can be replaced by mn, such as where m is integer.

In performing these operations, it may be desirable for a given implementation to use one or more power-saving strategies. To save power, the b-bit training can be considered to include 1-bit training. In this case, the update rules become:

$$W^{FFE} \leftarrow W^{FFE} - 2\mu Q_{b-bit}\left(\begin{bmatrix} e_I[n] \\ e_Q[n] \end{bmatrix}\right) Q_{b-bit}\left(\begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix}^T\right) \tag{49}$$

$$W^{FFE} \leftarrow W^{FFE} - 2\mu Q_{b-bit}\left(\begin{bmatrix} e_I[n] \\ e_Q[n] \end{bmatrix}\right) Q_{b-bit}\left(\begin{bmatrix} x_I^t[n-d] \\ x_Q^t[n-d] \\ x_I^t[n-1-d] \\ x_Q^t[n-1-d] \\ \vdots \\ x_I^t[n-M+1-d] \\ x_Q^t[n-M+1-d] \end{bmatrix}^T\right) \tag{50}$$

$$w_I^{dc} \leftarrow w_I^{dc} + 2\mu Q_{b-bit}\left(\begin{bmatrix} e_I[n] \\ e_Q[n] \end{bmatrix}^T\right) \sum_{i=1}^{L} \begin{bmatrix} w_{i,II}^{FFE} \\ w_{i,IQ}^{FFE} \end{bmatrix} \tag{51}$$

$$w_Q^{dc} \leftarrow w_Q^{dc} + 2\mu Q_{b-bit}\left(\begin{bmatrix} e_I[n] \\ e_Q[n] \end{bmatrix}^T\right) \sum_{i=1}^{L} \begin{bmatrix} w_{i,QI}^{FFE} \\ w_{i,QQ}^{FFE} \end{bmatrix} \tag{52}$$

-continued $$W^{PN} \leftarrow \tag{53}$$

$$W^{PN} - 2\mu Q_{b-bit}\left(\begin{bmatrix} e_I[n] \\ e_Q[n] \end{bmatrix}^T\right) Q_{b-bit}\left(W^{FFE} \begin{bmatrix} r_I[n] - w_I^{dc} \\ r_Q[n] - w_Q^{dc} \\ r_I[n-1] - w_I^{dc} \\ r_Q[n-1] - w_Q^{dc} \\ \vdots \\ r_I[n-L+1] - w_I^{dc} \\ r_Q[n-L+1] - w_Q^{dc} \end{bmatrix}\right)$$

According to an aspect of the disclosure, the principles and methods disclosed herein may be configured as a radiofrequency circuit. This radiofrequency circuit may include a signal processing circuit, configured to receive data representing a received first radiofrequency signal including one or more known symbols; determine a difference between the received data and the one or more known symbols; generate a plurality of equalization parameters representing the determined difference between the received data and the one or more known symbols; and one or more equalization circuits, configured to receive the plurality of equalization parameters from the signal processing circuit; receive a second radiofrequency signal; modify the second radiofrequency signal according to the plurality of equalization parameters; and output the modified second radiofrequency signal as an equalized signal.

The one or more equalization circuits may be configured to perform precursor equalization and postcursor equalization. The precursor equalization may include receiving the second radiofrequency signal; modifying the second radiofrequency signal according to a first plurality of equalization parameters of the plurality of equalization parameters; and outputting the modified second radiofrequency signal as a precursor equalized signal. The postcursor equalization may include receiving the precursor equalized signal; modifying the precursor equalized signal according to a second plurality of equalization parameters of the plurality of equalization parameters; and outputting the modified precursor signal as the equalized signal.

The precursor equalization circuit may modify the second radiofrequency signal to reduce intersymbol interference from a symbol proceeding the symbol of the radiofrequency transmission. The postcursor equalization circuit may modify the second radiofrequency signal to reduce intersymbol interference from a symbol following the symbol of the radiofrequency transmission.

According to an aspect of the disclosure, the first plurality of equalization parameters may include an in-phase to in-phase (II) parameter; an in-phase to quadrature (IQ) parameter; a quadrature to in-phase (QI) parameter, and a quadrature to quadrature (QQ) parameter. According to an aspect of the disclosure, the second plurality of equalization parameters may include an in-phase to in-phase (II) parameter; an in-phase to quadrature (IQ) parameter; a quadrature to in-phase (QI) parameter, and a quadrature to quadrature (QQ) parameter.

The signal processing circuit may be further configured to generate a plurality of bias offset parameters representing a difference between the received data and the one or more known symbols; and further including a bias offset modification circuit, configured to receive a DC biased radiofrequency signal; modify a bias offset of the DC biased radiofrequency signal according to the plurality of bias offset parameters; and output the modified DC biased radiofrequency signal as the second radiofrequency signal.

In this manner, the signal processing circuit may be configured to determine each of the plurality of bias offset parameters and the plurality of equalization parameters as one or more in-phase components and one or more quadrature components.

The radiofrequency circuit may further include a data demodulation circuit. The data demodulation circuit may be configured to receive the equalized signal, demodulate the equalized signal, and output the demodulated equalized signal as the demodulated signal. The signal processing circuit may be further configured to receive the equalized signal; receive the demodulated signal; determine a difference between the equalized signal and the demodulated signal; generate from at least the difference between the equalized signal and the demodulated signal a plurality of phase adjustment parameters; wherein the radiofrequency integrated circuit further includes a phase adjustment circuit, wherein the phase adjustment circuit is configured to receive the plurality of phase adjustment parameters; receive the precursor equalized signal; and adjust a phase of the precursor equalized signal by the plurality of phase adjustment parameters.

DP #4

Figure 79:
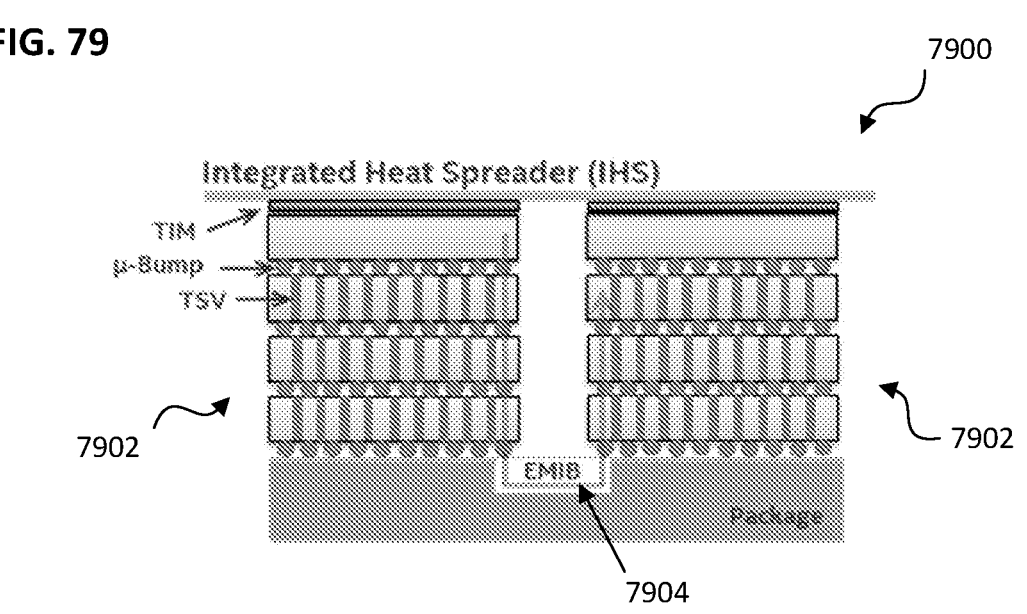
FIG. 79 depicts a conventional configuration for chip-to-chip communication.

FIG. 79 depicts a conventional configuration for chip-to-chip communication using one or more embedded multi-die interconnect bridges (EMIBs) 7900. In this figure, a first chip 7902 is connected to a second chip 7902 via the EMIB 7904, which is embedded within the chip package. In this manner, communications from one chip travel through the chip's various layers toward the EMIB, across the EMIB, and then up the various layers of the second chip. It is also known to utilize one or more silicon interposers for this purpose.

In the context of chip-to-chip/multichip communications, and particularly as 3-D heterogeneous chip integration becomes more commonplace, such reliance on EMIBs and/or silicon interposers is becoming less suitable, at least due to the emerging cost and data rate requirements. Such silicon interposers and EMIBs face at least bandwidth and routing limitations, and pin cost challenges. They generally do not offer flexible chiplet topologies or broadcastable, point-to-multipoint data messaging.

Figure 80:
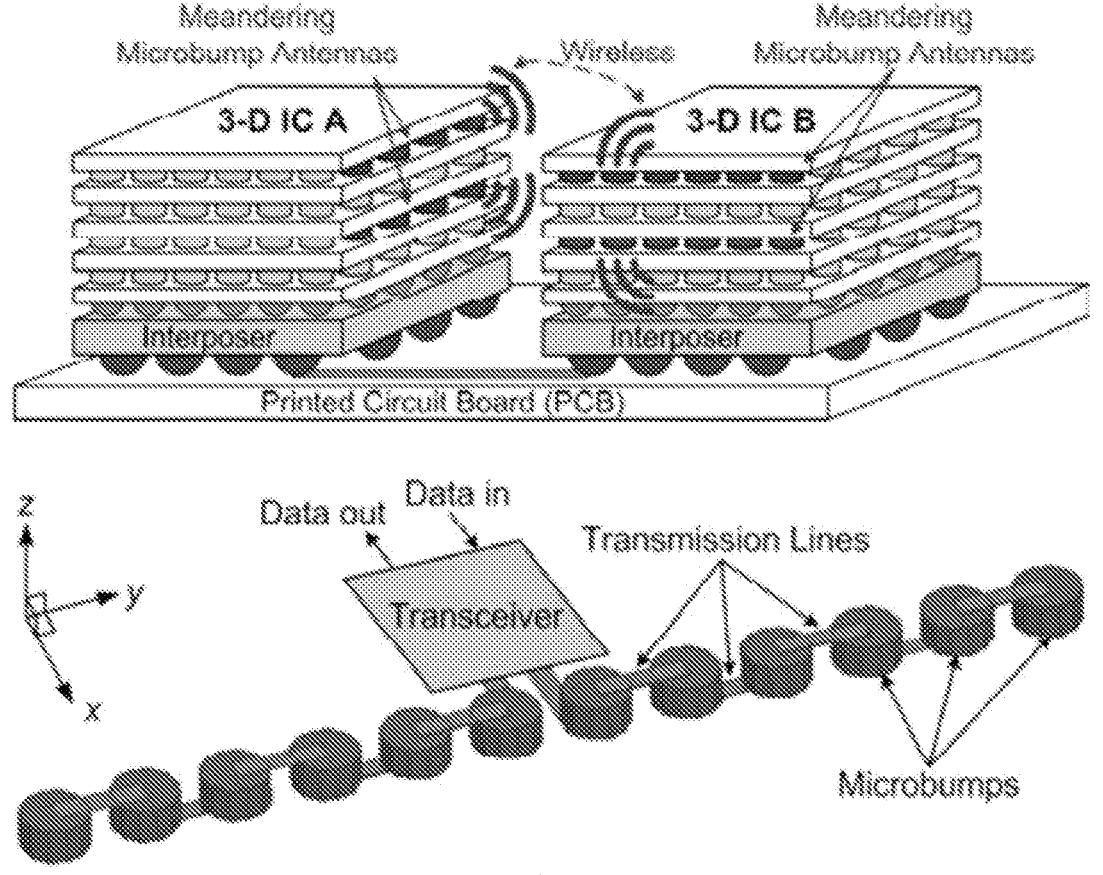
FIG. 80 depicts a wireless chip to chip configuration in a multichip context.

In light if this, it may be desirable to implement one or more wireless chip-to-chip communications (WC2C) strategies to enable chip-to-chip communication without the above limitations of the above-referenced electrically conductive connections. FIG. 80 depicts a WC2C configuration in a multichip context. The strategy depicted in FIG. 80, however, has several challenges. The angular coverage, communication range, and efficient wide-frequency operation of such a configuration are limited due to the hostile in-package/silicon channel environment and the low-profile form factor requirement for antennas.

With respect to the antenna polarization, state-of-the-art wireless interconnects often utilize horizontally-polarized antennas, such as dipole microbump antennas, due to the short-and-wide form factor of the chiplets. This may result in diminished or unacceptable performance, however, since the horizontally-polarized antennas suffer from limited communication range and narrow operational bandwidth. It may also be known to utilize certain vertically-polarized, slot microbump antennas; however, it may be extremely challenging to obtain broadband and efficient antenna performance due to the microbump height limitation ($<<100$ μm). It has been contemplated to utilize silicon-embedded antennas instead; however, their radiation efficiency may be unacceptable for many implementations (e.g. their radiation efficiency is known to be $\leftarrow10$ dB). This may be particularly true for technologies using high-conductivity silicon substrates ($<<1$ S/m).

To solve these challenges, the use of re-radiating elements to enable in-package cross-floor WC2C communications between 3-D heterogeneous chiplets is disclosed herein. In some implementations, multiple, cascaded re-radiating elements may form a radiating path (referred to occasionally herein as a domino channel). This domino channel may significantly extend WC2C range. Within the WC2C context, it is also possible to use dual-polarized microbump antennas along with the re-radiating structures. These strategies may help to overcome the narrow bandwidth, limited rage, limited angular coverage associated with known WC2C efforts. In particular, they may permit broadcastable, point-multipoint data messaging across floors; address the excessive complexity and topological limitations of known, wired interconnect solutions; allow flexible floor-planning of 3D integrated products to alleviate thermal/mechanical constraints and reduce time-to-market; reduce latency; extend communication range (e.g., such as with the Domino channel); and support dual polarization.

Figures 81, 82:
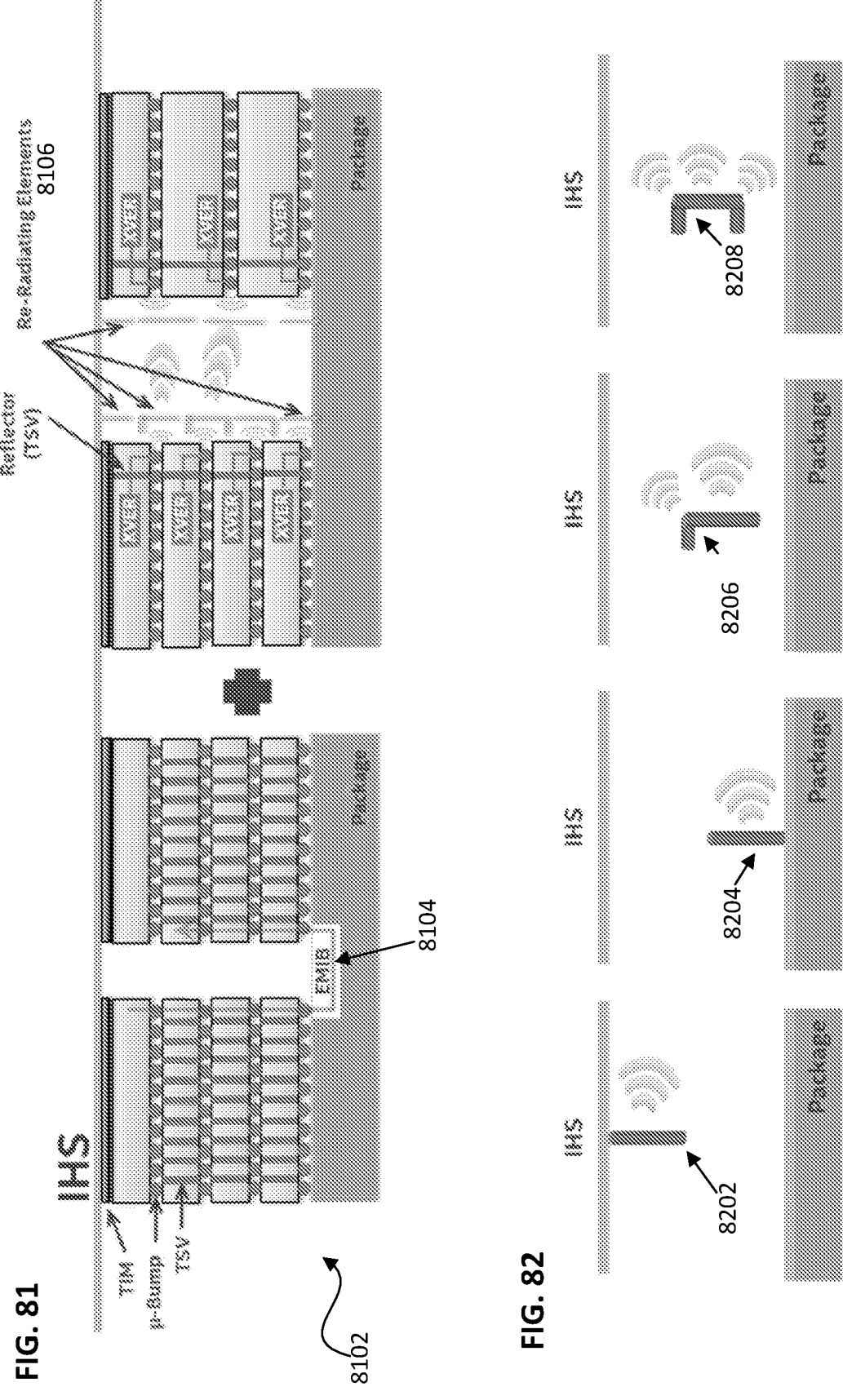
FIG. 81 depicts a cross-floor communication architecture according to an aspect of the disclosure.
FIG. 82 depicts various configurations of the re-radiating structures disclosed herein, along with their re-radiating directions.

FIG. 81 depicts a cross-floor communication architecture according to an aspect of the disclosure. The cross-floor communication architecture may include an embedded multi-die interconnect bridge (EMIB) 8104 between dies and wireless chip-to-chip communication (WC2C) employing re-radiators 8106 (e.g. re-radiating elements/re-radiating structures). In this example, one or more re-radiating elements may be employed to overcome the above-described microbump antenna performance limitations (e.g., narrow operation bandwidth and/or short communication range), which are known to arise because of the extremely low-profile form factor ($<<100$ μm) and the thin metal layers on the silicon substrate.

The re-radiating elements may be one or more resonance structures. That is, they may exhibit a half-wavelength length, such as if they are located in the mold material between dies. If they are connected to the integrated heat spreader (IHS) or the package ground, they may exhibit a quarter-wavelength length. Signals on microbump antennas (or signal couplers) may be wirelessly coupled to the "full-size" resonant or electrically-large re-radiating structures in a sub-wavelength distance. Such coupling may extend wireless communication coverage (range or angle). Thus, the re-radiating structures may help to remedy some of the small antenna challenges and layout restrictions of silicon substrates described above.

FIG. 82 depicts various configurations of the re-radiating structures disclosed herein, along with their re-radiating directions. For example, 0480 depicts a straight, linear re-radiating structure. This structure 0480 acts as an antenna with a wider angular coverage; however, overall radiation gain is limited due the wider angular coverage. Such a reradiating structure connected to the IHS (as depicted by 0480) or to the package ground (as depicted by 8204) is expected to act like a monopole antenna, which would slightly tilt the beam downward (e.g., in the case of the IHS) or upward direction (e.g. in the case of the package ground).

The re-radiating structure of 0480 may be bent or angled. Such a bent structure may support re-radiation in a diagonal direction. For example, 8206 depicts a re-radiating structure which may be bent or formed in an L-shape (e.g. exhibiting a first portion and a second portion at a non-zero/non-180-degree angle to the first portion; e.g. wherein the first portion is at an approximately 90-degree angle to the second portion). As depicted by 8206, a re-radiating structure in this configuration may exhibit a first radiation direction similar to that of a similarly positioned straight, re-radiating element (e.g. as shown in 0480 or 8204) and a second radiation pattern oblique to the first radiation pattern. The re-radiating structure may be configured with two or more bends/angles (e.g. three or more portions) as depicted in 8208. Such a re-radiating structure may exhibit a first radiation angle similar to that of 8206, along with a second radiation angle and a third radiation angle, wherein the second radiation angle and the third radiation angle are different and wherein they are both oblique to the first radiation angle.

These re-radiating structures may be made from one or more metallic structures, such as, but not limited to, one or more metallic rods, one or more through-mold-vias (TMVs), and/or one or more copper pillars. Alternatively or additionally, one or more multi-pieces of the reflector structures can be pre-made. These one or more pre-made structures can be plugged into holes in the molding material. Alternatively or additionally, one or more additional through-silicon-via (TSV) structures may be included in the silicon substrate as one or more reflectors.

Figures 83, 84:
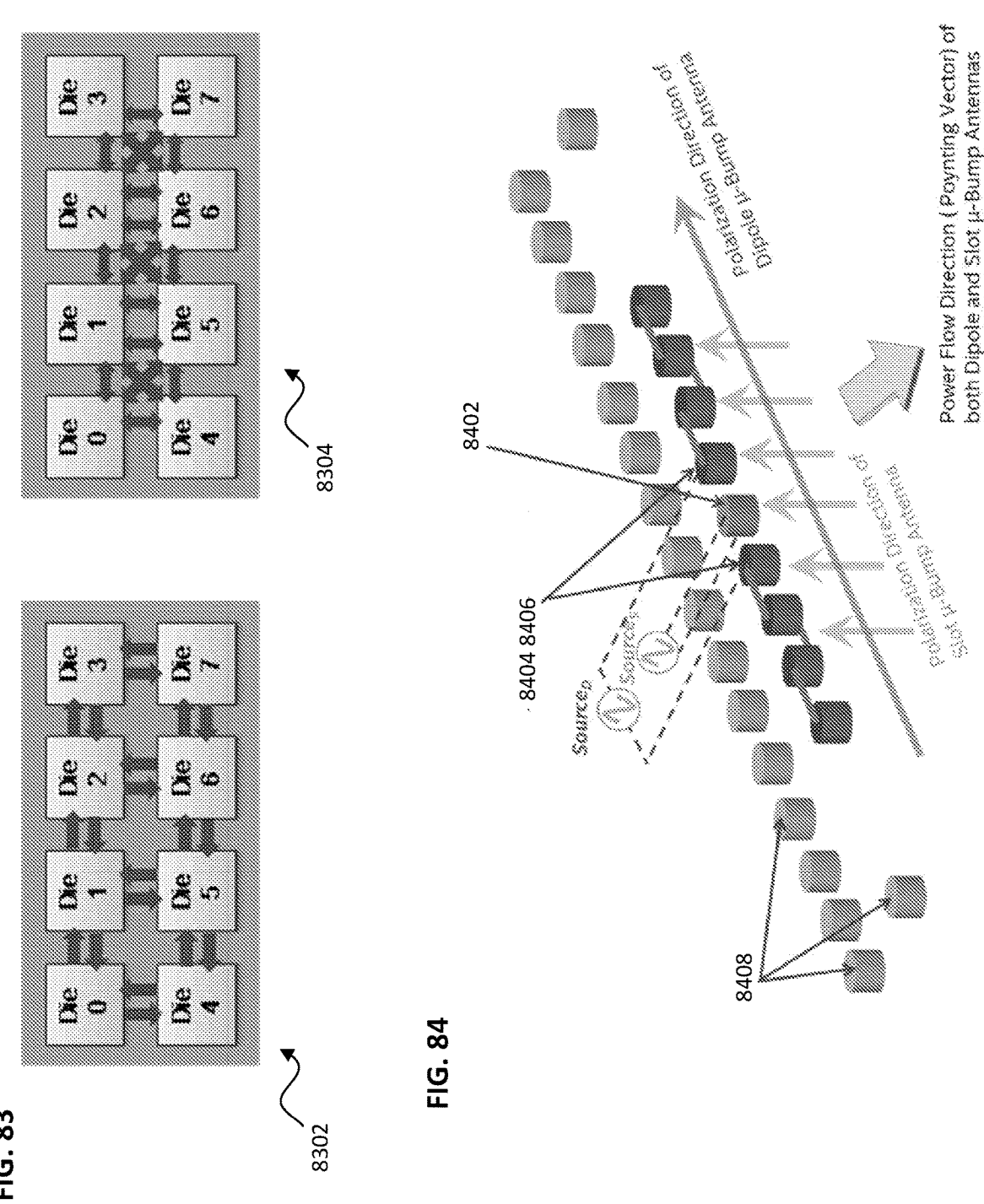
FIG. 83 depicts example network topologies that are supported by re-radiating structures, according to an aspect of the disclosure.
FIG. 84 depicts a feed architecture of dual-polarized microbump antenna with one or more pluralities of radiating microbumps.

The cross-floor communication architecture employing WC2C re-radiating structures proposed herein may be used in a variety of communication topologies, such as for extra short range and short diagonal range. FIG. 83 depicts once such topology, according to an aspect of the disclosure. In this figure, a first plurality of dies 8302 (in this figure, depicted as, but in no way limited to, 8 dies) are arranged with antennas and re-radiating elements to permit wireless communication in adjacent dies (e.g., essentially with dies that are immediately above, below, to the left, or to the right of a transmitting die). Alternatively or additionally, 8304 depicts a second plurality of dies (also depicted as, but in no way limited to, 8 dies) that are arranged with antennas and re-radiating elements to permit wireless communication with adjacent dies (e.g. as described above) and with dies that are oblique or diagonal to the transmitting die. Although two topologies are depicted herein, the principles and methods disclosed herein are not limited to the use of the topologies depicted as 8302 and 8304, but rather may be implemented in a variety of topologies, such as with different communication configurations between dies, with different die arrangements, and/or with a different number of dies. Using such topologies, MIMO antenna arrays and re-radiating elements may improve coverage and performance of 3-D cross-floor WC2C communications.

According to an aspect of the disclosure, the principles and methods disclosed herein may be utilized in a dual polarization context. That is, the extra-short-range wireless chip-to-chip (WC2C) communications can be extended to support dual-linear-polarization, i.e. both vertical and horizontal-polarizations by integrating dipole and slot microbump antennas inside the radiating aperture as depicted in FIG. 84.

FIG. 84 depicts a feed microbump 8402, with one or more pluralities of radiating microbumps 8404 (microbumps depicted to the left of the feed microbump 8402) and 8406 (microbumps depicted to the right of the feed microbump 8402), positioned near and/or adjacent to the first plurality of microbumps. One side of the feed microbump 8402 may be connected to system ground (not depicted in this figure) while the other side of the feed microbump 8402 may be connected to an excitation source, transceiver, or differential source (not depicted in this figure). The one or more pluralities of radiating microbumps 8404 and 8406 may be configured to re-radiate a received radiofrequency signal that is emitted by the feed microbump 8402.

According to an aspect of the disclosure, each plurality of the one or more pluralities of radiating microbumps 8404 and 8406 may include a plurality of microbumps that are electrically conductively connected to one another, such as depicted in at least FIG. 84. These electrically conductive connections may be implemented, for example, through the use of transmission lines, which may be used to connect adjacent microbumps.

According to an aspect of the disclosure, one or more electrically shorted microbumps 8408 may be placed along one or more sides of the one or more radiating microbumps. In this manner, the one or more electrically shorted microbumps may form a radiation aperture, which may further direct the electromagnetic radiation emitted by the one or more pluralities of the feed microbump 8402 and the radiating elements 8404 and 8406.

Thus, slot microbump antenna along with the radiating aperture can support both single-ended and differential feed structures. On the other hand, the dipole microbump antenna having two arms, made from microbumps and transmission lines, can also be placed inside the radiating aperture. That is, the plurality of electrically conductively connected microbumps constructively form a dipole antenna. The constructively formed dipole antenna may have a horizontal polarization. At the same time, the microbumps may also constructively form one or more slot antennas, wherein each constructively formed slot antenna has a vertical polarization. In this manner, dual polarization transmission may be achieved. That is, the slot and dipole microbump antennas may be considered a complementary pair, as their spherical radiation modes are not only orthogonal at near-field regions, but also orthogonal at far-field regions, thereby improving isolation levels between the antennas. The two orthogonal channels may double the maximum data throughputs without demanding additional space within the chip footprint for antenna placement on the silicon die. This may be, for example, because the dipole microbump antenna shares the antenna footprint area with the slot microbump antenna.

Although the spherical radiation modes of these two antennas may be orthogonal to one another, there is some potential for interactions between their feed transmission lines to limit their isolation performance. In this case, the isolation can be improved by using the combination of one or more differential feeds for the dipole microbump antennas and one or more single-ended feeds for the slot dipole antenna. In this manner, common (or even-mode) interferences may be cancelled out.

Figure 85:
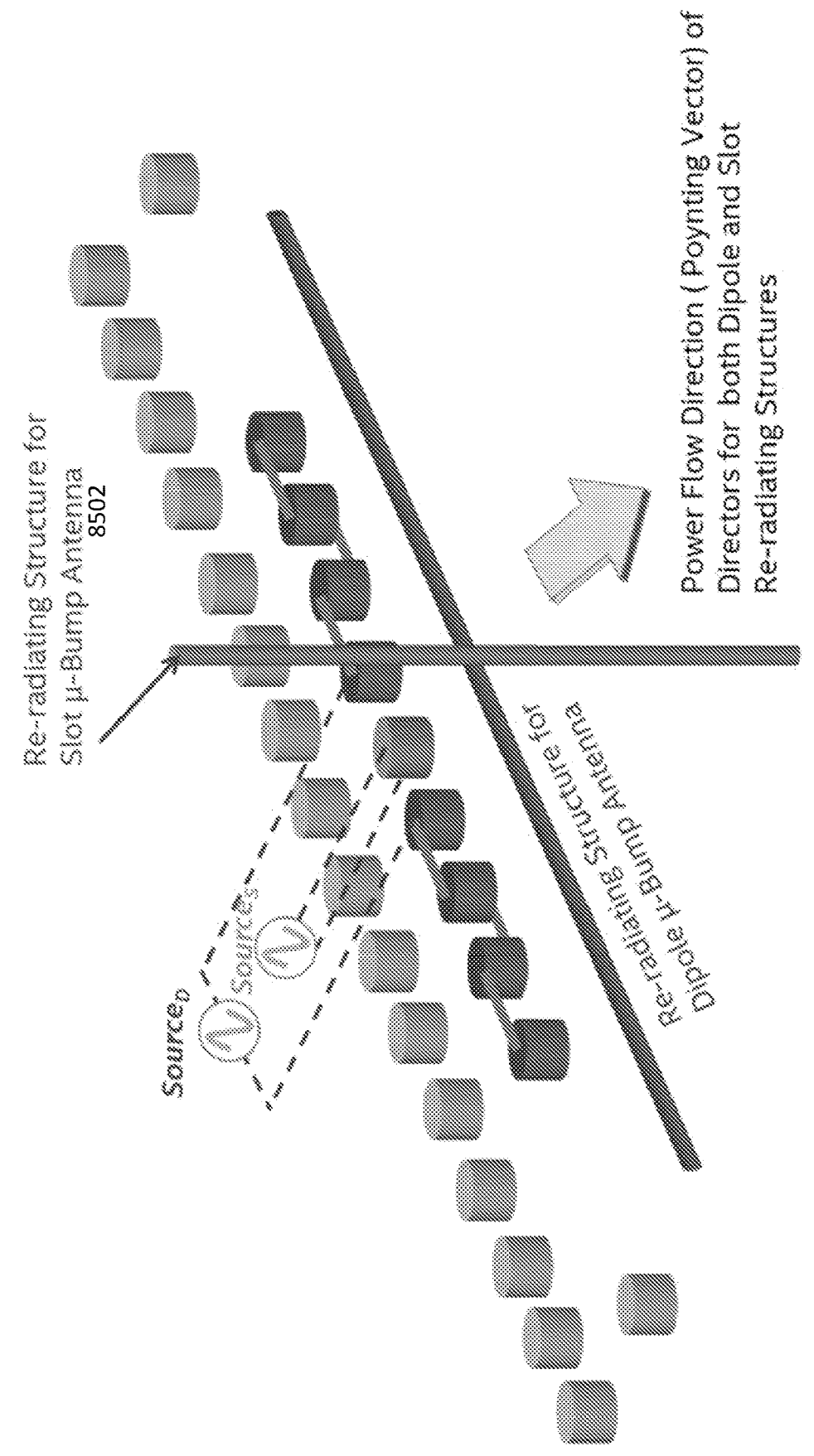
FIG. 85 depicts dual-polarized microbump antenna structures in connection with one or more reradiating structures.

Re-radiating structures as depicted above may be implemented to support the dual-linearly-polarized antenna. In FIG. 85, the dual polarized microbump antenna structures of FIG. 84 are depicted in connection with one or more reradiating structures 8502. In this manner, one or more reradiating structures 8502 may be placed in proximity to the dual polarized antennas (e.g., in proximity to the one or more radiating microbump antennas) to extend or redirect the radiofrequency emission. Furthermore, as will be described in greater detail below, a plurality of reradiating structures 8502 may be placed alongside one another (e.g. in a chain or domino formation), so as to direct and/or extend the radiofrequency emission.

Figure 86:
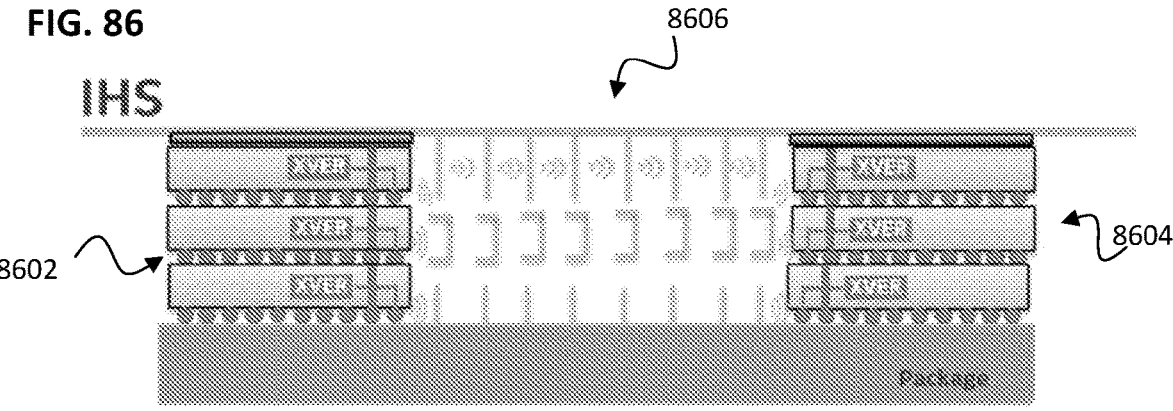
FIG. 86 depicts re-radiating structures between dies and used to create domino channels.

In greater detail, the re-radiating structures can be placed between dies and used to create domino channels, as illustrated in FIG. 86. In this figure, a first die 8602 transmits to a second die 8604 via a plurality of re-radiating structures 8606. In this figure, and for demonstrative purposes only, three varieties of reradiating structures are depicted. Along the top row of 8606, straight or linear reradiating structures are depicted as being connected to the IHS (as in 0480); along the bottom row, the straight or linear reradiating structures are depicted as being connected to the package (as in 8204); and in the middle row, bent or shaped re-radiating structures are depicted (as in 8208). Any one or more types of these reradiating structures may be used. Otherwise stated, only one or more linear reradiating elements attached to the IHS, only one or more linear reradiating elements attached to the package, only one or more curved or bent reradiating elements; or any combination of the above types of reradiating elements may be used. In this figure, the channel between the first die 8602 and the second die 8604 is depicted as including eight reradiating elements of each type. The number of reradiating elements, depicted herein is selected for demonstrative purposes only, and the actual number of reradiating elements may be greater or fewer than eight, depending on the implementation.

In this manner, the signals from the microbump antennas and/or any antenna on the silicon substrate can be coupled to the nearest re-radiating structure. This coupled re-radiating structure begins resonating, and the coupled signals are transferred to the next re-radiating structure. This may continue through one or more additional reradiating structures. Eventually the signals are coupled to receiving antenna on the other die. In the case of multiple reradiating structures, this may occur through a cascade reaction (or domino reaction). This domino reaction may decrease the channel loss in the sub-THz operational frequency range and enable longer distance WC2C communications.

According to another aspect of the disclosure, a thickness of the metal reradiating structures may be selected to influence ohmic loss and/or quality factor Q. That is, thicker metal structures (one or two dimensions) could be used in the re-radiating structure to reduce both the ohmic loss and quality-factor Q (or increase bandwidth because quality-factor Q is inversely proportional to bandwidth). In a sense, the cascaded re-radiating structures may create one or more virtual transmission lines. Nevertheless, they are less dependent on a transmission medium (or "substrate" material in terms of transmission-line analogy) than a conventional electrically conductive transmission line. This allows for a hybrid structure having flavors of both transmission lines, such as microstrip and strip lines, and antenna radiations.

Figure 87:
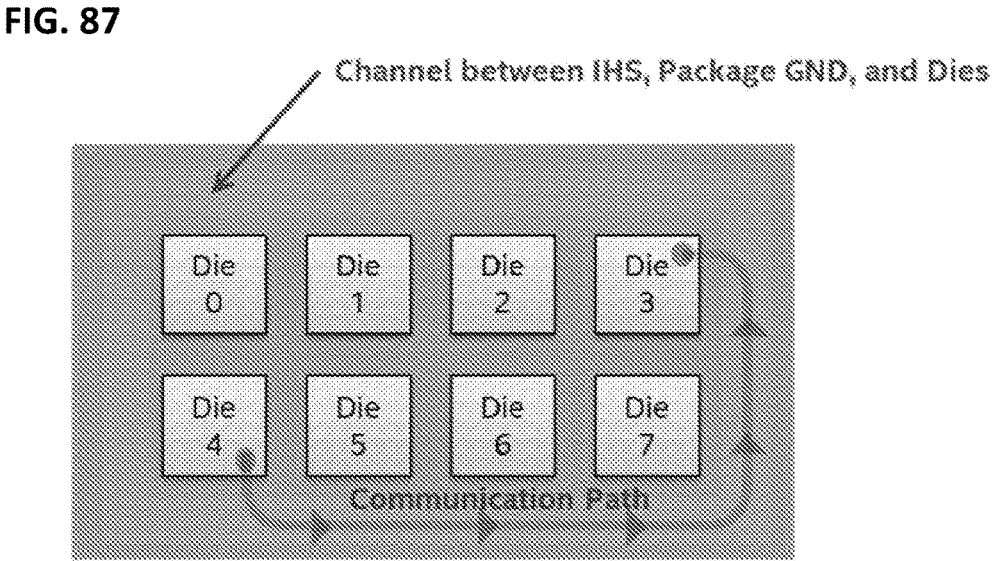
FIG. 87 depicts such a point-to-point communication between dies.

When the domino channel is used together with other type of wired and wireless channels, it is possible to perform a variety of point-to-point and/or point-to-multipoint communications between dies. FIG. 87 depicts such a point-to-point communication between dies, in which a plurality of re-radiating elements is used to route a radiofrequency transmission from one die to another. The use of such re-radiating elements may make it possible to route a radiofrequency transmission through a channel in which a radiofrequency transmission from the transmitter to the receiver would otherwise be difficult or impossible. In greater detail, a wireless channel exists between dies, integrated heat spreader (IHS) enclosure, and top ground layer of package. Although this enclosed channel may exhibit severe cavity resonances, the silicon dies, having high conductivity (<<1 S/m), act like a lossy dielectric loading material. This may reduce the Q of the cavity, significantly mitigating the cavity resonances, and the channel can then be used for WC2C communication. The use of these reradiating structures, such as within the domino channel concepts disclosed herein, foster long-distance WC2C communication despite the significant channel loss, the sharp curve paths, and the low amplifier gain.

Figure 88:
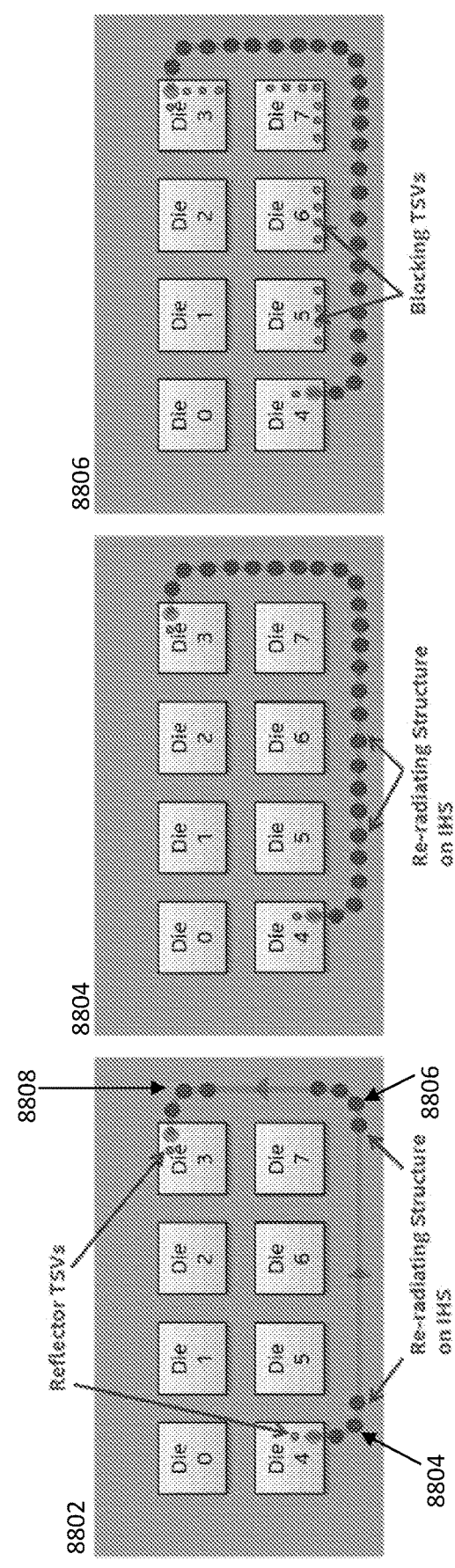
FIG. 88 depicts various implementations of reradiating structures to overcome the above challenges relative to the wireless channel.

According to another aspect of the disclosure, one or more re-radiating structures may help to overcome these challenges. FIG. 88 depicts various implementations of reradiating structures to overcome the above challenges relative to the wireless channel. In 8802, one or more reradiating structures are placed at curved areas or bends within the wireless channel path, such that the radiofrequency emission is rerouted from a first direction to a second direction, different from the first direction. In greater detail, 8802 depicts a transmission from Die 4, which initially radiates in a downward direction. One or more reradiating elements are placed in a first curve 8804, thereby causing the radiofrequency transmission to primarily reroute in a second direction, primarily toward the right of the image 8802. One or more reradiating structures may be placed in a second curve 8806, thereby causing the radiofrequency emission to change directions from a primarily horizontal direction to a primarily vertical direction, as depicted herein. One or more reradiating structures may be placed in a third curve 8808, thereby causing the radiofrequency emission to change direction from a primarily vertical direction into a primarily horizontal direction, such that it is received by the intended die (die 3). Although this image depicts three clusters of reradiating elements used to change directions of the radiofrequency emission, the skilled person will understand that the number of groups of reradiating elements, and the number of reradiating elements used for each group, may be selected for any given implementation and can be greater or fewer than three.

Continuing with FIG. 88, 8804 depicts a plurality of reradiating structures used according to a different aspect of the disclosure. In this manner, rather than relying on a plurality of groups of reradiating elements to change directions of the radiofrequency emission, a continuous chain or domino arrangement of reradiating structures is implemented between the transmitting die and the receiving die.

In this manner, die for transmits to a reradiating structure, which admits to the next reradiating structure, which continues until the final reradiating structure emits the radiofrequency transmission to die three, where it is received. That is, one or more reradiating structures may be placed in curved paths or placed periodically with a sub-wavelength separation distance to form the Domino channel. In this manner, signal power may be focused in the locus of the resonance of the re-radiating structure and transferred to the next re-radiating structure. As shown in 8806, one or more through-silicon-vias (TSVs) may optionally be placed on the edges of silicon substrates along the path in order to further reduce the channel loss.

Figure 89:
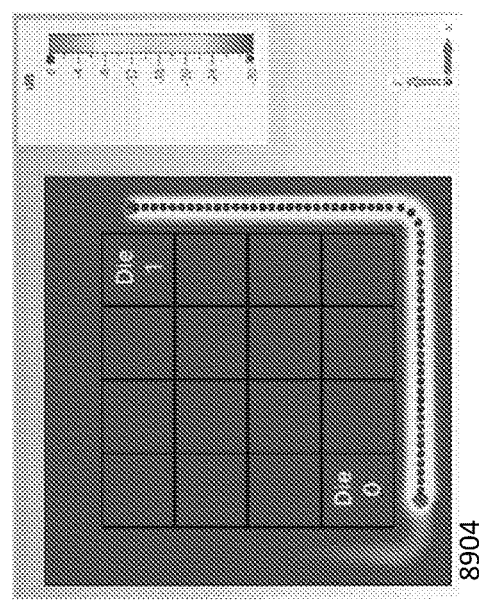
FIG. 89 depicts a simulation result of power flow for a point-to-point communication between dies.
Figure 89:
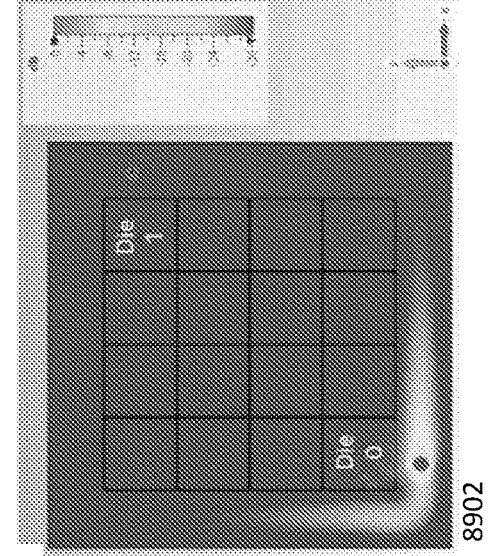

To demonstrate the use of such re-radiating structures, full-wave simulations were carried out. The simulations demonstrate the longer-range communication benefits of this so-called domino channel as implemented by cascading re-radiating structures between two dies. FIG. 89 depicts a representative scenario. Quarter-wavelength reradiating structures are connected to the integrated heat spreader (IHS), for example, generally as depicted in FIG. 86. In this manner, the re-radiating structures do not interfere with trace routings on the top layer of the package. The scenario assumes 30 dB channel loss tolerance. Element 8902 depicts the radiofrequency transmission between two dies without using re-radiating elements. Element 8904 depicts the radiofrequency transmission between the two dies using the domino channel configuration, in which a plurality of reradiating elements is placed between the transmitting die and the receiving die. In 8902, the transmission cannot reach to the right corner of the path, and the receiving die does not in fact receive the radiofrequency transmission. In 8904, the cascaded reradiating structures permit the radiofrequency transmission to extend to the receiving die, without significant channel loss. In 8904, the power distributions are focused on the locus of the re-radiating structures.

Figure 90:
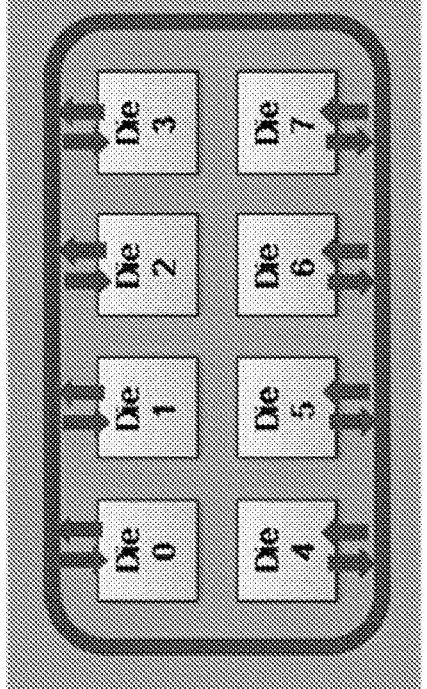
FIG. 90 depicts two exemplary network topologies for reradiating elements.
Figure 90:
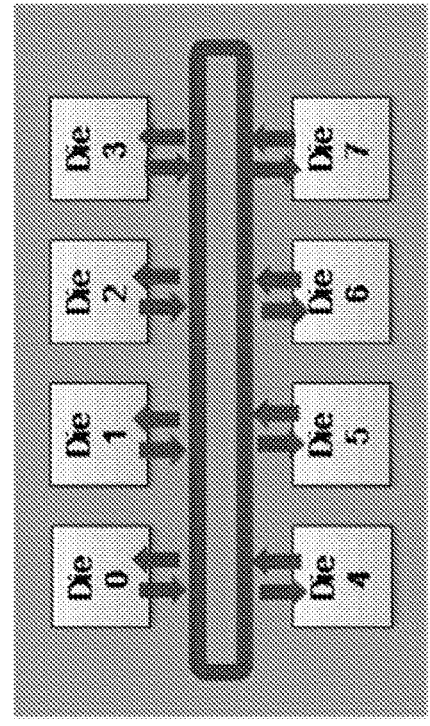

In light of the foregoing, the Domino channel configuration and the use of re-radiating structures may enable comparatively long range point-multipoint communications through a ring network topology. FIG. 90 depicts two such exemplary topologies. In 9002, eight dies are depicted in a rectangular formation, with four dies along the top row and four dies along the bottom row. Without the use of the reradiating elements as described herein, it may be possible to transmit from any die to an adjacent or obliquely located die; however, direct transmissions to other dies may be difficult or impossible. Using the reradiating elements as described herein, however, such transmissions may become a reality. 9002 depicts a plurality of reradiating elements placed in a ring formation around the eight dies (depicted as the exterior ring connected to each die by arrows representing a transmission path). In this manner, each die may transmit to the plurality of reradiating elements, which may then direct the radiofrequency transmission around the path of reradiating elements. In this manner, one or more dies may receive the transmission from the one or more reradiating elements. 9004 depicts an alternative configuration of reradiating elements, according to another aspect of the disclosure. In this case, the plurality of reradiating elements are positioned in a ring formation between the dies (e.g. between the first row of dies and the second row of dies). In this manner, any one die may transmit to the ring of reradiating elements, which then forwards the radiofrequency transmission along the path of reradiating elements, such that any one or more other dies may receive the radiofrequency transmission.

The principles and devices disclosed herein may be configured as a multichip package that includes a first chiplet, including a first antenna, configured to radiate a radiofrequency signal; a second chiplet, including a second antenna, configured to receive the radiofrequency signal; and at least one electromagnetic energy reradiating element, configured to receive the radiofrequency signal from the first antenna, and to reradiate the radiofrequency signal.

Figure 91:
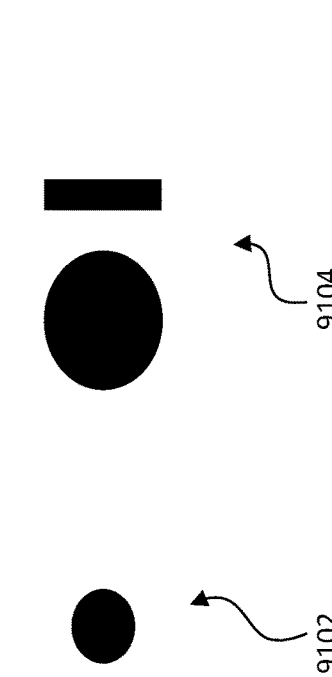
FIG. 91 depicts a cross-sectional view of reradiating elements.

FIG. 91 depicts a cross-sectional view of reradiating elements, in which example 2-dimensional thickness changes to the reradiating elements and the resulting changes in quality factor Q are demonstrated. For example, a moderately-sized reradiating element having a generally rounded cross-section 9102 will be expected to exhibit a high Q. 0416 depicts a 2D cross section of two reradiating element shapes which exhibit a lower Q. 9106 depicts an essentially 1D cross-section of a reradiating element shape exhibiting a lower Q.

The at least one electromagnetic energy reradiating element may include a first electromagnetic energy reradiating element and a second electromagnetic energy reradiating element, the second electromagnetic energy reradiating element configured to receive the reradiated radiofrequency signal from the first electromagnetic energy reradiating element. In this manner, a reradiating element may receive a radiofrequency signal and then radiate the radiofrequency signal to a second reradiating element. The number of reradiating elements may be greater than two. In some configurations, many reradiating elements may be placed adjacently in a chain or domino formation, such that they define a path along which the radiofrequency signal is radiated.

In some configurations, the path of reradiation, as described immediately above, may be a generally unbroken path, such that a continuous succession of reradiating elements extends from a transmitting antenna to a receiving antenna. In other circumstances, the path between the transmitting antenna and the receiving antenna may have a non-continuous succession of reradiating elements. In this circumstance, it may be sufficient to place one or more reradiating elements along curved pathways in the path between the transmitting antenna and the receiving antenna. In this manner, a radiofrequency signal may be transmitted in a first direction. When it is necessary (e.g. due to the curved nature of a path between the transmitting antenna and the receiving antenna) to curve or change the direction of transmission, a plurality of reradiating elements may be placed in a curved fashion such that they define a new direction for continued radiation of the radiofrequency transmission. By placing a plurality of reradiating elements along curves or bends of the wireless path, a radiofrequency transmission may be directed along corners or around obstacles to improve wireless transmission performance.

According to an aspect of the disclosure, the reradiating elements may include one or more segments having a length equal to one-half of a wavelength of the radiofrequency signal. The one or more reradiating elements may be configured as one or more dipole antennas. In this manner, the one or more reradiating elements may have an emission pattern similar or identical to a dipole antenna. According to another aspect of the disclosure, the one or more reradiating elements may include at least one segment having a length equal to one-quarter of a wavelength of the first radiofrequency signal.

According to an aspect of the disclosure, the chip package may optionally include a heat spreader or a reference potential plane. In this manner, the at least one electromagnetic energy reradiating element may be electrically conductively connected to the heat spreader or the reference potential plane, and the at least one electromagnetic energy reradiating element may be configured as a monopole antenna.

According to an aspect of the disclosure, the at least one electromagnetic energy reradiating element may include a first segment and a second segment, essentially perpendicular to the first segment. The first segment may have a first radiation angle, and the second segment may have a second radiation angle, wherein the at least one electromagnetic energy reradiating element has a primary radiation angle in the range from the first radiation angle to the second radiation angle.

The reradiating elements may be created from any of a variety of metallic structures, capable of receiving and reradiating a radiofrequency transmission. A nonexhaustive list of such materials includes one or more metallic rods; one or more vias; and one or more copper pillars.

DEFINITIONS

The detailed description refers to the accompanying drawings that show, by way of illustration, specific details and aspects of this disclosure in which the disclosure may be practiced. Other aspects may be utilized and structural, logical, and electrical changes may be made without departing from the scope of the disclosure. The various aspects of this disclosure are not necessarily mutually exclusive, as some aspects of this disclosure can be combined with one or more other aspects of this disclosure to form new aspects.

The word "exemplary" is used herein to mean "serving as an example, instance, or illustration". Any aspect of the disclosure or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. The terms "group (of)", "set (of)", "collection (of)", "series (of)", "sequence (of)", "grouping (of)", etc., and the like in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As used herein, "memory" is understood as a computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" refers to any type of executable instruction, including firmware.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

The term "semiconductor substrate" is defined to mean any construction including semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring to the transmit signal in baseband, intermediate, and radio frequencies.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

The term "antenna" or "antenna structure", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

The term "calibration" as used herein may describe a process in which a device or a component of a device (e.g., a radiohead circuit, a transceiver chain, a component of a transceiver chain, and the like) is calibrated. Illustratively, the term calibration may describe a process in which one or more deviations of a behavior of a device or of one of its components from an expected or desired behavior are corrected. Further illustratively, the term calibration may describe a process in which the operation of a device or of one of its components is aligned with a predefined or desired operation of the device or of the component. By way of example, a calibration may describe a process in which nonlinearities are eliminated and/or in which mismatches are eliminated.

The term "operatively connected" as used herein may describe a connection between two elements, such that a first element operates or functions using as input the output of a second element. According to an aspect of the disclosure, "operatively connected" may describe an electrically conductive connection. That is, two elements that are operatively connected as described herein may be electrically conductively connected such that an electric charge may travel from the first element to the second element.

DP #13

In Example 1, a circuit package including: a first chiplet, including: a first side and a second side, opposite to the first side; a first terminal, extending between the first side and the second side; a first solder element, mounted on the first terminal; a second terminal, extending between the first side and the second side, a second solder element, mounted on the second terminal; and a metallic element, electrically conductively connected to the second solder element; wherein the metallic element has a shape whose perimeter at least partially surrounds the first terminal.

In Example 2, the circuit package of Example 1, further including a first transmission line, electrically conductively connected to the first terminal; wherein the first terminal is configured to receive an electrical signal from the first transmission line and to emit a radiofrequency signal from at least the solder element, wherein the radiofrequency signal represents the received electrical signal.

In Example 3, the circuit package of Example 2, wherein the metallic element is configured to at least one of inductively or capacitively couple the second solder element with the first solder element.

In Example 4, the circuit package of Example 3, wherein the at least one of the inductive or capacitive coupling of the metallic element with the first solder element alters an impedance of the second solder element.

In Example 5, the circuit package of any one of Examples 2 to 4, wherein the first solder element is electrically conductively connected to a package ground layer and am m7 ground layer of the first chiplet.

In Example 6, the circuit package of Example 1, further including a first transmission line, electrically conductively connected to the second terminal; wherein the second terminal is configured to receive an electrical signal from the first transmission line and to emit a radiofrequency signal from at least the solder element, wherein the radiofrequency signal represents the received electrical signal.

In Example 7, the circuit package of Example 6, wherein the metallic element is a top-loaded antenna.

In Example 8, the circuit package of Example 6, wherein the metallic element performs a top-loading function.

In Example 9, the circuit package of any one of Examples 6 or 8, wherein the first terminal is electrically shorted.

In Example 10, the circuit package of any one of Examples 1 to 9, wherein the first solder element is a solder bump.

In Example 11, the circuit package of any one of Examples 1 to 10, wherein the first solder element is a microbump.

In Example 12, the circuit package of any one of Examples 1 to 11, wherein the first terminal is a via.

In Example 13, the circuit package of any one of Examples 1 to 12, wherein the second solder element is a solder bump.

In Example 14, the circuit package of any one of Examples 1 to 13, wherein the second solder element is a microbump.

In Example 15, the circuit package of any one of Examples 1 to 14, wherein the second terminal is a via.

In Example 16, the circuit package of any one of Examples 1 to 15, further including one or more third terminals, placed along at least one side of the metallic element, wherein the one or more third terminals are electrically shorted.

In Example 17, the circuit package of Example 16, wherein the one or more third terminals form an aperture to direct the radiofrequency signal.

In Example 18, the circuit package of Example 16 or 17, wherein the one or more third terminals are vias.

In Example 19, the circuit package of any one of Examples 1 to 18, wherein the metallic element is cut from at least one layer of the circuit package.

In Example 20, the circuit package of any one of Examples 1 to 19, wherein the metallic element is cut from an m8 layer of the circuit package.

In Example 21, the circuit package of any one of Examples 1 to 20, further including a second chiplet, including: a first side and a second side, opposite to the first side; a first terminal, extending between the first side and the second side; a first solder element, mounted on the first terminal; a second terminal, extending between the first side and the second side, a second solder element, mounted on the second terminal; and a metallic element, electrically conductively connected to the second solder element; wherein the metallic element has a shape whose perimeter at least partially surrounds the first terminal.

In Example 22, a means for chiplet radiofrequency emission including: a first chiplet, including: a first side and a second side, opposite to the first side; a first terminal, extending between the first side and the second side; a first solder element, mounted on the first terminal; a second terminal, extending between the first side and the second side, a second solder element, mounted on the second terminal; and a metallic element, electrically conductively connected to the second solder element; wherein the metallic element has a shape whose perimeter at least partially surrounds the first terminal.

In Example 23, the means for chiplet radiofrequency emission of Example 22, further including a first transmission line, electrically conductively connected to the first terminal; wherein the first terminal is configured to receive an electrical signal from the first transmission line and to emit a radiofrequency signal from at least the solder element, wherein the radiofrequency signal represents the received electrical signal.

In Example 24, the means for chiplet radiofrequency emission of Example 23, wherein the metallic element is configured to at least one of inductively or capacitively couple the second solder element with the first solder element.

In Example 25, the means for chiplet radiofrequency emission of Example 24, wherein the at least one of the inductive or capacitive coupling of the metallic element with the first solder element alters an impedance of the first solder element.

In Example 26, the means for chiplet radiofrequency emission of any one of Examples 23 to 25, wherein the second solder element is electrically conductively connected to a package ground layer and am m7 ground layer of the first chiplet.

In Example 27, the means for chiplet radiofrequency emission of Example 22, further including a first transmission line, electrically conductively connected to the second terminal; wherein the second terminal is configured to receive an electrical signal from the first transmission line and to emit a radiofrequency signal from at least the solder element, wherein the radiofrequency signal represents the received electrical signal.

In Example 28, the means for chiplet radiofrequency emission of Example 27, wherein the metallic element is a top-loaded antenna.

In Example 29, the means for chiplet radiofrequency emission of Example 27, wherein the metallic element performs a top-loading function.

In Example 30, the means for chiplet radiofrequency emission of any one of Examples 27 or 29, wherein the first terminal is electrically shorted.

In Example 31, the means for chiplet radiofrequency emission of any one of Examples 22 to 30, wherein the first solder element is a solder bump.

In Example 32, the means for chiplet radiofrequency emission of any one of Examples 22 to 31, wherein the first solder element is a microbump.

In Example 33, the means for chiplet radiofrequency emission of any one of Examples 22 to 32, wherein the first terminal is a via.

In Example 34, the means for chiplet radiofrequency emission of any one of Examples 22 to 33, wherein the second solder element is a solder bump.

In Example 35, the means for chiplet radiofrequency emission of any one of Examples 22 to 34, wherein the second solder element is a microbump.

In Example 36, the means for chiplet radiofrequency emission of any one of Examples 22 to 35, wherein the second terminal is a via.

In Example 37, the means for chiplet radiofrequency emission of any one of Examples 22 to 36, further including one or more third terminals, placed along at least one side of the metallic element, wherein the one or more third terminals are electrically shorted.

In Example 38, the means for chiplet radiofrequency emission of Example 37, wherein the one or more third terminals form an aperture to direct the radiofrequency signal.

In Example 39, the means for chiplet radiofrequency emission of Example 37 or 38, wherein the one or more third terminals are vias.

In Example 40, the means for chiplet radiofrequency emission of any one of Examples 22 to 39, wherein the metallic element is cut from at least one layer of the means for chiplet radiofrequency emission.

In Example 41, the means for chiplet radiofrequency emission of any one of Examples 22 to 40, wherein the metallic element is cut from an m8 layer of the means for chiplet radiofrequency emission.

DP #3

In Example 42, a multichip radiofrequency transmission device, including: a first chiplet; a first antenna; a first transmission line, connecting the first antenna to the first chiplet; a second chiplet; a second antenna; and a second transmission line, connecting the second antenna to the second chiplet; wherein a minimum distance between the first chiplet and the second chiplet is greater than a minimum distance between the first antenna and the second antenna.

In Example 43, the multichip radiofrequency transmission device of Example 42, further including: a third chiplet; a third antenna; and a third transmission line, connecting the third antenna to the second chiplet; wherein a minimum distance between the first chiplet, the second chiplet, and the third chiplet is greater than a minimum distance between the first antenna, the second antenna, and the third antenna.

In Example 44, the multichip radiofrequency transmission device of Example 42 or 43, wherein at least one of the first antenna or the second antenna includes a plurality of vertically stacked vias.

In Example 45, the multichip radiofrequency transmission device of any one of Examples 42 to 44, wherein at least one of the first antenna or the second antenna includes a plurality of through silicon via (TSV) antennas.

In Example 46, the multichip radiofrequency transmission device of any one of Examples 42 to 45, wherein at least one of the first antenna, second antenna, or third antenna is a top-loaded monopole antenna.

In Example 47, the multichip radiofrequency transmission device of any one of Examples 42 to 46, further including the first chiplet, wherein the first chiplet includes a transceiver and one or more processors, configured to control the transceiver to transmit a wireless signal via the first antenna to at least the second antenna or the third antenna.

In Example 48, the multichip radiofrequency transmission device of any one of Examples 42 to 47, wherein the first transmission line is configured to electrically conductively connect the first antenna to the first chiplet.

In Example 49, the multichip radiofrequency transmission device of any one of Examples 42 to 48, wherein the second transmission line is configured to electrically conductively connect the second antenna to the second chiplet.

In Example 50, the multichip radiofrequency transmission device of any one of Examples 42 to 49, wherein the third transmission line is configured to electrically conductively connect the third antenna to the third chiplet.

In Example 51, the multichip radiofrequency transmission device of any one of Examples 42 to 50, wherein at least one of the first transmission line, the second transmission line, or the third transmission line is a strip line.

In Example 52, the multichip radiofrequency transmission device of any one of Examples 42 to 51, wherein at least one of the first transmission line, the second transmission line, or the third transmission line is a microstrip.

In Example 53, the multichip radiofrequency transmission device of any one of Examples 42 to 52, wherein at least one of the first transmission line, the second transmission line, or the third transmission line is a waveguide.

In Example 54, the multichip radiofrequency transmission device of Example 53, wherein waveguide is a substrate integrated waveguide.

In Example 55, the multichip radiofrequency transmission device of any one of Examples 42 to 54, further including a plurality of radiofrequency reflecting elements, configured to receive a radiofrequency signal from the first antenna and reflect the received radiofrequency signal toward the second antenna.

In Example 56, the multichip radiofrequency transmission device of Example 55, wherein the first antenna is positioned between at least one of the plurality of radiofrequency reflecting elements and the second antenna.

In Example 57, the multichip radiofrequency transmission device of any one of Examples 42 to 56, wherein the minimum distance between the first antenna and the second antenna is less than 500 μm.

In Example 58, the multichip radiofrequency transmission device of any one of Examples 42 to 57, wherein the minimum distance between the first antenna and the second antenna is less than 300 μm.

In Example 59, the multichip radiofrequency transmission device of any one of Examples 43 to 58, wherein the vias are between 100 μm and 200 μm in diameter.

In Example 60, the multichip radiofrequency transmission device of any one of Examples 42 to 59, wherein a length of at least one of the first transmission line, second transmission line, or third transmission line is variable.

In Example 61, the multichip radiofrequency transmission device of any one of Examples 42 to 60, wherein the multichip radiofrequency transmission device is printed on a printed circuit board (PCB).

In Example 62, the multichip radiofrequency transmission device of any one of Examples 42 to 60, wherein the multichip radiofrequency transmission device is formed on a silicon die.

In Example 63, the multichip radiofrequency transmission device of any one of Examples 42 to 62, further including an encapsulation material, encapsulating the first chiplet and the second chiplet.

In Example 64. A multichip radiofrequency transmission system, including: a first multichip radiofrequency transmission device, including: a first chiplet; a first antenna; a first transmission line, connecting the first antenna to the first chiplet; a second chiplet; a second antenna; and a second transmission line, connecting the second antenna to the second chiplet; wherein a minimum distance between the first chiplet and the second chiplet is greater than a minimum distance between the first antenna and the second antenna; and a second multichip radiofrequency transmission device, including: a third chiplet; a third antenna; a third transmission line, connecting the third antenna to the third chiplet; a fourth chiplet; a fourth antenna; and a fourth transmission line, connecting the fourth antenna to the fourth chiplet; wherein a minimum distance between the third chiplet and the fourth chiplet is greater than a minimum distance between the third antenna and the fourth antenna.

In Example 65, the multichip radiofrequency transmission device of Example 64, wherein at least one of the third antenna or the fourth antenna includes a plurality of vertically stacked vias.

In Example 66, the multichip radiofrequency transmission device of Example 64 to 65, wherein at least one of the third antenna or the fourth antenna includes a plurality of through silicon via (TSV) antennas.

In Example 67, the multichip radiofrequency transmission device of any one of Examples 64 to 66, wherein at least one of the third antenna, or fourth antenna is a top-loaded monopole antenna.

In Example 68, the multichip radiofrequency transmission device of any one of Examples 64 to 67, further including the second chiplet, wherein the second chiplet includes a transceiver and one or more processors, configured to control the transceiver to transmit a wireless signal via the third antenna to at least the fourth antenna.

In Example 69, a multichip radiofrequency transmission means, including: a first processing means; a first antenna; a first transmission means, connecting the first antenna to the first processing means; a second processing means; a second antenna; and a second transmission line, connecting the second antenna to the second processing means; wherein a minimum distance between the first processing means and the second processing means is greater than a minimum distance between the first antenna and the second antenna.

In Example 70, the multichip radiofrequency transmission means of Example 69, further including: a third processing means; a third antenna; and a third transmission line, connecting the third antenna to the second processing means; wherein a minimum distance between the first processing means, the second processing means, and the third processing means is greater than a minimum distance between the first antenna, the second antenna, and the third antenna.

In Example 71, the multichip radiofrequency transmission means of Example 69 or 70, wherein at least one of the first antenna or the second antenna includes a plurality of vertically stacked vias.

In Example 72, the multichip radiofrequency transmission means of any one of Examples 69 to 71, wherein at least one of the first antenna or the second antenna includes a plurality of through silicon via (TSV) antennas.

In Example 73, the multichip radiofrequency transmission means of any one of Examples 69 to 72, wherein at least one of the first antenna, second antenna, or third antenna is a top-loaded monopole antenna.

In Example 74, the multichip radiofrequency transmission means of any one of Examples 69 to 73, further including the first processing means, wherein the first processing means includes a transceiver and one or more processors, configured to control the transceiver to transmit a wireless signal via the first antenna to at least the second antenna or the third antenna.

In Example 75, the multichip radiofrequency transmission means of any one of Examples 69 to 74, wherein the first transmission line is configured to electrically conductively connect the first antenna to the first processing means.

In Example 76, the multichip radiofrequency transmission means of any one of Examples 69 to 75, wherein the second transmission line is configured to electrically conductively connect the second antenna to the second processing means.

In Example 77, the multichip radiofrequency transmission means of any one of Examples 69 to 76, wherein the third transmission line is configured to electrically conductively connect the third antenna to the third processing means.

In Example 78, the multichip radiofrequency transmission means of any one of Examples 69 to 77, wherein at least one of the first transmission line, the second transmission line, or the third transmission line is a strip line.

In Example 79, the multichip radiofrequency transmission means of any one of Examples 69 to 78, wherein at least one of the first transmission line, the second transmission line, or the third transmission line is a microstrip.

In Example 80, the multichip radiofrequency transmission means of any one of Examples 69 to 79, wherein at least one of the first transmission line, the second transmission line, or the third transmission line is a waveguide.

In Example 81, the multichip radiofrequency transmission means of Example 80, wherein waveguide is a substrate integrated waveguide.

In Example 82, the multichip radiofrequency transmission means of any one of Examples 69 to 81, further including a plurality of radiofrequency reflecting elements, configured to receive a radiofrequency signal from the first antenna and reflect the received radiofrequency signal toward the second antenna.

In Example 83, the multichip radiofrequency transmission means of Example 82, wherein the first antenna is positioned between at least one of the plurality of radiofrequency reflecting elements and the second antenna.

In Example 84, the multichip radiofrequency transmission means of any one of Examples 69 to 83, wherein the minimum distance between the first antenna and the second antenna is less than 500 μm.

In Example 85, the multichip radiofrequency transmission means of any one of Examples 69 to 84, wherein the minimum distance between the first antenna and the second antenna is less than 300 μm.

In Example 86, the multichip radiofrequency transmission means of any one of Examples 70 to 85, wherein the vias are between 100 μm and 200 μm in diameter.

In Example 87, the multichip radiofrequency transmission means of any one of Examples 69 to 86, wherein a length of at least one of the first transmission line, second transmission line, or third transmission line is variable.

In Example 88, the multichip radiofrequency transmission means of any one of Examples 69 to 87, wherein the multichip radiofrequency transmission means is printed on a printed circuit board (PCB).

In Example 89, the multichip radiofrequency transmission means of any one of Examples 69 to 87, wherein the multichip radiofrequency transmission means is formed on a silicon die.

In Example 90, the multichip radiofrequency transmission means of any one of Examples 69 to 89, further including an encapsulation material, encapsulating the first processing means and the second processing means.

DP #6

In Example 91, a multichip module including: a chiplet including: a first receive antenna; a second receive antenna; one or more receivers, configured to receive a combined wireless transmission on the first receive antenna and the second receive antenna, wherein the combined wireless transmission represents a first wireless transmission transmitted by a first transmit antenna and a second wireless transmission, different from the first wireless transmission, transmitted by a second transmit antenna; decode the combined wireless transmission according to one or more predefined decoding parameters to determine the first wireless transmission and the second wireless transmission from the combined wireless transmission; and send the decoded first wireless transmission to an equalizer and the decoded second wireless transmission to an equalizer.

In Example 92, the multichip module of Example 91, wherein decoding the combined wireless transmission includes applying a predetermined weight to at least one of the combined wireless transmissions as received on the first receive antenna or the combined wireless transmission as received on the second receive antenna.

In Example 93, the multichip module of Example 9292, wherein the predetermined weight is received through a backchannel.

In Example 94, the multichip module of Example 91 or Example 93, wherein an additional chiplet sends the predetermined weight to the chiplet through a backchannel.

In Example 95, the multichip module of Example 91, Example 93, or Example 94, wherein the chiplet applies the predetermined weight at one of the one or more receive antennas before MIMO decoding.

In Example, 96, the multichip module of Example 95, wherein the predetermined weight is based on a spatial relationship between the first transmit antenna and the second transmit antenna relative to the first receive antenna and the second receive antenna.

In Example 97, the multichip module of Example 96, wherein the first receive antenna and the second receive antenna are fixedly mounted with respect to the first transmit antenna and the second transmit antenna.

In Example 98, the multichip module of any one of Examples 92 to 97, wherein the predetermined weight represents a phase shift between one of the first transmit antenna or the second transmit antenna and one of the first receive antenna or the second receive antenna.

In Example 99, the multichip module of any one of Examples 91 to 98, wherein the first receive antenna and the second receive antenna are fixedly mounted with respect to the chiplet.

In Example 100, the multichip module of any one of Examples 91 to 99, further including one or more equalizing circuits, configured to receive the decoded first wireless transmission and the decoded second wireless transmission and to modify the decoded first wireless transmission and the decoded second wireless transmission according to one or more equalization parameters.

In Example 101, the multichip module of Example 100, wherein modifying the decoded first wireless transmission and the decoded second wireless transmission according to the one or more equalization parameters includes reducing intersymbol interference.

In Example 102, the multichip module of Example 100 or 101, wherein modifying the decoded first wireless transmission and the decoded second wireless transmission according to the one or more equalization parameters includes performing at least one of a precursor equalization operation or a postcursor equalization operation.

In Example 103, the multichip module of any one of Examples 91 to 102, wherein the wireless transmission is precoded.

In Example 104, the multichip module of any one of Examples 91 to 103, wherein the wireless transmission is a line of sight transmission.

In Example 105, the multichip module of any one of Examples 91 to 104, wherein the multichip module is further configured to perform a training operation including: receiving a first training transmission as transmitted by a first transmit antenna on at least the first radiofrequency antenna or the second radiofrequency antenna; and determining a first receive training parameter based on the first training transmission.

In Example 106, the multichip module of Example 105, wherein the first receive training parameter is a first receiver weight.

In Example 107, the multichip module of Example 106, wherein the multichip module is further configured to: receive a second training transmission as transmitted by the first transmit antenna on at least the first radiofrequency antenna or the second radiofrequency antenna; determine a first signal parameter of the received first training transmission and a second signal parameter of the received second training transmission; transmit data representing an index for either the first training transmission or the second training transmission based on at least one of the first signal parameter or the second signal parameter.

In Example 108, the multichip module of Example 107, wherein the first signal parameter and the second signal parameter include signal strength.

In Example 109, the multichip module of any one of Examples 91 to 108, wherein the multichip module is further configured to perform a training operation including: receiving a first training transmission on the first receive antenna and the second receive antenna, wherein the first training transmission is transmitted by the first transmit antenna; receiving a second training transmission on the first receive antenna and the second receive antenna, wherein the second training transmission is transmitted by the second transmit antenna; and determining one or more training parameters based on the first training transmission and the received second training transmission.

In Example 110, the multichip module of Example 109, wherein the one or more training parameters include a phase or amplitude of at least one of the first training transmission or the second training transmission.

In Example 111, a multichip module including: a chiplet including: a first receive antenna, electrically conductively coupled to a first receiver; a second receive antenna, electrically conductively coupled to a second receiver; a radio circuitry, including: the first receiver, configured to receive a combined wireless transmission from the first receive antenna, wherein the combined wireless transmission represents a first wireless transmission transmitted by a first transmit antenna and a second wireless transmission, different from the first wireless transmission, transmitted by a second transmit antenna; and the second receiver, configured to receive the combined wireless transmission from the second receive antenna; and one or more processors, configured to receive data representing the combined wireless transmission as received on the first receive antenna and the combined wireless transmission as received on the second receive antenna; decode the data according to one or more predefined decoding parameters to determine the first wireless transmission and the second wireless transmission from the combined wireless transmission; and send the decoded first wireless transmission to an equalizer and the decoded second wireless transmission to an equalizer.

In Example 112, the multichip module of Example 111, wherein decoding the data includes applying a predetermined weight to the data.

In Example 113, the multichip module of Example 112, wherein the predetermined weight is based on a spatial relationship between the first transmit antenna and the second transmit antenna relative to the first receive antenna and the second receive antenna.

In Example 114, the multichip module of Example 113, wherein the first receive antenna and the second receive antenna are fixedly mounted with respect to the first transmit antenna and the second transmit antenna.

In Example 115, the multichip module of any one of Examples 112 to 114, wherein the predetermined weight represents a phase shift between one of the first transmit antenna or the second transmit antenna and one of the first receive antenna or the second receive antenna.

In Example 116, the multichip module of any one of Examples 111 to 115, wherein the first receive antenna and the second receive antenna are fixedly mounted with respect to the chiplet.

In Example 117, the multichip module of any one of Examples 111 to 116, further including one or more equalizing circuits, configured to receive the decoded first wireless transmission and the decoded second wireless transmission and to modify the decoded first wireless transmission and the decoded second wireless transmission according to one or more equalization parameters.

In Example 118, the multichip module of Example 117, wherein modifying the decoded first wireless transmission and the decoded second wireless transmission according to the one or more equalization parameters includes reducing intersymbol interference.

In Example 119, the multichip module of Example 117 or 118, wherein modifying the decoded first wireless transmission and the decoded second wireless transmission according to the one or more equalization parameters includes performing at least one of a precursor equalization operation or a postcursor equalization operation.

In Example 120, the multichip module of any one of Examples 111 to 119, wherein the wireless transmission is precoded.

In Example 121, the multichip module of any one of Examples 111 to 120, wherein the wireless transmission is a line of sight transmission.

In Example 122, the multichip module of any one of Examples 111 to 121, wherein the multichip module is further configured to perform a training operation including: receiving a first training transmission as transmitted by a first transmit antenna on at least the first radiofrequency antenna or the second radiofrequency antenna; and determining a first receive training parameter based on the first training transmission.

In Example 123, the multichip module of Example 122, wherein the multichip module is further configured to: receive a second training transmission as transmitted by the first transmit antenna on at least the first radiofrequency antenna or the second radiofrequency antenna; determine a first signal parameter of the received first training transmission and a second signal parameter of the received second training transmission; transmit data representing an index for either the first training transmission or the second training transmission based on at least one of the first signal parameter or the second signal parameter.

In Example 124, the multichip module of Example 123, wherein the first signal parameter and the second signal parameter include signal strength.

In Example 125, the multichip module of any one of Examples 111 to 124, wherein the multichip module is further configured to perform a training operation including: receiving a first training transmission on the first receive antenna and the second receive antenna, wherein the first training transmission is transmitted by the first transmit antenna; receiving a second training transmission on the first receive antenna and the second receive antenna, wherein the second training transmission is transmitted by the second transmit antenna; and determining one or more training parameters based on the first training transmission and the received second training transmission.

In Example 126, the multichip module of Example 125, wherein the one or more training parameters include a phase or amplitude of at least one of the first training transmission or the second training transmission.

In Example 127, a multichip module, including: one or more receivers, configured to receive data representing an adaptive complex weight of a received radiofrequency signal; determine a phase offset of the received radiofrequency signal from the received data; determine one or more asymmetric properties of a wireless channel based on the received data; send an instruction to modify the radiofrequency signal by the phase offset and/or the one or more asymmetric properties.

In Example 128, a multichip module, including: one or more transmitters, configured to receive data representing a complex weight of a first radiofrequency signal; modify an amplitude and/or a phase offset of a second radiofrequency signal based on the received data.

In Example 129, the multichip module of 128, wherein the transmitter is configured to modify the amplitude and/or the phase offset across a plurality of MIMO channels.

In Example 130, the multichip module of 129 or 128, further including a feedback path from a receiver to the transmitter to report a preferred value for a complex tap at the transmitter.

In Example 131, the multichip module of any one of examples 69 to 105, wherein the multichip module comprises an additional chiplet, which comprises one or more processors, which is configured to apply the predetermined weight to at least one of the transmit antennas before MIMO decoding.

In Example 132, a precoding-decoding means including: a chiplet including: a first receive antenna; a second receive antenna; one or more receivers, configured to receive a combined wireless transmission on the first receive antenna and the second receive antenna, wherein the combined wireless transmission represents a first wireless transmission transmitted by a first transmit antenna and a second wireless transmission, different from the first wireless transmission, transmitted by a second transmit antenna; decode the combined wireless transmission according to one or more predefined decoding parameters to determine the first wireless transmission and the second wireless transmission from the combined wireless transmission; and send the decoded first wireless transmission to an equalizer and the decoded second wireless transmission to an equalizer.

In Example 133, the precoding-decoding means of Example 132, wherein decoding the combined wireless transmission includes applying a predetermined weight to at least one of the combined wireless transmissions as received on the first receive antenna or the combined wireless transmission as received on the second receive antenna.

In Example 134, the precoding-decoding means of 132, wherein the predetermined weight is received through a backchannel.

In Example 135, the precoding-decoding means of Example 132 or Example 133, wherein an additional chiplet sends the predetermined weight to the chiplet through a backchannel.

In Example 136, the precoding-decoding means of any one of Examples 132 to 135, wherein the chiplet applies the predetermined weight at one of the one or more receive antennas before MIMO decoding.

In Example, 137, the precoding-decoding means of Example 136, wherein the predetermined weight is based on a spatial relationship between the first transmit antenna and the second transmit antenna relative to the first receive antenna and the second receive antenna.

In Example 138, the precoding-decoding means of Example 137, wherein the first receive antenna and the second receive antenna are fixedly mounted with respect to the first transmit antenna and the second transmit antenna.

In Example 139, the precoding-decoding means of any one of Examples 133 to 138, wherein the predetermined weight represents a phase shift between one of the first transmit antenna or the second transmit antenna and one of the first receive antenna or the second receive antenna.

In Example 140, the precoding-decoding means of any one of Examples 132 to 139, wherein the first receive antenna and the second receive antenna are fixedly mounted with respect to the chiplet.

In Example 141, the precoding-decoding means of any one of Examples 132 to 140, further including one or more equalizing circuits, configured to receive the decoded first wireless transmission and the decoded second wireless transmission and to modify the decoded first wireless transmission and the decoded second wireless transmission according to one or more equalization parameters.

In Example 142, the precoding-decoding means of Example 141, wherein modifying the decoded first wireless transmission and the decoded second wireless transmission according to the one or more equalization parameters includes reducing intersymbol interference.

In Example 143, the precoding-decoding means of Example 141 or 142, wherein modifying the decoded first wireless transmission and the decoded second wireless transmission according to the one or more equalization parameters includes performing at least one of a precursor equalization operation or a postcursor equalization operation.

In Example 144, the precoding-decoding means of any one of Examples 132 to 143, wherein the wireless transmission is precoded.

In Example 145, the precoding-decoding means of any one of Examples 132 to 144, wherein the wireless transmission is a line of sight transmission.

In Example 146, the precoding-decoding means of any one of Examples 132 to 145, wherein the precoding-decoding means is further configured to perform a training operation including: receiving a first training transmission as transmitted by a first transmit antenna on at least the first radiofrequency antenna or the second radiofrequency antenna; and determining a first receive training parameter based on the first training transmission.

In Example 147, the precoding-decoding means of Example 146, wherein the first receive training parameter is a first receiver weight.

In Example 148, the precoding-decoding means of Example 147, wherein the precoding-decoding means is further configured to: receive a second training transmission as transmitted by the first transmit antenna on at least the first radiofrequency antenna or the second radiofrequency antenna; determine a first signal parameter of the received first training transmission and a second signal parameter of the received second training transmission; transmit data representing an index for either the first training transmission or the second training transmission based on at least one of the first signal parameter or the second signal parameter.

In Example 149, the precoding-decoding means of Example 148, wherein the first signal parameter and the second signal parameter include signal strength.

In Example 150, the precoding-decoding means of any one of Examples 132 to 149, wherein the precoding-decoding means is further configured to perform a training operation including: receiving a first training transmission on the first receive antenna and the second receive antenna, wherein the first training transmission is transmitted by the first transmit antenna; receiving a second training transmission on the first receive antenna and the second receive antenna, wherein the second training transmission is transmitted by the second transmit antenna; and determining one or more training parameters based on the first training transmission and the received second training transmission.

In Example 151, the precoding-decoding means of Example 150, wherein the one or more training parameters include a phase or amplitude of at least one of the first training transmission or the second training transmission.

In Example 152, a precoding-decoding means including: a chiplet including: a first receive antenna, electrically conductively coupled to a first receiver; a second receive antenna, electrically conductively coupled to a second receiver; a radio circuitry, including: the first receiver, configured to receive a combined wireless transmission from the first receive antenna, wherein the combined wireless transmission represents a first wireless transmission transmitted by a first transmit antenna and a second wireless transmission, different from the first wireless transmission, transmitted by a second transmit antenna; and the second receiver, configured to receive the combined wireless transmission from the second receive antenna; and one or more processors, configured to receive data representing the combined wireless transmission as received on the first receive antenna and the combined wireless transmission as received on the second receive antenna; decode the data according to one or more predefined decoding parameters to determine the first wireless transmission and the second wireless transmission from the combined wireless transmission; and send the decoded first wireless transmission to an equalizer and the decoded second wireless transmission to an equalizer.

In Example 153, the precoding-decoding means of Example 152, wherein decoding the data includes applying a predetermined weight to the data.

In Example 154, the precoding-decoding means of Example 153, wherein the predetermined weight is based on a spatial relationship between the first transmit antenna and the second transmit antenna relative to the first receive antenna and the second receive antenna.

In Example 155, the precoding-decoding means of Example 154, wherein the first receive antenna and the second receive antenna are fixedly mounted with respect to the first transmit antenna and the second transmit antenna.

In Example 156, the precoding-decoding means of any one of Examples 153 to 155, wherein the predetermined weight represents a phase shift between one of the first transmit antenna or the second transmit antenna and one of the first receive antenna or the second receive antenna.

In Example 157, the precoding-decoding means of any one of Examples 152 to 156, wherein the first receive antenna and the second receive antenna are fixedly mounted with respect to the chiplet.

In Example 158, the precoding-decoding means of any one of Examples 152 to 157, further including one or more equalizing circuits, configured to receive the decoded first wireless transmission and the decoded second wireless transmission and to modify the decoded first wireless transmission and the decoded second wireless transmission according to one or more equalization parameters.

In Example 159, the precoding-decoding means of Example 158, wherein modifying the decoded first wireless transmission and the decoded second wireless transmission according to the one or more equalization parameters includes reducing intersymbol interference.

In Example 160, the precoding-decoding means of Example 158 or 159, wherein modifying the decoded first wireless transmission and the decoded second wireless transmission according to the one or more equalization parameters includes performing at least one of a precursor equalization operation or a postcursor equalization operation.

In Example 161, the precoding-decoding means of any one of Examples 152 to 160, wherein the wireless transmission is precoded.

In Example 162, the precoding-decoding means of any one of Examples 152 to 161, wherein the wireless transmission is a line of sight transmission.

In Example 163, the precoding-decoding means of any one of Examples 152 to 162, wherein the precoding-decoding means is further configured to perform a training operation including: receiving a first training transmission as transmitted by a first transmit antenna on at least the first radiofrequency antenna or the second radiofrequency antenna; and determining a first receive training parameter based on the first training transmission.

In Example 164, the precoding-decoding means of Example 163, wherein the precoding-decoding means is further configured to: receive a second training transmission as transmitted by the first transmit antenna on at least the first radiofrequency antenna or the second radiofrequency antenna; determine a first signal parameter of the received first training transmission and a second signal parameter of the received second training transmission; transmit data representing an index for either the first training transmission or the second training transmission based on at least one of the first signal parameter or the second signal parameter.

In Example 165, the precoding-decoding means of Example 164, wherein the first signal parameter and the second signal parameter include signal strength.

In Example 166, the precoding-decoding means of any one of Examples 152 to 165, wherein the precoding-decoding means is further configured to perform a training operation including: receiving a first training transmission on the first receive antenna and the second receive antenna, wherein the first training transmission is transmitted by the first transmit antenna; receiving a second training transmission on the first receive antenna and the second receive antenna, wherein the second training transmission is transmitted by the second transmit antenna; and determining one or more training parameters based on the first training transmission and the received second training transmission.

In Example 167, the precoding-decoding means of Example 166, wherein the one or more training parameters include a phase or amplitude of at least one of the first training transmission or the second training transmission.

In Example 168, a precoding-decoding means, including: one or more receivers, configured to receive data representing an adaptive complex weight of a received radiofrequency signal; determine a phase offset of the received radiofrequency signal from the received data; determine one or more asymmetric properties of a wireless channel based on the received data; send an instruction to modify the radiofrequency signal by the phase offset and/or the one or more asymmetric properties.

In Example 169, a precoding-decoding means, including: one or more transmitters, configured to receive data representing a complex weight of a first radiofrequency signal; modify an amplitude and/or a phase offset of a second radiofrequency signal based on the received data.

In Example 170, the precoding-decoding means of 169, wherein the transmitter is configured to modify the amplitude and/or the phase offset across a plurality of MIMO channels.

In Example 171, the precoding-decoding means of 170 or 169, further including a feedback path from a receiver to the transmitter to report a preferred value for a complex tap at the transmitter.

In Example 172, the precoding-decoding means of any one of Examples 152 to 171 wherein the precoding-decoding means comprises an additional chiplet, which comprises one or more processors, which is configured to apply the predetermined weight to at least one of the transmit antennas before MIMO decoding.

DP #5

In Example 173, a multichip package including: a first chiplet, including: a radio circuitry; a plurality of receive antennas, connected to the radio circuitry, and configured to receive a line of sight wireless signal transmitted from a plurality of transmit antennas of a second chiplet at a predetermined wavelength; wherein a distance between each of the plurality of receive antennas and a neighboring antenna of the plurality of receive antennas is greater than a predetermined minimum distance; and wherein the predetermined minimum distance is determined from a function that includes at least the predetermined wavelength.

In Example 173a, the multichip package of example 173, wherein the neighboring antenna is an antenna in a proximity of the plurality of receive antennas.

In Example 174, the multichip package of Example 173, wherein the predetermined minimum distance is calculated from a function including at least the predetermined wavelength and either a total number of receive antennas in the plurality of receive antennas or a total number of transmit antennas in the total number of transmit antennas.

In Example 175, the multichip package of Example 173 or 174, wherein a distance between each antenna of the plurality of transmit antennas and a neighboring antenna of the plurality of transmit antennas is equal to a distance between each antenna of the plurality of receive antennas and a neighboring antenna of the plurality of receive antennas.

In Example 176, the multichip package of any one of Examples 173 to 175, wherein the predetermined minimum distance equals $$\sqrt{\frac{D\lambda}{N}},$$

wherein D is a distance between any of the plurality of transmit antennas and any of the plurality of receive antennas; $\lambda$ is the predetermined wavelength; and N is a total number of transmit antennas in the plurality of transmit antennas or a total number of receive antennas in the plurality of receive antennas.

In Example 177, a multichip system including: a first chiplet including: a first radio circuitry; a plurality of transmit antennas, connected to the first radio circuitry, and configured to transmit a wireless signal at a predetermined wavelength; a second chiplet including: a second radio circuitry; a plurality of receive antennas, connected to the second radio circuitry, and configured to receive a wireless signal at the predetermined wavelength; wherein a distance between each of the plurality of transmit antennas relative to a neighboring antenna of the plurality of transmit antennas and a distance between each of the plurality of receive antennas relative to a neighboring antenna of the plurality of receive antennas is greater than a predetermined minimum distance; and wherein the predetermined minimum distance is calculated from a function including at least the predetermined wavelength.

In Example 178a, the multichip system of Example 177, wherein the plurality of transmit antennas are configured to transmit a line of sight wireless signal.

In Example 178b, the multichip system of Example 177 or 177a, wherein the plurality of receive antennas are configured to receive a line of sight wireless signal.

In Example 178c, the multichip system of Example 177, 177a, or 177b, wherein the wireless signal is transmitted at 140 GHz, from two transmit antennas to two receive antennas, a smallest distance between any one transmit antenna and any one receive antenna is 1 mm, and wherein the two transmit antennas are placed 1.2 mm apart from one another and the two receive antennas are placed 1.2 mm apart from one another.

In Example 178d, the multichip system of Example 177, 177a, or 177b, wherein the wireless signal is transmitted at 140 GHz, from four transmit antennas to four receive antennas, a smallest distance between any one transmit antenna and any one receive antenna is 1 mm, and wherein the four transmit antennas are placed 0.8 mm apart from one another and the four receive antennas are placed 0.8 mm apart from one another.

In Example 178, the multichip system of Example 177, wherein the predetermined minimum distance is calculated from a function including at least the predetermined wavelength and either a total number of receive antennas in the plurality of receive antennas or a total number of transmit antennas in the total number of transmit antennas.

In Example 179, the multichip system of Example 177 or 178, wherein a distance between each antenna of the plurality of transmit antennas and a neighboring antenna of the plurality of transmit antennas is equal to a distance between each antenna of the plurality of receive antennas and a neighboring antenna of the plurality of receive antennas.

In Example 180, the multichip system of any one of Examples 177 to 179, wherein the predetermined minimum distance equals w $$\sqrt{\frac{D\lambda}{N}},$$

wherein D is a distance between any of the plurality of transmit antennas and any of the plurality of receive antennas; $\lambda$ is the predetermined wavelength; and N is a total number of transmit antennas in the plurality of transmit antennas or a total number of receive antennas in the plurality of receive antennas.

In Example 181, a chiplet, including: a wireless transmission precoder, including: an antenna array, including a first transmit antenna and a second transmit antenna; a precoding circuit, configured to: receive a first signal, representing first data for wireless transmission; receive a second signal, representing second data for wireless transmission; generate a first precoded signal as a direct sum of the first signal and the second signal; generate a second precoded signal as an inverse of the direct sum of the first signal and the second signal; and send the first precoded signal on the first transmit antenna and the second precoded signal on the second transmit antenna.

In Example 182 the wireless communication system of Example 181, wherein the precoding circuit receives the first signal and the second signal from one or more equalizers.

In Example 183 the wireless communication system of Example 181 or 182, wherein sending the first precoded signal includes performing a line of sight transmission of the first precoded signal on the first transmit antenna, and wherein sending the second precoded signal includes performing a line of sight transmission of the second precoded signal on the second transmit antenna.

In Example 184, a chiplet, including: a wireless transmission decoder, including an antenna array, including a first receive antenna and a second receive antenna; a decoding circuit, configured to: receive a first wireless signal on the first receive antenna, wherein the first wireless signal includes a first precoded signal and a second precoded signal; receive a second wireless signal on the second receive antenna, wherein the second wireless signal includes the first precoded signal and the second precoded signal; generate a first decoded signal as a direct sum of the first wireless signal and the second wireless signal; and generate a second decoded signal as an inverse of the direct sum of the first wireless signal and the second wireless signal.

In Example 185, the chiplet of Example 184, wherein the decoding circuit is further configured to send the first decoded signal and the second decoded signal to one or more equalizers.

In Example 186, the chiplet of Example 184 or 185, wherein receiving the first wireless signal includes receiving a line of sight transmission of the first precoded signal and the second precoded signal on the first transmit antenna, and wherein receiving the second wireless signal includes receiving a line of sight transmission of the first precoded signal and the second precoded signal on the second transmit antenna.

In Example 187, a wireless communication system including: a first chiplet, including: a first antenna array, including a first transmit antenna and a second transmit antenna; a precoding circuit, configured to: receive a first signal, representing first data for wireless transmission; receive a second signal, representing second data for wireless transmission; generate a first precoded signal as a direct sum of the first signal and the second signal; generate a second precoded signal as an inverse of the direct sum of the first signal and the second signal; send the first precoded signal on the first transmit antenna and the second precoded signal on the second transmit antenna; a second chiplet, including: a second antenna array, including a first receive antenna and a second receive antenna; a decoding circuit, configured to: receive a first wireless signal on the first receive antenna, wherein the first wireless signal includes the first precoded signal and the second precoded signal; receive a second wireless signal on the second receive antenna, wherein the second wireless signal includes the first precoded signal and the second precoded signal; generate a first decoded signal as a direct sum of the first wireless signal and the second wireless signal; and generate a second decoded signal as an inverse of the direct sum of the first wireless signal and the second wireless signal.

In Example 188, the wireless communication system of Example 187, wherein the precoding circuit receives the first signal and the second signal from one or more equalizers.

In Example 189, the wireless communication system of Example 187 or 188, wherein the decoding circuit is further configured to send the first decoded signal and the second decoded signal to one or more equalizers.

In Example 190, a method of arranging an antenna array, including: determining a wavelength for a wireless transmission; calculating a minimum distance between neighboring receive antennas based at least on the wavelength; and arranging a plurality of receive antennas in the receiving antenna array, such that each antenna of the plurality of receive antennas is at least the minimum distance from any neighboring receive antenna.

In Example 191, the method of arranging an antenna array of Example 190, further including: determining a quantity of receive antennas for a receiving antenna array; determining a minimum distance between the receiving antennas of the receiving antenna array and transmitting antennas of a transmitting antenna array; and arranging a plurality of receive antennas, configured to receive a line of sight wireless signal transmitted from a plurality of transmit antennas at a predetermined wavelength; wherein a distance between each of the plurality of receive antennas relative to a neighboring antenna of the plurality of receive antennas is greater than a predetermined minimum distance; and wherein the predetermined minimum distance is determined from a function that includes at least the predetermined wavelength.

In Example 192, the method of Example 190, wherein the predetermined minimum distance is calculated from a function that includes at least the predetermined wavelength and either a total number of receive antennas in the plurality of receive antennas or a total number of transmit antennas in the total number of transmit antennas.

In Example 193, the method of Example 190 or 192, wherein a distance between each antenna of the plurality of transmit antennas relative to a neighboring antenna of the plurality of transmit antennas is equal to a distance between each antenna of the plurality of receive antennas and a neighboring antenna of the plurality of receive antennas.

In Example 194, the method of any one of Examples 190 to 193, wherein the predetermined minimum distance equals $$\sqrt{\frac{D\lambda}{N}},$$

wherein D is a distance between any of the plurality of transmit antennas and any of the plurality of receive antennas; $\lambda$ is the predetermined wavelength; and N is a total number of transmit antennas in the plurality of transmit antennas or a total number of receive antennas in the plurality of receive antennas.

DP #16

In Example 195, a multichip package including: a plurality of chiplets, in which at least a first chiplet includes: a first surface and a second surface opposite to the first surface, wherein the first surface includes a cavity, and wherein the cavity is defined by a plurality of surfaces; and one or more antennas, on a surface of the plurality of surfaces.

In Example 196, the multichip package of Example 195, wherein the one or more antennas are configured to transmit and/or receive a wireless signal.

In Example 197, the multichip package of Example 195 or 196, wherein the cavity includes any of a bottom surface, a top surface, one or more side surfaces, or any combination thereof.

In Example 198, the multichip package of any one of Examples 195 to 197, further including a second chiplet, wherein the second chiplet includes: a first surface and a second surface opposite to the first surface, wherein the first surface includes a cavity, and wherein the cavity is defined by a plurality of surfaces; and one or more antennas, on a surface of the plurality of surfaces; wherein the one or more antennas of the first chiplet are configured to transmit a wireless signal to the one or more antennas of the second chiplet.

In Example 199, the multichip package of Example 198, wherein the first chiplet further includes a transceiver, electrically conductively connected to the one or more antennas of the first chiplet; and wherein the second chiplet further includes a transceiver, electrically conductively connected to the one or more antennas of the second chiplet.

In Example 200, the multichip package of Example 199, wherein the transceiver of the first chiplet is configured to control the one or more antennas of the first chiplet to transmit a radiofrequency signal and/or wherein the transceiver of the second chiplet is configured to control the one or more antennas of the second chiplet to transmit a radiofrequency signal.

In Example 201, the multichip package of any one of Examples 195 to 200, wherein the one or more antennas of the first chiplet extend away from the second surface of the first chiplet.

In Example 202, the multichip package of any one of Examples 195 to 201, wherein a top portion of the one or more antennas of the first chiplet is coplanar with the first surface of the first chiplet.

In Example 203, the multichip package of any one of Examples 195 to 202, further including a solder element on at least one of the one or more antennas of the first chiplet.

In Example 204, the multichip package of Example 203, wherein the solder element is a solder bump.

In Example 205, the multichip package of Example 203, wherein the solder element is a microbump.

In Example 206, the multichip package of any one of Examples 195 to 205, further including a third chiplet, mounted over the first surface of the first chiplet, wherein the one or more antennas are between the second surface of the first chiplet and the second chiplet.

In Example 207, the multichip package of any Example 206, wherein the third chiplet is mounted over the first surface of the first chiplet via one or more solder elements.

In Example 208, the multichip package of any Example 207, wherein the one or more solder elements are one or more microbumps.

In Example 209, the multichip package of any one of Examples 195 to 208, further including a dielectric layer, in the cavity.

In Example 210, the multichip package of Example 209, wherein the dielectric layer surrounds one or more sides of the one or more antennas or antenna extensions.

In Example 211, the multichip package of Example 209 or 210, wherein the dielectric layer has a higher dielectric constant than the one or more antennas.

In Example 212, the multichip package of any one of Examples 195 to 211, further including a plurality of terminals, around one or more sides of the cavity.

In Example 213, the multichip package of Example 212, wherein the plurality of terminals are configured to receive a radiofrequency signal transmitted by the one or more antennas in a first direction and to reflect the radiofrequency signal in a second direction, different from the first direction.

In Example 214, the multichip package of any one of Examples 195 to 213, wherein the cavity is rectangular.

In Example 215, the multichip package of any one of Examples 195 to 214, wherein the cavity has a circular shape.

In Example 216, the multichip package of any one of Examples 195 to 215, wherein the cavity has a cylindrical shape.

In Example 217, the multichip package of any one of Examples 195 to 216, wherein at least one side of the cavity corresponds with an edge of the chiplet, and wherein the one or more antennas are configured to send a wireless signal to one or more second antennas on a second chiplet.

In Example 218, the multichip package of Example 217, further including a waveguide between the first chiplet and the second chiplet.

In Example 219, the multichip package of any one of Examples 195 to 218, wherein the first chiplet and one or more additional chiplets are surrounded by a packaging material.

In Example 220, a chiplet and antenna structure, including: an interposer; a first patch substrate, mounted on the interposer; a second patch substrate, mounted on the interposer; a gap between the first patch substrate and the second patch substrate; and one or radiofrequency transmission elements in the gap.

In Example 221, the multichip package of Example 220, wherein the one or more radiofrequency transmission elements are one or more waveguides.

In Example 222, the multichip package of Example 220, wherein the one or more radiofrequency transmission elements are one or more antennas.

In Example 223, the multichip package of any one of Examples 220 to 222, further including a transceiver, wherein the one or more antennas are electrically conductively connected to the transceiver.

In Example 224, the multichip package of Example 223, wherein the transceiver is configured to control the one or more antennas to transmit a radiofrequency signal.

In Example 225, the multichip package of any one of Examples 220 to 224, further including a chiplet, mounted to the first patch substrate and the second patch substrate, above the gap.

In Example 226, a multichip package communication means including: a plurality of processing means, in which at least a first processing means includes: a first surface and a second surface opposite to the first surface, wherein the first surface includes a cavity, and wherein the cavity is defined by a plurality of surfaces; and one or more antennas, on a surface of the plurality of surfaces.

In Example 227, the multichip package communication means of Example 226, wherein the one or more antennas are configured to transmit and/or receive a wireless signal.

In Example 228, the multichip package communication means of Example 226 or 227, wherein the cavity includes any of a bottom surface, a top surface, one or more side surfaces, or any combination thereof.

In Example 229, the multichip package communication means of any one of Examples 226 to 228, further including a second processing means, wherein the second processing means includes: a first surface and a second surface opposite to the first surface, wherein the first surface includes a cavity, and wherein the cavity is defined by a plurality of surfaces; and one or more antennas, on a surface of the plurality of surfaces; wherein the one or more antennas of the first processing means are configured to transmit a wireless signal to the one or more antennas of the second processing means.

In Example 230, the multichip package communication means of Example 229, wherein the first processing means further includes a transceiver, electrically conductively connected to the one or more antennas of the first processing means; and wherein the second processing means further includes a transceiver, electrically conductively connected to the one or more antennas of the second processing means.

In Example 231, the multichip package communication means of Example 230, wherein the transceiver of the first processing means is configured to control the one or more antennas of the first processing means to transmit a radiofrequency signal and/or wherein the transceiver of the second processing means is configured to control the one or more antennas of the second processing means to transmit a radiofrequency signal.

In Example 232, the multichip package communication means of any one of Examples 226 to 231, wherein the one or more antennas of the first processing means extend away from the second surface of the first processing means.

In Example 233, the multichip package communication means of any one of Examples 226 to 232, wherein a top portion of the one or more antennas of the first processing means is coplanar with the first surface of the first processing means.

In Example 234, the multichip package communication means of any one of Examples 226 to 233, further including a solder element on at least one of the one or more antennas of the first processing means.

In Example 235, the multichip package communication means of Example 234, wherein the solder element is a solder bump.

In Example 236, the multichip package communication means of Example 234, wherein the solder element is a microbump.

In Example 237, the multichip package communication means of any one of Examples 226 to 236, further including a third processing means, mounted over the first surface of the first processing means, wherein the one or more antennas are between the second surface of the first processing means and the second processing means.

In Example 238, the multichip package communication means of any Example 237, wherein the third processing means is mounted over the first surface of the first processing means via one or more solder elements.

In Example 239, the multichip package communication means of any Example 238, wherein the one or more solder elements are one or more microbumps.

In Example 240, the multichip package communication means of any one of Examples 226 to 239, further including a dielectric layer, in the cavity.

In Example 241, the multichip package communication means of Example 240, wherein the dielectric layer surrounds one or more sides of the one or more antennas or antenna extensions.

In Example 242, the multichip package communication means of Example 240 or 241, wherein the dielectric layer has a higher dielectric constant than the one or more antennas.

In Example 243, the multichip package communication means of any one of Examples 226 to 242, further including a plurality of terminals, around one or more sides of the cavity.

In Example 244, the multichip package communication means of Example 243, wherein the plurality of terminals are configured to receive a radiofrequency signal transmitted by the one or more antennas in a first direction and to reflect the radiofrequency signal in a second direction, different from the first direction.

In Example 245, the multichip package communication means of any one of Examples 226 to 244, wherein the cavity is rectangular.

In Example 246, the multichip package communication means of any one of Examples 226 to 245, wherein the cavity has a circular shape.

In Example 247, the multichip package communication means of any one of Examples 226 to 246, wherein the cavity has a cylindrical shape.

In Example 248, the multichip package communication means of any one of Examples 226 to 247, wherein at least one side of the cavity corresponds with an edge of the processing means, and wherein the one or more antennas are configured to send a wireless signal to one or more second antennas on a second processing means.

In Example 249, the multichip package communication means of Example 248, further including a waveguide between the first processing means and the second processing means.

In Example 250, the multichip package communication means of any one of Examples 226 to 249, wherein the first processing means and one or more additional processing means are surrounded by a packaging material.

In Example 251, a processing means and antenna structure, including: an interposer; a first patch substrate, mounted on the interposer; a second patch substrate, mounted on the interposer; a gap between the first patch substrate and the second patch substrate; and one or radiofrequency transmission elements in the gap.

In Example 252, the multichip package communication means of Example 251, wherein the one or more radiofrequency transmission elements are one or more waveguides.

In Example 253, the multichip package communication means of Example 251, wherein the one or more radiofrequency transmission elements are one or more antennas.

In Example 254, the multichip package communication means of any one of Examples 251 to 253, further including a transceiver, wherein the one or more antennas are electrically conductively connected to the transceiver.

In Example 255, the multichip package communication means of Example 254, wherein the transceiver is configured to control the one or more antennas to transmit a radiofrequency signal.

In Example 256, the multichip package communication means of any one of Examples 251 to 255, further including a processing means, mounted to the first patch substrate and the second patch substrate, above the gap.

DP #7

In Example 257, a radiofrequency circuit including: a signal processing circuit, configured to: receive data representing a received first radiofrequency signal including one or more known symbols; determine a difference between the received data and the one or more known symbols; generate a plurality of equalization parameters representing the determined difference between the received data and the one or more known symbols; and one or more equalization circuits, configured to receive the plurality of equalization parameters from the signal processing circuit; receive a second radiofrequency signal; modify the second radiofrequency signal according to the plurality of equalization parameters; and output the modified second radiofrequency signal as an equalized signal.

In Example 258, the radiofrequency circuit of Example 257, wherein the one or more equalization circuits include a precursor equalization circuit and a postcursor equalization circuit; wherein the precursor equalization circuit is configured to receive the second radiofrequency signal; modify the second radiofrequency signal according to a first plurality of equalization parameters of the plurality of equalization parameters; and output the modified second radiofrequency signal as a precursor equalized signal; and wherein the postcursor equalization circuit is configured to receive the precursor equalized signal; modify the precursor equalized signal according to a second plurality of equalization parameters of the plurality of equalization parameters; and output the modified precursor signal as the equalized signal.

In Example 259, the radiofrequency circuit of Example 258, wherein the precursor equalization circuit is configured to modify the second radiofrequency signal to reduce intersymbol interference from a symbol proceeding the symbol of the radiofrequency transmission.

In Example 260, the radiofrequency circuit of Example 258 or 259, wherein the postcursor equalization circuit is configured to modify the second radiofrequency signal to reduce intersymbol interference from a symbol following the symbol of the radiofrequency transmission.

In Example 261, the radiofrequency circuit of any one of Examples 257 to 260, wherein the first plurality of equalization parameters include an in-phase to in-phase (II) parameter; an in-phase to quadrature (IQ) parameter; a quadrature to in-phase (QI) parameter, and a quadrature to quadrature (QQ) parameter.

In Example 262, the radiofrequency circuit of any one of Examples 257 to 261, wherein the second plurality of equalization parameters include an in-phase to in-phase (II) parameter; an in-phase to quadrature (IQ) parameter; a quadrature to in-phase (QI) parameter, and a quadrature to quadrature (QQ) parameter.

In Example 263, the radiofrequency circuit of any one of Examples 257 to 262, wherein the signal processing circuit is further configured to: generate a plurality of bias offset parameters representing a difference between the received data and the one or more known symbols; and further including a bias offset modification circuit, configured to receive a DC biased radiofrequency signal; modify a bias offset of the DC biased radiofrequency signal according to the plurality of bias offset parameters; and output the modified DC biased radiofrequency signal as the second radiofrequency signal.

In Example 264, the radiofrequency circuit of Example 263, wherein the signal processing circuit is configured to determine each of the plurality of bias offset parameters and the plurality of equalization parameters as one or more in-phase components and one or more quadrature components.

In Example 265, the radiofrequency circuit of any one of Examples 260 to 264, further including a data demodulation circuit, configured to receive the equalized signal, demodulate the equalized signal, and output the demodulated equalized signal as the demodulated signal; wherein the signal processing circuit is further configured to: receive the equalized signal; receive the demodulated signal; determine a difference between the equalized signal and the demodulated signal; generate from at least the difference between the equalized signal and the demodulated signal a plurality of phase adjustment parameters; wherein the radiofrequency integrated circuit further includes a phase adjustment circuit, wherein the phase adjustment circuit is configured to receive the plurality of phase adjustment parameters; receive the precursor equalized signal; and adjust a phase of the precursor equalized signal by the plurality of phase adjustment parameters.

In Example 266, a radiofrequency circuit including: one or more equalization circuits, configured to receive from an antenna a first radiofrequency signal and a second radiofrequency signal, wherein the first radiofrequency signal represents one or more known symbols; a first analogue-digital converter, electrically conductively connected to the one or more equalization circuits, and configured to receive the first radiofrequency signal and to output first data representing the first radiofrequency signal; a second analogue-digital converter, electrically conductively connected to the one or more equalization circuits, and configured to receive an output of the one or more equalization circuits, and to output second data representing the output of the one or more equalization circuits; a signal processing circuit, electrically conductively connected to the first analogue-digital converter and the second analogue-digital converter, and configured to: receive the first data and the second data; determine a first difference between the first data and the one or more known symbols; determine a second difference between the second data and the one or more known symbols; generate a first plurality of equalization parameters representing the determined first difference and a second plurality of equalization parameters representing the determined second difference; wherein the one or more equalization circuits are further configured to: receive the first plurality of equalization parameters and the second plurality of equalization parameters; modify the second radiofrequency signal according to the first plurality of equalization parameters and the second plurality of equalization parameters; and output the modified second radiofrequency signal as an equalized signal.

In Example 267, the radiofrequency circuit of Example 266, wherein the first plurality of equalization parameters are precursor equalization parameters and the second plurality of equalization parameters are postcursor equalization parameters.

In Example 268, the radiofrequency circuit of Example 266 or 267, wherein the one or more equalization circuits include a precursor equalization circuit and a postcursor equalization circuit; wherein the precursor equalization circuit is configured to receive the second radiofrequency signal; modify the second radiofrequency signal according to the first plurality of equalization parameters; and output the modified bias offset signal as a precursor equalized signal; and wherein the postcursor equalization circuit is configured to receive the precursor equalized signal; modify the precursor equalized signal according to the second plurality of equalization parameters; and output the modified precursor signal as the equalized signal.

In Example 269, the radiofrequency circuit of Example 268, wherein the precursor equalization circuit is configured to modify the second radiofrequency signal to reduce intersymbol interference from a symbol proceeding the symbol of the radiofrequency transmission.

In Example 270, the radiofrequency circuit of Example 268 or 269, wherein the postcursor equalization circuit is configured to modify the second radiofrequency signal to reduce intersymbol interference from a symbol following the symbol of the radiofrequency transmission.

In Example 271, the radiofrequency circuit of any one of Examples 268 to 270, wherein the first plurality of equalization parameters include an in-phase to in-phase (II) parameter; an in-phase to quadrature (IQ) parameter; a quadrature to in-phase (QI) parameter, and a quadrature to quadrature (QQ) parameter.

In Example 272, the radiofrequency circuit of any one of Examples 268 to 271, wherein the second plurality of equalization parameters include an in-phase to in-phase (II) parameter; an in-phase to quadrature (IQ) parameter; a quadrature to in-phase (QI) parameter, and a quadrature to quadrature (QQ) parameter.

In Example 273, the radiofrequency circuit of any one of Examples 268 to 272, wherein the signal processing circuit is further configured to: generate a plurality of bias offset parameters representing a determined difference between the received data and the one or more known symbols; and further including a bias offset modification circuit, configured to receive a DC biased radiofrequency signal; modify a bias offset of the DC biased radiofrequency signal according to the plurality of bias offset parameters; and output the modified DC biased radiofrequency signal as the second radiofrequency signal.

In Example 274, the radiofrequency circuit of Example 273, wherein the signal processing circuit is configured to determine each of the plurality of bias offset parameters and the plurality of equalization parameters as one or more in-phase components and one or more quadrature components.

In Example 275, the radiofrequency circuit of any one of Examples 268 to 274, further including a data demodulation circuit, configured to receive the equalized signal, demodulate the equalized signal, and output the demodulated equalized signal as the demodulated signal; wherein the signal processing circuit is further configured to: receive the equalized signal; receive the demodulated signal; determine a difference between the equalized signal and the demodulated signal; generate from at least the difference between the equalized signal and the demodulated signal a plurality of phase adjustment parameters; wherein the radiofrequency circuit further includes a phase adjustment circuit, wherein the phase adjustment circuit is configured to: receive the plurality of phase adjustment parameters; receive the precursor equalized signal; and adjust a phase of the precursor equalized signal by the plurality of phase adjustment parameters.

In Example 276, a radiofrequency adjustment means including: a signal processing means, configured to: receive data representing a received first radiofrequency signal including one or more known symbols; determine a difference between the received data and the one or more known symbols; generate a plurality of equalization parameters representing the determined difference between the received data and the one or more known symbols; and one or more equalization means, configured to receive the plurality of equalization parameters from the signal processing means; receive a second radiofrequency signal; modify the second radiofrequency signal according to the plurality of equalization parameters; and output the modified second radiofrequency signal as an equalized signal.

In Example 277, the radiofrequency adjustment means of Example 276, wherein the one or more equalization means include a precursor equalization means and a postcursor equalization means; wherein the precursor equalization means is configured to receive the second radiofrequency signal; modify the second radiofrequency signal according to a first plurality of equalization parameters of the plurality of equalization parameters; and output the modified second radiofrequency signal as a precursor equalized signal; and wherein the postcursor equalization means is configured to receive the precursor equalized signal; modify the precursor equalized signal according to a second plurality of equalization parameters of the plurality of equalization parameters; and output the modified precursor signal as the equalized signal.

In Example 278, the radiofrequency adjustment means of Example 277, wherein the precursor equalization means is configured to modify the second radiofrequency signal to reduce intersymbol interference from a symbol proceeding the symbol of the radiofrequency transmission.

In Example 279, the radiofrequency adjustment means of Example 277 or 278, wherein the postcursor equalization means is configured to modify the second radiofrequency signal to reduce intersymbol interference from a symbol following the symbol of the radiofrequency transmission.

In Example 280, the radiofrequency adjustment means of any one of Examples 276 to 279, wherein the first plurality of equalization parameters include an in-phase to in-phase (II) parameter; an in-phase to quadrature (IQ) parameter; a quadrature to in-phase (QI) parameter, and a quadrature to quadrature (QQ) parameter.

In Example 281, the radiofrequency adjustment means of any one of Examples 276 to 280, wherein the second plurality of equalization parameters include an in-phase to in-phase (II) parameter; an in-phase to quadrature (IQ)

parameter; a quadrature to in-phase (QI) parameter, and a quadrature to quadrature (QQ) parameter.

In Example 282, the radiofrequency adjustment means of any one of Examples 276 to 281, wherein the signal processing means is further configured to: generate a plurality of bias offset parameters representing a difference between the received data and the one or more known symbols; and further including a bias offset modification means, configured to receive a DC biased radiofrequency signal; modify a bias offset of the DC biased radiofrequency signal according to the plurality of bias offset parameters; and output the modified DC biased radiofrequency signal as the second radiofrequency signal.

In Example 283, the radiofrequency adjustment means of Example 282, wherein the signal processing means is configured to determine each of the plurality of bias offset parameters and the plurality of equalization parameters as one or more in-phase components and one or more quadrature components.

In Example 284, the radiofrequency adjustment means of any one of Examples 279 to 283, further including a data demodulation means, configured to receive the equalized signal, demodulate the equalized signal, and output the demodulated equalized signal as the demodulated signal; wherein the signal processing means is further configured to: receive the equalized signal; receive the demodulated signal; determine a difference between the equalized signal and the demodulated signal; generate from at least the difference between the equalized signal and the demodulated signal a plurality of phase adjustment parameters; wherein the radiofrequency integrated means further includes a phase adjustment means, wherein the phase adjustment means is configured to receive the plurality of phase adjustment parameters; receive the precursor equalized signal; and adjust a phase of the precursor equalized signal by the plurality of phase adjustment parameters.

In Example 285, a radiofrequency adjustment means including: one or more equalization means, configured to receive from an antenna a first radiofrequency signal and a second radiofrequency signal, wherein the first radiofrequency signal represents one or more known symbols; a first analogue-digital converter, electrically conductively connected to the one or more equalization means, and configured to receive the first radiofrequency signal and to output first data representing the first radiofrequency signal; a second analogue-digital converter, electrically conductively connected to the one or more equalization means, and configured to receive an output of the one or more equalization means, and to output second data representing the output of the one or more equalization means; a signal processing means, electrically conductively connected to the first analogue-digital converter and the second analogue-digital converter, and configured to: receive the first data and the second data; determine a first difference between the first data and the one or more known symbols; determine a second difference between the second data and the one or more known symbols; generate a first plurality of equalization parameters representing the determined first difference and a second plurality of equalization parameters representing the determined second difference; wherein the one or more equalization means are further configured to: receive the first plurality of equalization parameters and the second plurality of equalization parameters; modify the second radiofrequency signal according to the first plurality of equalization parameters and the second plurality of equalization parameters; and output the modified second radiofrequency signal as an equalized signal.

In Example 286, the radiofrequency adjustment means of Example 285, wherein the first plurality of equalization parameters are precursor equalization parameters and the second plurality of equalization parameters are postcursor equalization parameters.

In Example 287, the radiofrequency adjustment means of Example 285 or 286, wherein the one or more equalization means include a precursor equalization means and a postcursor equalization means; wherein the precursor equalization means is configured to receive the second radiofrequency signal; modify the second radiofrequency signal according to the first plurality of equalization parameters; and output the modified bias offset signal as a precursor equalized signal; and wherein the postcursor equalization means is configured to receive the precursor equalized signal; modify the precursor equalized signal according to the second plurality of equalization parameters; and output the modified precursor signal as the equalized signal.

In Example 288, the radiofrequency adjustment means of Example 287, wherein the precursor equalization means is configured to modify the second radiofrequency signal to reduce intersymbol interference from a symbol proceeding the symbol of the radiofrequency transmission.

In Example 289, the radiofrequency adjustment means of Example 287 or 288, wherein the postcursor equalization means is configured to modify the second radiofrequency signal to reduce intersymbol interference from a symbol following the symbol of the radiofrequency transmission.

In Example 290, the radiofrequency adjustment means of any one of Examples 287 to 289, wherein the first plurality of equalization parameters include an in-phase to in-phase (II) parameter; an in-phase to quadrature (IQ) parameter; a quadrature to in-phase (QI) parameter, and a quadrature to quadrature (QQ) parameter.

In Example 291, the radiofrequency adjustment means of any one of Examples 287 to 290, wherein the second plurality of equalization parameters include an in-phase to in-phase (II) parameter; an in-phase to quadrature (IQ) parameter; a quadrature to in-phase (QI) parameter, and a quadrature to quadrature (QQ) parameter.

In Example 292, the radiofrequency adjustment means of any one of Examples 287 to 291, wherein the signal processing means is further configured to: generate a plurality of bias offset parameters representing a determined difference between the received data and the one or more known symbols; and further including a bias offset modification means, configured to receive a DC biased radiofrequency signal; modify a bias offset of the DC biased radiofrequency signal according to the plurality of bias offset parameters; and output the modified DC biased radiofrequency signal as the second radiofrequency signal.

In Example 293, the radiofrequency adjustment means of Example 292, wherein the signal processing means is configured to determine each of the plurality of bias offset parameters and the plurality of equalization parameters as one or more in-phase components and one or more quadrature components.

In Example 294, the radiofrequency adjustment means of any one of Examples 287 to 293, further including a data demodulation means, configured to receive the equalized signal, demodulate the equalized signal, and output the demodulated equalized signal as the demodulated signal; wherein the signal processing means is further configured to: receive the equalized signal; receive the demodulated signal; determine a difference between the equalized signal and the demodulated signal; generate from at least the difference between the equalized signal and the demodulated signal a plurality of phase adjustment parameters; wherein the radiofrequency adjustment means further includes a phase adjustment means, wherein the phase adjustment means is configured to: receive the plurality of phase adjustment parameters; receive the precursor equalized signal; and adjust a phase of the precursor equalized signal by the plurality of phase adjustment parameters.

DP #4

In Example 295, a multichip package including: a first chiplet, including a first antenna, configured to radiate a radiofrequency signal; a second chiplet, including a second antenna, configured to receive the radiofrequency signal; and at least one electromagnetic energy reradiating element, configured to receive the radiofrequency signal from the first antenna, and to reradiate the radiofrequency signal.

In Example 296, the chip package of Example 295, wherein the at least one electromagnetic energy reradiating element includes a first electromagnetic energy reradiating element and a second electromagnetic energy reradiating element, the second electromagnetic energy reradiating element configured to receive the reradiated radiofrequency signal from the first electromagnetic energy reradiating element.

In Example 297, the chip package of Example 296, wherein the second antenna is further configured to receive the reradiated radiofrequency signal from the at least one electromagnetic energy reradiating element.

In Example 298, the chip package of any one of Examples 295 to 297, wherein the at least one electromagnetic energy reradiating element is positioned between the first antenna and the second antenna.

In Example 299, the chip package of any one of Examples 295 to 298, wherein the at least one electromagnetic energy reradiating element includes at least one segment having a length equal to one-half of a wavelength of the radiofrequency signal.

In Example 300, the chip package of Example 299, wherein the at least one electromagnetic energy reradiating element is configured as a dipole antenna.

In Example 301, the chip package of any one of Examples 295 to 300, wherein the at least one electromagnetic energy reradiating element includes at least one segment having a length equal to one-quarter of a wavelength of the first radiofrequency signal.

In Example 302, the chip package of Example 301, further including a heat spreader or a reference potential plane, wherein the at least one electromagnetic energy reradiating element is electrically conductively connected to the heat spreader or the reference potential plane, and the at least one electromagnetic energy reradiating element is configured as a monopole antenna.

In Example 303, the chip package of any one of Examples 295 to 302, wherein the at least one electromagnetic energy reradiating element includes a first segment and a second segment, essentially perpendicular to the first segment.

In Example 304, the chip package of Example 303, wherein the first segment has a first radiation angle and the second segment has a second radiation angle, wherein the at least one electromagnetic energy reradiating element has a primary radiation angle in the range from the first radiation angle to the second radiation angle.

In Example 305, the chip package of any one of Examples 295 to 304, wherein the at least one electromagnetic energy reradiating element includes or is a metallic rod.

In Example 306, the chip package of any one of Examples 295 to 305, wherein the at least one electromagnetic energy reradiating element includes or is a via.

In Example 307, the chip package of any one of Examples 295 to 306, wherein the at least one electromagnetic energy reradiating element includes or is a copper pillar.

In Example 308, the chip package of any one of Examples 295 to 307, wherein the at least one electromagnetic energy reradiating element includes a first electromagnetic energy reradiating element and a second electromagnetic energy reradiating element, wherein the first electromagnetic energy reradiating element and/or the second electromagnetic energy reradiating element is a passive electromagnetic energy reradiating element.

In Example 309, the chip package of any one of Examples 295 to 308, wherein the at least one electromagnetic energy reradiating element includes a first electromagnetic energy reradiating element and a second electromagnetic energy reradiating element, wherein the first electromagnetic energy reradiating element and/or the second electromagnetic energy reradiating element is an active electromagnetic energy reradiating element; further including a transceiver, configured to receive the first radiofrequency signal and to subsequently transmit a second radiofrequency signal representing the received first radiofrequency signal.

In Example 310, the chip package of any one of Examples 295 to 309, wherein the first antenna is configured as a solder bump antenna, the solder bump antenna including a first plurality of solder bumps, electrically conductively connected to each other, and configured to radiate the radiofrequency signal in a first direction; and a third antenna, configured as a slot antenna, and configured to radiate the radiofrequency signal in a second direction, orthogonal to the first direction.

In Example 311, the chip package of Example 310, further including a feed solder bump, electrically conductively connected to a radiofrequency transmitter, and configured to radiate the radiofrequency frequency to the first antenna and the third antenna.

In Example 312, the chip package of Example 310 or 311, wherein the first plurality of solder bumps are arranged linearly.

In Example 313, the chip package of any one of Examples 310 to 312, further including a second plurality of solder bumps, arranged parallel to the first plurality of solder bumps, wherein the second plurality of solder bumps connect a power source to a reference potential.

In Example 314, the chip package of 313, wherein the second plurality of solder bumps forms a short circuit.

In Example 315, the chip package of any one of Examples 310 to 314, further including a differential feed, configured to provide the radiofrequency signal to the first antenna; and a single-ended feed, configured to provide the radiofrequency signal to the third antenna.

In Example 316, the chip package of any one of Examples 295 to 315, wherein the at least one electromagnetic energy reradiating element includes a plurality of electromagnetic energy reradiating elements arranged along a path between the first chiplet and the second chiplet.

In Example 317, the chip package of any one of Examples 295 to 316, wherein a path between the first antenna and the second antenna includes one or more curves, and wherein one or more of the reradiating elements are located in each curve.

In Example 318, the chip package of any one of Examples 295 to 317, wherein a plurality of reradiating elements are placed along a path between the first antenna and the second antenna.

In Example 319, a multichip communication means including: a first processing means, including a first antenna, configured to radiate a radiofrequency signal; a second processing means, including a second antenna, configured to receive the radiofrequency signal; and at least one electromagnetic energy reradiating element, configured to receive the radiofrequency signal from the first antenna, and to reradiate the radiofrequency signal.

In Example 320, the multichip communication means of Example 319, wherein the at least one electromagnetic energy reradiating element includes a first electromagnetic energy reradiating element and a second electromagnetic energy reradiating element, the second electromagnetic energy reradiating element configured to receive the reradiated radiofrequency signal from the first electromagnetic energy reradiating element.

In Example 321, the multichip communication means of Example 320, wherein the second antenna is further configured to receive the reradiated radiofrequency signal from the at least one electromagnetic energy reradiating element.

In Example 322, the multichip communication means of any one of Examples 319 to 321, wherein the at least one electromagnetic energy reradiating element is positioned between the first antenna and the second antenna.

In Example 323, the multichip communication means of any one of Examples 319 to 322, wherein the at least one electromagnetic energy reradiating element includes at least one segment having a length equal to one-half of a wavelength of the radiofrequency signal.

In Example 324, the multichip communication means of Example 323, wherein the at least one electromagnetic energy reradiating element is configured as a dipole antenna.

In Example 325, the multichip communication means of any one of Examples 319 to 324, wherein the at least one electromagnetic energy reradiating element includes at least one segment having a length equal to one-quarter of a wavelength of the first radiofrequency signal.

In Example 326, the multichip communication means of Example 325, further including a heat spreader or a reference potential plane, wherein the at least one electromagnetic energy reradiating element is electrically conductively connected to the heat spreader or the reference potential plane, and the at least one electromagnetic energy reradiating element is configured as a monopole antenna.

In Example 327, the multichip communication means of any one of Examples 319 to 326, wherein the at least one electromagnetic energy reradiating element includes a first segment and a second segment, essentially perpendicular to the first segment.

In Example 328, the multichip communication means of Example 327, wherein the first segment has a first radiation angle and the second segment has a second radiation angle, wherein the at least one electromagnetic energy reradiating element has a primary radiation angle in the range from the first radiation angle to the second radiation angle.

In Example 329, the multichip communication means of any one of Examples 319 to 328, wherein the at least one electromagnetic energy reradiating element includes or is a metallic rod.

In Example 330, the multichip communication means of any one of Examples 319 to 329, wherein the at least one electromagnetic energy reradiating element includes or is a via.

In Example 331, the multichip communication means of any one of Examples 319 to 330, wherein the at least one electromagnetic energy reradiating element includes or is a copper pillar.

In Example 332, the multichip communication means of any one of Examples 319 to 331, wherein the at least one electromagnetic energy reradiating element includes a first electromagnetic energy reradiating element and a second electromagnetic energy reradiating element, wherein the first electromagnetic energy reradiating element and/or the second electromagnetic energy reradiating element is a passive electromagnetic energy reradiating element.

In Example 333, the multichip communication means of any one of Examples 319 to 332, wherein the at least one electromagnetic energy reradiating element includes a first electromagnetic energy reradiating element and a second electromagnetic energy reradiating element, wherein the first electromagnetic energy reradiating element and/or the second electromagnetic energy reradiating element is an active electromagnetic energy reradiating element; further including a transceiver, configured to receive the first radiofrequency signal and to subsequently transmit a second radiofrequency signal representing the received first radiofrequency signal.

In Example 334, the multichip communication means of any one of Examples 319 to 333, wherein the first antenna is configured as a solder bump antenna, the solder bump antenna including a first plurality of solder bumps, electrically conductively connected to each other, and configured to radiate the radiofrequency signal in a first direction; and a third antenna, configured as a slot antenna, and configured to radiate the radiofrequency signal in a second direction, orthogonal to the first direction.

In Example 335, the multichip communication means of Example 334, further including a feed solder bump, electrically conductively connected to a radiofrequency transmitter, and configured to radiate the radiofrequency frequency to the first antenna and the third antenna.

In Example 336, the multichip communication means of Example 334 or 335, wherein the first plurality of solder bumps are arranged linearly.

In Example 337, the multichip communication means of any one of Examples 334 to 336, further including a second plurality of solder bumps, arranged parallel to the first plurality of solder bumps, wherein the second plurality of solder bumps connect a power source to a reference potential.

In Example 338, the multichip communication means of 337, wherein the second plurality of solder bumps forms a short circuit.

In Example 339, the multichip communication means of any one of Examples 334 to 338, further including a differential feed, configured to provide the radiofrequency signal to the first antenna; and a single-ended feed, configured to provide the radiofrequency signal to the third antenna.

In Example 340, the multichip communication means of any one of Examples 319 to 339, wherein the at least one electromagnetic energy reradiating element includes a plurality of electromagnetic energy reradiating elements arranged along a path between the first processing means and the second processing means.

In Example 341, the multichip communication means of any one of Examples 319 to 340, wherein a path between the first antenna and the second antenna includes one or more curves, and wherein one or more of the reradiating elements are located in each curve.

In Example 342, the multichip communication means of any one of Examples 319 to 341, wherein a plurality of reradiating elements are placed along a path between the first antenna and the second antenna.

What is claimed is:

1. A circuit package comprising:
a first chiplet, comprising:
   a first side and a second side, opposite to the first side;
   a first terminal, connecting to the first side and the second side;
   a first solder element, mounted on the first terminal;
   a second terminal, connecting to the first side and the second side;
   a second solder element, mounted on the second terminal;
   a metallic element, operably connected to the second solder element; and
   a first transmission line, electrically conductively coupled to the first terminal; wherein the first terminal is configured to receive an electrical signal from the first transmission line and to emit a radiofrequency signal from at least the solder element, wherein the radiofrequency signal represents the received electrical signal,
   wherein the metallic element has a shape whose perimeter at least partially surrounds the first terminal.

2. The circuit package of claim 1, wherein the metallic element is configured to at least one of inductively or capacitively couple the second solder element with the first solder element.

3. The circuit package of claim 2, wherein the at least one of the inductive or capacitive coupling of the metallic element with the first solder element alters an impedance of the second solder element.

4. The circuit package of claim 1, wherein the first solder element is electrically conductively connected to a package ground layer and a ground layer of the first chiplet.

5. The circuit package of claim 1, further comprising:
   a first transmission line, electrically conductively connected to the second terminal;
   wherein the second terminal is configured to receive an electrical signal from the first transmission line and to emit a radiofrequency signal from at least the solder element, wherein the radiofrequency signal represents the received electrical signal.

6. The circuit package of claim 5, the circuit package of claim 5, wherein the metallic element is a top-loaded antenna.

7. The circuit package of claim 5, wherein the first terminal is electrically shorted.

8. The circuit package of claim 5, wherein the first solder element is a solder bump.

9. A multichip radiofrequency transmission device, comprising:
   a first chiplet;
   a first antenna;
   a first transmission line, coupling the first antenna to the first chiplet, wherein the first antenna is configured to receive an electrical signal from the first transmission line and to emit a radiofrequency signal, wherein the radiofrequency signal represents a received electrical signal;
   a second chiplet;
   a second antenna; and
   a second transmission line, connecting the second antenna to the second chiplet,
   wherein a minimum distance between the first chiplet and the second chiplet is greater than a minimum distance between the first antenna and the second antenna.

10. The multichip radiofrequency transmission device of claim 9, further comprising:

a third chiplet;
   a third antenna; and
   a third transmission line, connecting the third antenna to the second chiplet;
   wherein a minimum distance between the first chiplet, the second chiplet, and the third chiplet is greater than a minimum distance between the first antenna, the second antenna, and the third antenna.

11. The multichip radiofrequency transmission device of claim 9, wherein at least one of the first antenna or the second antenna comprises a plurality of vertically stacked vias.

12. The multichip radiofrequency transmission device of claim 9, wherein at least one of the first antenna or the second antenna comprises a plurality of through silicon via (TSV) antennas.

13. The multichip radiofrequency transmission device of claim 10, wherein at least one of the first antenna, second antenna, or third antenna is a top-loaded monopole antenna.

14. The multichip radiofrequency transmission device of claim 9, further including the first chiplet, wherein the first chiplet includes a transceiver and one or more processors, configured to control the transceiver to transmit a wireless signal via the first antenna to at least the second antenna or a third antenna.

15. The multichip radiofrequency transmission device of claim 9, wherein the first transmission line is configured to electrically conductively connect the first antenna to the first chiplet.

16. The multichip radiofrequency transmission device of claim 9, wherein the second transmission line is configured to electrically conductively connect the second antenna to the second chiplet; and wherein the third transmission line is configured to electrically conductively connect the third antenna to the third chiplet.

17. A multichip module comprising:
   a chiplet comprising:
      a first receive antenna;
      a second receive antenna; and
      a receiver, configured to:
         receive a combined wireless transmission on the first receive antenna and the second receive antenna, wherein the combined wireless transmission represents a first wireless transmission transmitted by a first transmit antenna and a second wireless transmission, different from the first wireless transmission, transmitted by a second transmit antenna; decode the combined wireless transmission according to a predefined decoding parameter to determine the first wireless transmission and the second wireless transmission from the combined wireless transmission; and
         send the decoded first wireless transmission to an equalizer and the decoded second wireless transmission to an equalizer.

18. The multichip module of claim 17, wherein decoding the combined wireless transmission comprises applying a predetermined weight to at least one of the combined wireless transmission as received on the first receive antenna or the combined wireless transmission as received on the second receive antenna.

19. The multichip module of claim 18, wherein the predetermined weight is based on a spatial relationship between the first transmit antenna and the second transmit antenna relative to the first receive antenna and the second receive antenna.

* * * * *